United States Patent [19]
Thompson et al.

[11] Patent Number: 5,633,802
[45] Date of Patent: May 27, 1997

[54] APPARATUS AND METHOD FOR THREE-DIMENSIONAL POWERLINE DESIGNING

[75] Inventors: Philip G. Thompson, Temecula, Calif.; Timothy Pilgrim, Dublin, Ireland

[73] Assignee: Calligraphic Systems Limited, Dublin, Ireland

[21] Appl. No.: 482,572

[22] Filed: Jun. 7, 1995

Related U.S. Application Data

[63] Continuation of Ser. No. 265,633, Jun. 24, 1994, Pat. No. 5,574,633, which is a continuation of Ser. No. 741,114, Aug. 5, 1991, abandoned.

[51] Int. Cl.$^6$ .................................................. G06F 15/00
[52] U.S. Cl. ........................................... 364/483; 364/506
[58] Field of Search .................................. 395/155–161, 395/119–127; 364/433, 483, 474.24, 480–481, 488, 492, 505–506, 511, 512, 550, 551.01, 556, 560–564, 567, 223.6, 223.7

[56] References Cited

U.S. PATENT DOCUMENTS 4,806,855 2/1989 Daus ........................................ 364/483
4,818,990 4/1989 Fernandes ............................. 364/433 X

OTHER PUBLICATIONS

Ringler, "Automated Methods of Power–Line Design/Analysis", Transmission & Distribution, Oct. 1990, pp. 70–73.
Partanen et al., "A Personal Computer Based Design System for Profiling Overhead Lines," Int. Conf. on Overhead Line Design Nov. 1988, pp. 146–150.
Koglin et al., "Representation of Planned Overhead Lines", Int. Conf. on Overhead Lines, Nov. 1988, pp. 151–155.
McDonald et al., "Sag–Tension Calculations, Valid for Any Line Geometry", Journ. of Strut Eng., Sep. 1990, pp. 2374–2387.
Riisio et al., "Computer Aided Design Systems for Line Routes Tower Slotting and Line Structures in Finland", Cigre, Sep. 1990, pp. 1–7.
Bates, "Transmission Line Computer Aided Design and Drafting", IEEE, 1989, pp. 26–30.
Carton et al., "Computer Aided Structural and Geometric Design of Power Lines", May 1991, pp. 210–215.
Carton et al., "Camelia", Int. Conf. on Overhead Line Design, Nov. 1988, pp. 141–145.
Dommel, "Overhead Line Parameters from Handbook Formulas and Computer Programs", IEEE, Feb. 1985, pp. 366–372.
Chan, "Interactive Graphics Interface for Power System Network Analysis", IEEE, 1990, pp. 34–38.
Aggeler et al., "Computerized Overhead Transmission Line Design with Powerline", Transmission & Distribution, Aug. 1991, pp. 144–150.

Primary Examiner—Mark R. Powell
Assistant Examiner—John E. Breene
Attorney, Agent, or Firm—Ostrolenk, Faber, Gerb & Soffen, LLP

[57] ABSTRACT

An apparatus for powerline designing and maintenance which provides assistance for the initial design of overhead powerlines and their maintenance. The apparatus includes a device for measuring the initial ground profile along a proposed route, and for defining the required support structures, taking into account the predicted cost of components together with prevailing safety standards and industry guidelines. Facilities are also provided for ordering fittings and for checking line tension at the construction stage. Previously constructed lines may be monitored by visual inspection of existing fittings for depreciation and damage or by resurvey and the data gathered can then be compared to the original design specifications.

14 Claims, 128 Drawing Sheets

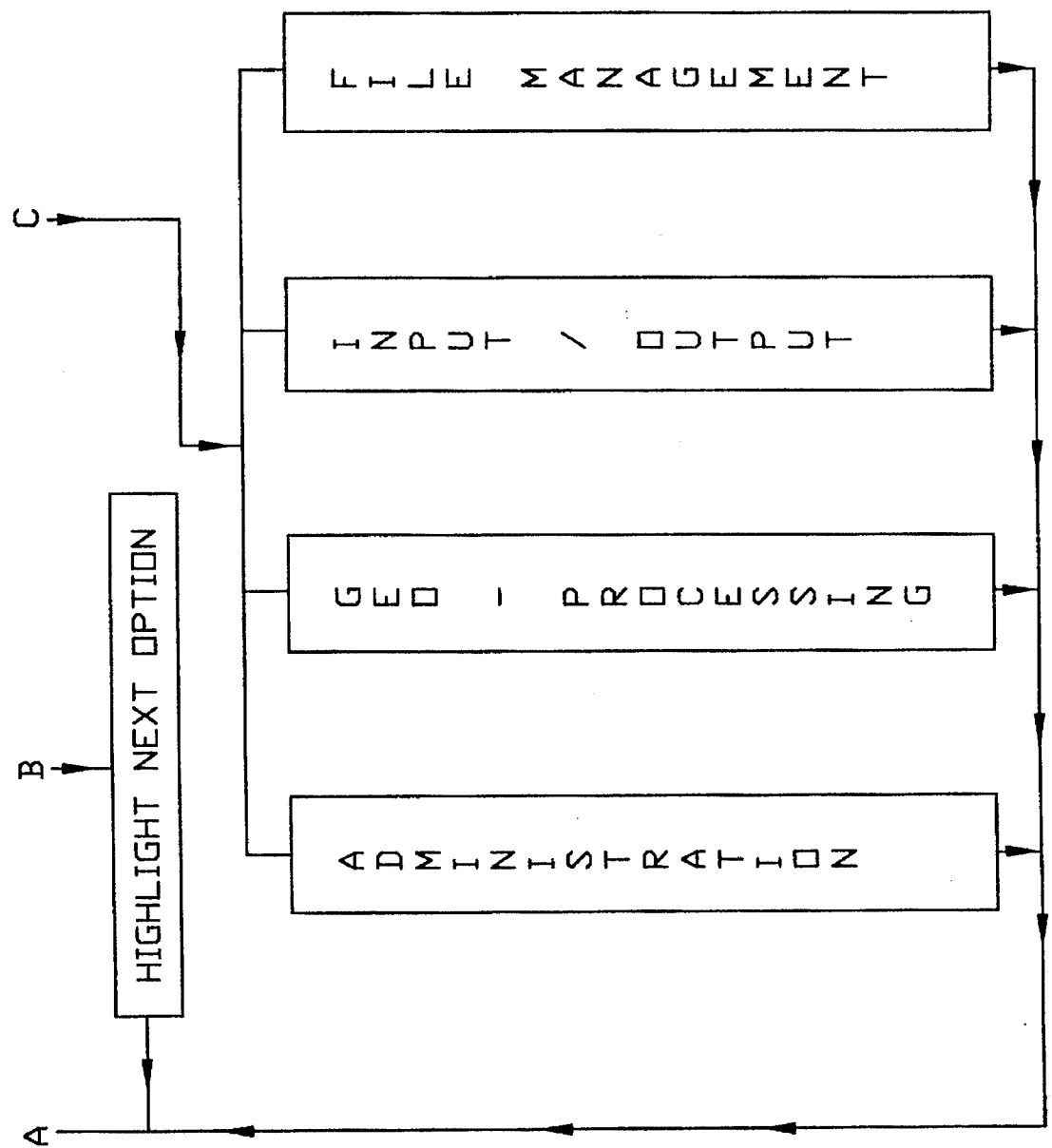

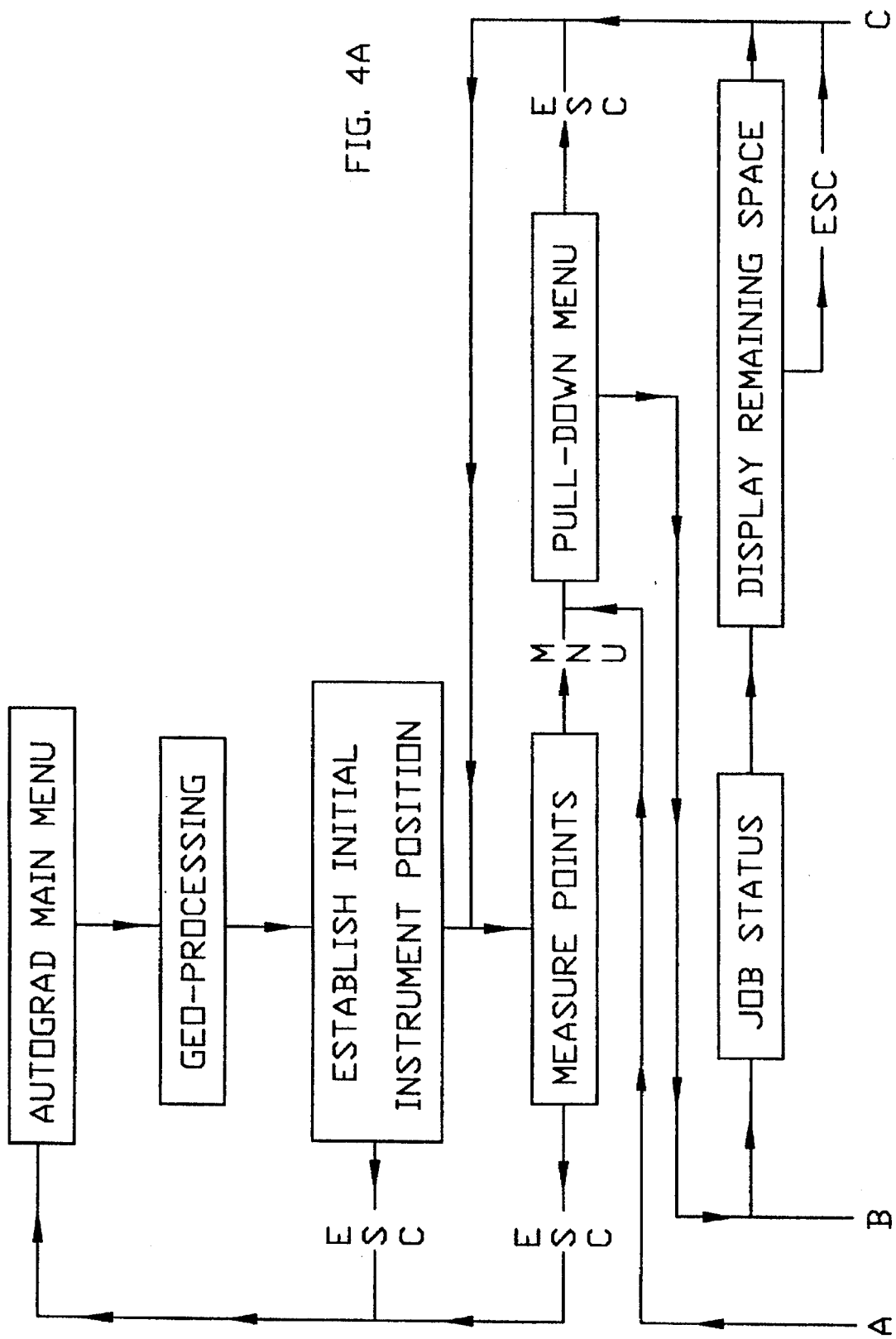

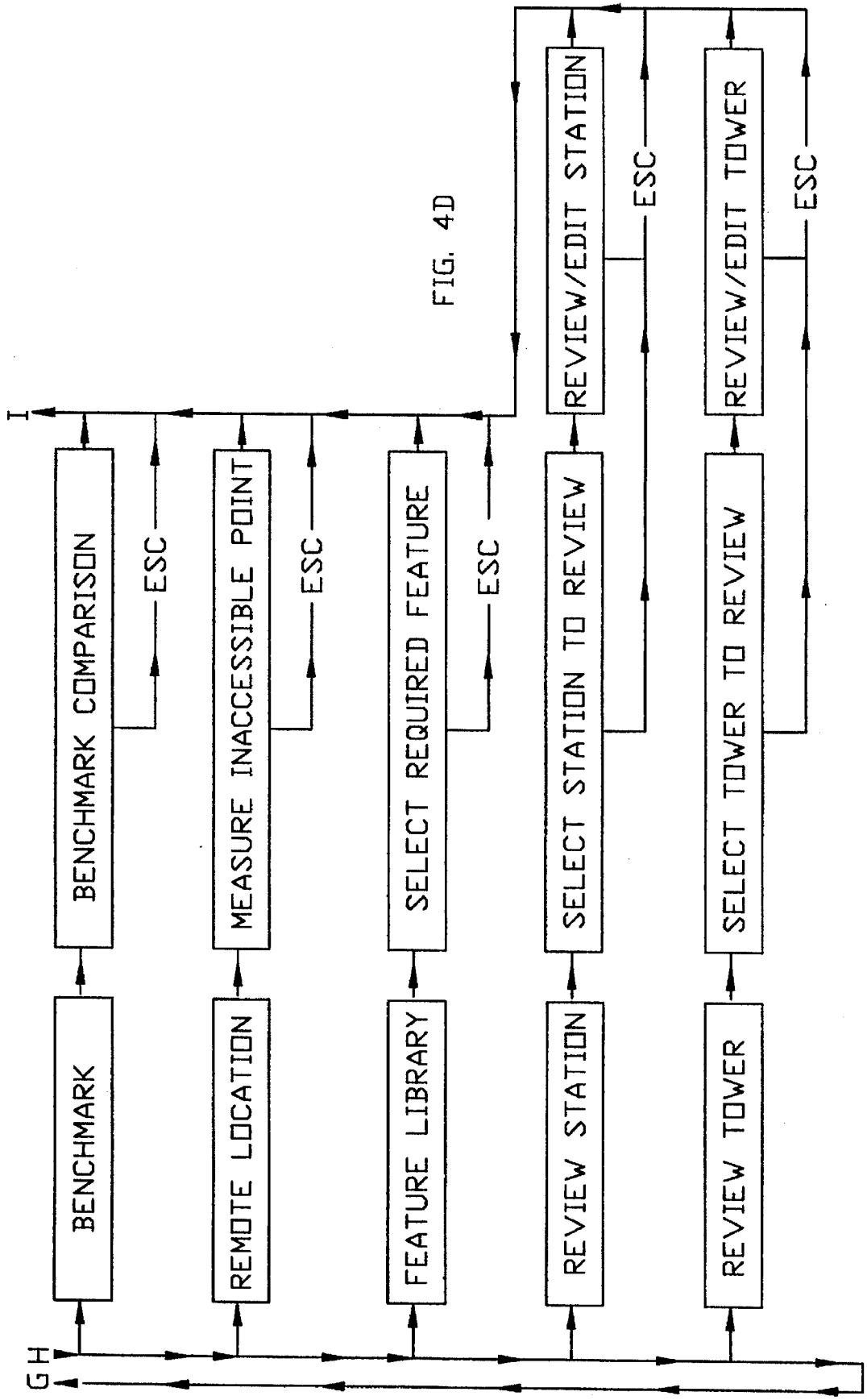

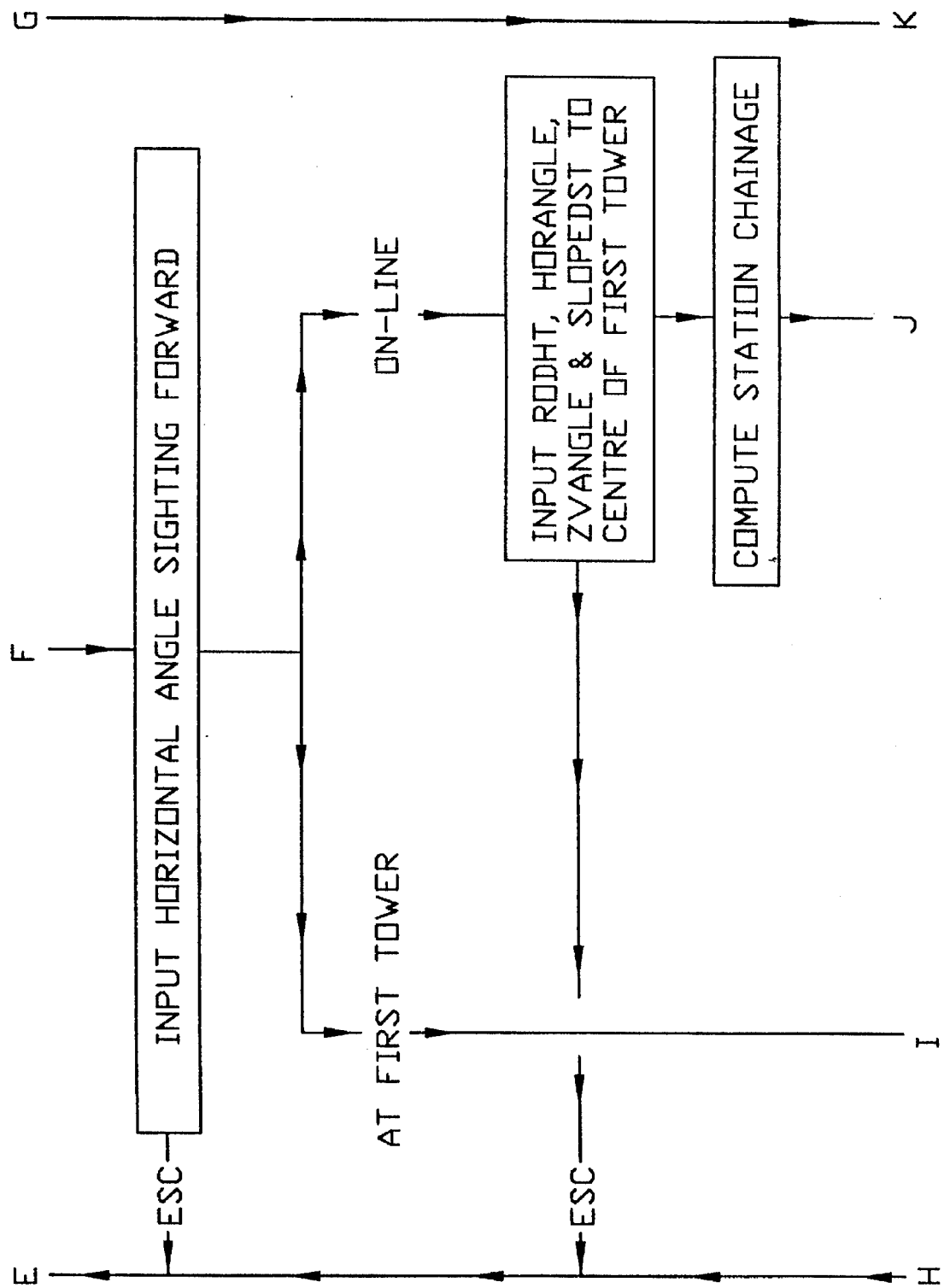

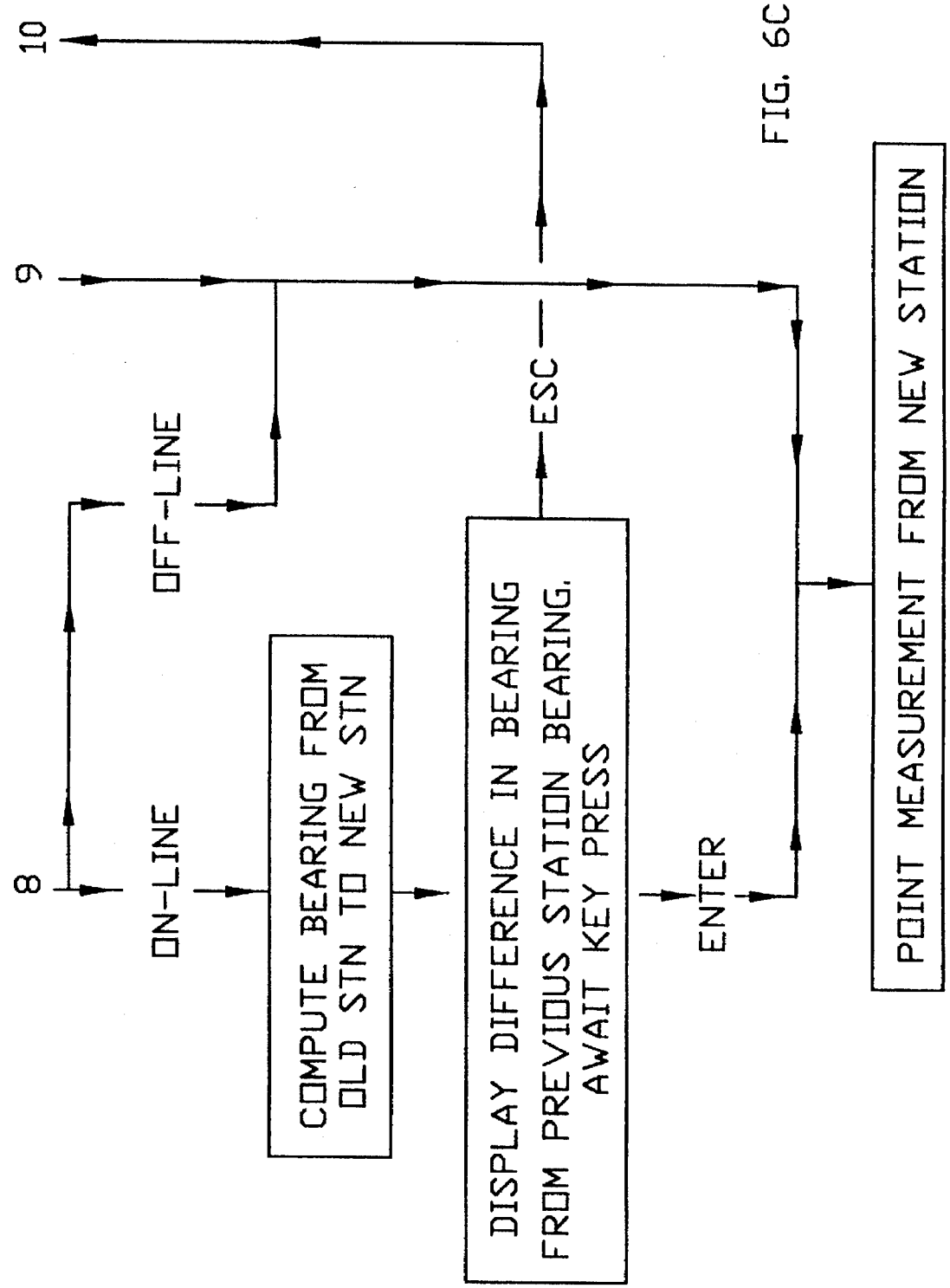

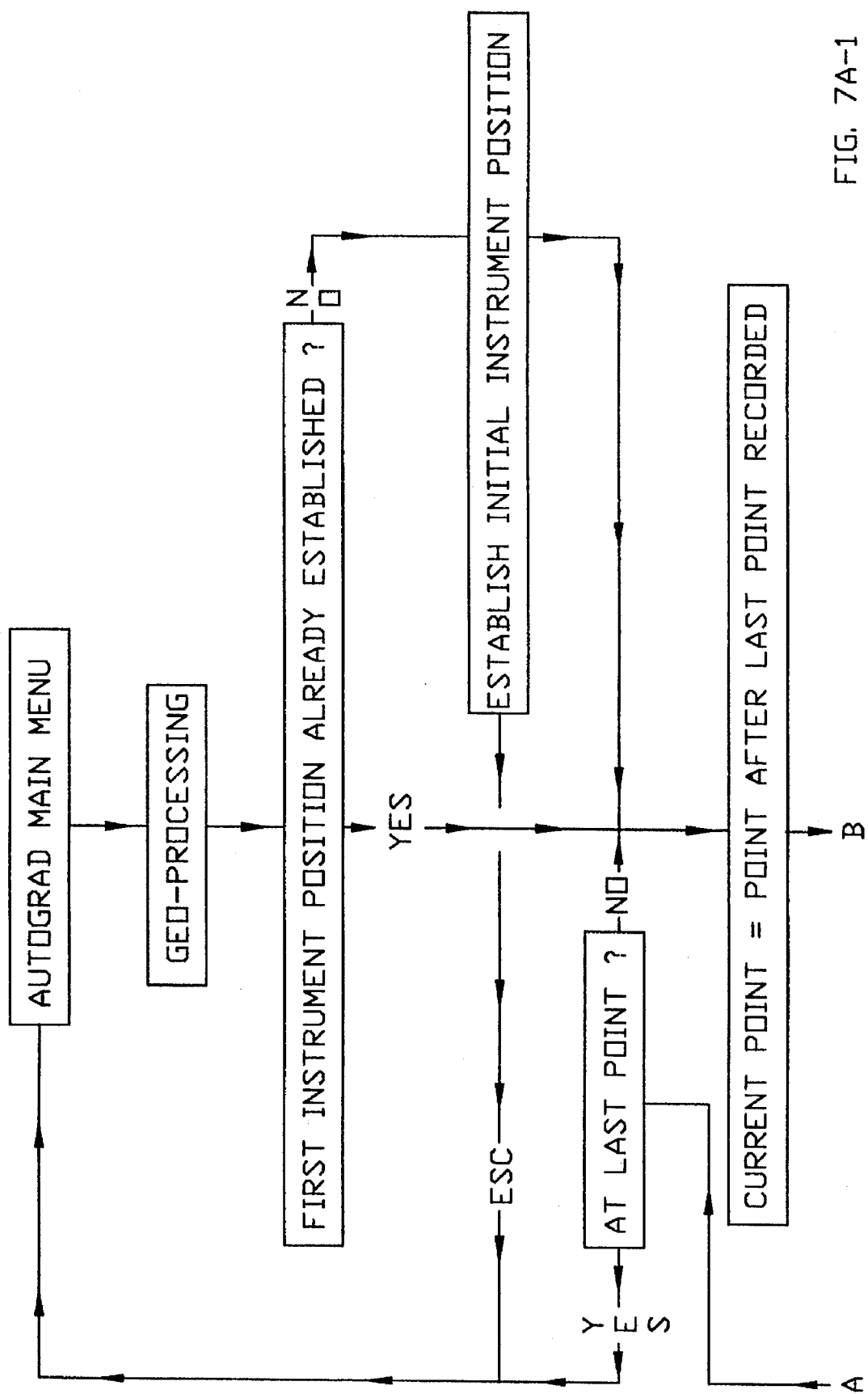

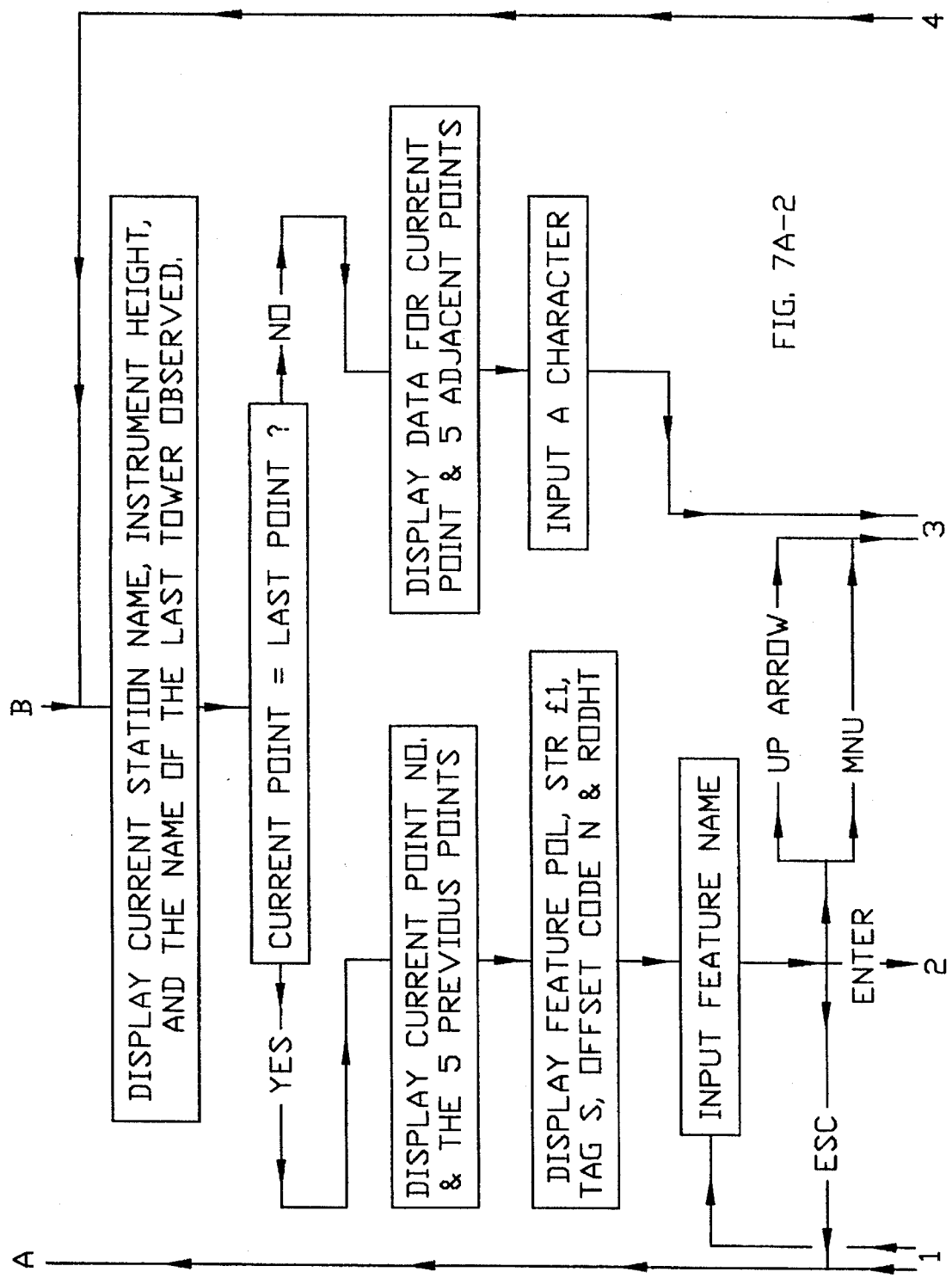

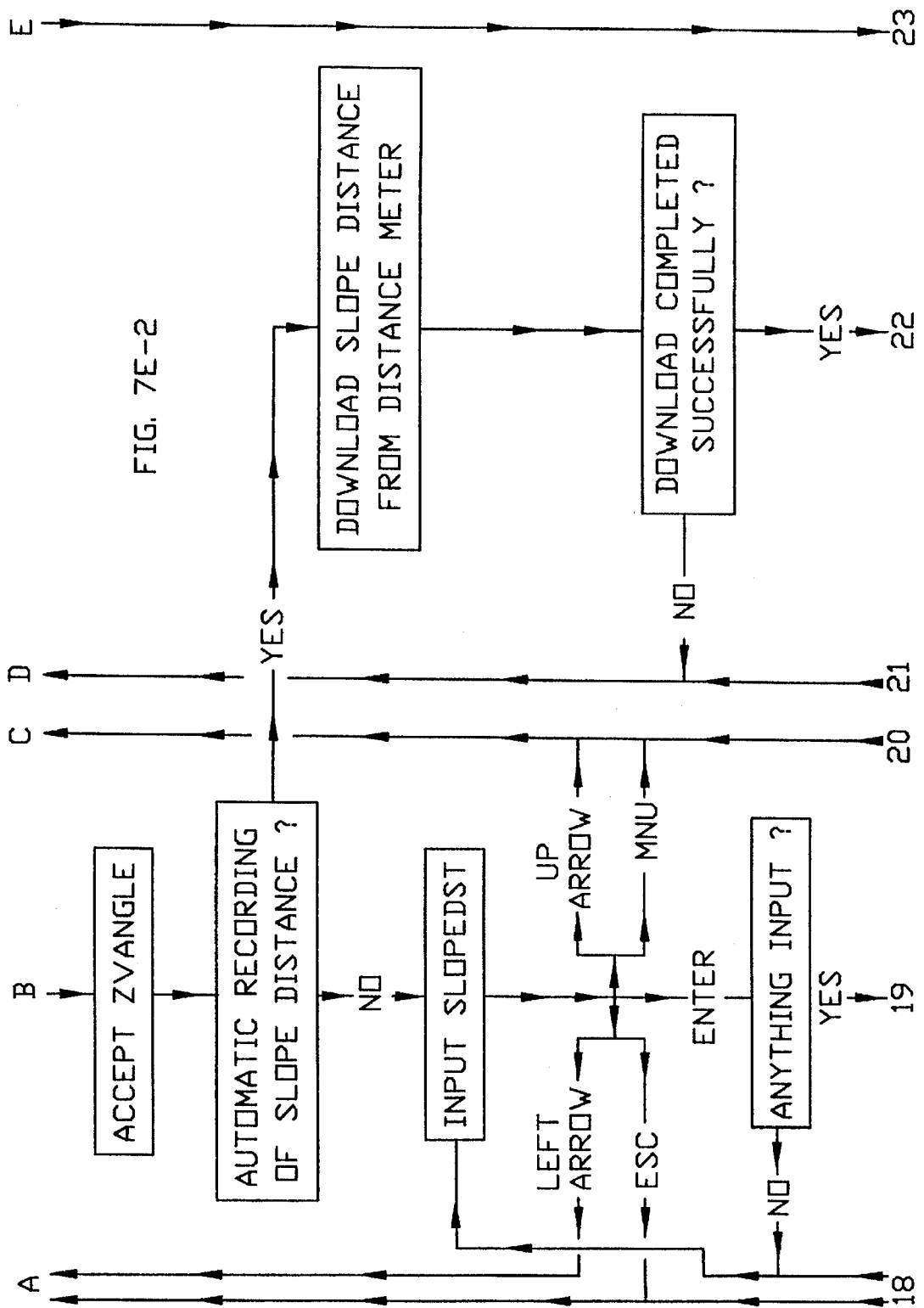

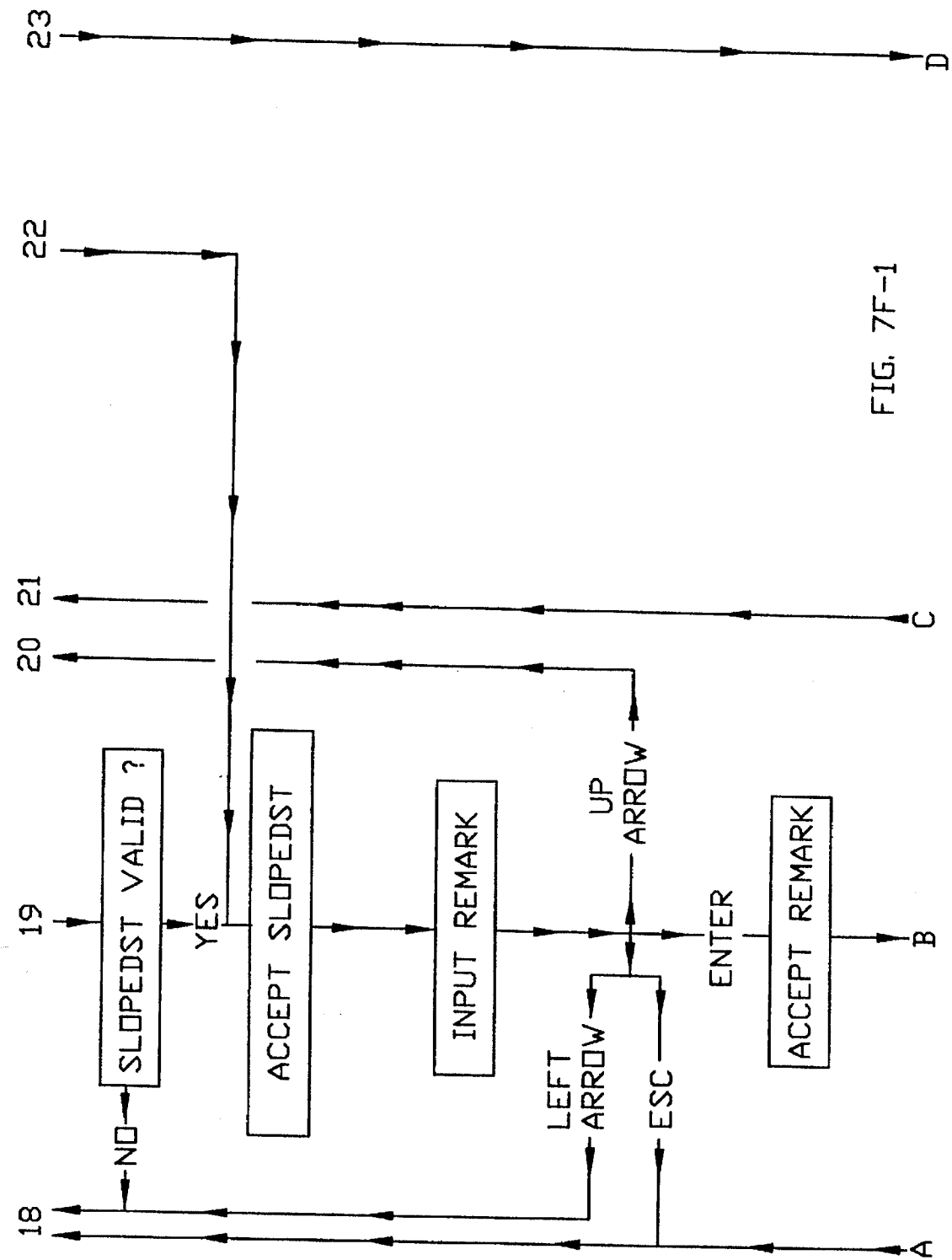

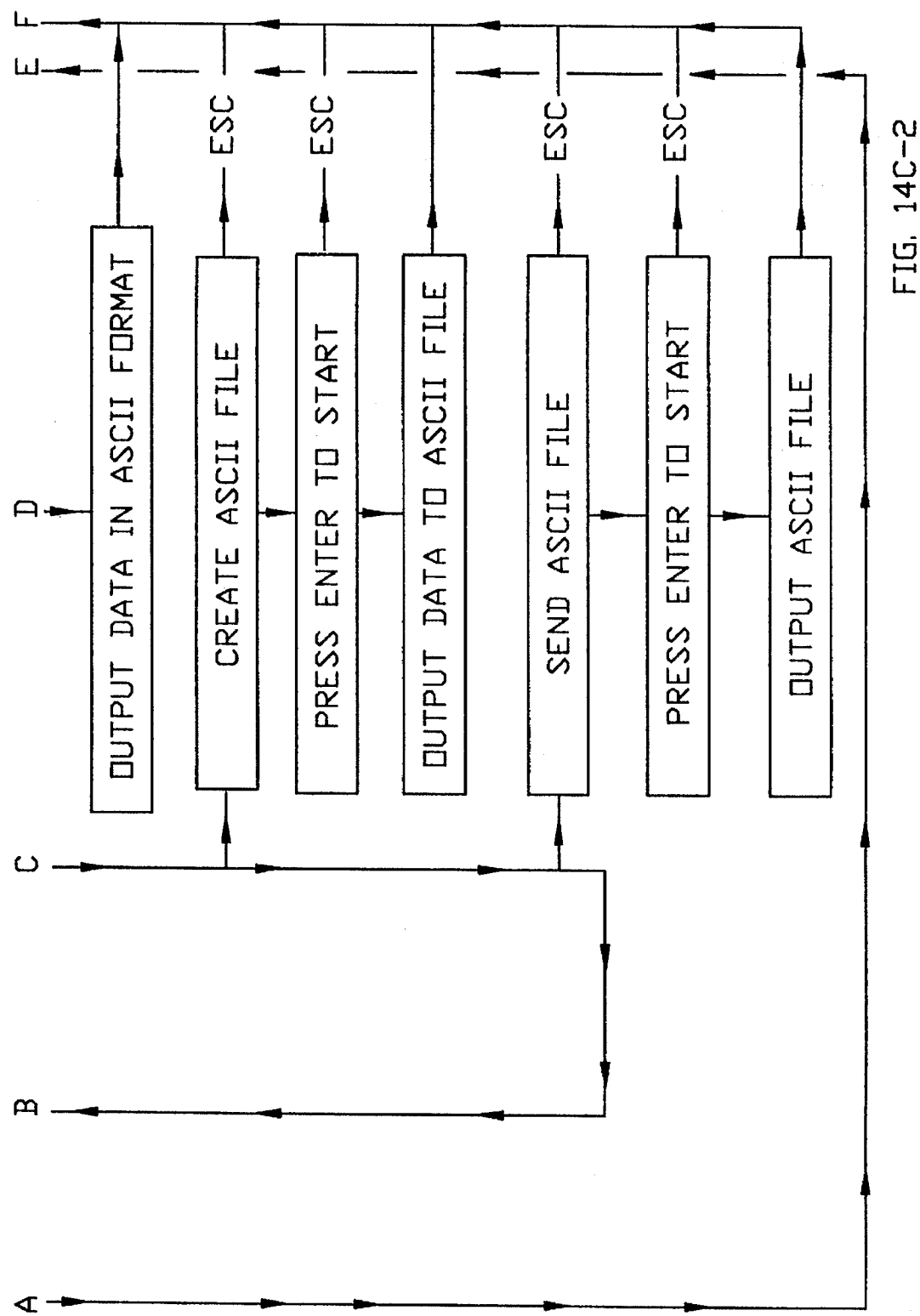

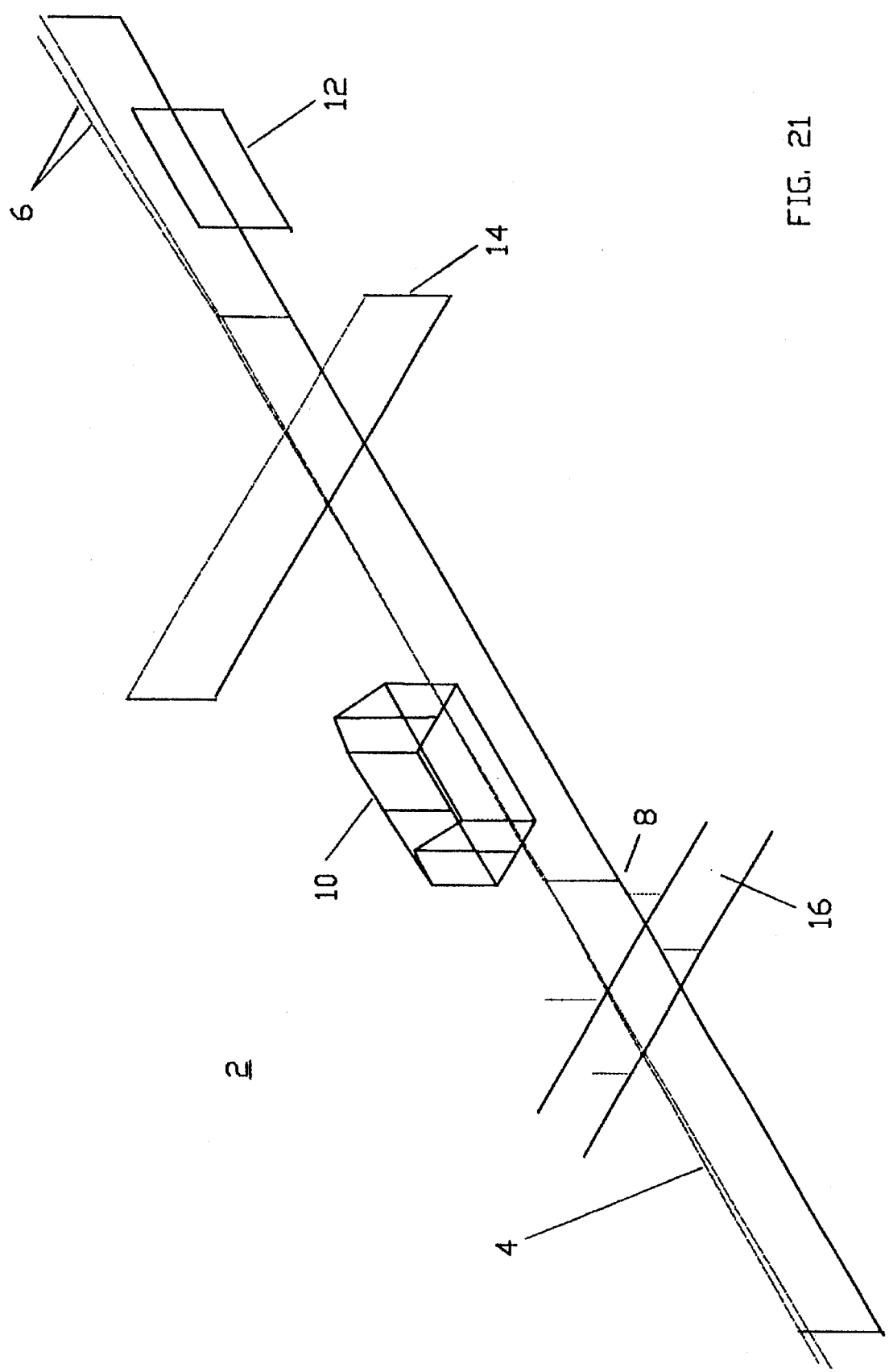

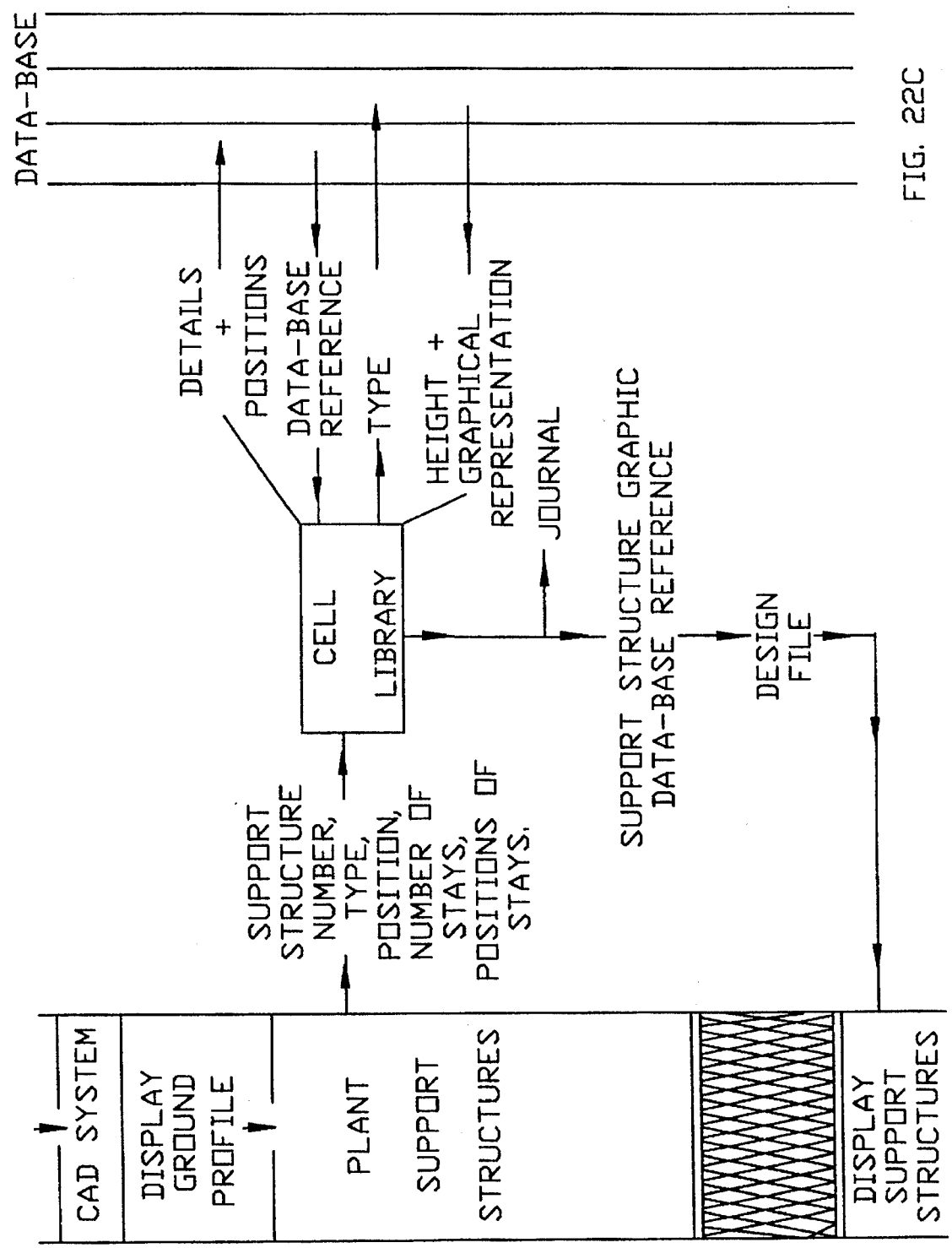

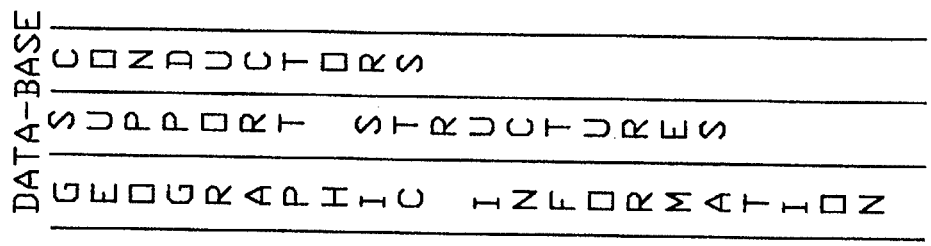
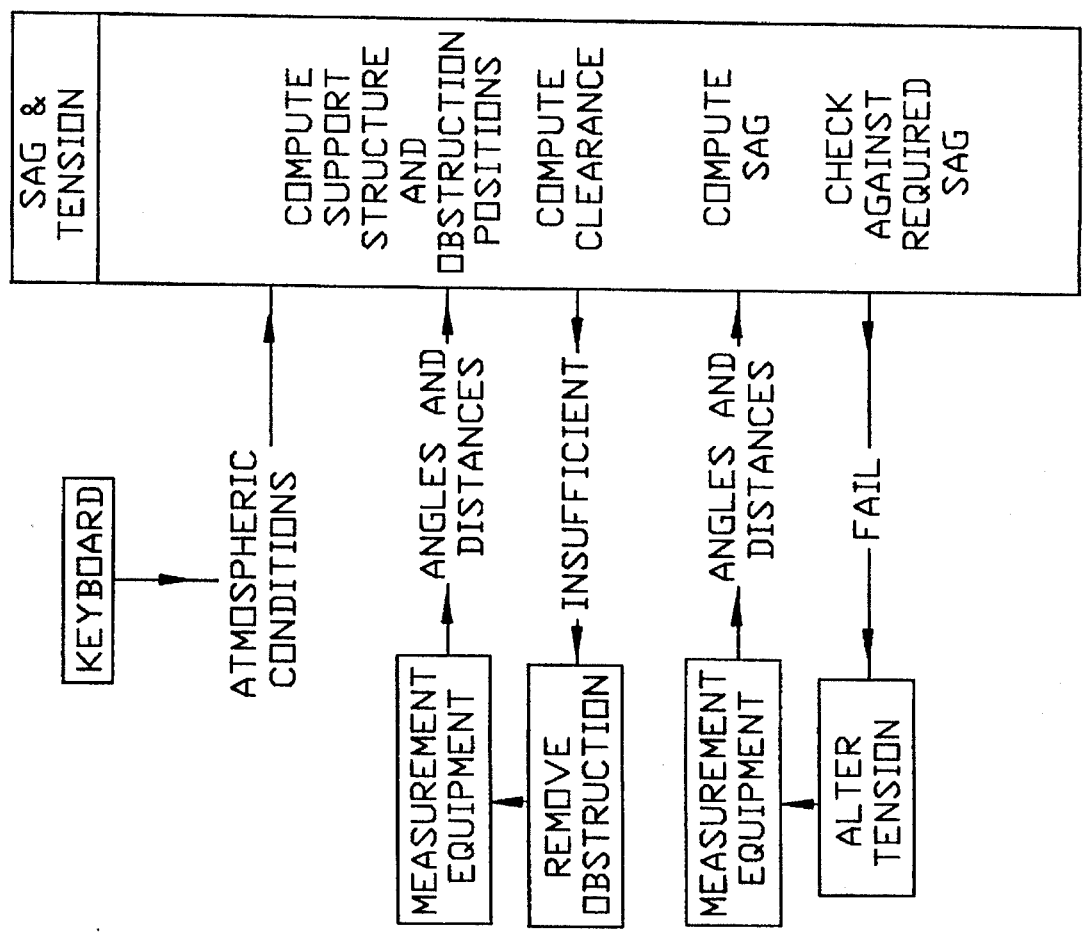
FIG. 22H

FIG. 24B

| LAND USAGE | RIGHT SIDE | LEFT SIDE | CHAINAGE | DATUM | DESCRIPTION |
|---|---|---|---|---|---|
| | | | .000 | 50.000 | DEVIATION= 0.000 |
| | | 5.988 | 6.023 | 45.502 | ROAD |
| | | 2.795 | 27.450 | 46.965 | GL. |
| 5.505 | | | 29.036 | 46.850 | ROAD |
| | | 1.602 | 29.962 | 46.579 | BUILDING |
| | | | 48.288 | 44.067 | HIGHLANDS CLOSE |
| | | | 57.437 | 43.634 | ROAD |
| 14.515 | | | 57.625 | 42.818 | 2 HIGHLANDS CLOSE |
| 2.939 | | | 94.840 | 41.233 | CONDUCT |
| 1.308 | | | 98.027 | 41.246 | 14 HIGHLANDS CLOSE |
| | | 3.345 | 120.509 | 39.376 | 19 HIGHLANDS CLOSE |
| | | 3.334 | 120.539 | 39.381 | CONDUCT |
| 12.457 | | | 127.875 | 38.384 | 5 BELVEDERE ROAD |
| 5.311 | | | 143.318 | 37.450 | 6 BELVEDERE ROAD |
| 5.908 | | | 144.351 | 37.444 | 7 BELVEDERE |
| 11.470 | | | 179.039 | 34.347 | CP 2 |
| | | 2.806 | 186.132 | 35.737 | CONDUCTOR |
| | | 2.808 | 186.133 | 35.691 | 10 BELVEDERE ROAD |
| | | 1.537 | 188.781 | 35.580 | CONDUCTOR |
| | | 1.534 | 188.797 | 35.597 | 11 BELVEDERE ROAD |
| | | | 214.101 | 33.260 | 15 BELVEDERE ROAD |
| | | 3.266 | 224.355 | 32.498 | CONDUCTOR |
| | | 3.239 | 224.620 | 32.474 | AERIAL ON 15 BELVED |
| | | 3.239 | 224.620 | 38.573 | CONDUCTOR ABOVE AER |
| | | 9.038 | 240.825 | 33.270 | ROAD |
| | 7.780 | | 243.711 | 33.121 | CP ON BARRIER |
| | 11.220 | | 263.895 | 30.627 | ROAD |
| | | 1.880 | 287.608 | 28.731 | CONCRETE MUFF |
| | | | 291.529 | 28.267 | PO 23 |

AUTOMATIC PLACEMENT OF TEXT PREVENTS TEXT CLASHING.

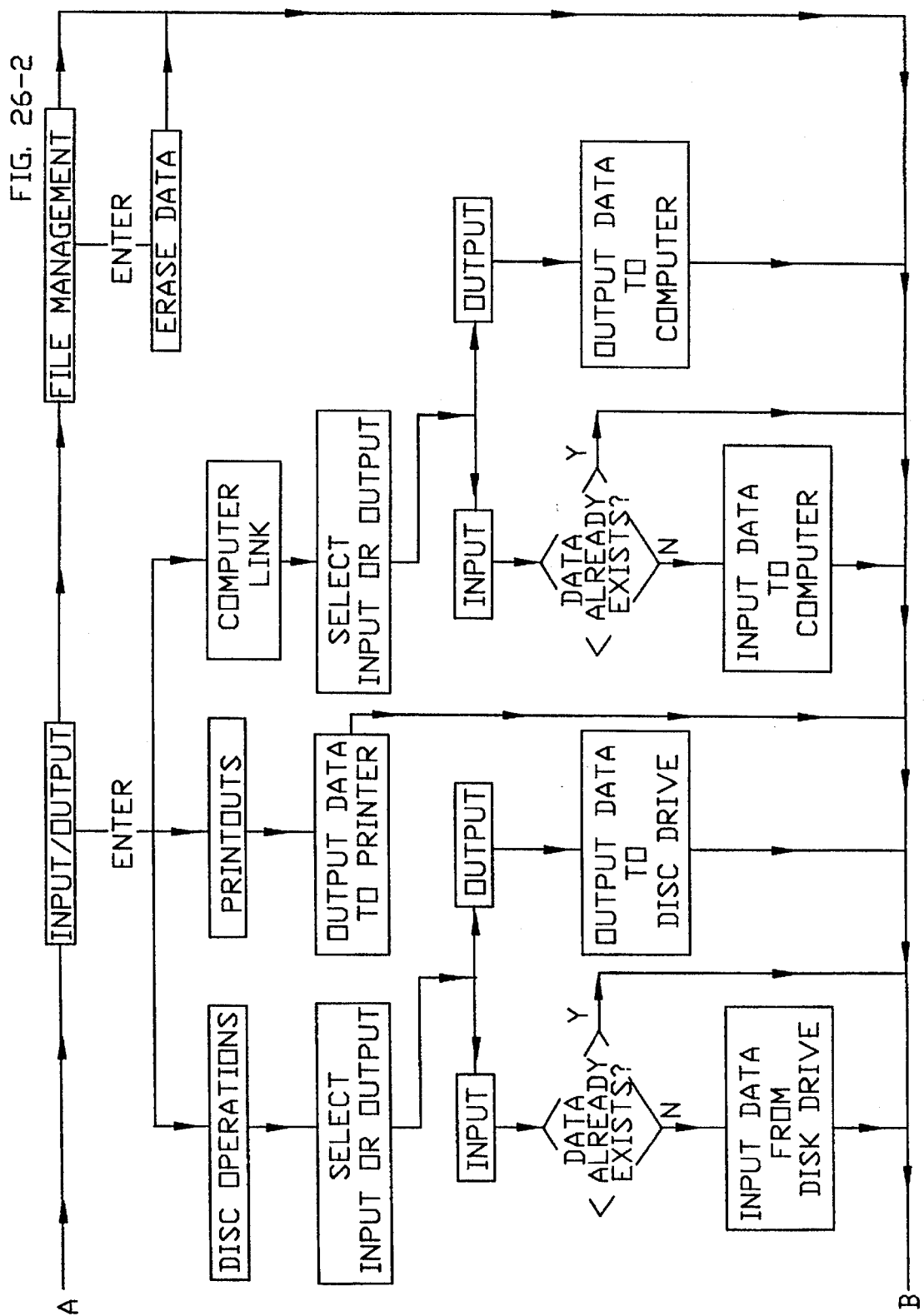

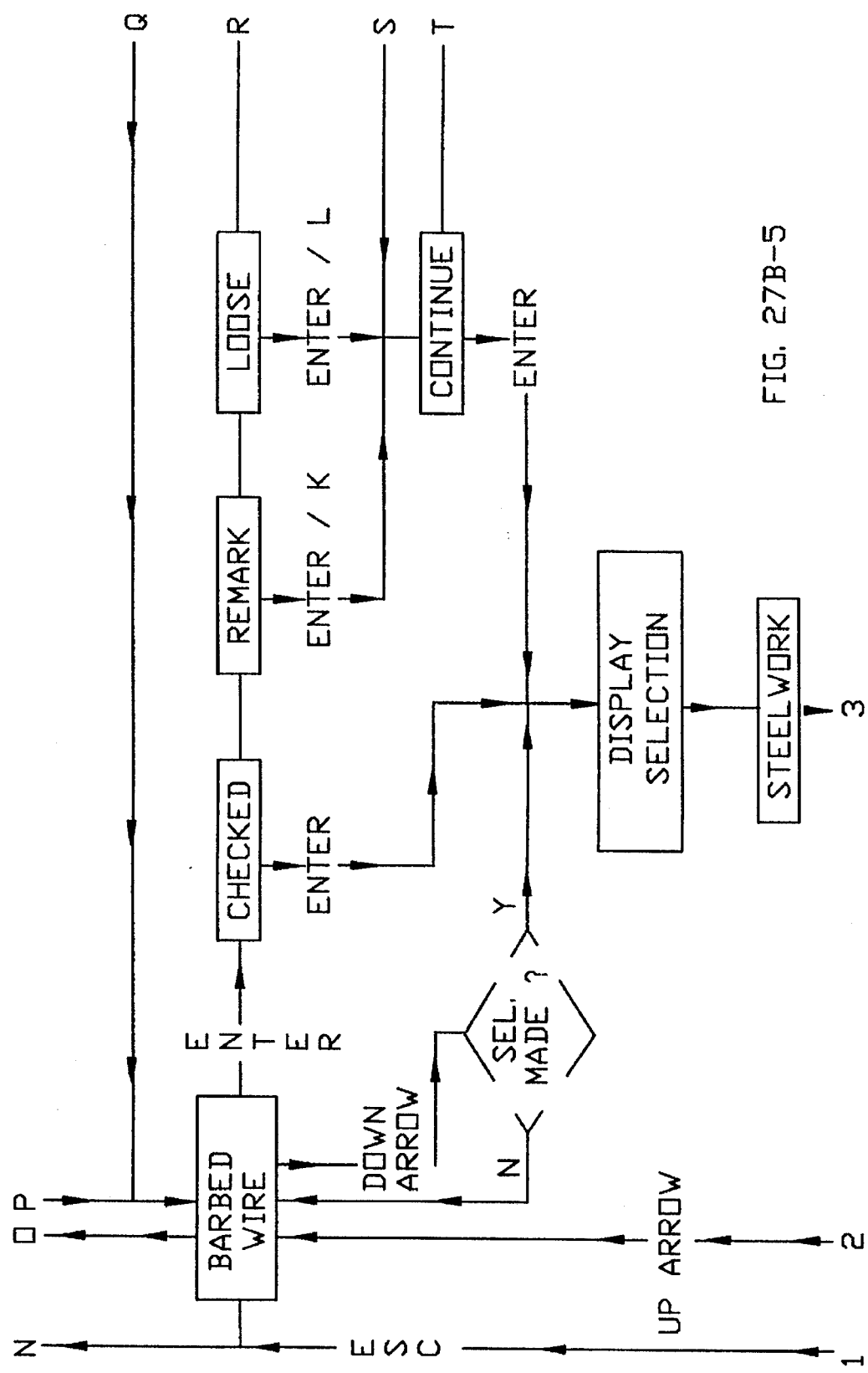

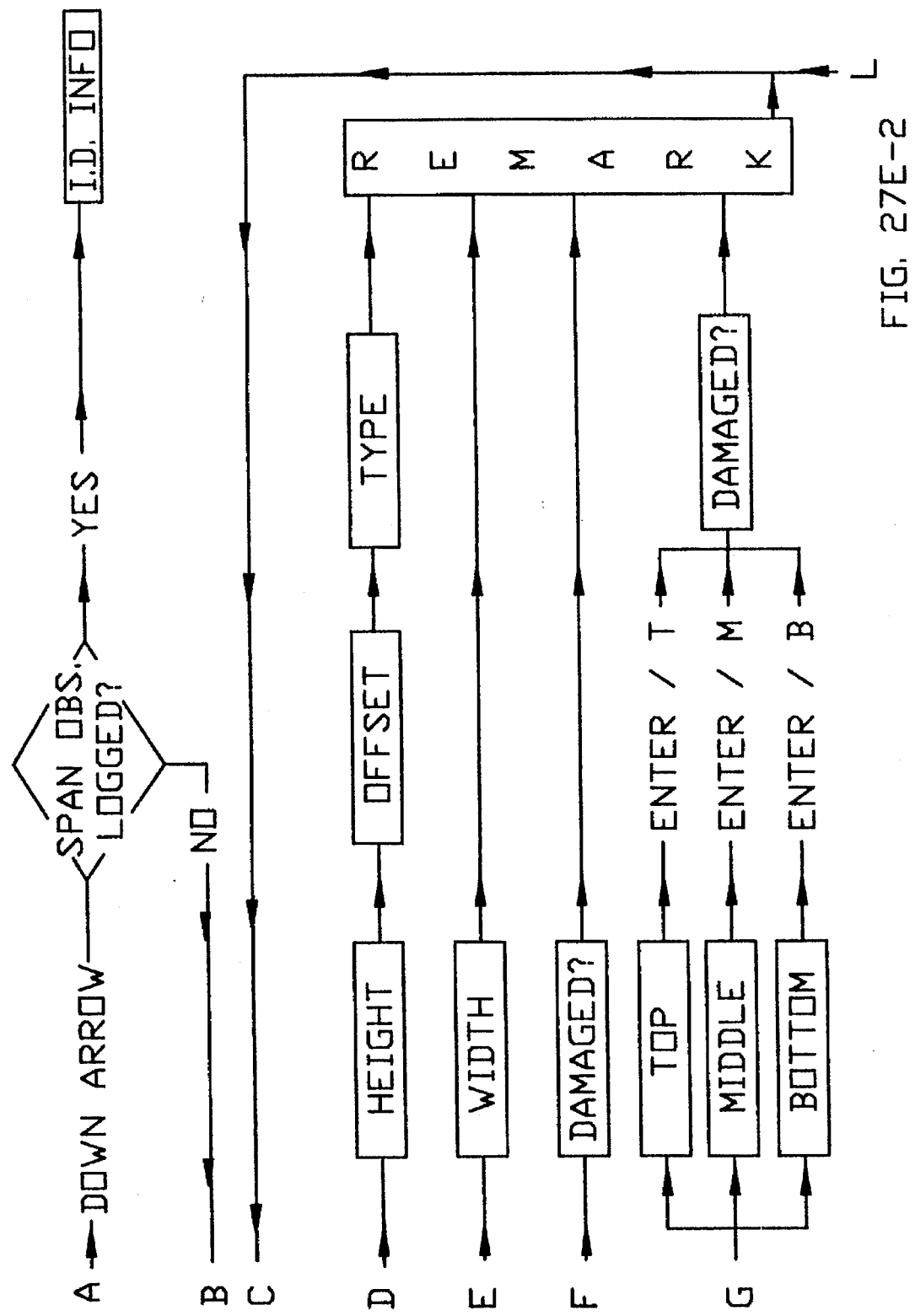

APPARATUS AND METHOD FOR THREE-DIMENSIONAL POWERLINE DESIGNING

This is a continuation of application Ser. No. 08/265,633, filed Jun. 24, 1994, now U.S. Pat. No. 5,574,633, which is a continuation of application Ser. No. 07/741,114, filed Aug. 5, 1991, now abandoned.

BACKGROUND OF THE INVENTION

The present invention relates to an overhead powerline survey method and, in particular, to a survey method for the design and maintenance of overhead powerlines, including survey of a line from points off the line so that the route of the line and the local topography in the vicinity of the line may be recorded.

Traditionally, surveying of existing powerlines or of the route of planned powerlines is restricted to following only the exact route of the powerline by sighting from one point on the line to the next, along the route of the line. The traditional methodology allows only very limited account to be taken of local topographical features, e.g., roads, houses and the like. Measurements taken in powerline surveys are generally recorded manually in a logbook and computed at a later time to derive two-dimensional co-ordinates for the points measured, i.e., height and distance along the line. These co-ordinates are then plotted using traditional drafting techniques. If it is required to input this data into a computerized system, the transfer has to be done manually.

The positions of the required support structures for a proposed powerline may then be defined on this plot. Then the line of the conductor is plotted and ground clearance is checked. If sufficient clearance has been obtained, this design is accepted and the relevant materials ordered so as to construct the powerline.

This paper based system has a number of inherent shortcomings. These are:

- The whole design process takes place in two dimensions whereas in reality three dimensional data should be used.
- Modifying a proposed design is time consuming and costly.
- The whole process is slow.
- The transcription of data and manual computation of coordinates and drafting thereof is prone to error.
- The survey technique requires that a corridor along the proposed route be cleared completely of vegetation, so as to establish a clear line of sight.
- The survey technique does not take full account of features offset from the route of the line.
- The design process takes place in a scaled plot, not at actual scale, thereby introducing errors due to the poor definition of the features plotted.
- The conductors are modelled using fixed parameters.
- These cannot be easily altered to take account of varying limits.
- The cost of the proposed line is not calculated until the design has been accepted.

SUMMARY OF THE INVENTION

It is the object of the present invention to overcome the above difficulties.

According to one aspect of the present invention there is provided apparatus for powerline designing including:

a device for preparing two and three dimensional representations of the proposed powerline and its support structures in relation to the surrounding land;

a device for defining the conductor design of the proposed powerline in relation to its surrounding environment;

a device for comparing and checking the conductor design parameters against industry standards; and a device for identifying the type, number, and cost of the components required to construct the powerline.

Conveniently, the apparatus also includes a device for measuring points off the proposed route of a powerline in addition to points strictly along the route of the powerline.

Preferably, the apparatus includes:

a device for checking the position of the actual line and determining the clearance between the ground profile and an existing or proposed powerline; and a device for modelling design factors such as conductor type, conductor weight, conductor tension, ambient temperature and the like.

Advantageously, the comparing and identifying devices include at least one reference data library containing data relating to industry standards, regulations for powerlines and specifications of available components and their properties and cost of components, and a device for accessing the reference data library.

Conveniently, the apparatus further includes a device for producing an initial design for a powerline using data including safety criteria, minimum clearance zones, fixed height zones within which existing structures may not be altered, varying geological land composition and exclusion zones within which support structures may not be placed.

Preferably, the device for producing an initial design includes an interactive communication device for permitting a user to modify an initially designed powerline interactively so as to achieve a suitable design, based on the available data including component cost and safety criteria.

According to another aspect, the invention further provides an apparatus for use in constructing and maintaining powerlines, including:

a device for recording data pertaining to the geographical position and condition of an existing powerline;

a computer for in-field calculation of the tension of the powerline conductors by the measurement of the conductor sag; and a redesigning device for determining and specifying repairs or modifications needed to be made to the powerline.

Conveniently, the apparatus includes a device for storing the original design data and for comparing the original design data with the recorded data to ascertain the repairs or modifications required to restore the powerline to its original design parameters.

The present invention also provides a method for powerline designing including the steps of:

preparing two and three dimensional representations of the proposed powerline and its support structures in relation to the surrounding land;

defining the conductor design of the proposed powerline in relation to its surrounding environment;

comparing and checking the conductor design parameters against industry standards; and identifying the type, number, and cost of the components required to construct the powerline.

Advantageously, the method includes the steps of checking the position of the actual line and determining the clearance between the ground profile and an existing or proposed powerline and modelling design factors such as conductor type, conductor weight, conductor tension, ambient temperature and the like.

Preferably, the steps of comparing and checking the conductor design parameters and identifying and specifying component requirements includes the steps of providing at least one reference data library containing data relating to industry standards, regulations for powerlines and specifications of available components and their properties and cost of components, and accessing the reference data library.

Conveniently, the method includes the step of producing an initial design for a powerline using data including safety criteria, minimum clearance zones, fixed height zones within which existing structures may not be altered, geological land composition and exclusion zones within which support structures may not be placed.

Advantageously, the method includes the step of interactively modifying an initially designed powerline so as to achieve a suitable design, based on the available data including component cost and safety criteria.

The invention still further provides a method for use in constructing and maintaining powerlines including the steps of:

recording data pertaining to the geographical position and condition of an existing powerline;

calculating in-field the tension of the powerline conductors by measuring the conductor sag; and determining and specifying repairs or modifications needed to be made to the powerline.

Preferably, the method includes the step of storing the original design data and comparing the original design data with the recorded data to ascertain the repairs or modifications required to restore the powerline to its design parameters.

The powerline program is a specialized program module that runs within any suitable program development environment such as that described in the invention disclosed in U.K. Patent Application No. 2203871A, entitled "Method and Apparatus for Survey Datalogging", hereinafter referred to as Autograd.

The PowerLine survey system is a collection of computer programs for the design and maintenance of overhead powerlines. The system covers all aspects of the design process from the measurement of the initial ground profile under the proposed route through the definition of the exact support structure positions and conductor types, taking into account the predicted cost and the relevant safety standards and industry guidelines, to ordering of the actual fittings required and checking the tension of the line at the final construction stage. An important feature of this collection of programs is that it does not finish on completion of the construction stage but also provides facilities whereby constructed lines may be subsequently checked both by visual inspection of the various fittings for depreciation or damage and also by re-survey if so required. Furthermore, it is not restricted to newly constructed lines but also provides facilities whereby existing lines may be surveyed and the existing support structures monitored, thereby bringing them into the system. All these functions are available within a single integrated collection of programs and are all stored within a single data-base.

As well as being innovative overall in providing a fully integrated system, there are included within these programs a number of very significant specific innovations.

The field survey program permits the route of the line to be surveyed not only from positions actually on that route itself but also from other places remote from but referenced to the route of the line. This has not, however, prevented implementation of the traditional survey technique of passing height and distance information via a change point but rather has supplemented it by now permitting the full three dimensional position of the observing station to be computed in this manner. Further flexibility is given in that the traditional traversing technique of passing three dimensional position information directly from one station to the next is provided as an alternative method.

During field surveys, the position of totally inaccessible points may be easily established using a technique which is new to powerline surveys and includes defining a vertical plane containing the required point using two easily accessible points and then sighting directly to the required point and computing its position.

For refurbishment surveys of existing powerlines, the facility has been provided in the field survey programs of monitoring existing support structures and checking them against design data-base information while the surveyor is still in the field.

All positional data is recorded as three dimensional co-ordinates, unlike the traditional method in which only two dimensional information is collected and plotted. Two dimensional output may still be obtained however so as to provide compatibility with existing work practices and formats.

The survey data gathered using a field computer may be passed either directly or via a storage medium to an office based design system. Each data point is incorporated in a data string and referenced to a specific feature type. This means that when it is passed across to the office design system, the reception program can read this information and define it appropriately using data-base information. The reception program thus creates a data file comparable with the specified Computer Aided Design (CAD) system.

The support structure positions and types may then be added to this design file. These support structures are retrieved from a library having a direct interface to the data-base. This means that the exact dimensions, loadings, components and cost of each type of structure are immediately available.

Once the support structures have been planted, the conductors may be modelled. To do this, a special program has been written which takes the complex mathematical equations of the curves defined by the conductors and plots their positions. A shadow may also be plotted defining the minimum clearance line thereby enabling ground clearance to be quickly checked. Some features (i.e., roads) require a greater clearance than this minimum distance. These clearances may be checked by the design engineer using the minimum distance function provided as a standard by the host CAD system.

The conductor program contains data on all the conductor types available and permits the design engineer to select the most appropriate one. The design engineer may also alter the equivalent span (related to the distance between tension points), operational temperature, ice loading and wind conditions thereby checking the ground clearance even in extreme conditions.

The next stage in the design process is to check that the designed line meets all the required safety standards. To do this a special analysis program has been written. This takes the designed line (together with all the related data-base information on the support structures and conductors used) and checks it against internationally recognized safety standards.

The designed line may then be costed on the basis of the fittings required and the estimated construction costs. A list of the required fittings may then be produced so that they may be ordered.

If at any time during the design or checking procedure a change is made, this is immediately reflected in the displayed plot and can quickly be checked for ground clearance, compliance with safety standards and costs.

A hard copy in the form of a fully annotated and properly presented drawing may be obtained at any time using the standard CAD system plot facility.

This plot may be passed to the engineer in charge of the construction process. The support structures may then be placed on this basis. The conductors may then be strung. In order to check that the required tension is being correctly applied the conductor computations are also provided on the hand-held field computer. This enables the engineer to determine how far the line should sag (taking into account the currently existing temperature conditions) for the tension applied.

If at some later stage it is required to update the ground profile to take account of any changes in the local geography since it was constructed, this may be quickly done using the same field survey system. The new survey may then be passed to the head office and overlaid over the original showing immediately any changes which have occurred. The effect of these changes are immediately revealed. Any resultant modifications may then be quickly determined and costed.

A further feature is that if at some stage a change is planned in the local geography (i.e., a new road is to be built or a local homeowner desires to build an extension) the effect of these changes may be determined prior to the actual construction taking place, and the proposed construction or the route of the line modified accordingly if this is significant.

For the continued maintenance of the line, a Line Patrol program has been written for the field computer which permits updated information resulting from a visual inspection to be gathered. This data is added to the data-base as soon as it is returned to the office. The relevant repairs or points for further inspection or survey may then not only be listed but their position may also be shown on an attached plot or plan saving substantial time at the repair stage.

Finally, it is possible at the time of a re-survey to check the tension of the line on the spot using the Sag & Tension module. The clearance between any observed point (either at ground level or at some other height, e.g., the top of a tree) may be checked without having to observe the line at all. A further benefit of this module is that where ground clearance is tight, the clearance may be checked not only for the currently prevailing weather conditions but also for worst case situations.

The PoleLine and TowerLine collection of programs running on an office computer give the overhead line engineer all the tools needed to design and maintain overhead lines under one environment. The system is sufficiently open to allow the completed design to be passed to other departments for their modifications to be incorporated.

The package runs under a host CAD environment and Poleline/Towerline data and drawings can be transferred amongst individuals with no conversion processes necessary and with no loss of information providing they have access to a computer running the same CAD package, irrespective of hardware.

This is a novel solution. There are current automated systems available to the overhead line engineer in certain specific tasks he has to perform, but the bulk of his existing workload is still manual drawings and manual calculations. Current methods are inaccurate and their scope limited. Current methods rely on a 2D profile scaled at 10:1 and thus proper 3D clearance checks often require the building of a scaled model. Poleline/Towerline is full 3D, full sized and hence exact measurements and design are possible.

Another advantage of using a CAD base is that the designer can annotate and tailor his drawing precisely, as well as being able to invoke other external processes to operate on his drawing.

The Towerline/Poleline programs preferably include four processes:

1. Ground Modeller

The ground modeller takes the survey data and produces a fully annotated 2D profile and/or 3D model. The appearance of each feature can be customized by the user. Surveys done at a later date can be appended to the model, for instance, to reflect a new road built.

2. Conductor Programs

This is the second stage of the design. Once the surveyed data has been modelled, the poles/towers are strung with conductor curves.

Should the survey be a "green field" survey, i.e., there are no existing poles/towers, or should the surveyor not have surveyed the towers and merely made a note of the tower actually there, it is first necessary to insert them.

The insert pole/tower facility is a powerful tool. All known poles/towers are stored in a symbol/cell library and can be retrieved as required. The degree of detail is determined by the user who customizes these libraries. For instance, if the engineer is merely interested in the attachment points, the tower would be simply a T shape to connect the conductors thereto. The wayleaves or easements offices would use a full 3D image to demonstrate to grantors (landowners) that the design is aesthetic.

There are several programs of the present invention provided to produce conductor curves. There is a database which can be customized by a user, containing all the current and historic conductors and for each conductor are stored the relevant physical constants: weight, weight when buffeted by the elements, Young's modulus, surface area, diameter, coefficient of thermal expansion, maximum tension allowed and the relevant temperature, the places where aeolian vibration is dangerous and the necessary counterbalances.

These values are essentially permanently fixed by the user. Every time a conductor is drawn, the user has to specify the temperature the conductor will be at in order to calculate the corresponding sag (i.e., on a cold day it will not sag as much as on a hot day). The user also specifies the scale he is using.

Traditionally, designers have used an exaggerated scale in order to fit the drawing onto a manageable sheet of paper. In some instances, he may specify the basic span. This quantity is a preset value that guarantees that the resultant tension in the conductor will not be excessive.

Another program matches one conductor to another. That is, should an existing line have been strung with conductor A and the designers want to replace it with conductor B (typically for sending more voltage down), they want to make sure the sag is the same so that the heavier conductor B will not violate the safety limits guaranteed by the previous conductor.

Another program produces templates. These can be plotted on acetate and used by draftsmen on the existing manual drawings. The ability to draw these templates at any size and scale (by altering the span and temperature) is a novel feature of the present invention. In the past, the high cost of laboriously calculating the ordinates, drawing them and cutting them out has meant that draftsmen had a limited set and used the nearest template available. Thus, precise curves are now feasible.

Two other programs are downleads for drawing the conductors as they come down from a tower to the substation and jumpers, the short pieces of conductor connecting sections of lines connected to different insulator sets. Traditionally these processes could only be designed using scaled physical models.

Where the conductor programs are different and unique from existing programs is that the full catenary equations are used in their construction. Displaying them graphically is also novel. In the past, people have been content to print out ordinates at fixed points along the curve. The ability to draw them swung out at any angle is new.

The interaction with the CAD system allows accurate measurement and dimensioning of critical clearances and rapid redesign should these clearances infringe legal obligations.

3. Pole/Tower Analysis

There is provided in the present invention a set of analysis packages to check the design of the overhead line. The checking done for the conductor programs is to check the interaction of the conductors with surrounding features. These analysis programs check that the resultant design does not infringe safety rules for the operating parameters of the equipment. For instance, on a cold day when the sag is reduced, the tension in the wire increases. Regulations decree the maximum loadings any particular piece of equipment can tolerate.

Each electricity company usually has computer programs to implement industrial standards. A superior feature of the present invention is that the design checks are done automatically on the CAD drawing, rather than at present having to type into a computer program all the details laboriously arrived at on the drawing board. In fact, some electricity companies have different interpretations of the regulations, i.e., the regulations say that stays should come out at 45 degrees. This is acceptable in rural areas, but in semi-rural/urban areas, land usage is at such a premium that this is impracticable. Hence, the implementations of these regulations are customized for each electricity company.

4. Scheduler

The final stage of the design is the building of the powerline. After checking the clearance and engineering details, the designer will need to know what components are needed to implement his design. He may even iterate again to find another design satisfying all the constraints but being cheaper to build using smaller and fewer poles and towers.

Furthermore, store requisition notices have to be issued telling the stores what components are required, where and when to deliver them. The scheduler does all this.

Every electricity company has a system to do this. They are all different and the format of the information they require is also different. The system according to the invention may be readily tailored to adapt to the particular needs of different electricity companies.

Most companies work as follows: the designer would write down a list of the towers/poles he has used in his design as well as their location and the conductors used. This would be given to a secretary to type into a mainframe computer program which would start the relevant machinery rolling. In the first instance, a program can be modified to produce the relevant input required by the mainframe and put it on a medium readable by it.

Further to this is the information required by the builders. When the engineer has designed his plan, he has decided what the sag/tension should be in the conductor at the critical temperatures (freezing to check that maximum likely tensions will not snap the wire or pull over the tower/pole, and very hot to check the maximum likely sags will not interfere with ground objects). Unfortunately, when the builders put up the conductor, the temperature will be about room temperature. Thus, the program has the ability to inquire of the design what the corresponding tension and sag will be at the temperature of the day so that the builders can tension the wire accordingly. The necessary engineering form is printed out giving the relevant details.

BRIEF DESCRIPTION OF THE DRAWINGS

Other features of the invention will become apparent in relation to the figures, in which;

FIG. 21 is an isometric projection of a sample powerline survey produced by a CAD system;

FIGS. 22A–I(II) is a schematic overview depicting the powerline survey, design and maintenance system in its entirety;

FIGS. 24A–B shows a sample section of line with the conductor strung;

FIGS. 26(I)–(II) is an overview flow chart of the integrated line patrol program;

DETAILED DESCRIPTION OF THE PREFERRED EMBODIMENTS

Figure 1:
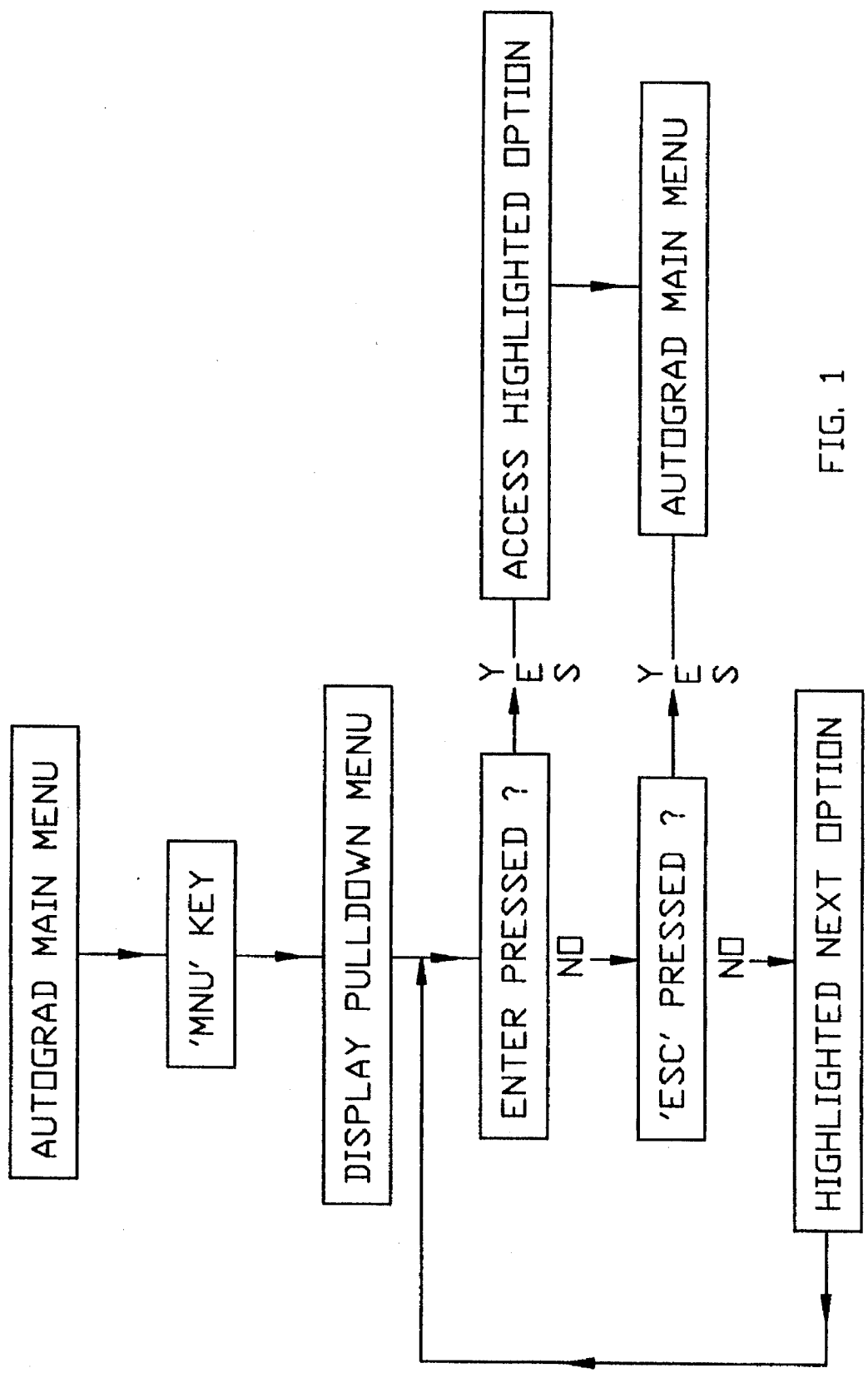
FIG. 1 is the Autograd Pull-down menu.
Figure 2A:
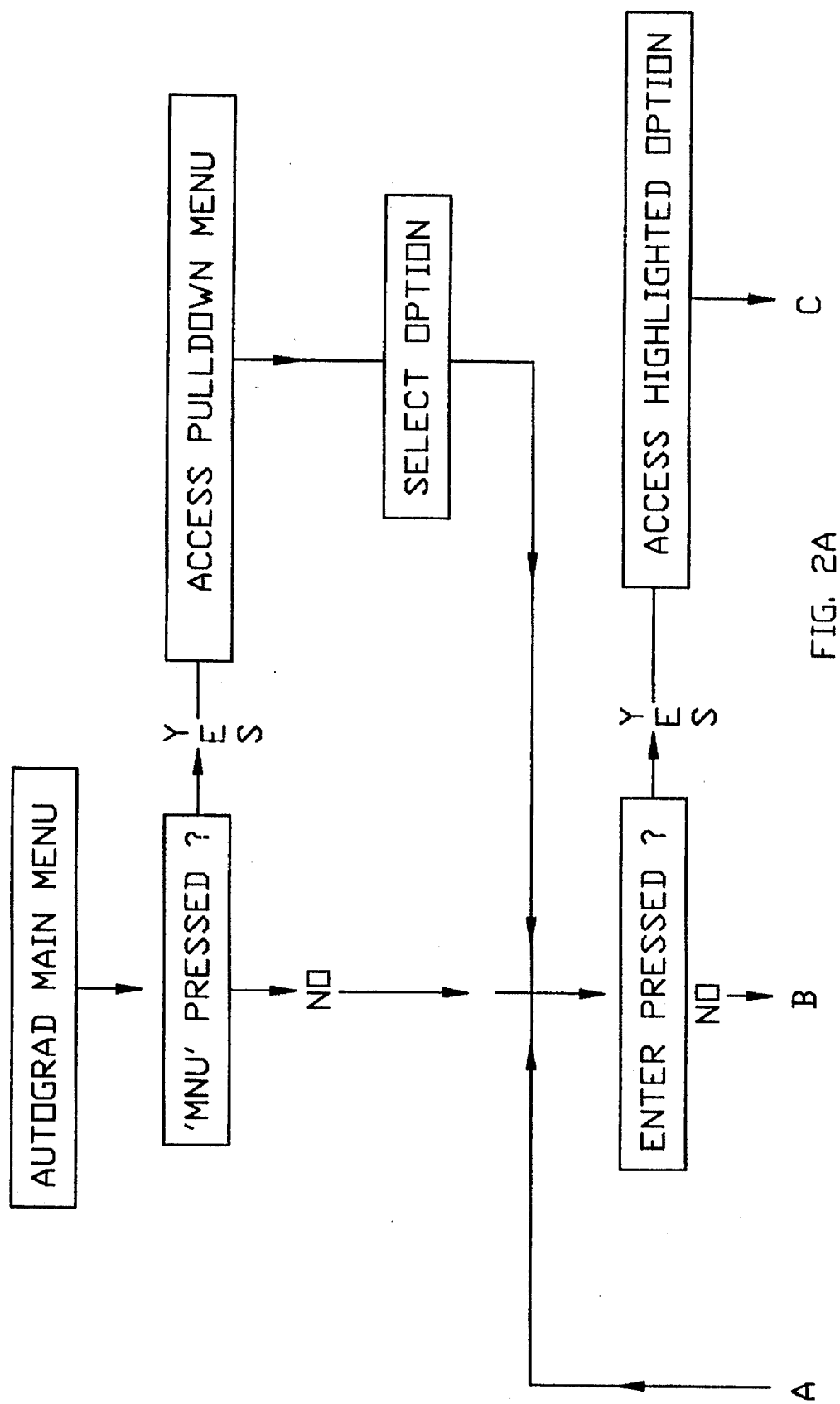
FIGS. 2A–B is the Autograd Main menu.
Figure 3A:
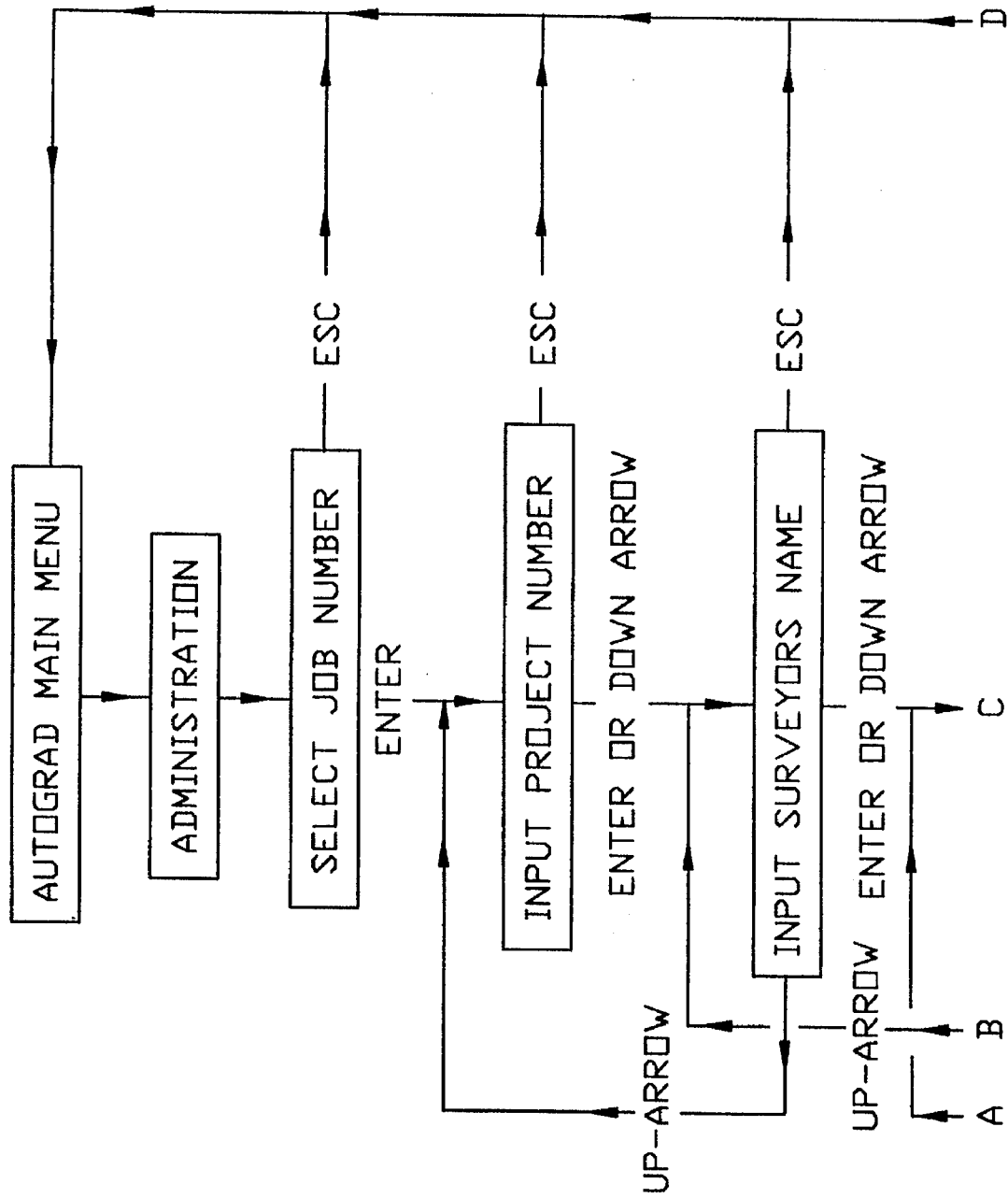
FIGS. 3A–B is the Autograd administration flow chart.
Figure 3B:
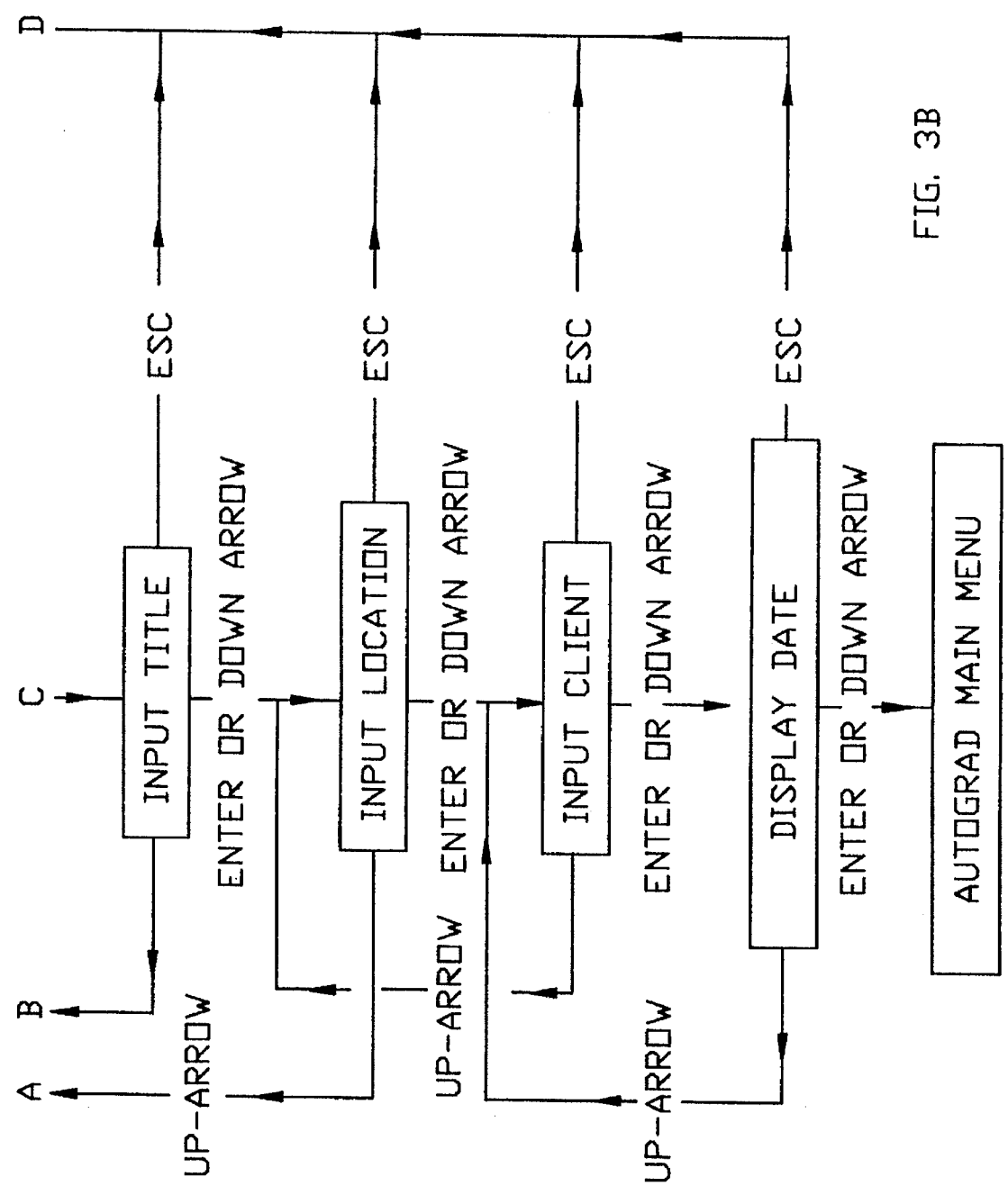
Figure 4B:
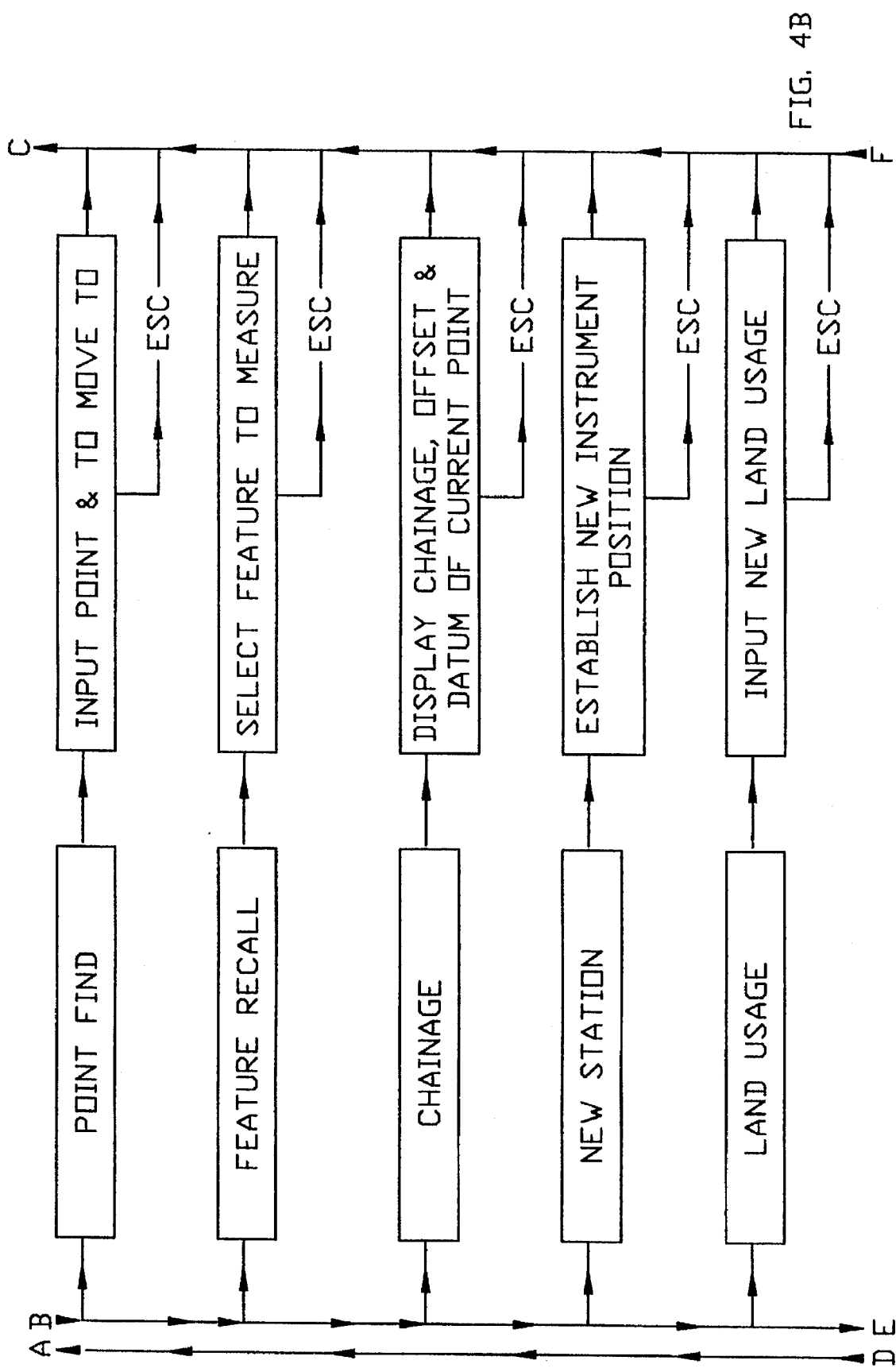
FIGS. 4A–D is a general overview of the geo-processing program.
Figure 4C:
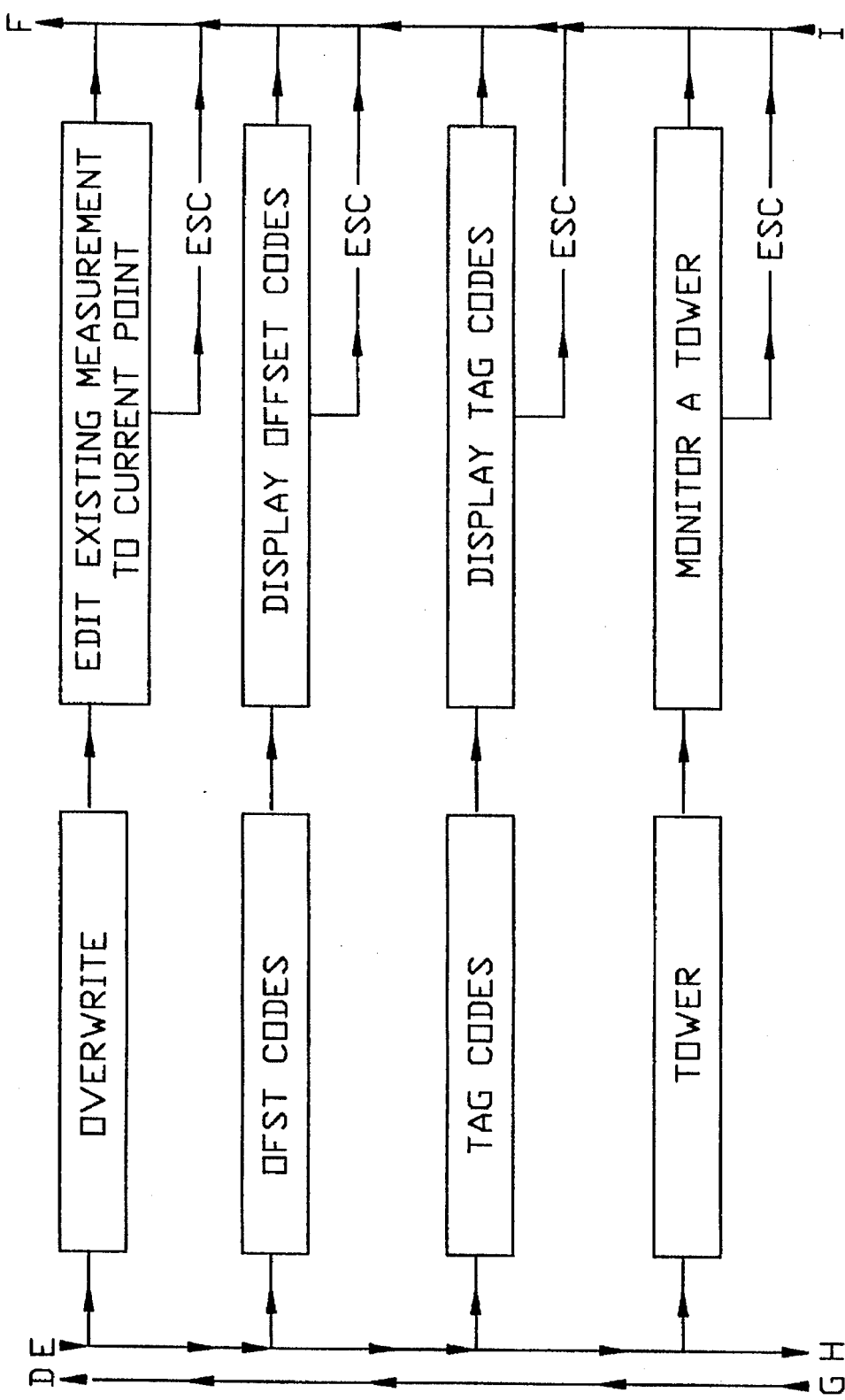
Figure 5A:
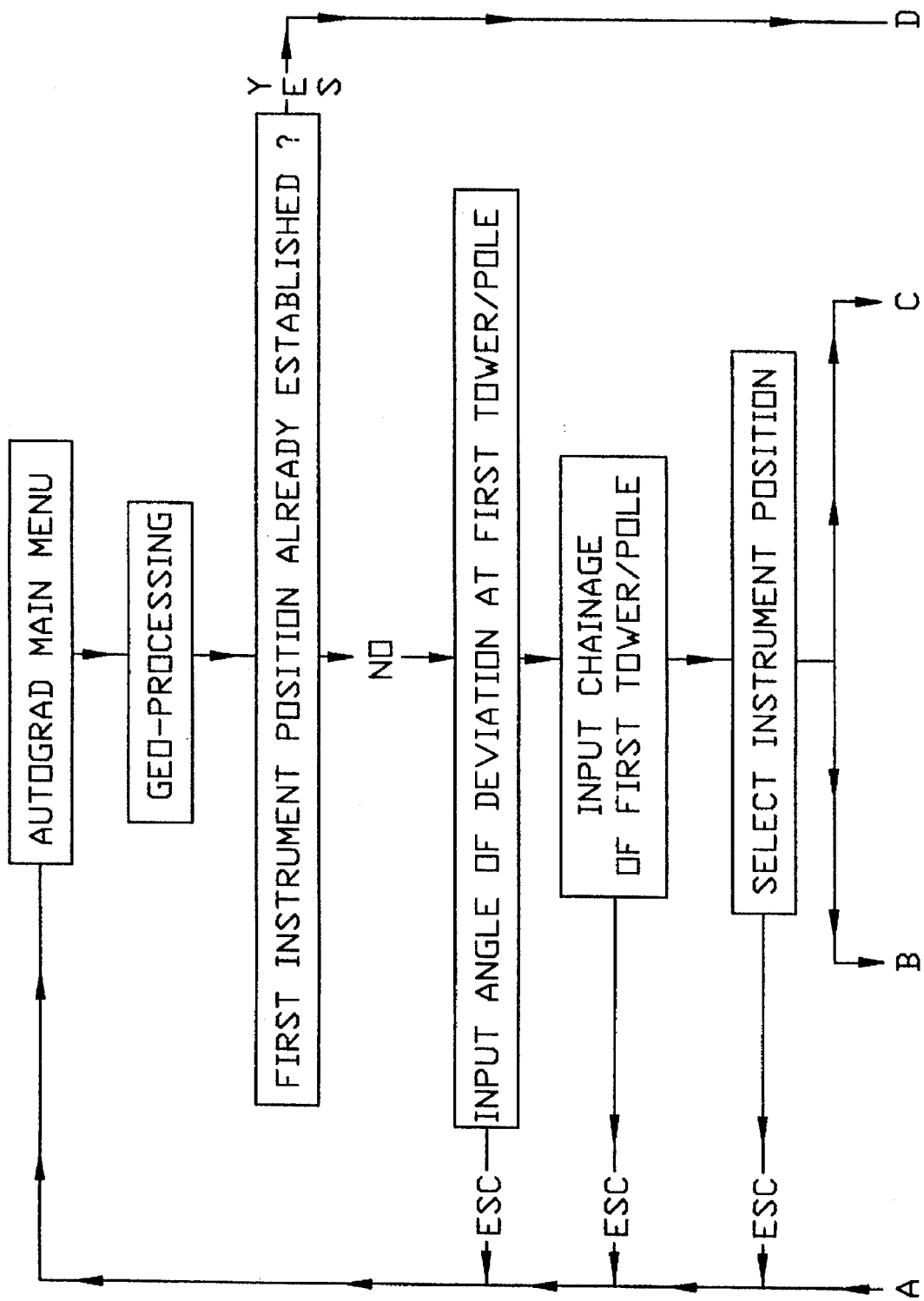
FIGS. 5A–D is the flow chart for the program for establishing an initial instrument position.
Figure 5B:
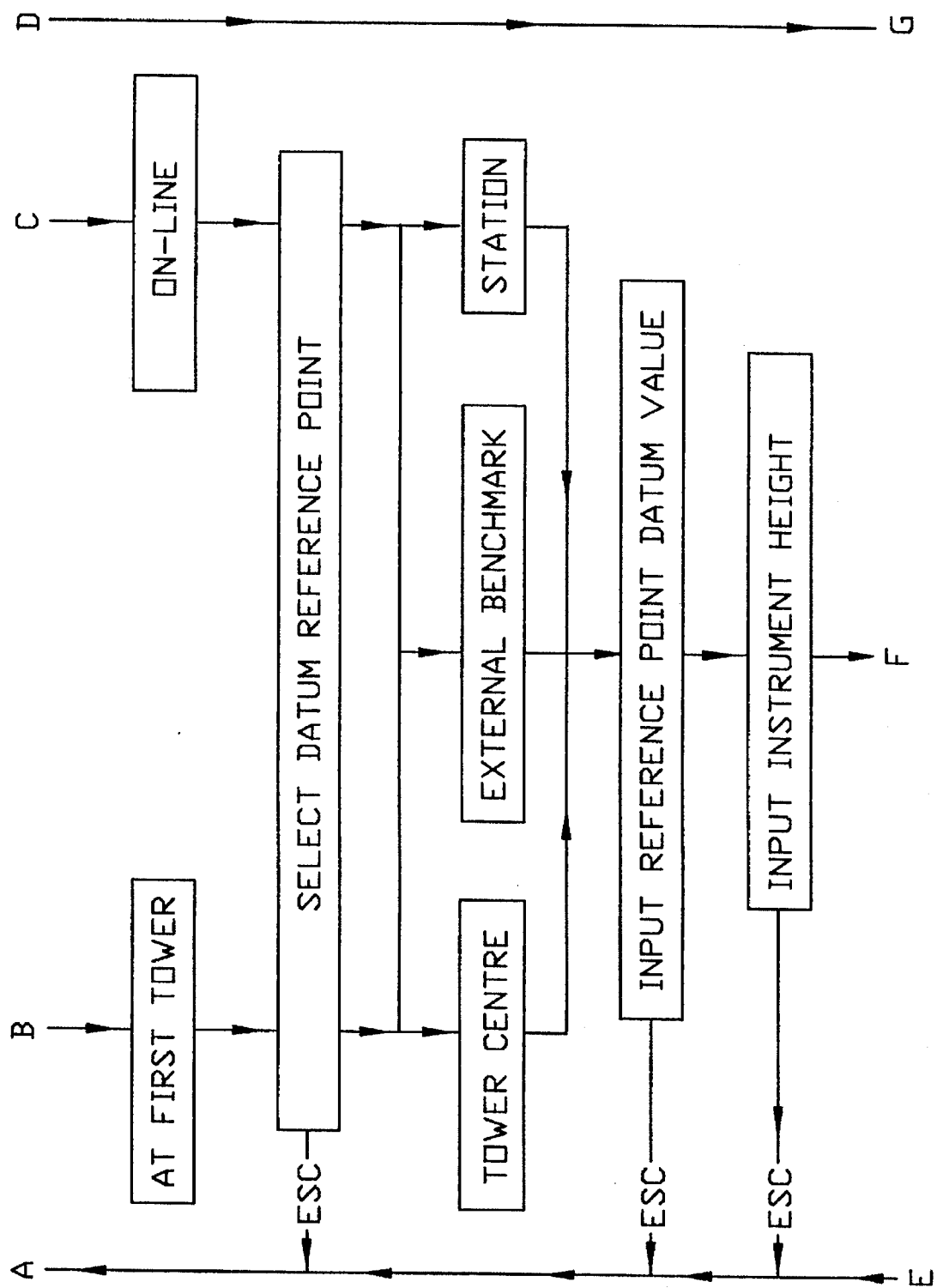
Figure 5D:
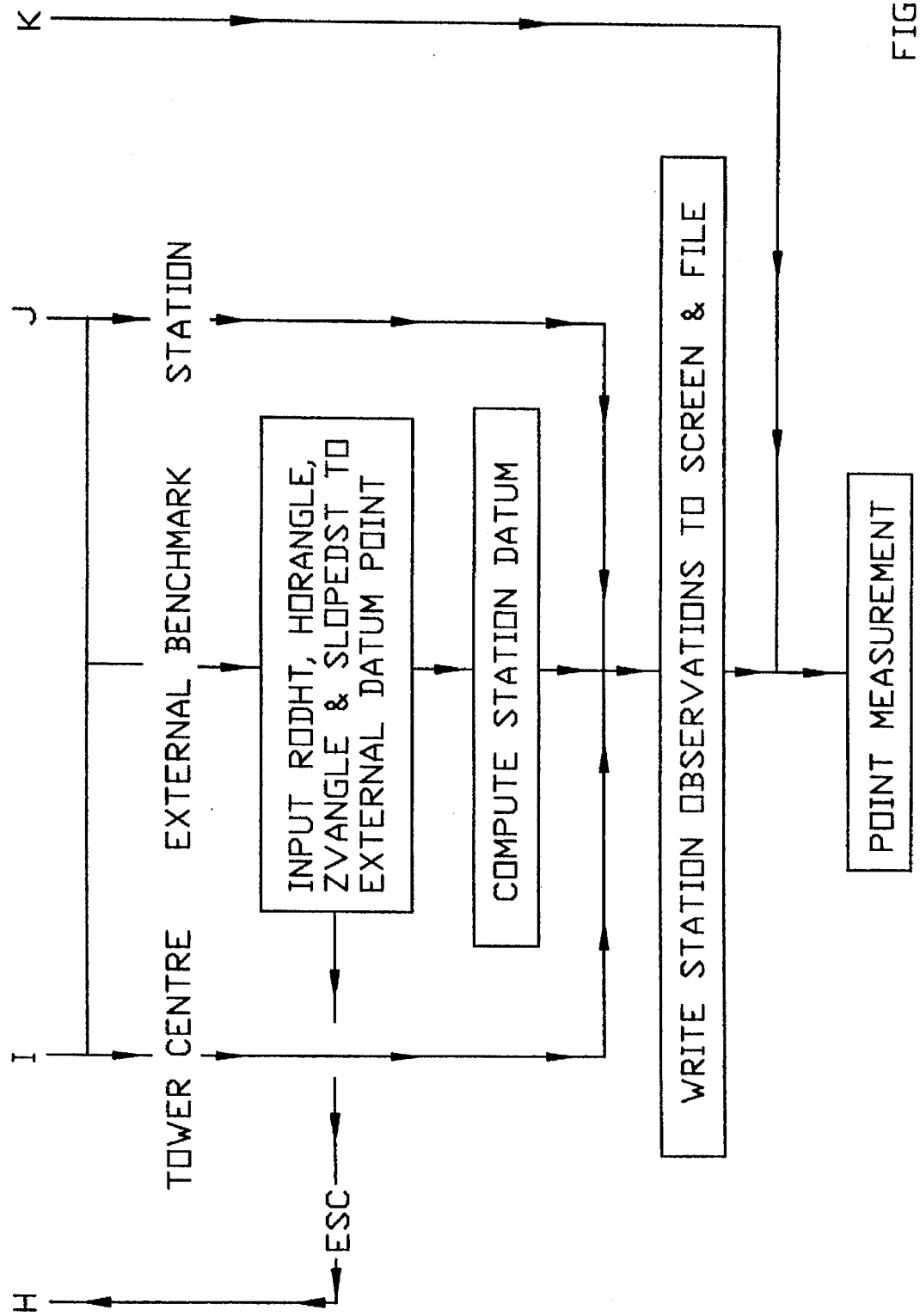
Figures 1, 6A:
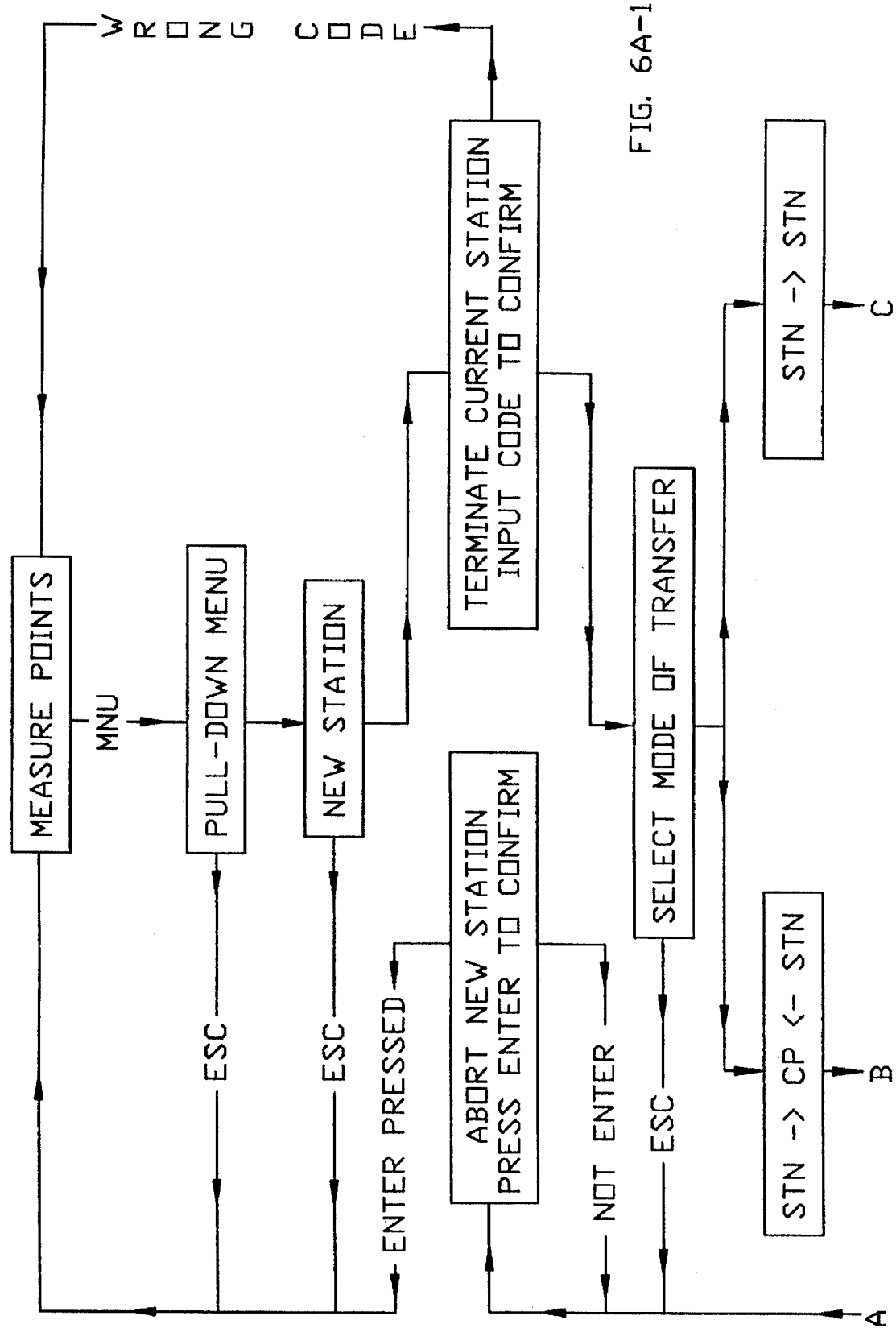
FIGS. 6A(I)–C is the flow chart for the program for establishing subsequent instrument positions.
Figures 2, 6A:
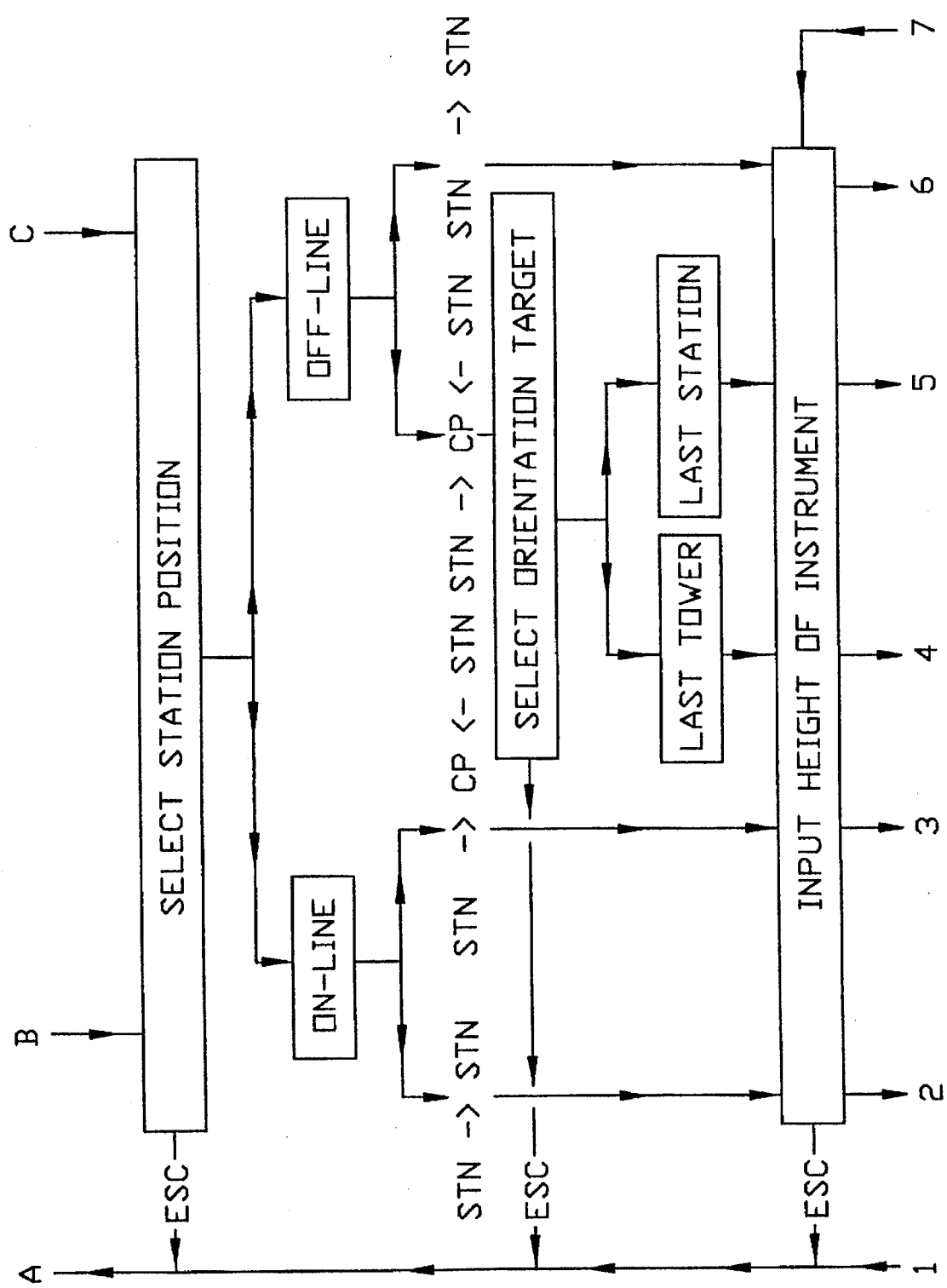
Figures 1, 6B:
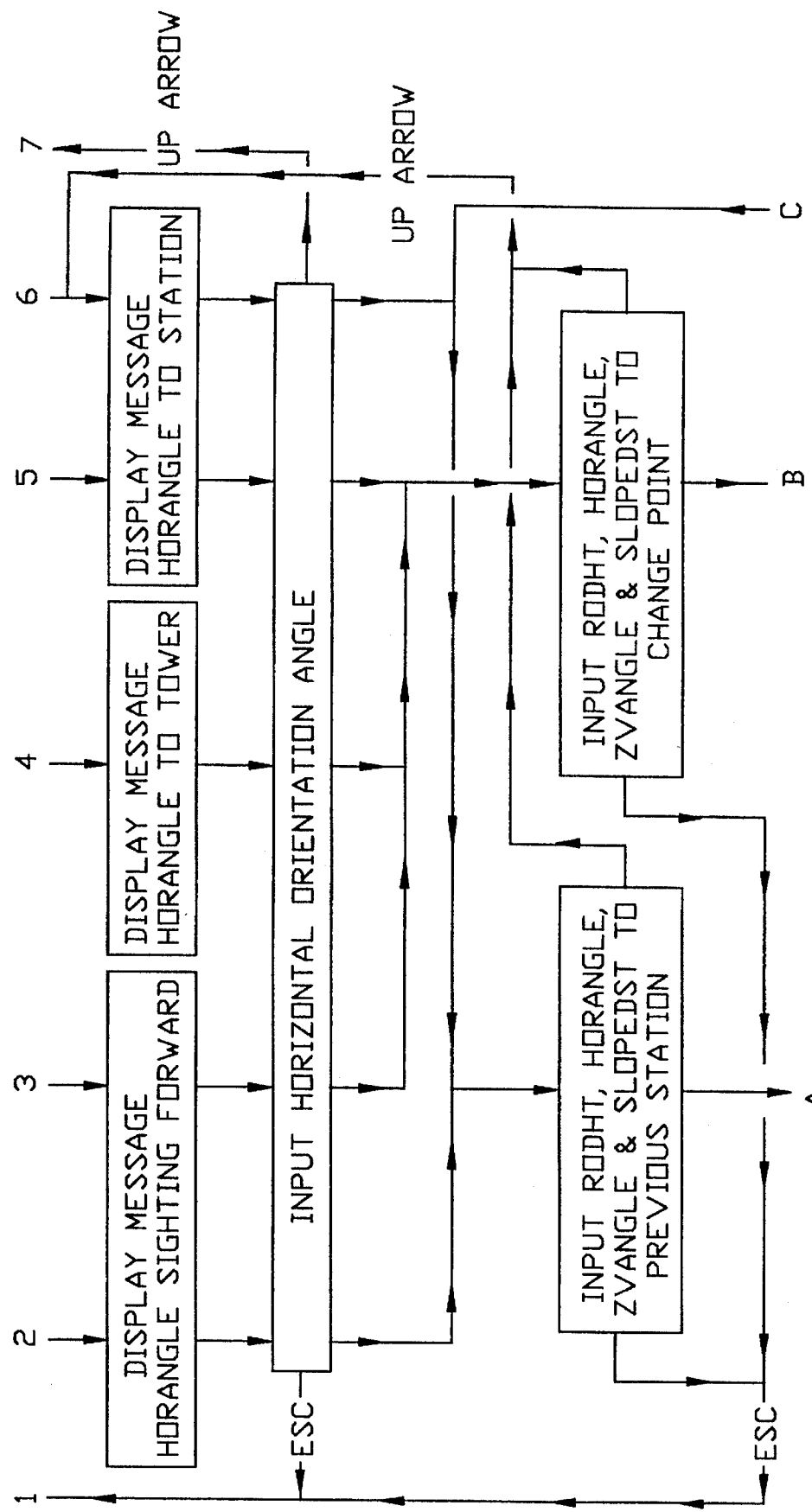
Figures 2, 6B:
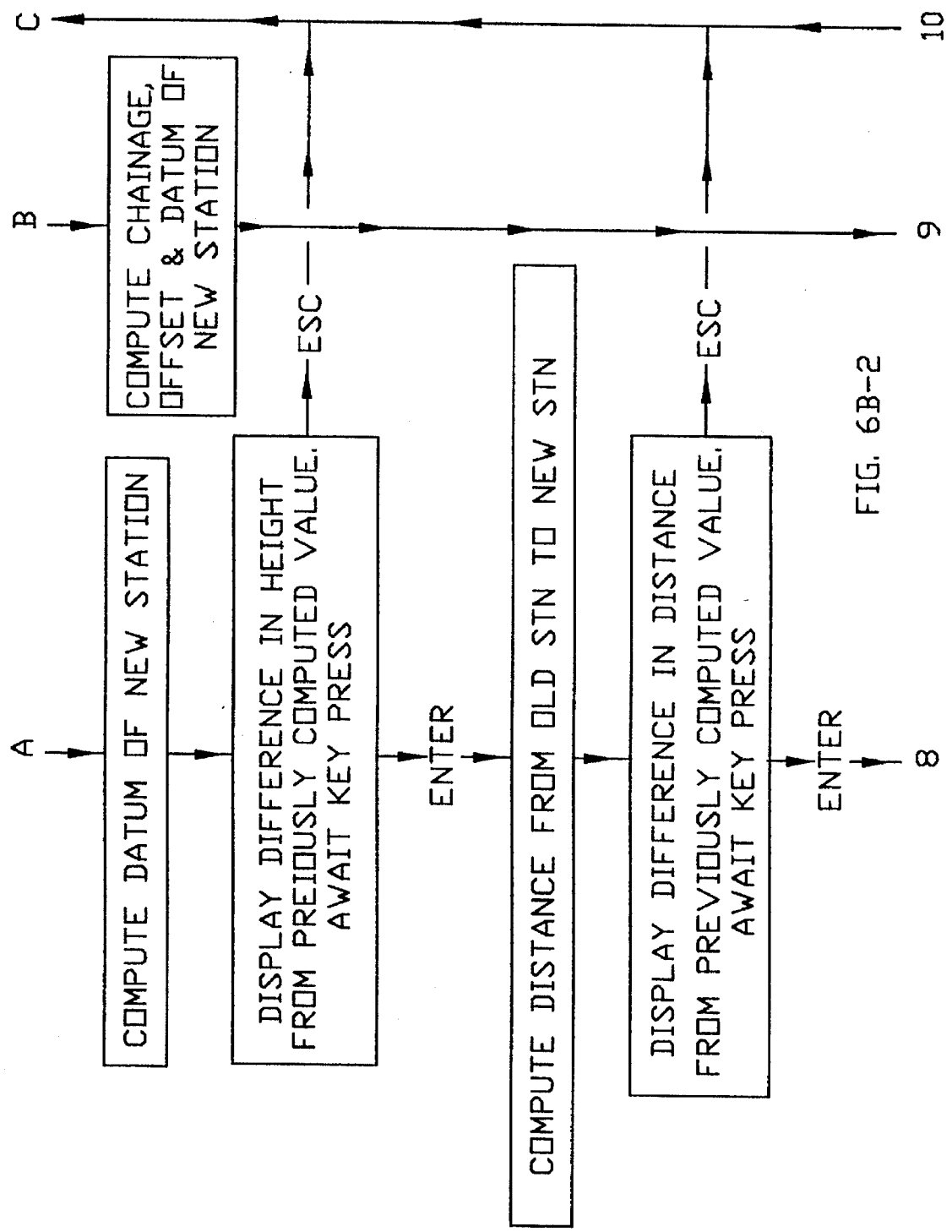
Figures 1, 7B:
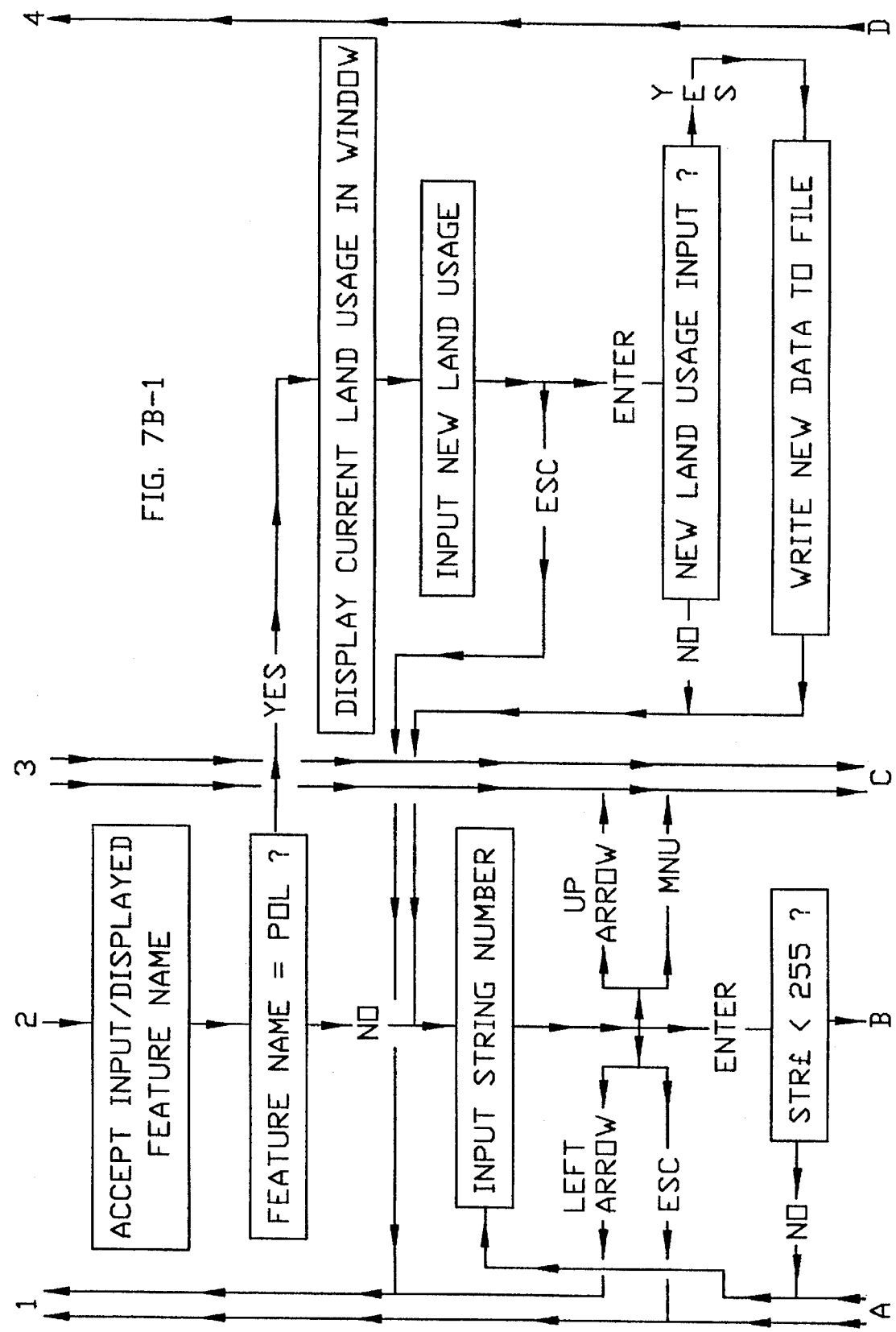
Figures 2, 7B:
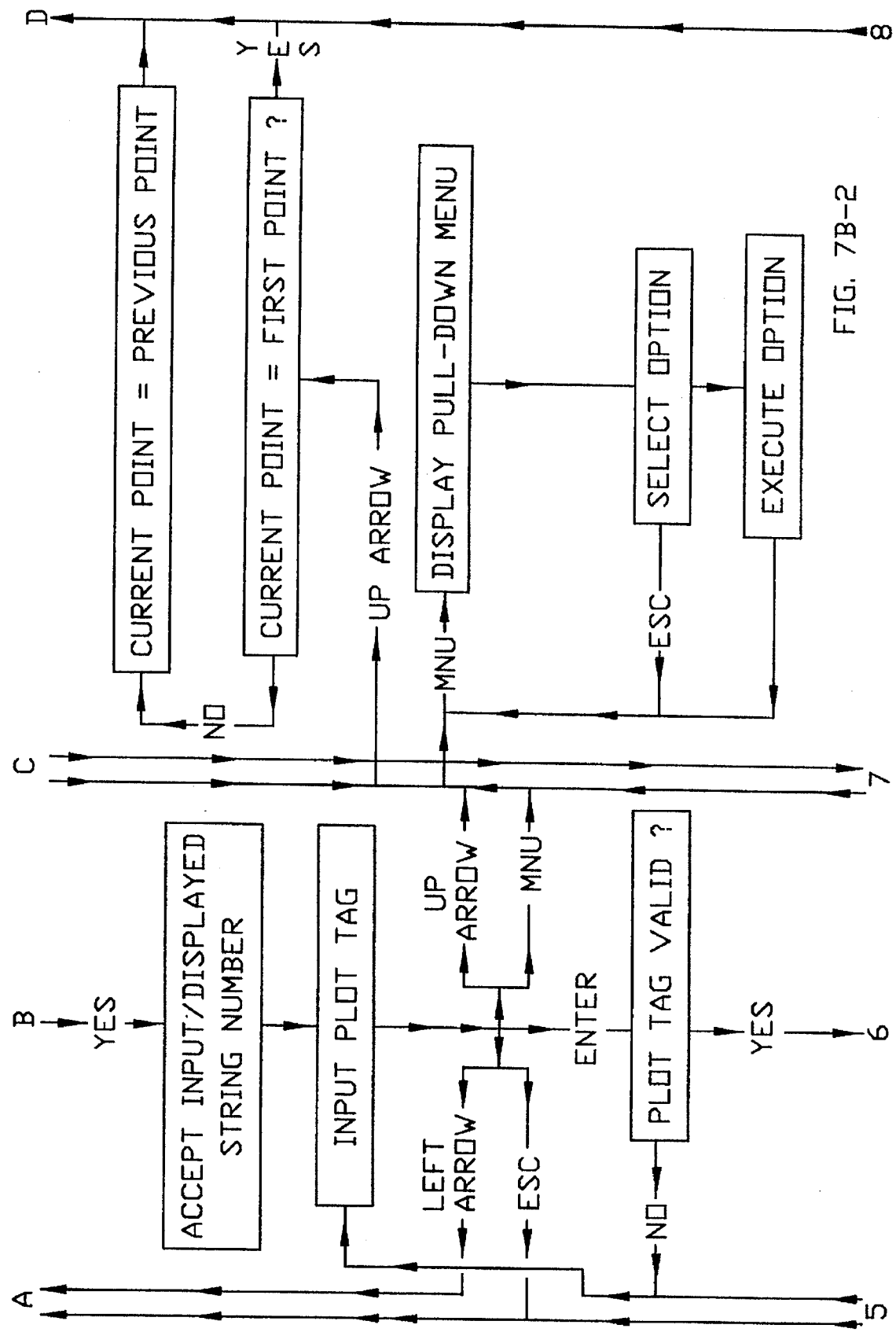
FIGS. 7A(I)–F(II) is the flow chart of the program for the measurement of a point.
Figures 1, 7C:
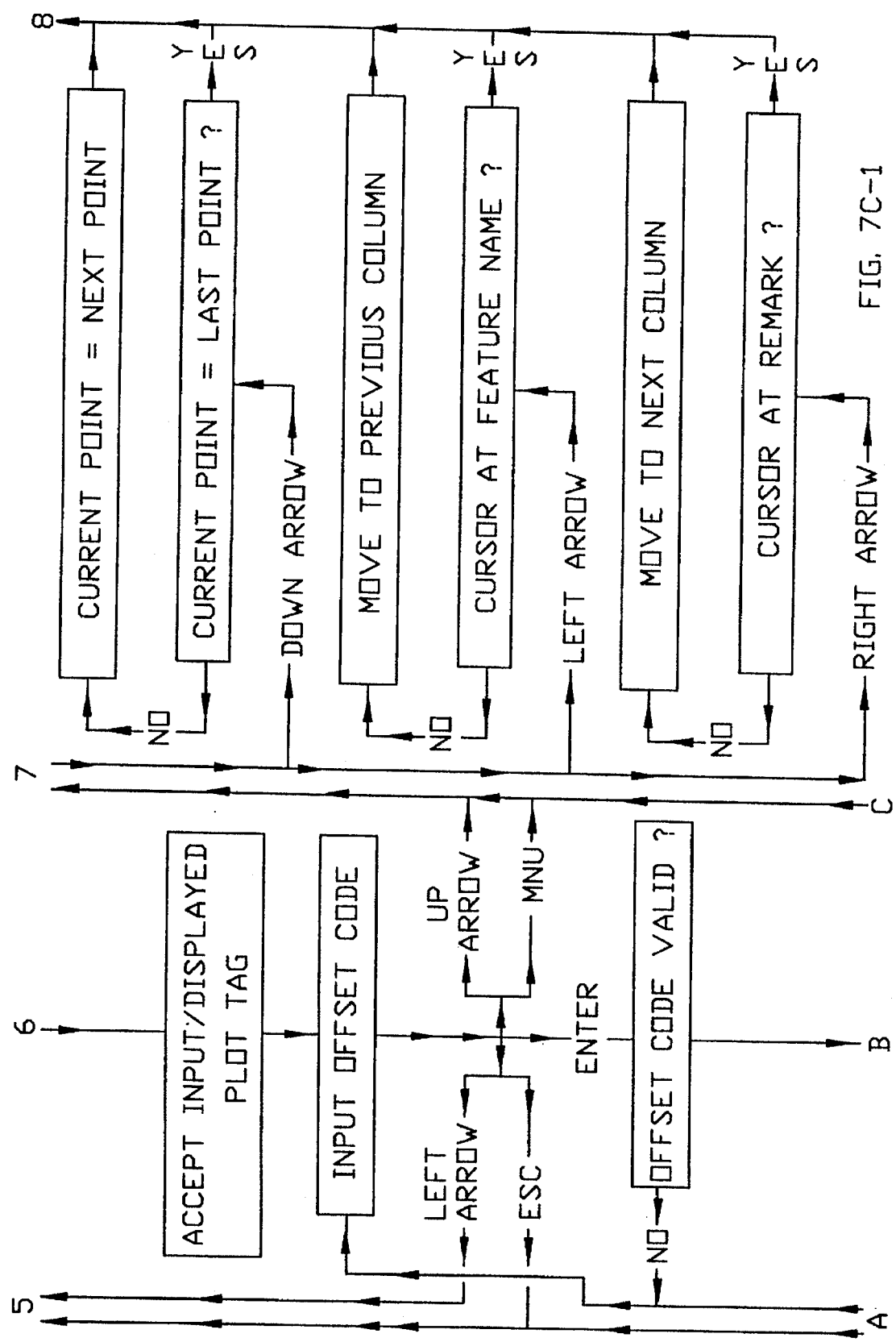
Figures 2, 7C:
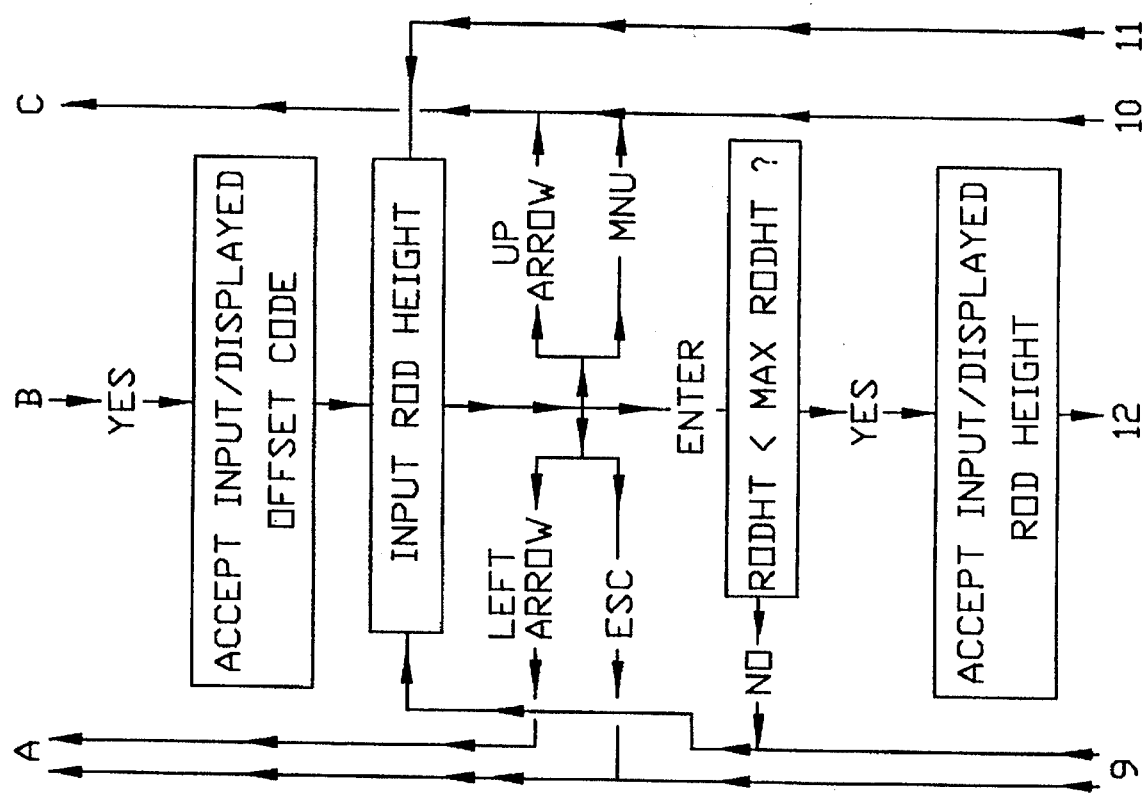
Figures 1, 7D:
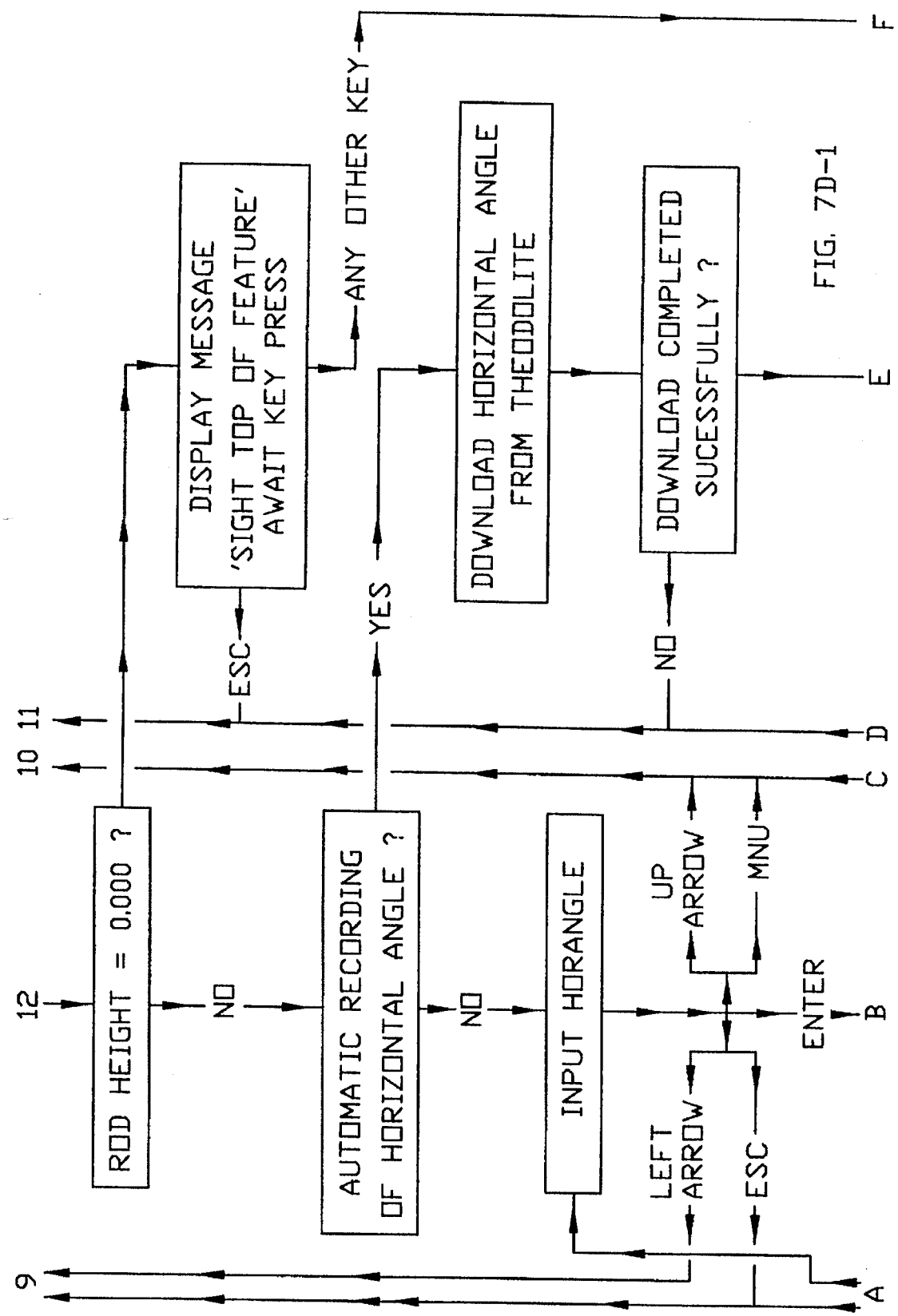
Figures 2, 7D:
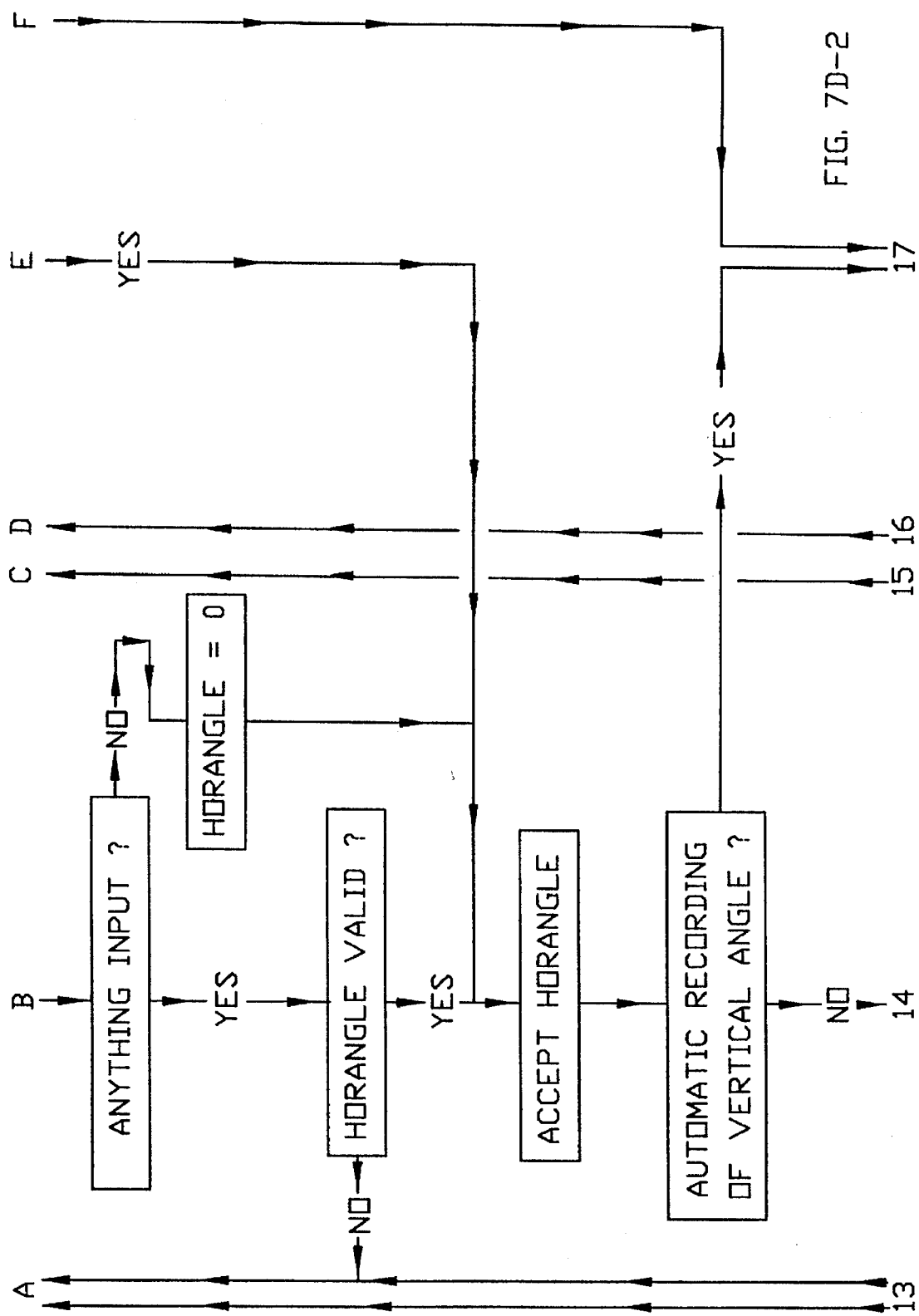
Figures 1, 7E:
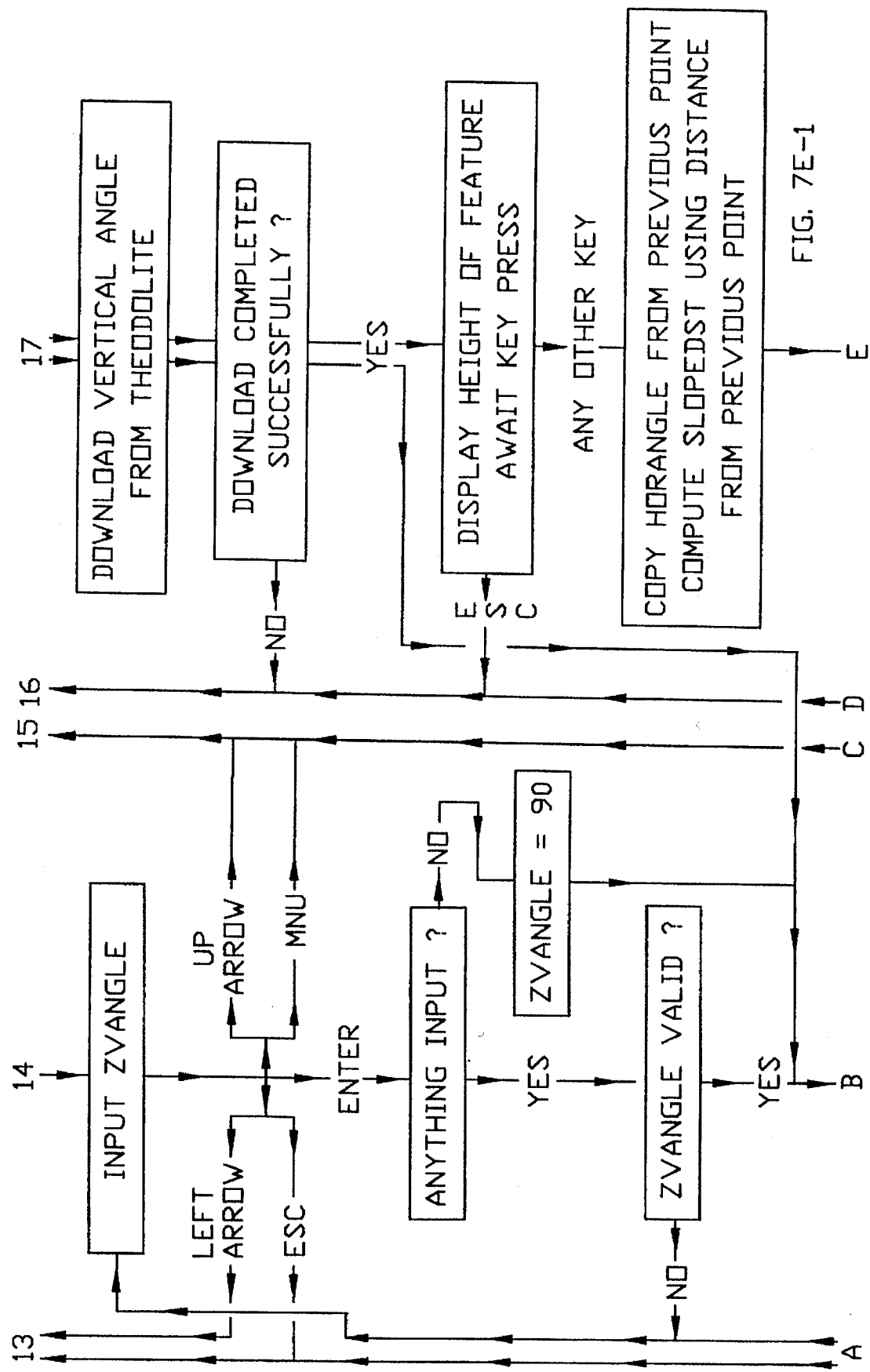
Figures 2, 7F:
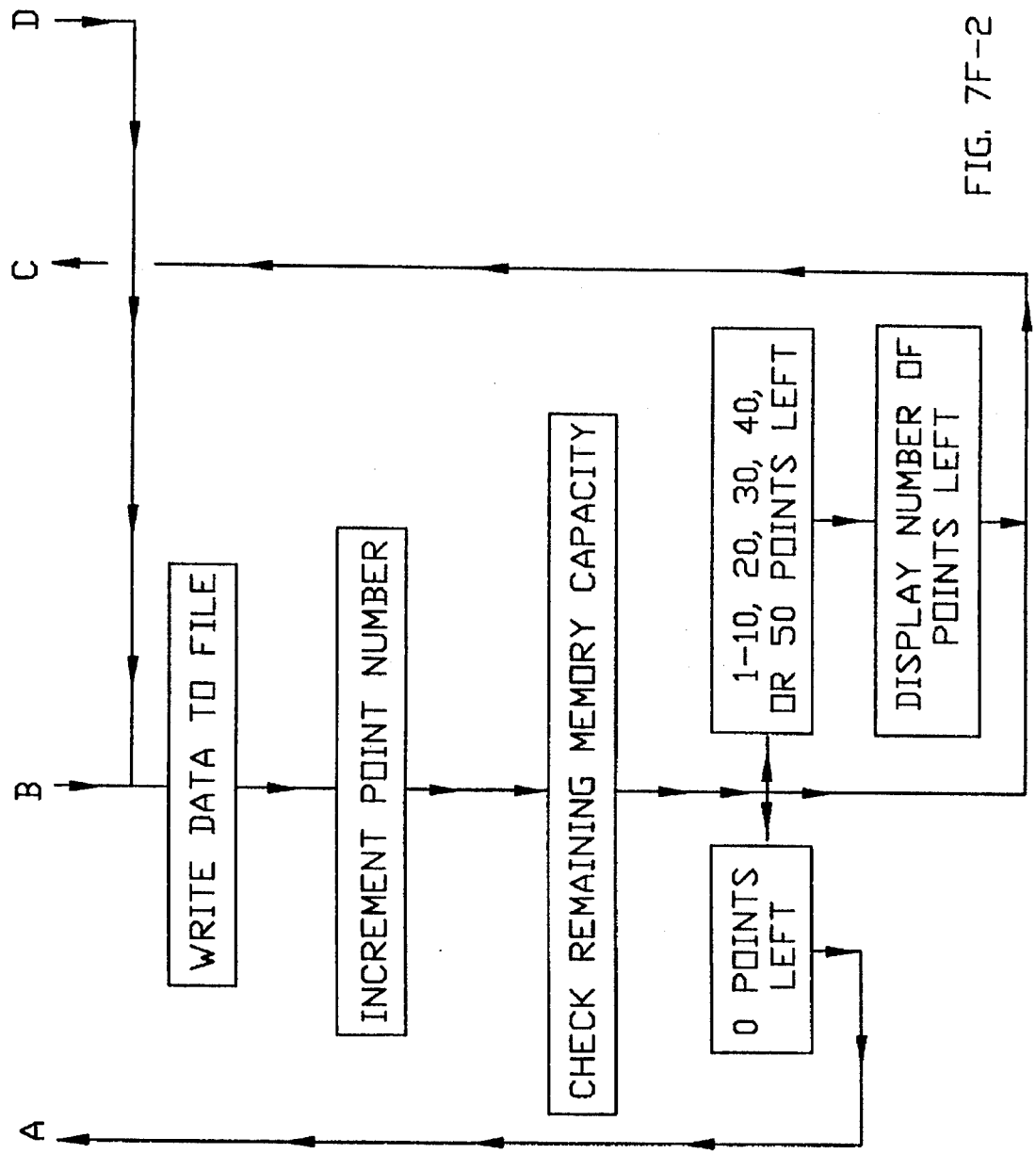
Figures 1, 8A:
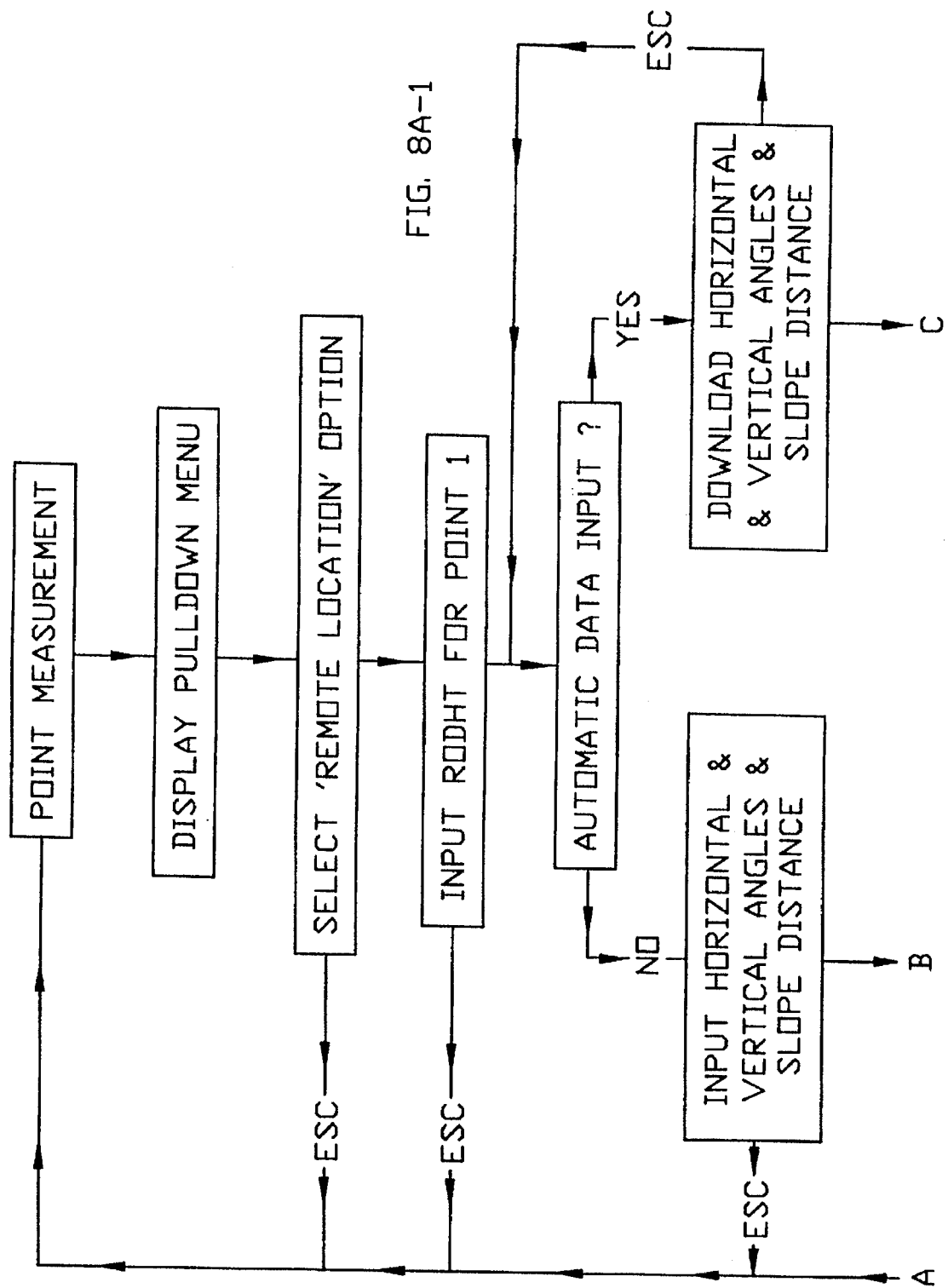
FIGS. 8A(I)–B(II) is the flow chart for measuring inaccessible points.
Figures 2, 8A:
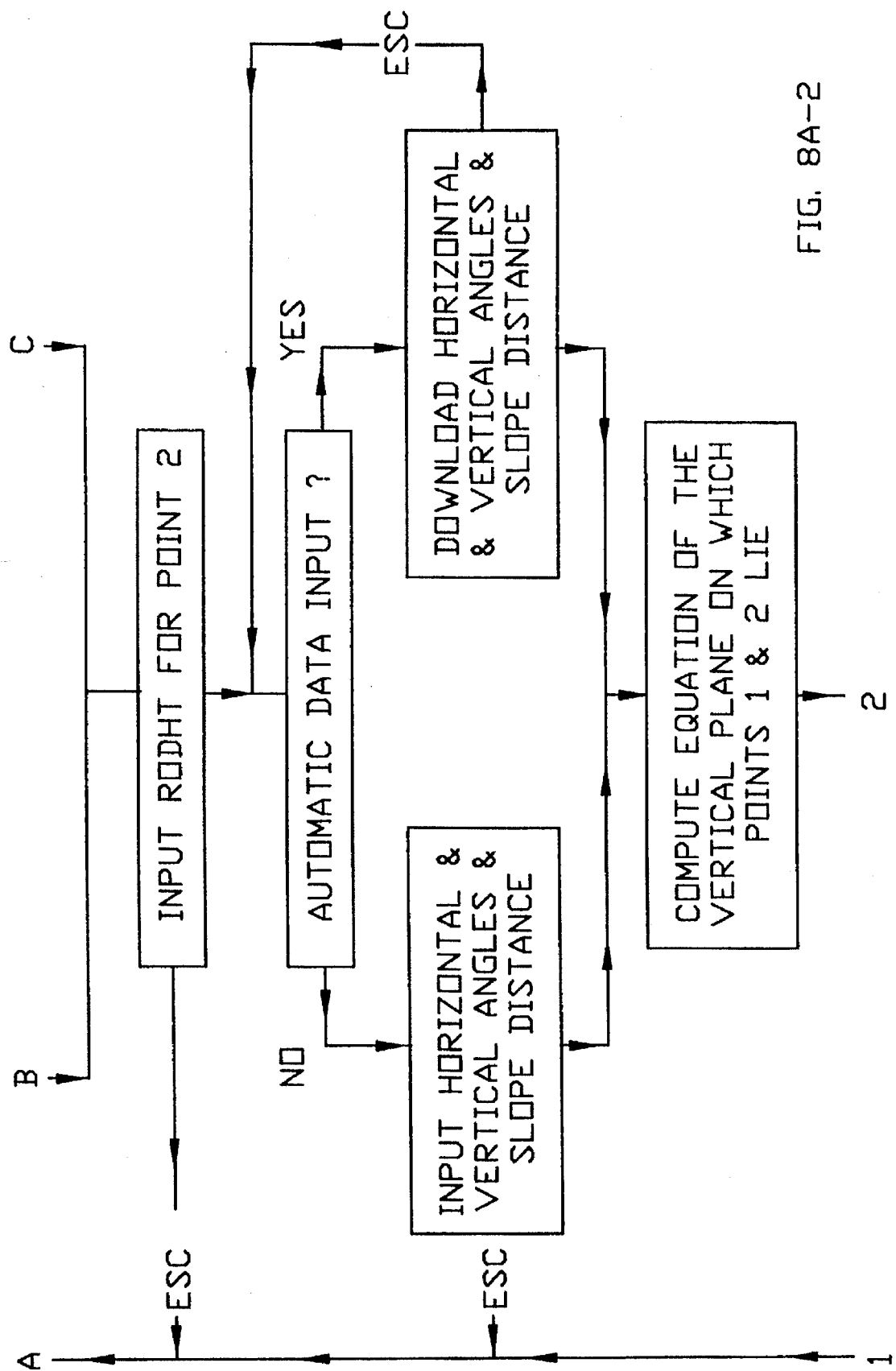
Figures 1, 8B:
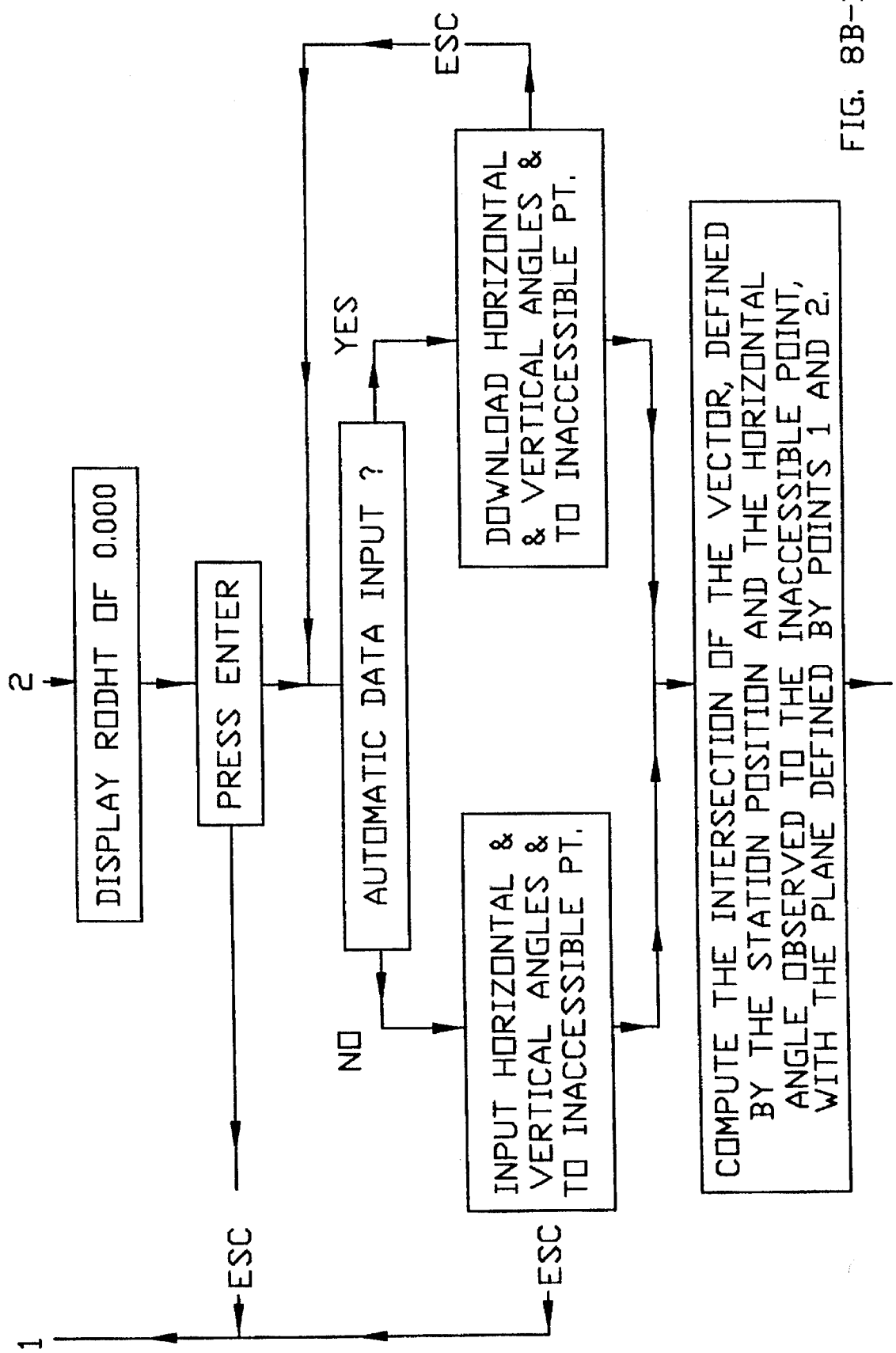
Figures 2, 8B:
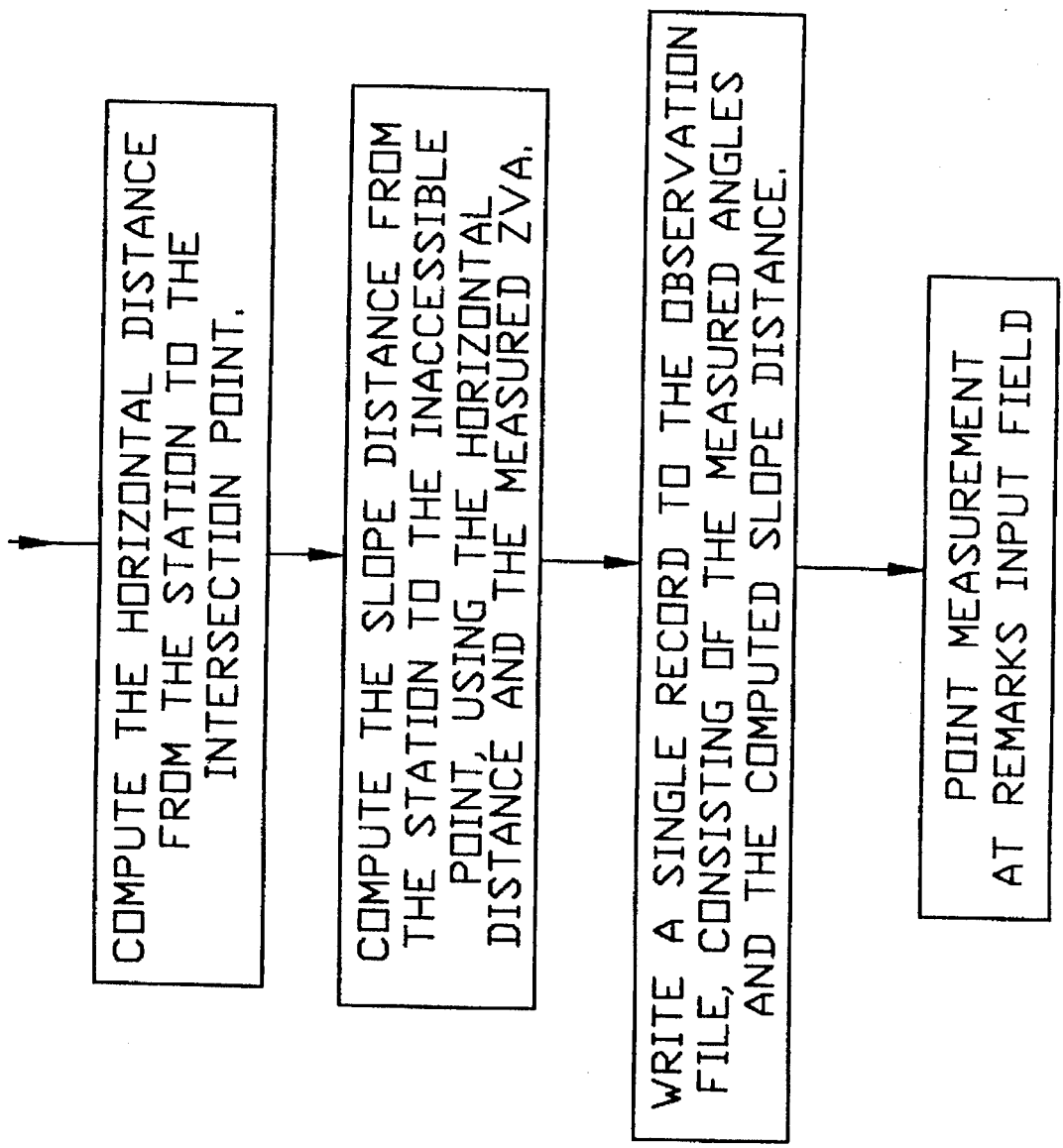
Figure 9A:
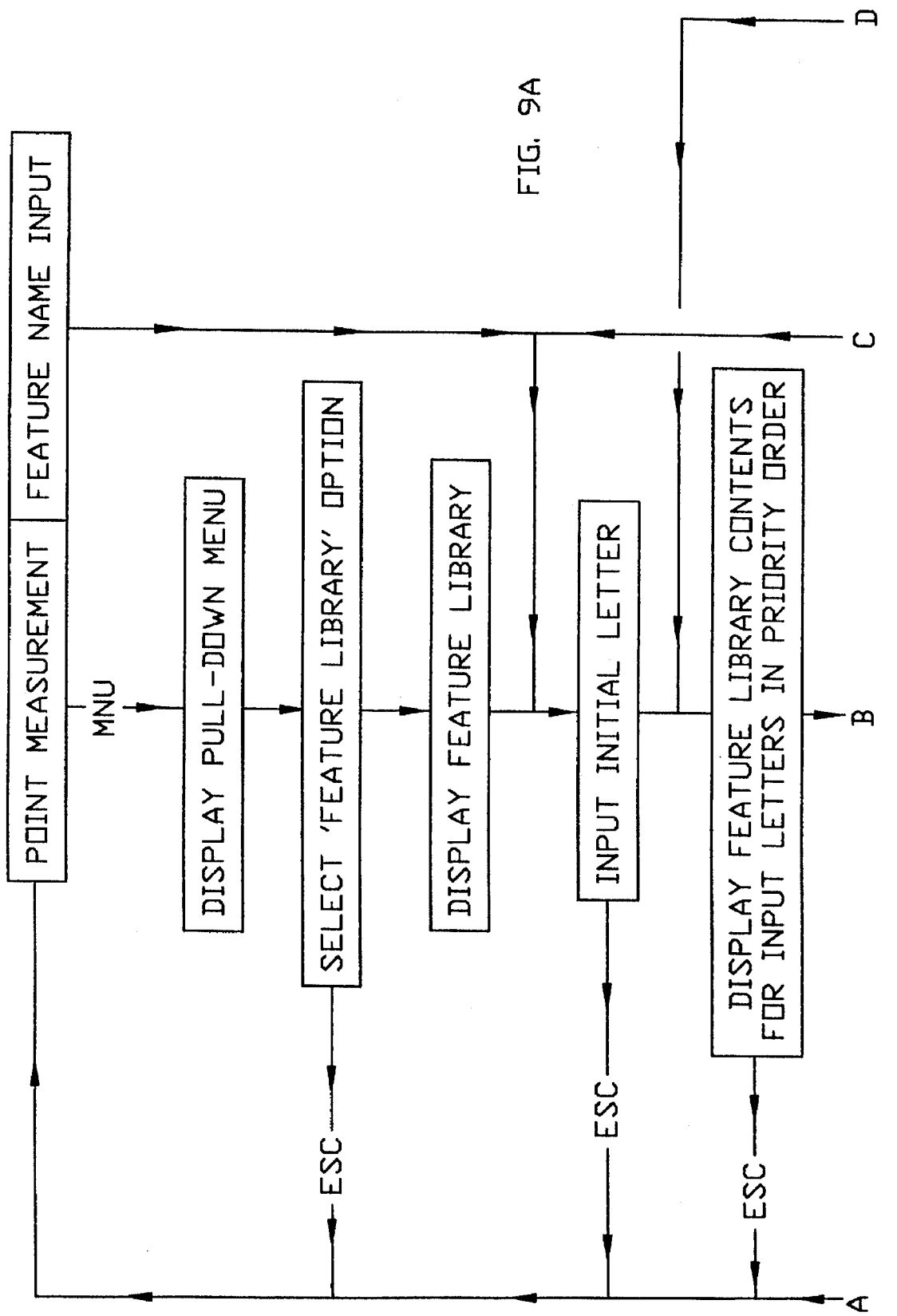
FIGS. 9A–B is the feature library selection flow chart.
Figure 9B:
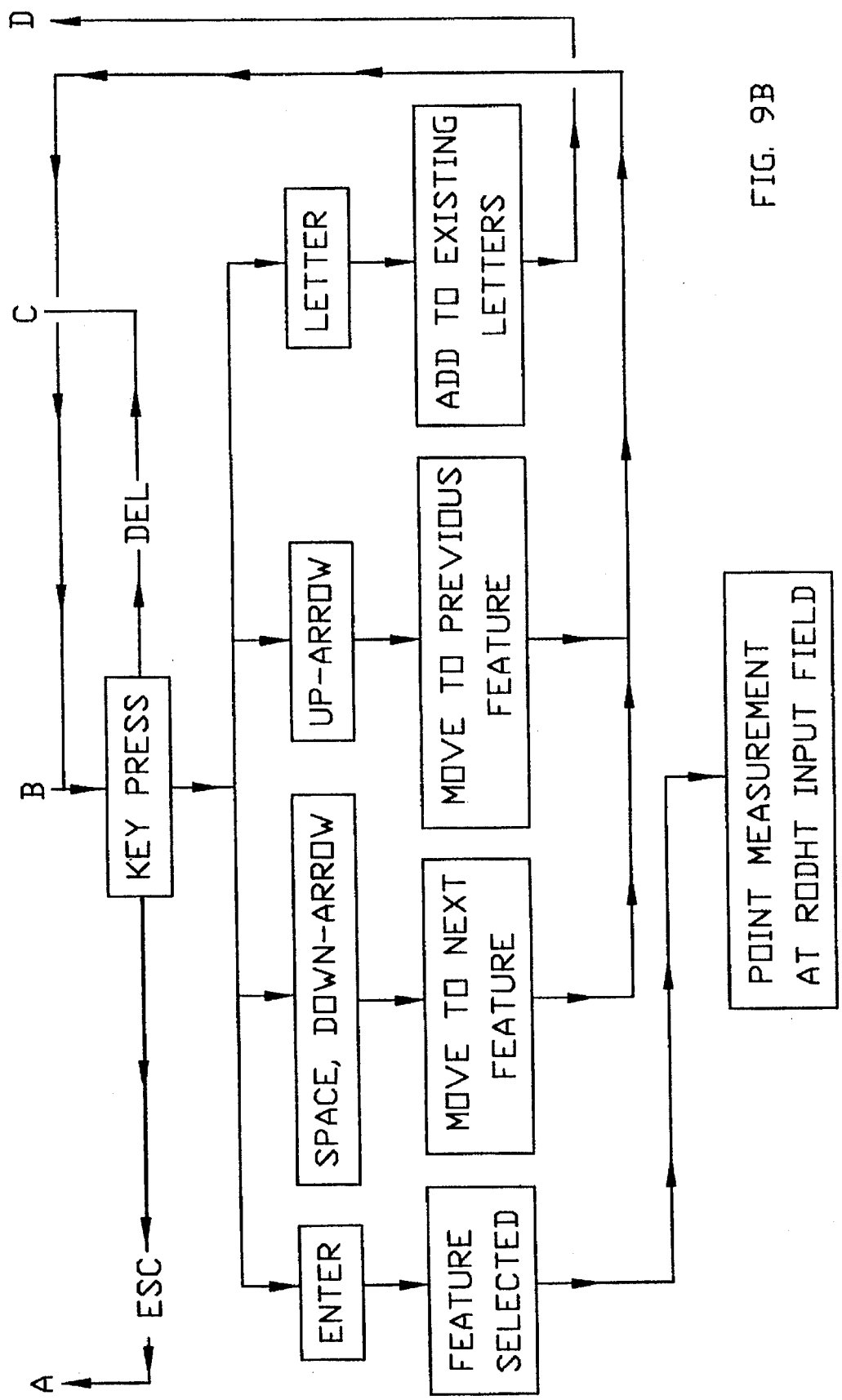

FIG. 1 shows the program module for selecting a pull-down menu option in the Autograd master program. As shown in FIG. 2, upon selection, the standard Autograd menu is displayed, giving four options, i.e., administration (FIG. 3), geo-processing (FIG. 4), input/output (FIG. 15) and file management (FIG. 16).

Figures 1, 27A:
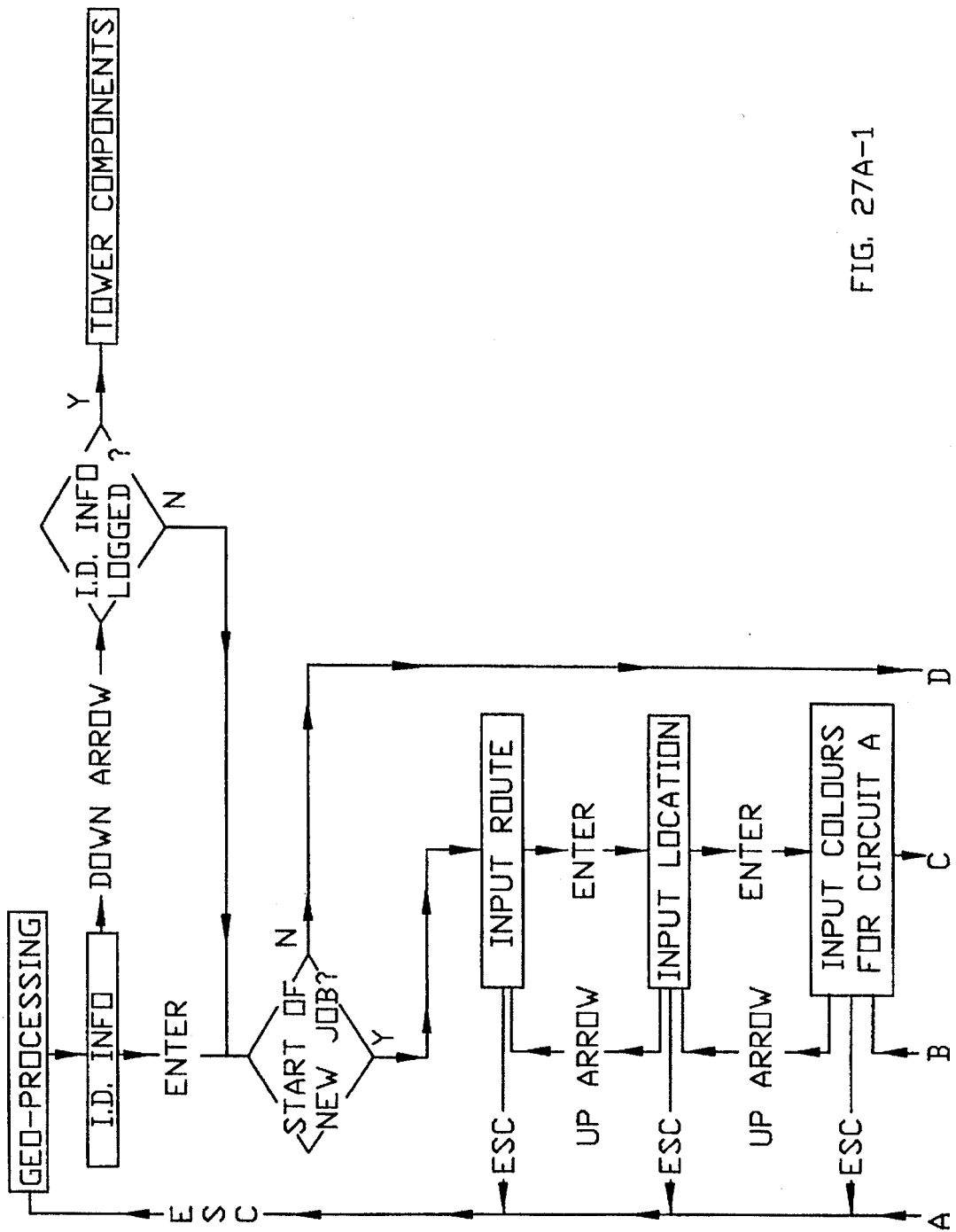
FIGS. 27A(I)–E(E) is a flow chart showing the integrated line patrol program in detail.
Figures 2, 27A:
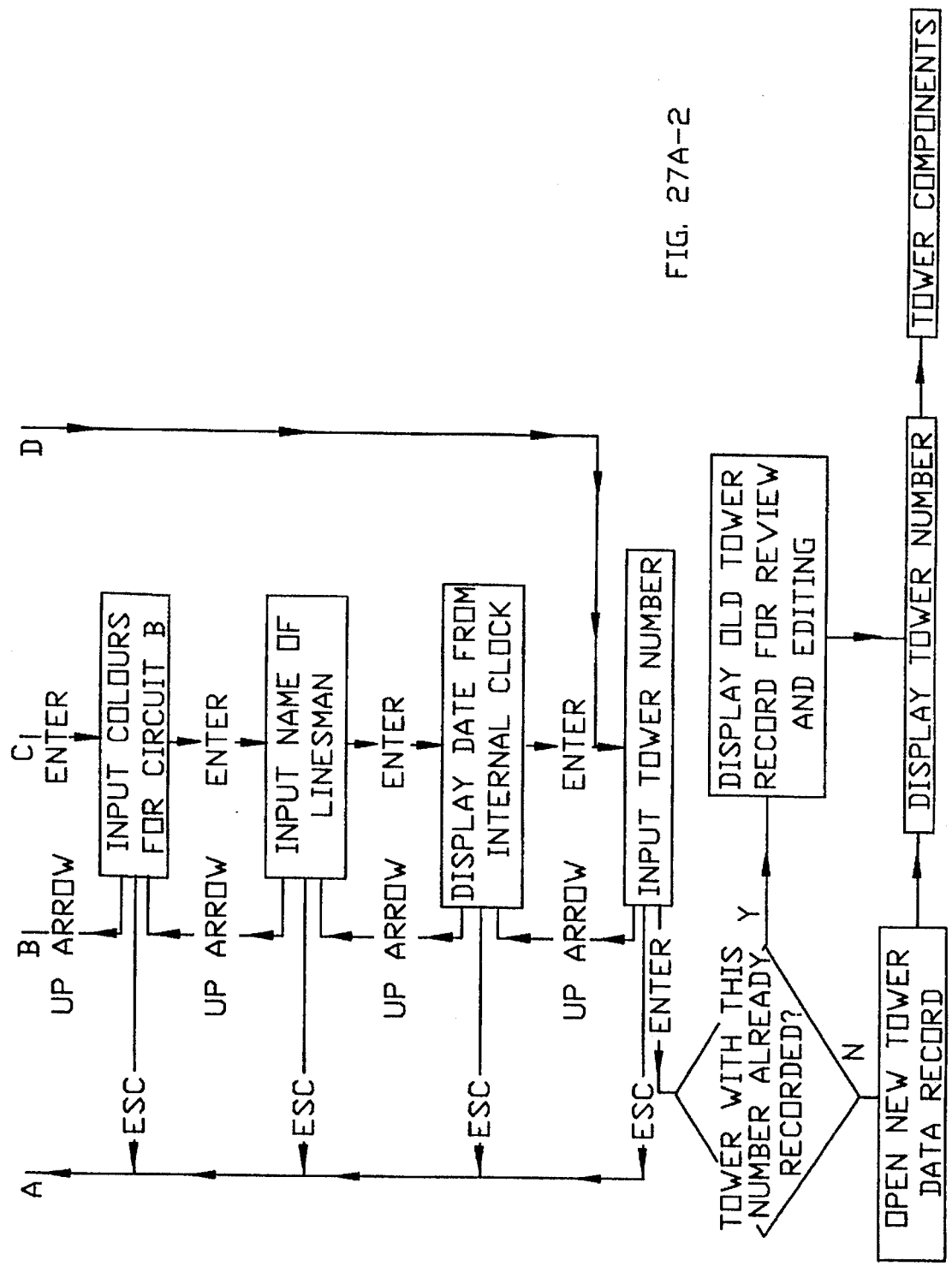
Figures 1, 27B:
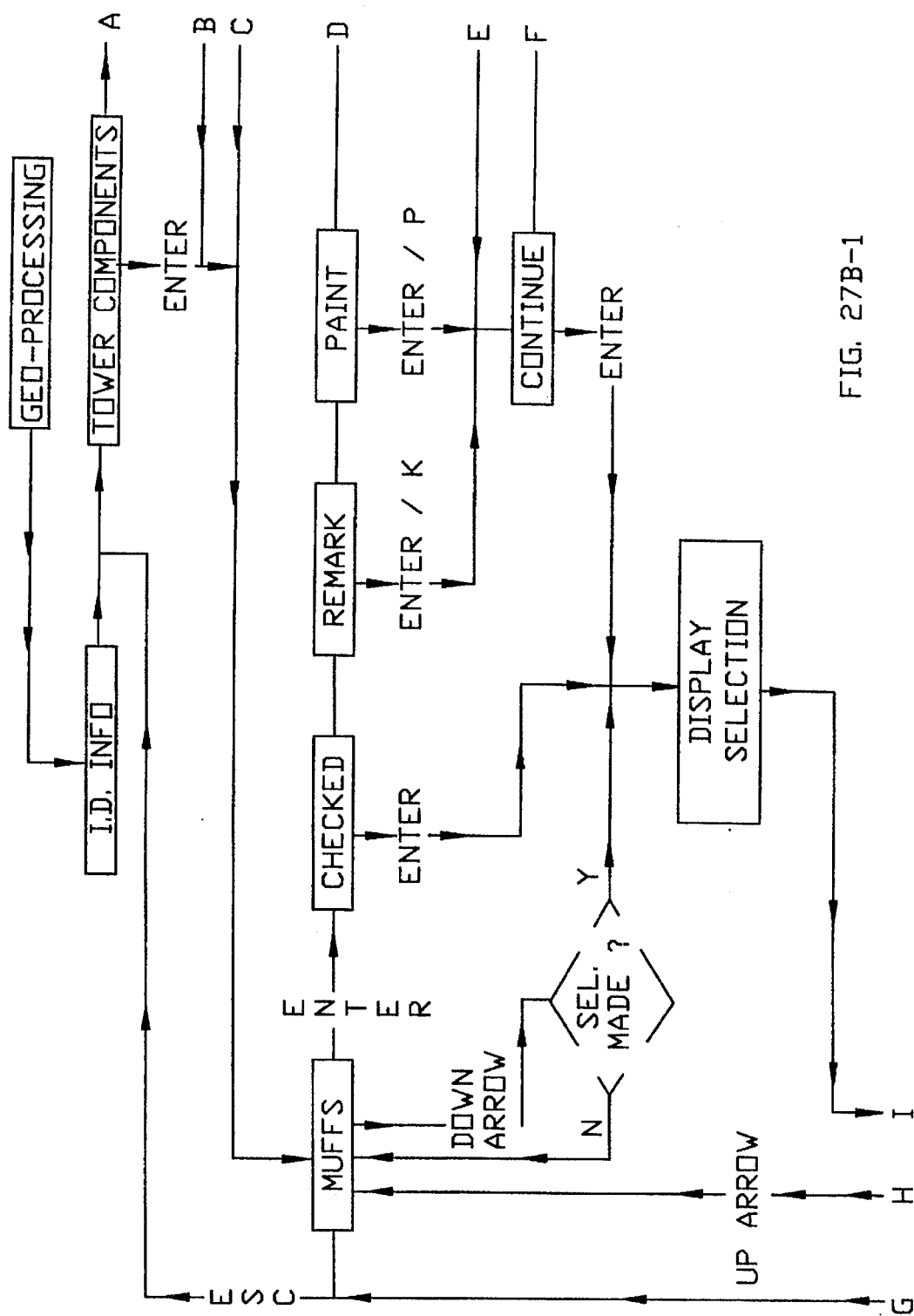
Figures 2, 27B:
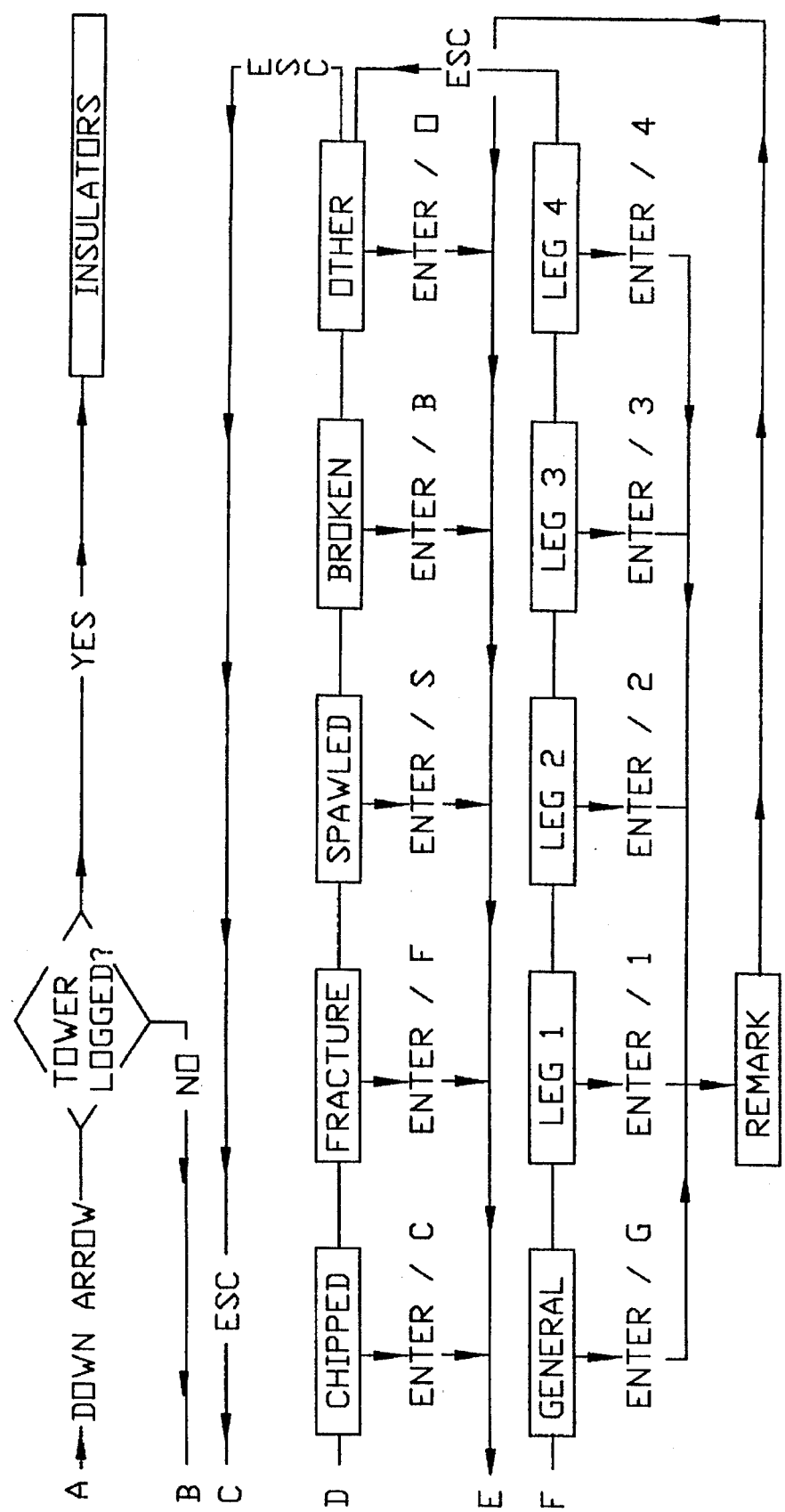
Figures 3, 27B:
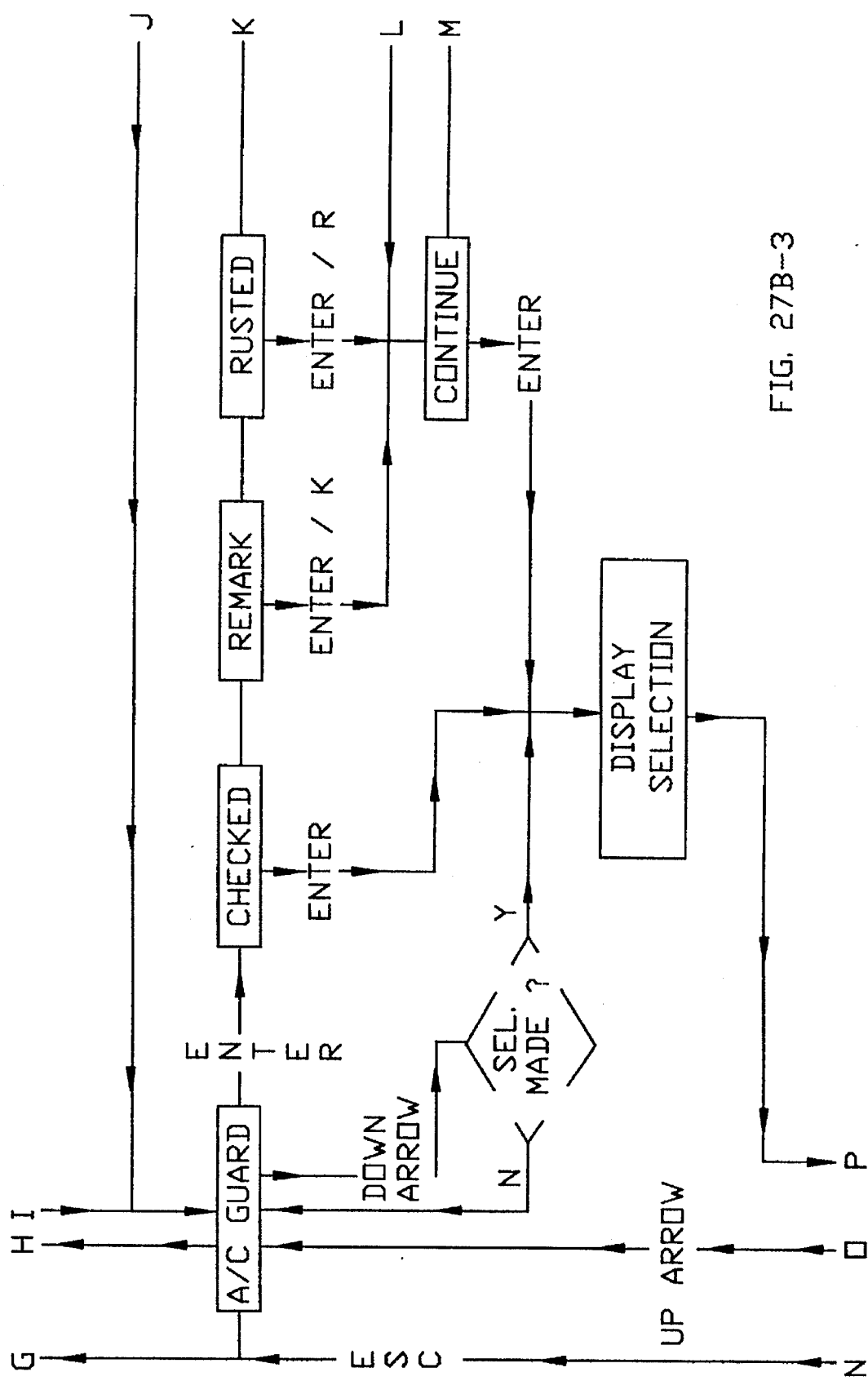

The administration feature, as shown in the flow chart of FIG. 3, is a standard Autograd feature used for the selection of any of nine different jobs and the inputting of job identity information for the selected one, consisting of project number, surveyor, title, location, client and start date.

Figures 4, 27B:
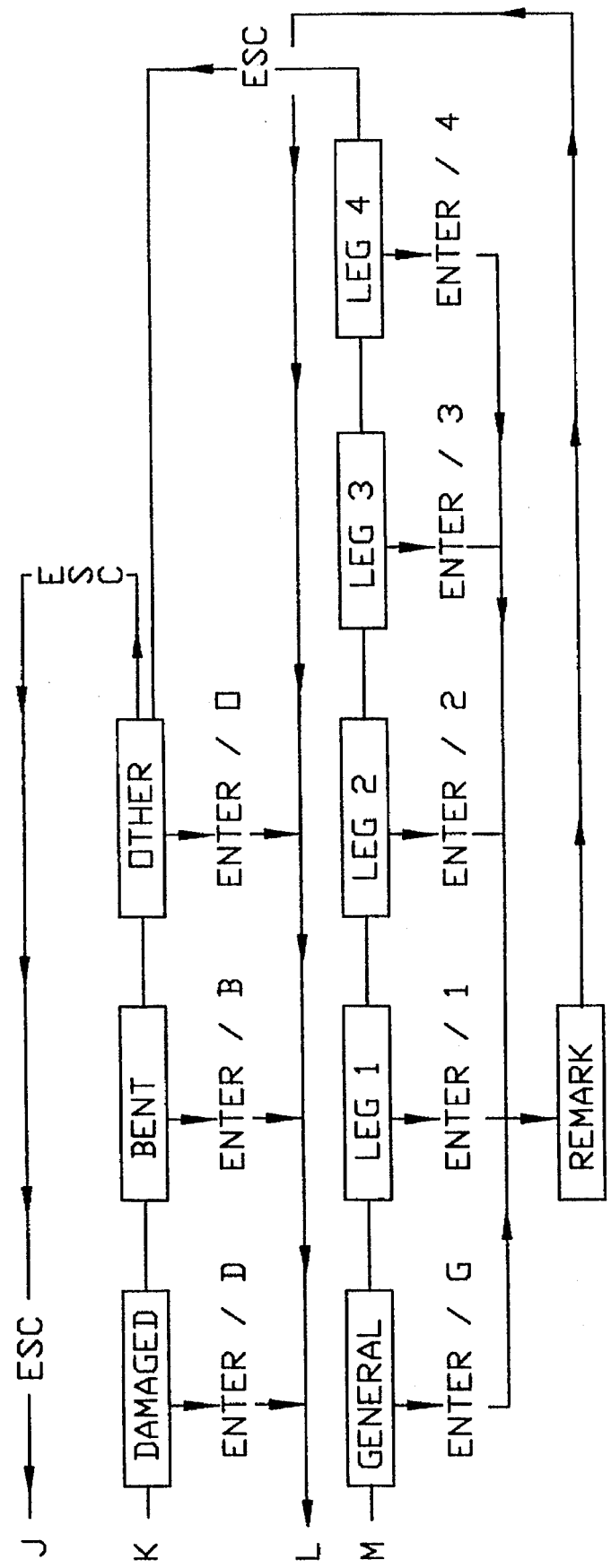

FIG. 4 shows a general overview flowchart of the geoprocessing program. This is a program for the establishment of instrument positions relative to the powerline or proposed route thereof and the recording and processing of the measurements taken from these positions. This is the central core of the program which will now be described in greater detail.

Figures 6, 27B:
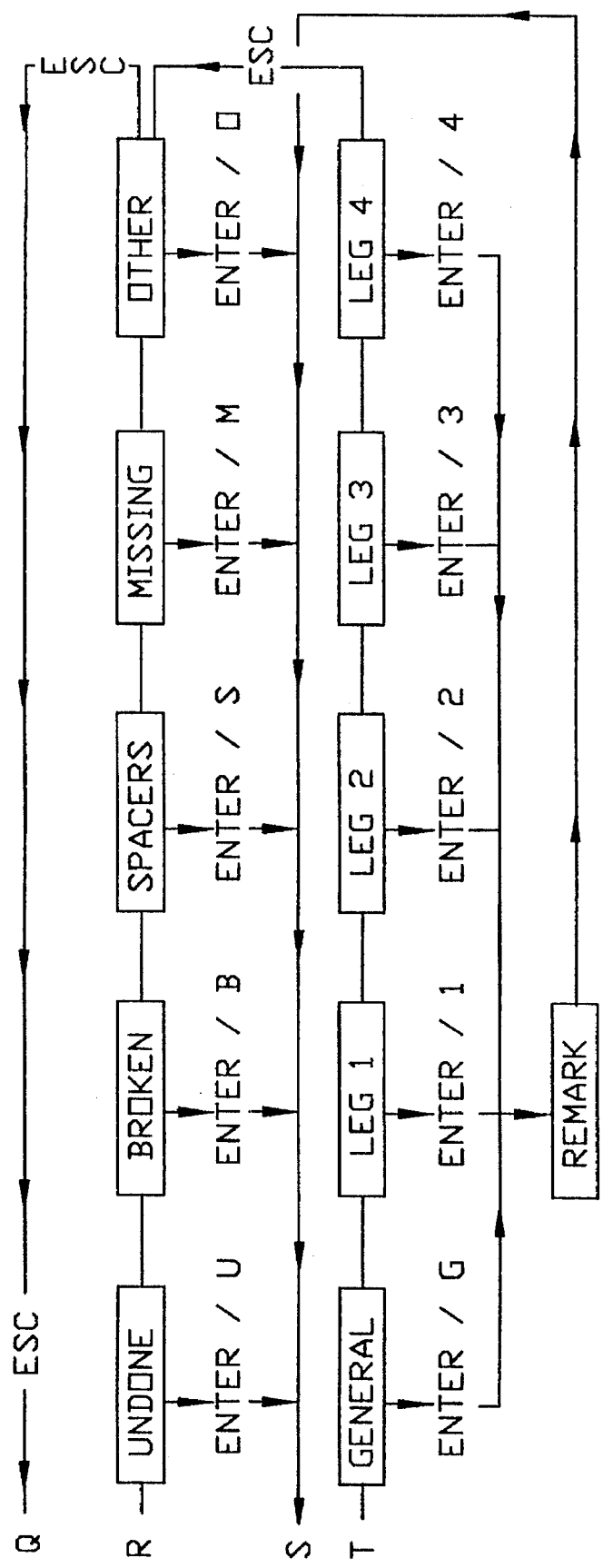
Figures 7, 27B:
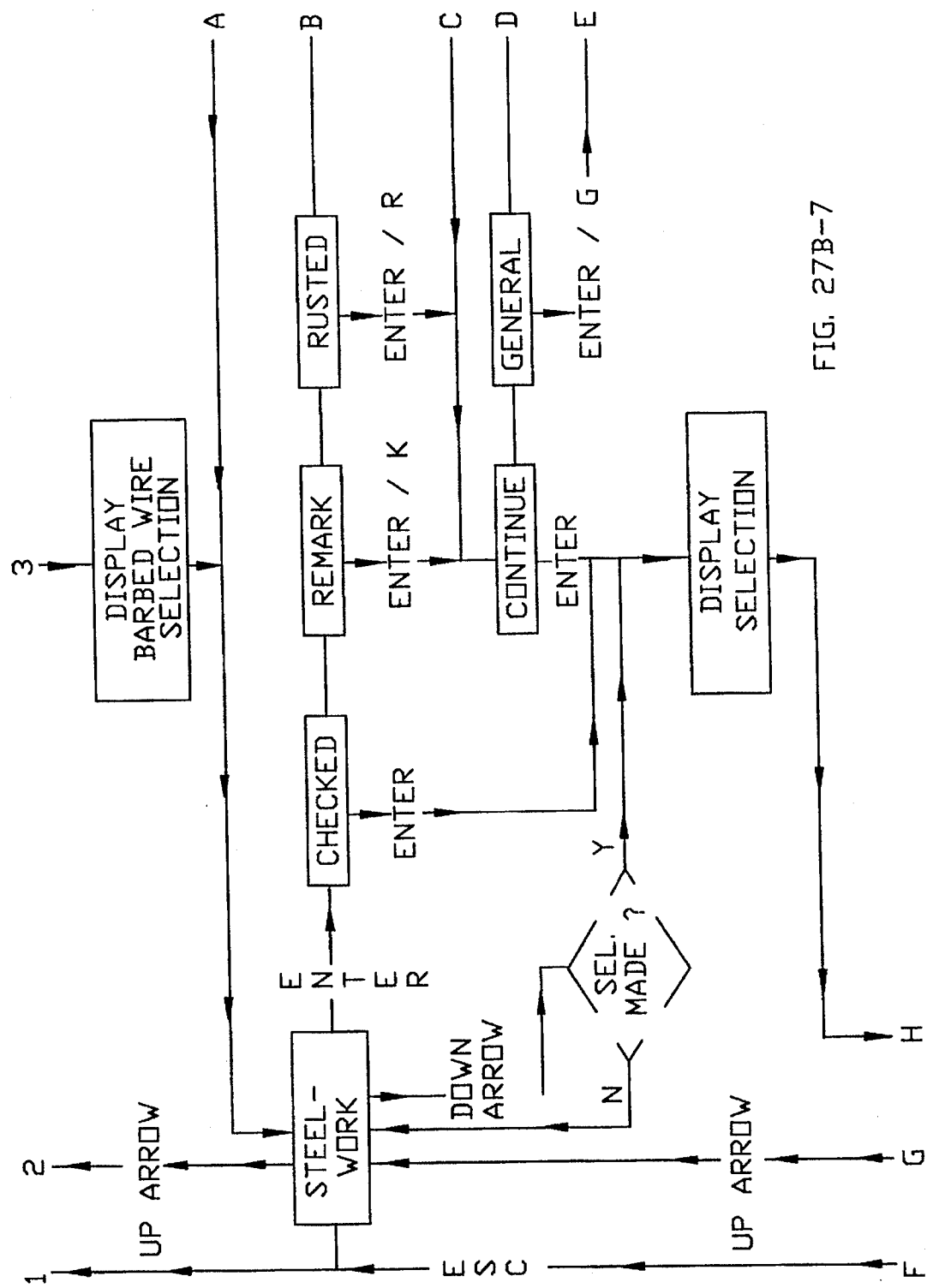
Figures 8, 27B:
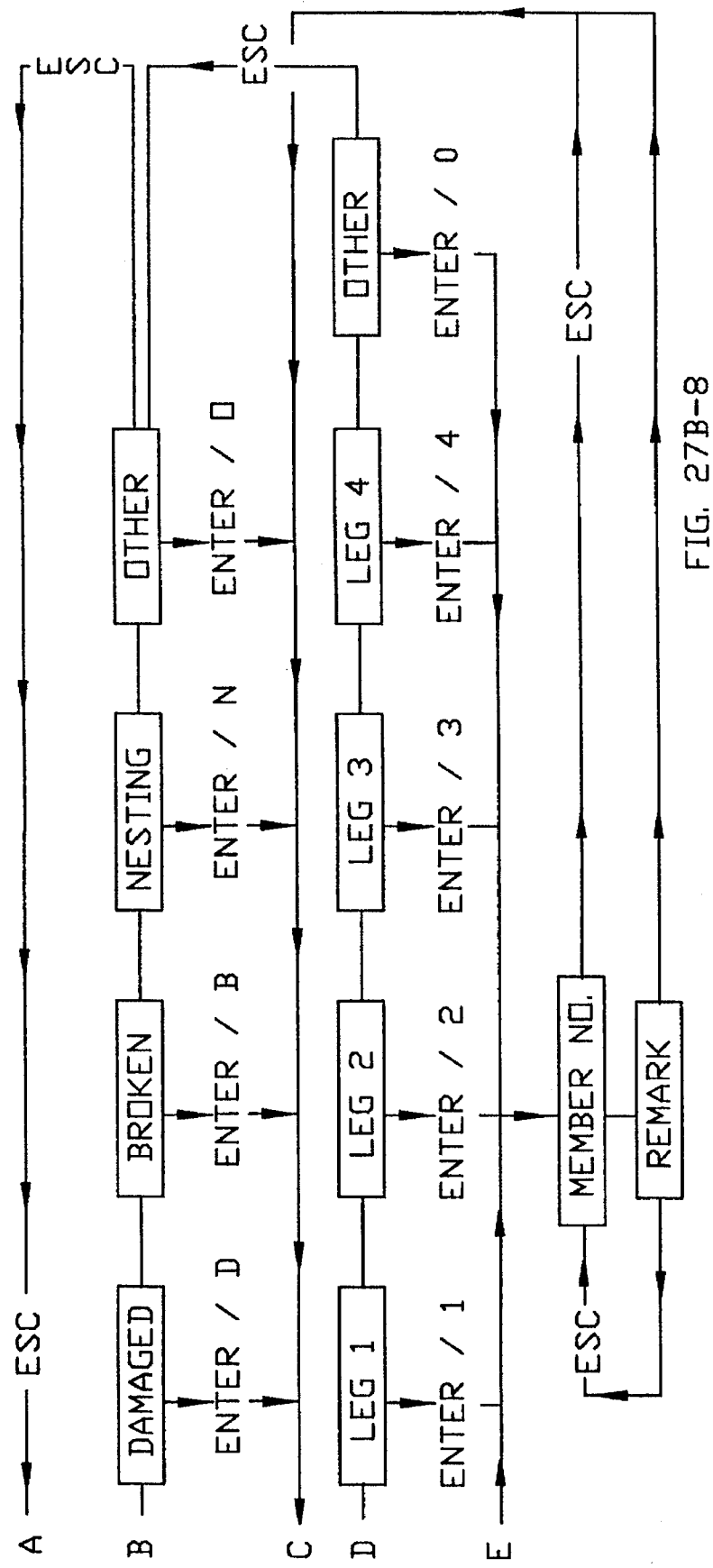
Figures 9, 27B:
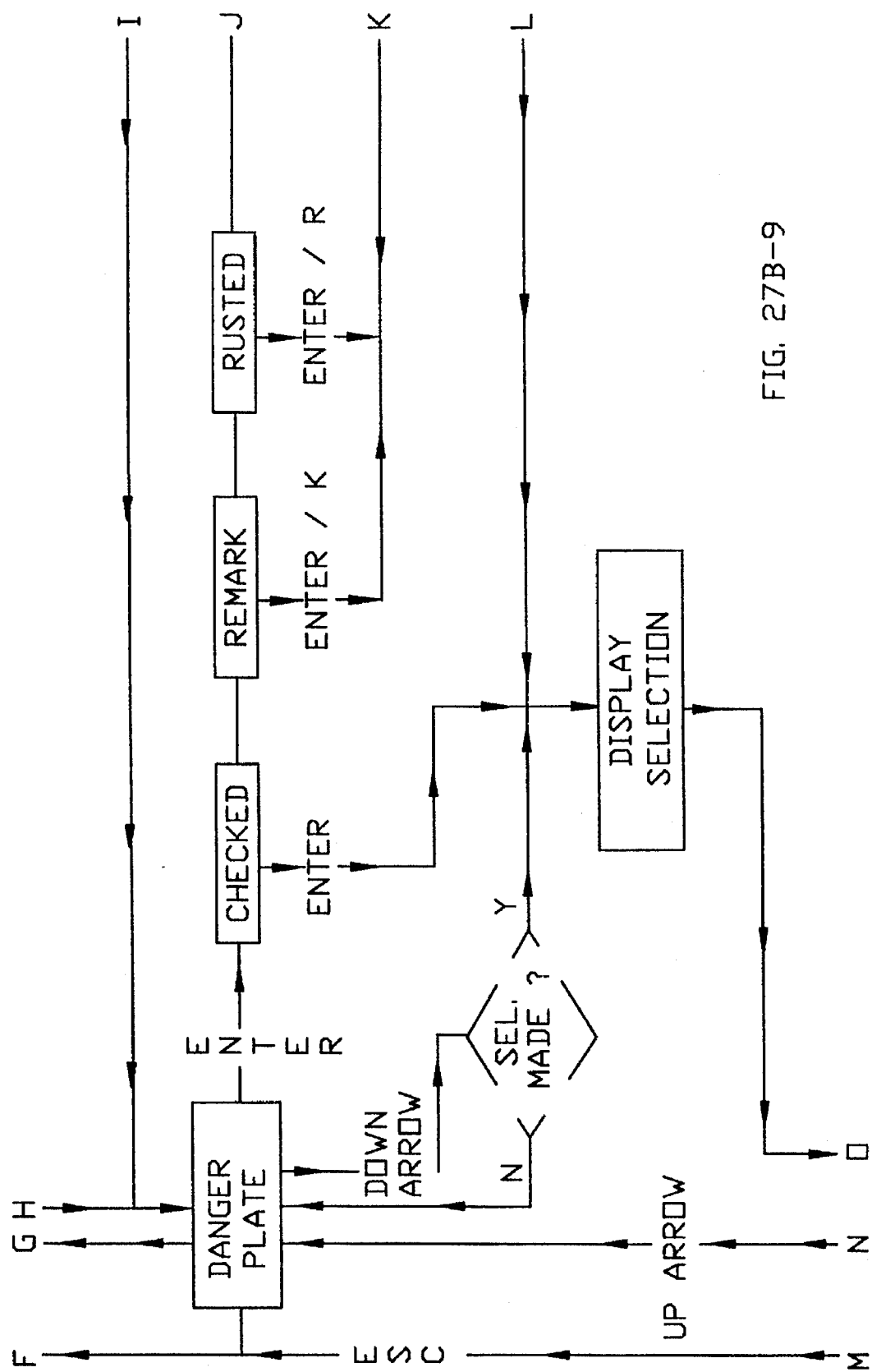
Figures 10, 27B:
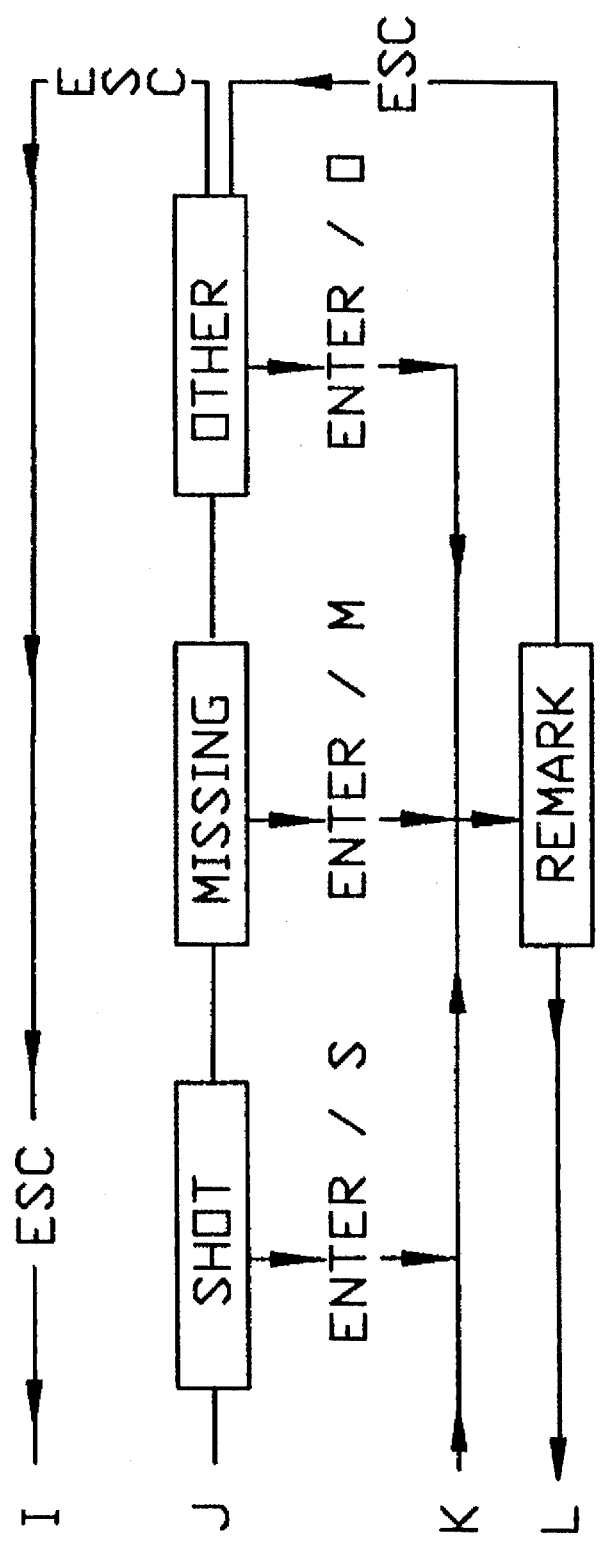
Figures 11, 27B:
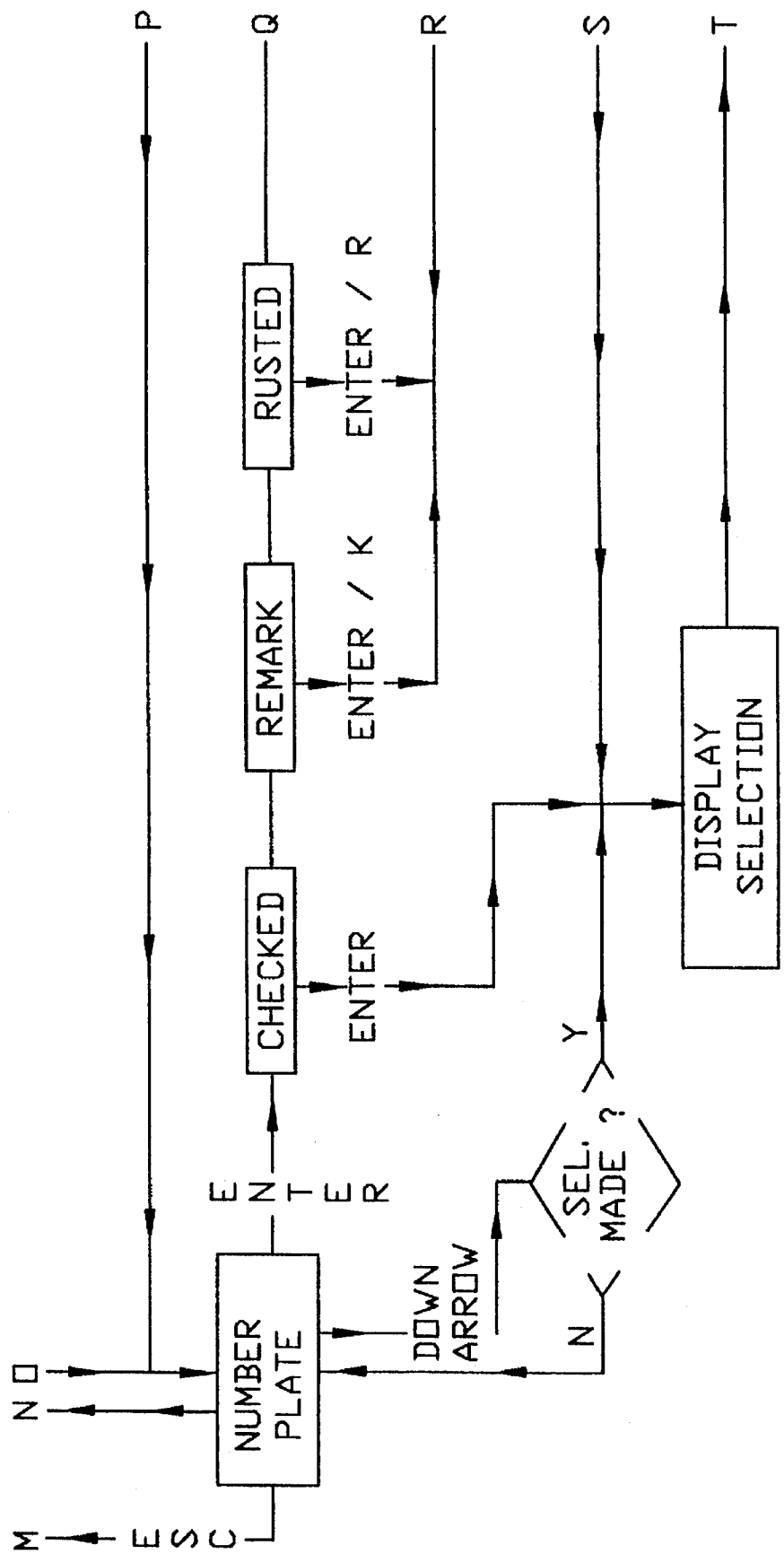
Figures 12, 27B:
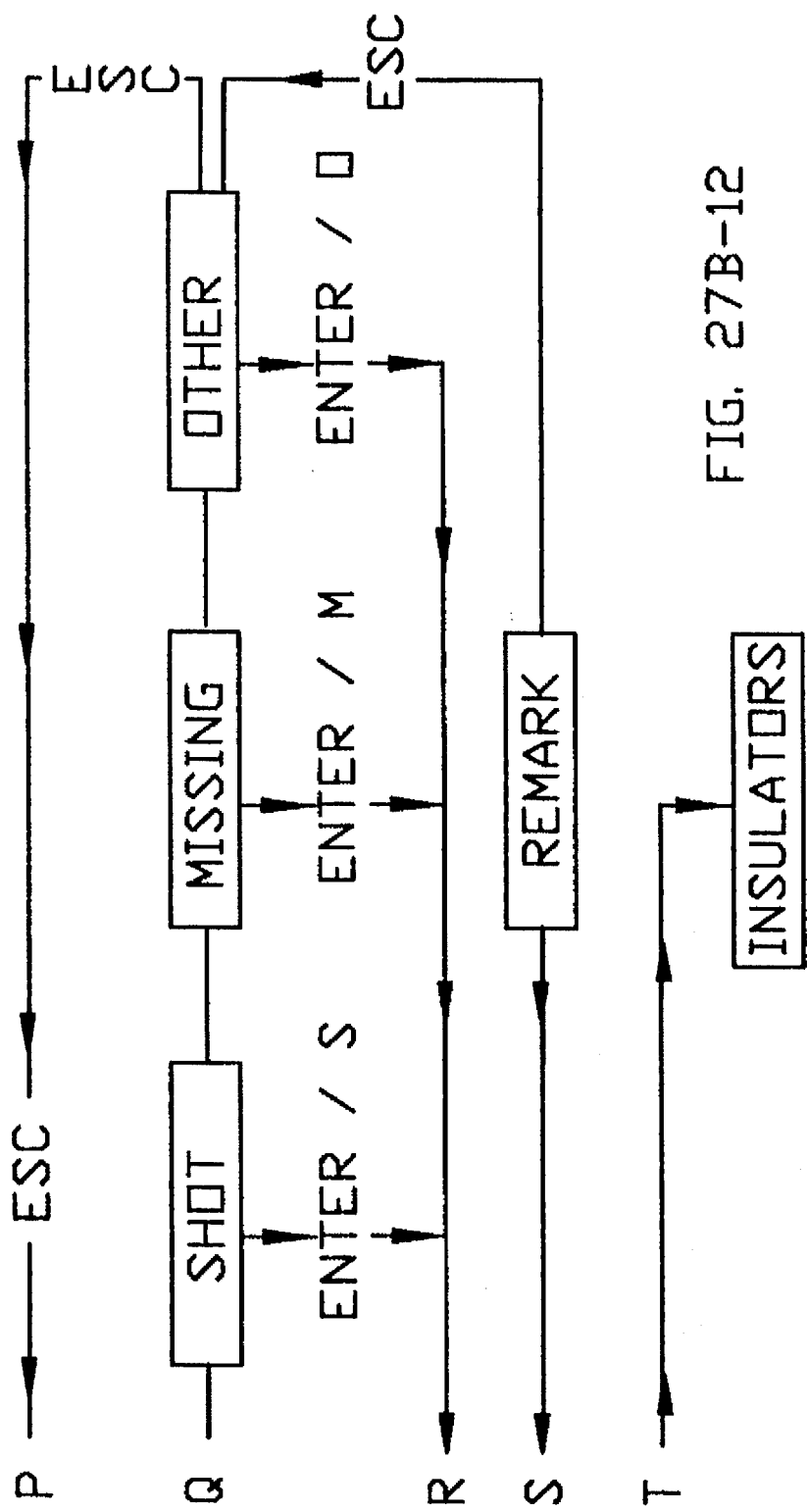
Figures 1, 27C:
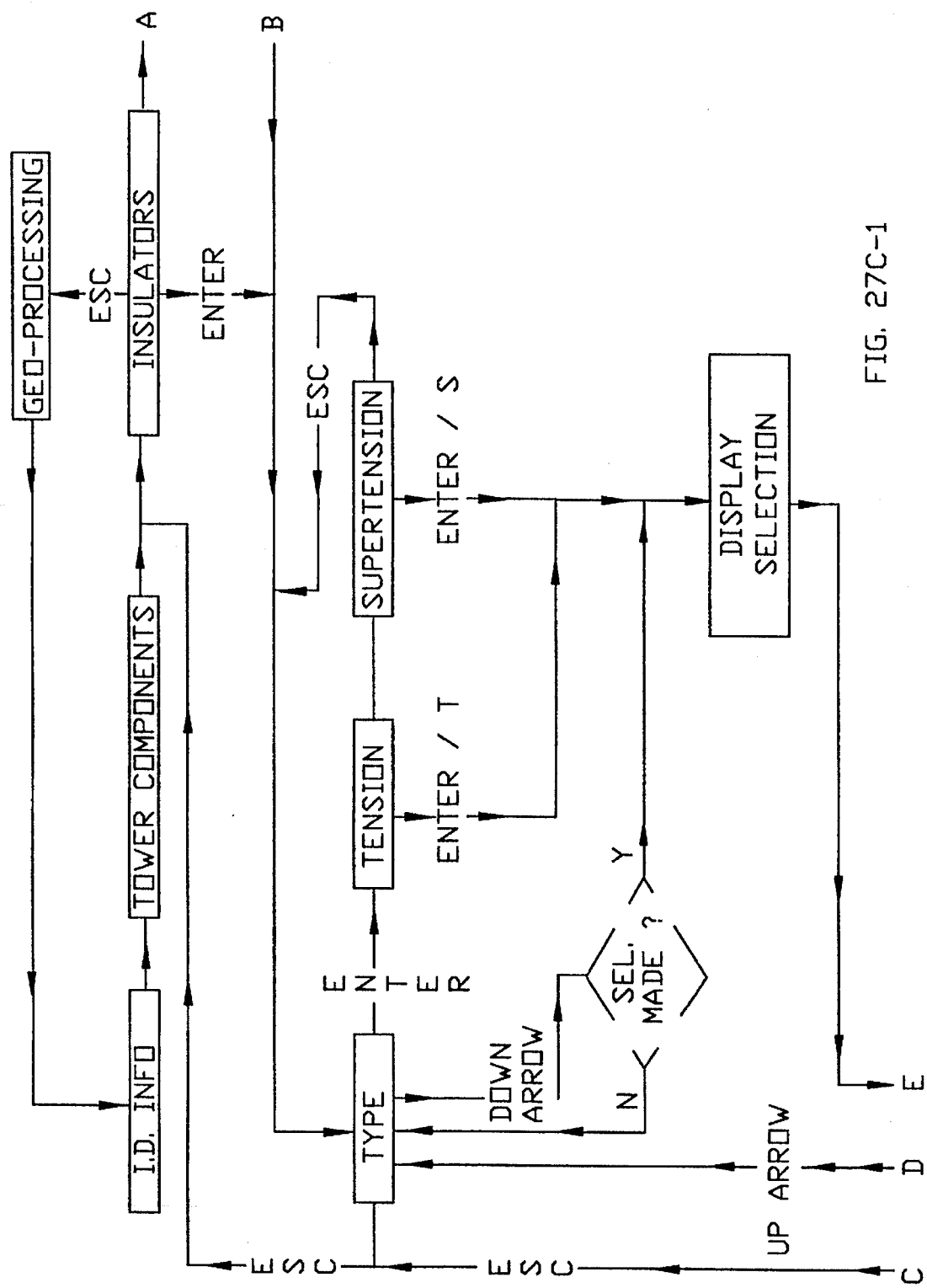
Figures 2, 27C:
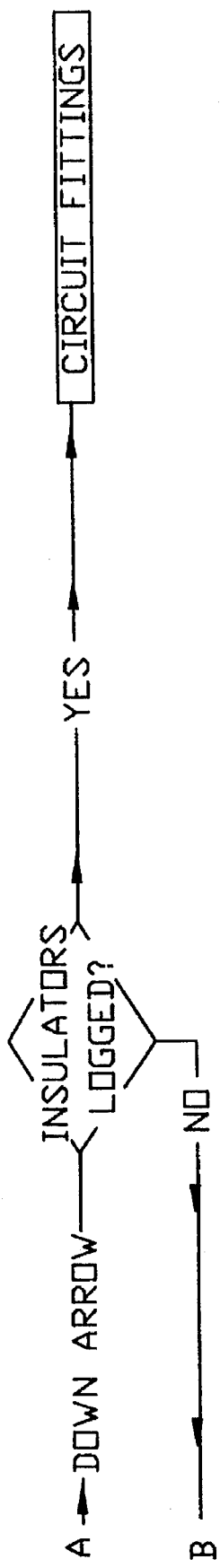
Figures 3, 27C:
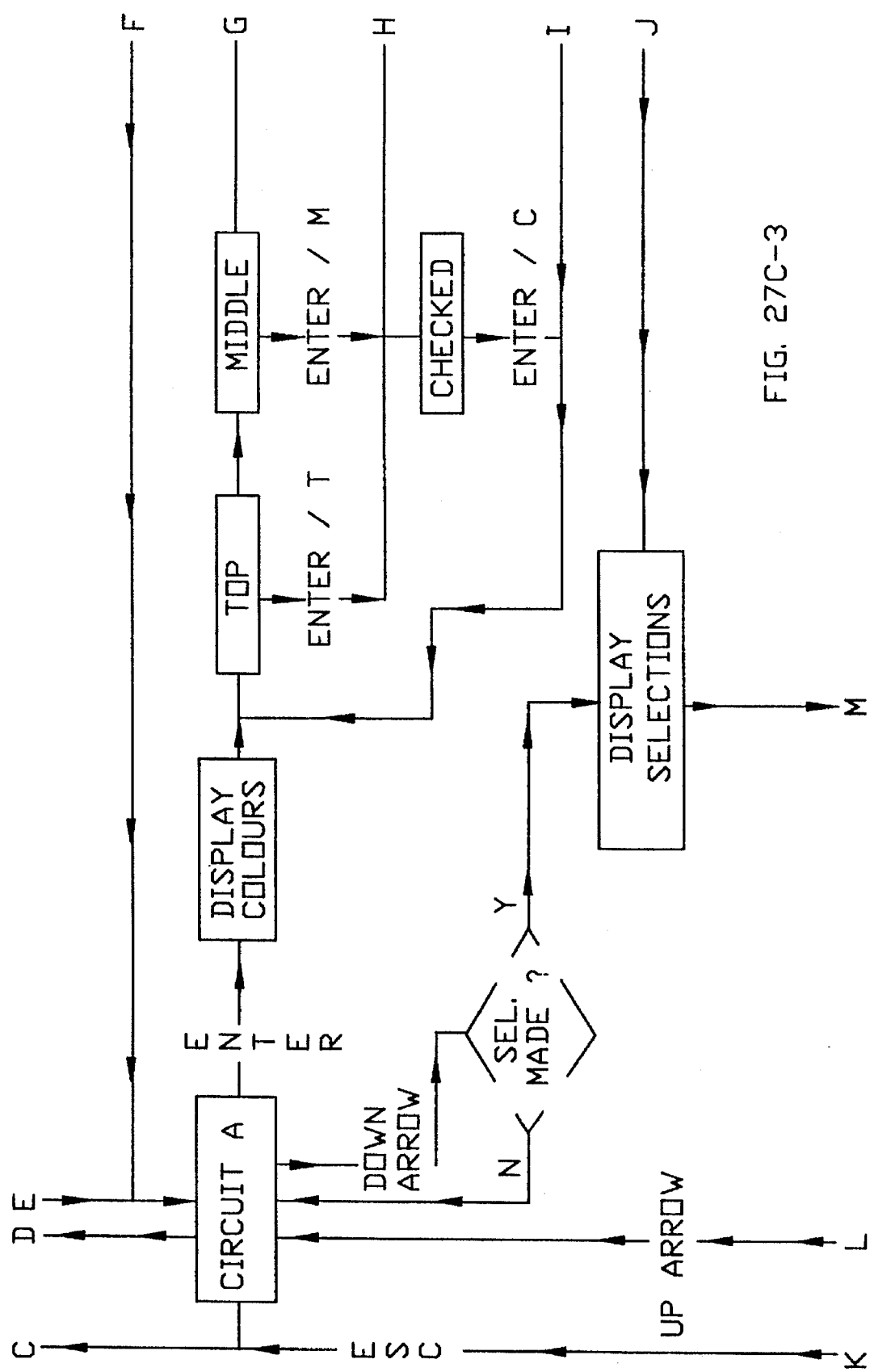
Figures 4, 27C:
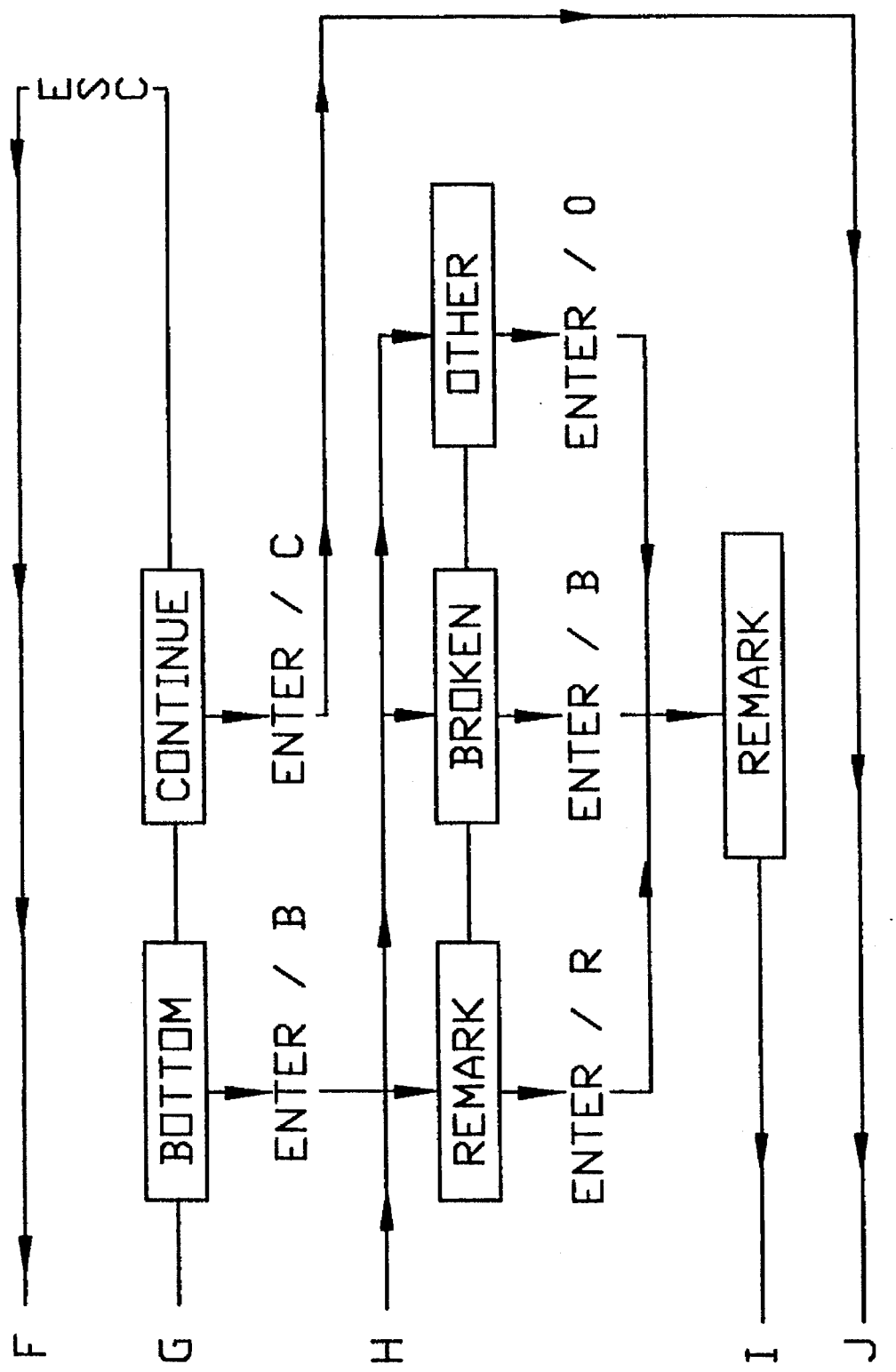
Figures 5, 27C:
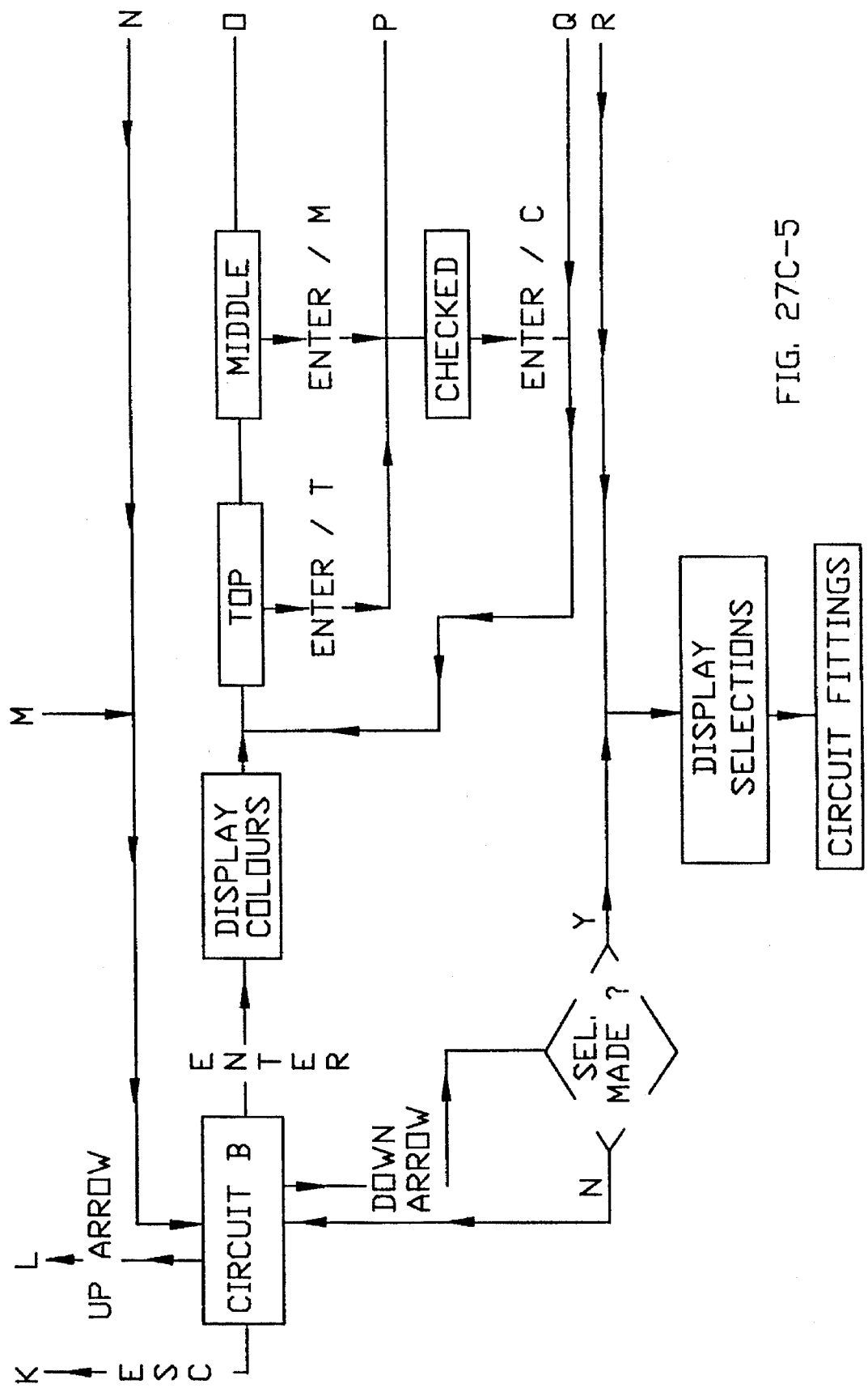
Figures 6, 27C:
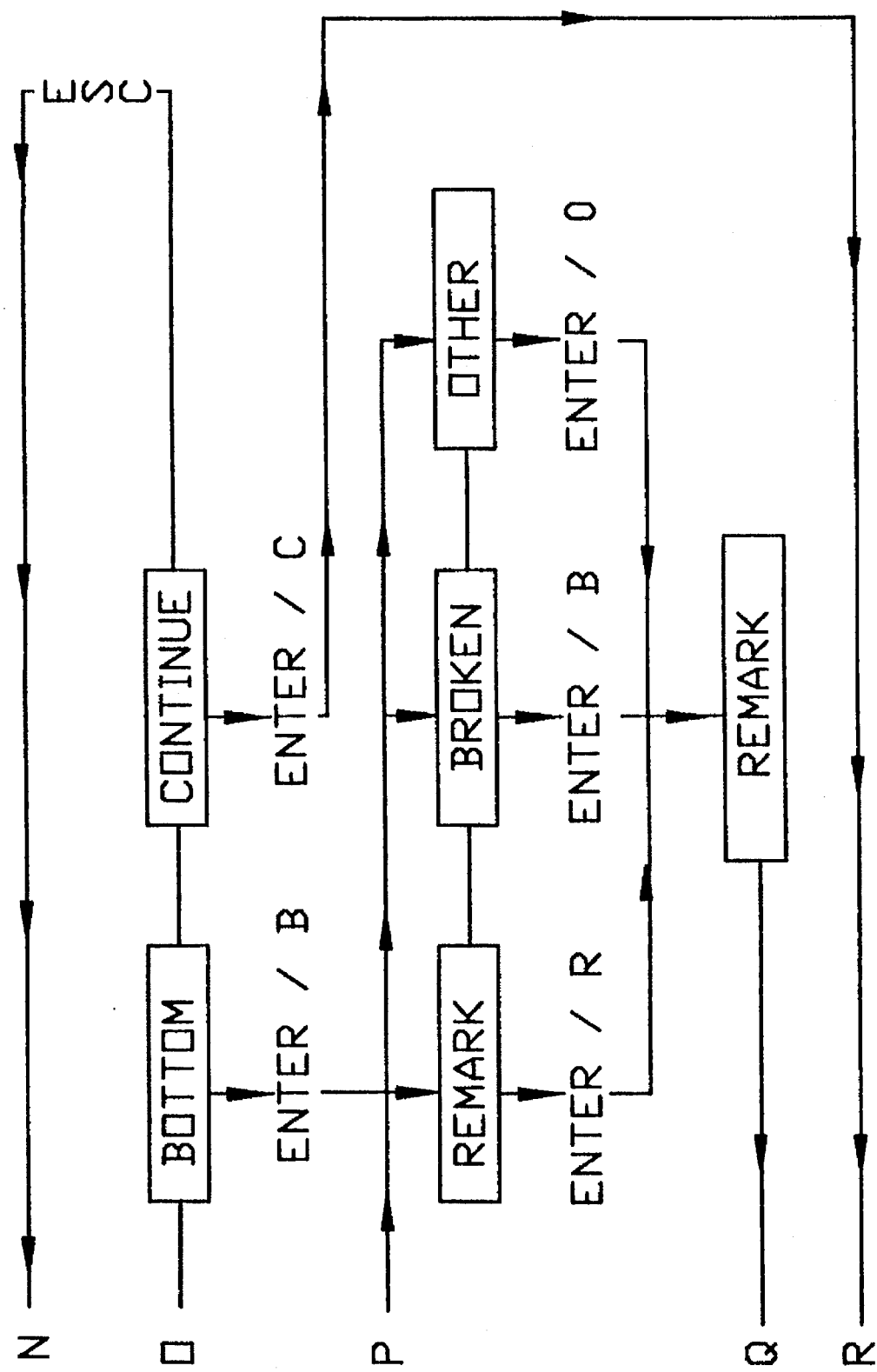

Referring now to FIGS. 5 and 6, flow charts for the establishment of initial and subsequent instrument positions respectively are shown. Each section of line between two changes in direction is treated as a separate entity and output independently of all other sections of line. For a given section of line, the initial instrument position has to be either under the first tower/pole of the section of line or may alternatively be established from sightings to the first tower/pole. Thereafter, new positions may be established either by sighting them from a previous instrument position or alternatively sighting a pre-established change point. The horizontal circle orientation may be set on either the earth line, the previous station or another known point, i.e., the previous tower/pole.

FIG. 7 shows the program steps involved in point measurement. Once the instrument position and the orientation of the horizontal circle of the instrument have been established, any point may be coordinated simply by observing the horizontal angle, zenith angle and slope distance from the station to that point.

Points which are vertically above or below previously observed points may be coordinated simply by measuring zenith angle. In this case, the height difference between the two points is displayed.

As shown in the FIG. 8 flow chart, inaccessible points may be coordinated by selecting the 'Remote Location' option from the menu and then observing two points colinear with the required point and measuring the horizontal and vertical angles to the required point.

Points are measured sequentially, the most recently measured always appearing at the bottom of the logging sheet. Previous points may be reviewed either through scrolling up the logging sheet, using the cursor control keys, or alternatively moving the display directly to a specified point using the 'Point Find' option from the pull-down menu.

FIG. 9 shows the flow chart for the features library selection. Feature names are used to define the type of object being measured. They consist of alpha/numeric text. A specific object is defined by a series of points having the same feature name and string number. Within both the field collection/computation and the office based graphic processing modules there resides a common feature library. This library holds information pertaining to each feature which may be observed.

When collecting data in the field, the user may select a feature from this library. Associated with this feature will be a connection code (usually either 'S' (Straight), 'C' (Curved), 'G' (Gap) or 'V' (Vertical Straight)), a string number (either an absolute number or an increment on the string number associated with the previous feature of the selected type observed during the current job), and a code indicating whether the elevation of points on this feature should be used to form a digital terrain model and associated contoured drawing. When a feature is chosen from the library, these associated codes are placed in the appropriate fields. They may, however, be overwritten at the user's discretion. If the user inputs a feature name directly, it is pulled automatically from the feature library. (If it does not exist in the feature library a warning is given.) Alternatively, the user may return to an incomplete feature by selecting the relevant feature name and string number combination using a feature recall facility. Selection of a feature from the library (or feature recall memory) is done through inputting the first character of the required feature (this moves the display to the features starting with this character) and then scrolling through the displayed features using the cursor control keys and/or the space bar until the required one is displayed. The displayed feature may be selected using the enter key.

The contents of the feature library are:

Common Data:
  Feature Name
Field Specific Data:
  Default Connection Code
  Default String Number (or 'I' to increment from previous number)
Office Specific Data:
  Color
  Line Thickness
  Color of Gaps
  Line Thickness of Gaps (can be set to zero)
  Text to be displayed? (All points, First Point on Feature, None)
  Symbol (If any)
  Direction of connection (Up, Down, Left, Right)
  3D Connection Representation, the current options are as follows (These will be expanded as the need becomes evident):

Horizontal Splined Best Fit Curve/Straight

Straight Vertical Line

Single Point

-continued

Dip/Hump (Straight Sides)

Dip/Hump (Rounded)

Vertical Lines Connected at Top

Vertical Lines Connected at Bottom

Vertical Lines Connected Top – Bottom

3D Curve (Left/Right of Line).

The option is given within the field system to add new features to the library.

An eight character feature code may be entered in order to identify the object being observed. This feature code has an equivalent in the feature code library in the overhead line profile modelling program which indicates how this particular feature is displayed and plotted. The required feature may be pulled from a library held in the computer memory using the 'Feature Recall' or 'Feature Library' option in the pull-down menu.

A feature number is also given for each point to differentiate between points on similar features, i.e., Wall 1 and Wall 2.

Each point may be given a link code indicating how that point is linked to the next point with the same feature name and number. These codes and their meanings may be displayed by choosing an option from the pull-down menu.

By selecting an option from a pull-down menu the current land usage may be logged. This land usage remains active until another land usage is logged.

An offset code indicates whether a point being observed is on the route of the power line or not. This influences whether an offset value is computed. If a point on line would have an offset value of greater than one meter a warning is given. An 'I' code excludes the current point. The permissible codes may be displayed by choosing the relevant option from the menu.

The flow chart for the tower monitoring section of the geo-processing program is shown in FIG. 10, while FIG. 11 shows a general overview of the data flow route for the tower design file. The field survey program is divided into two distinct modules, one for surveying high voltage lines (generally supported by steel towers) known as TowerLine and one for surveying low voltage lines (generally supported on wooden poles) known as PoleLine.

Figures 1, 10A:
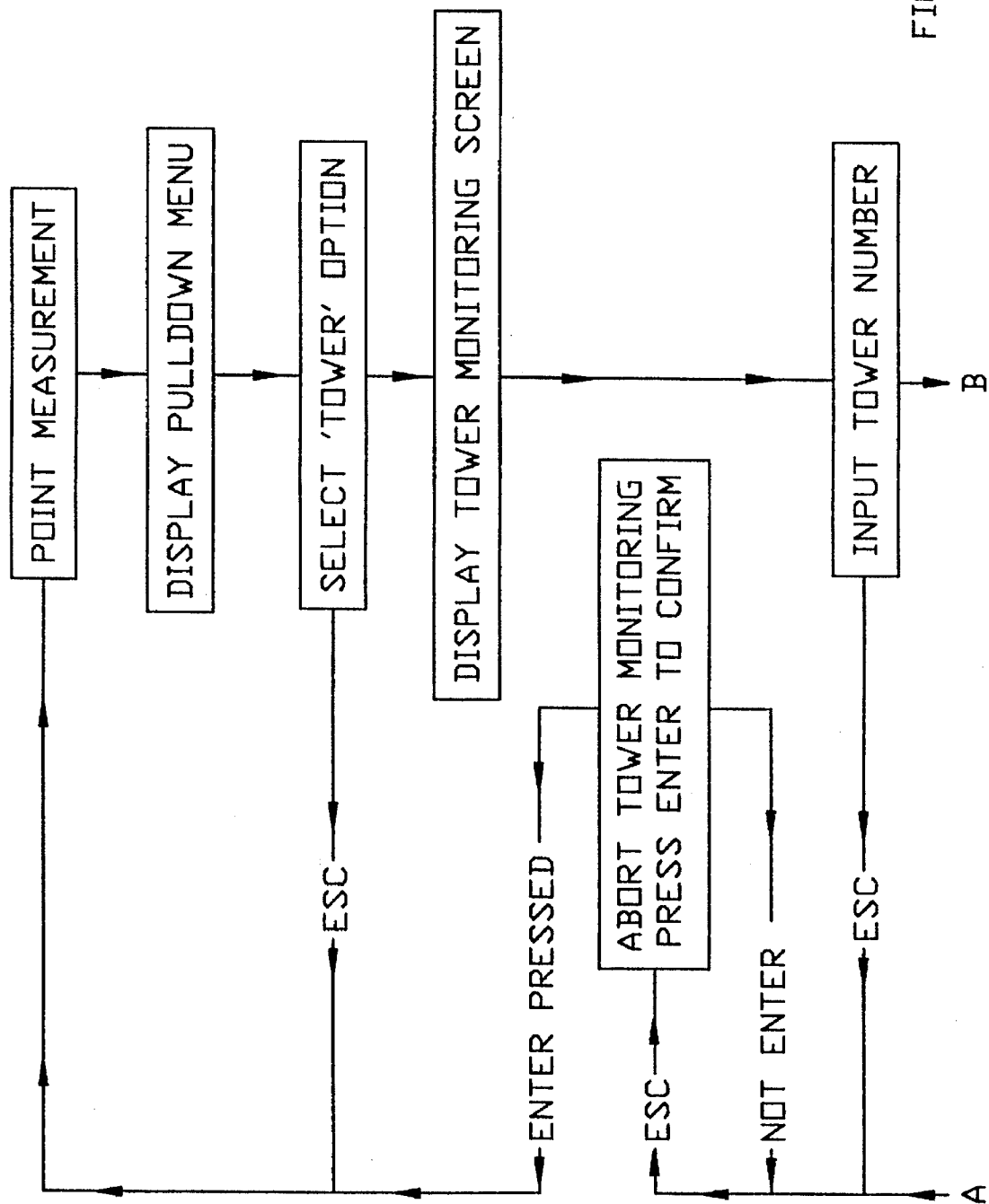
FIGS. 10A(I)–D(II) are the tower monitoring and pole recording program flow charts)
Figures 2, 10A:
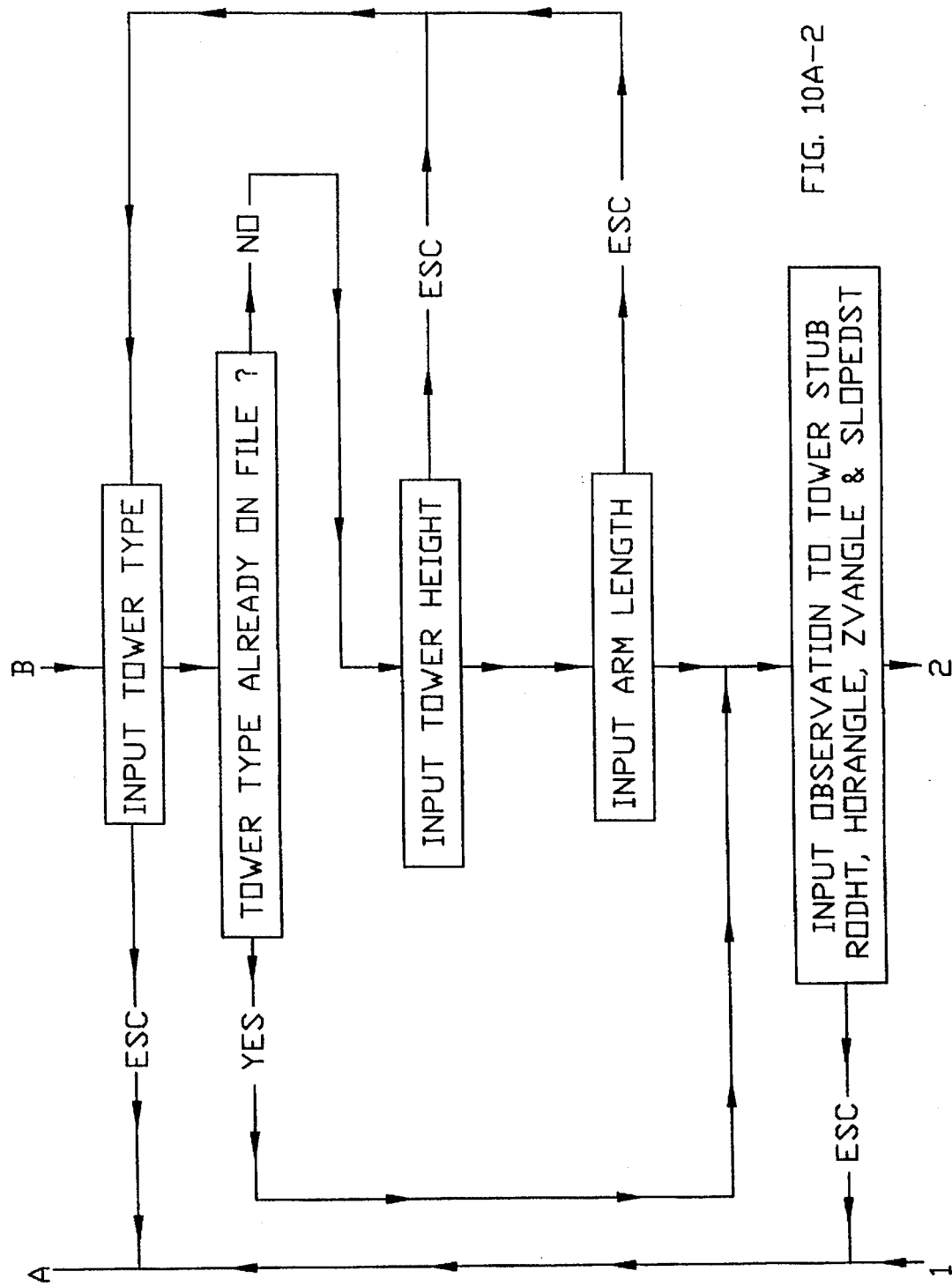
Figure 10B:
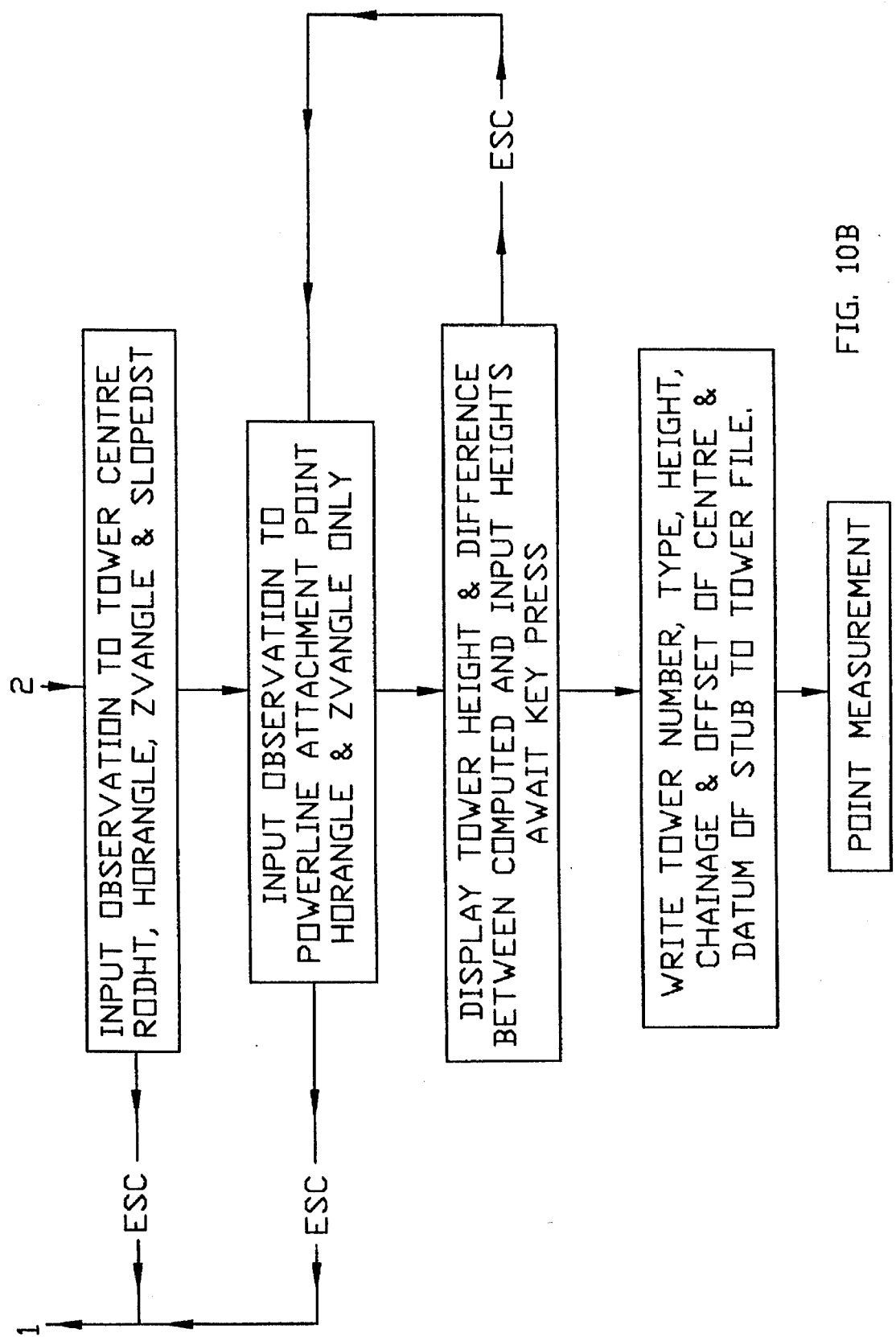

As shown in FIG. 10A and 10B, towers along the route of the powerline may be logged, recording their name and type, chainage and datum. Their height above stub level may also be measured and compared with the design height for towers of that type. The difference is displayed. The recorded details are written to a separate file which may be output from the Input/Output section of the program.

Figures 1, 10C:
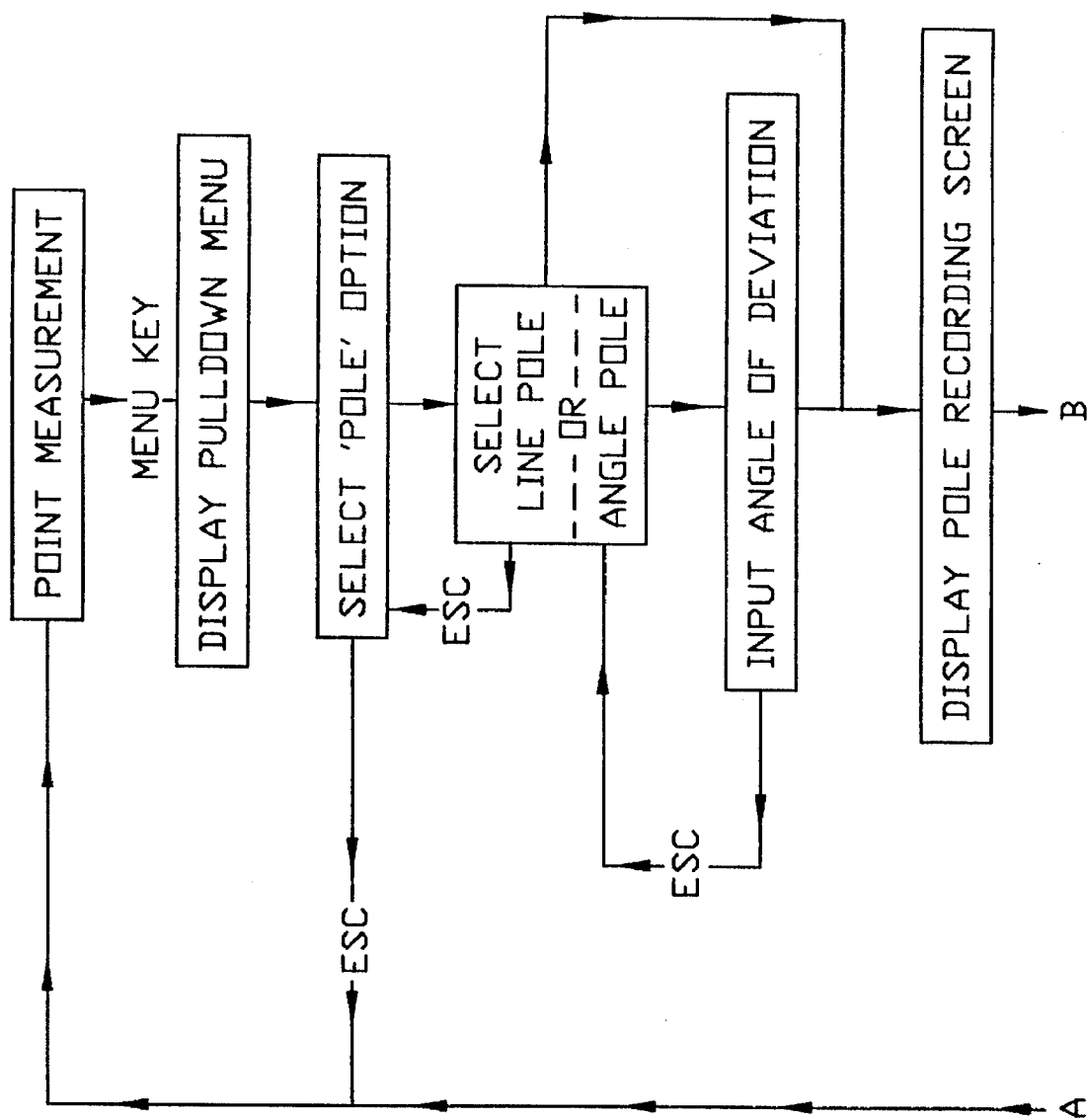
Figures 2, 10C:
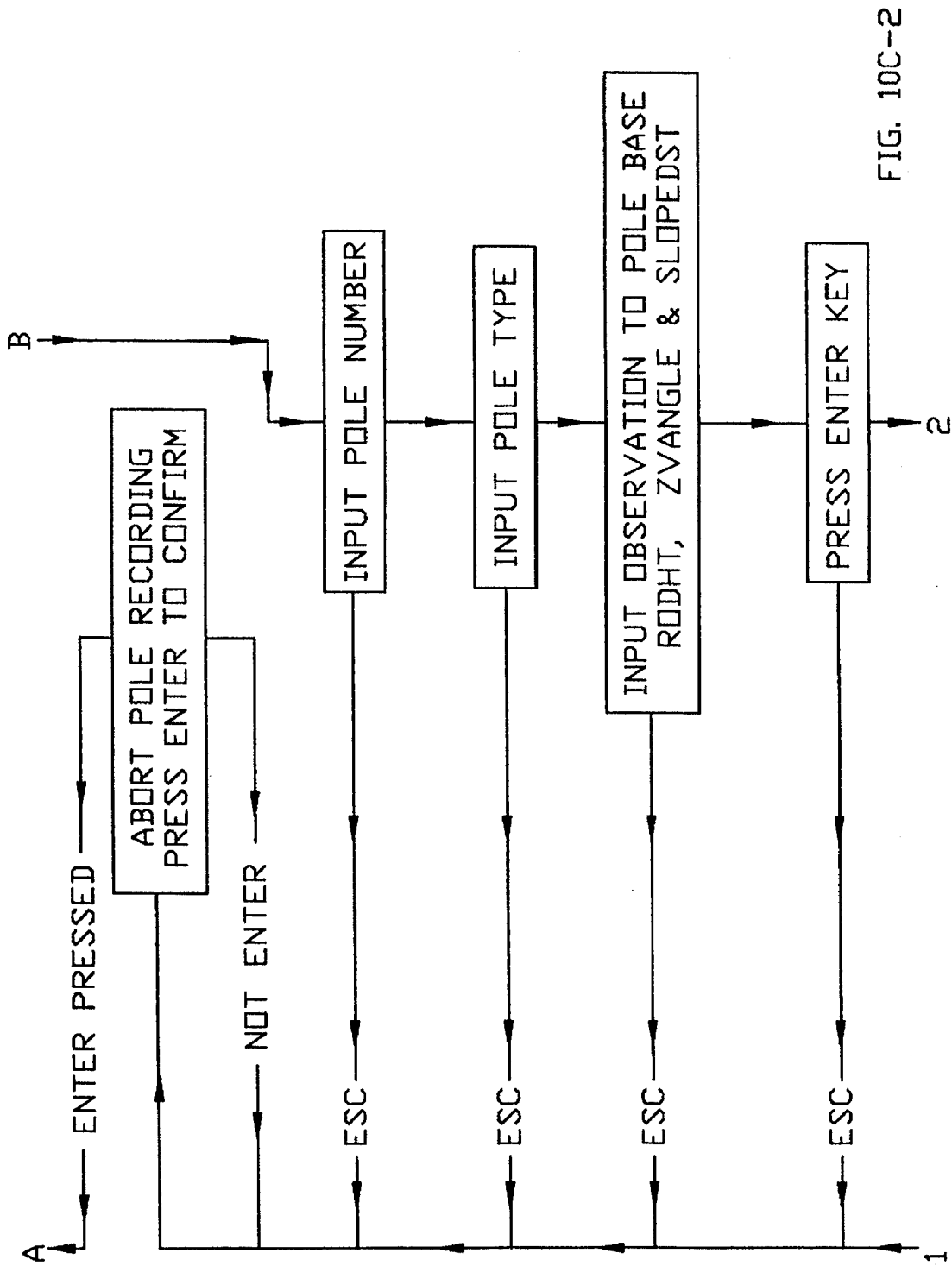
Figures 1, 10D:
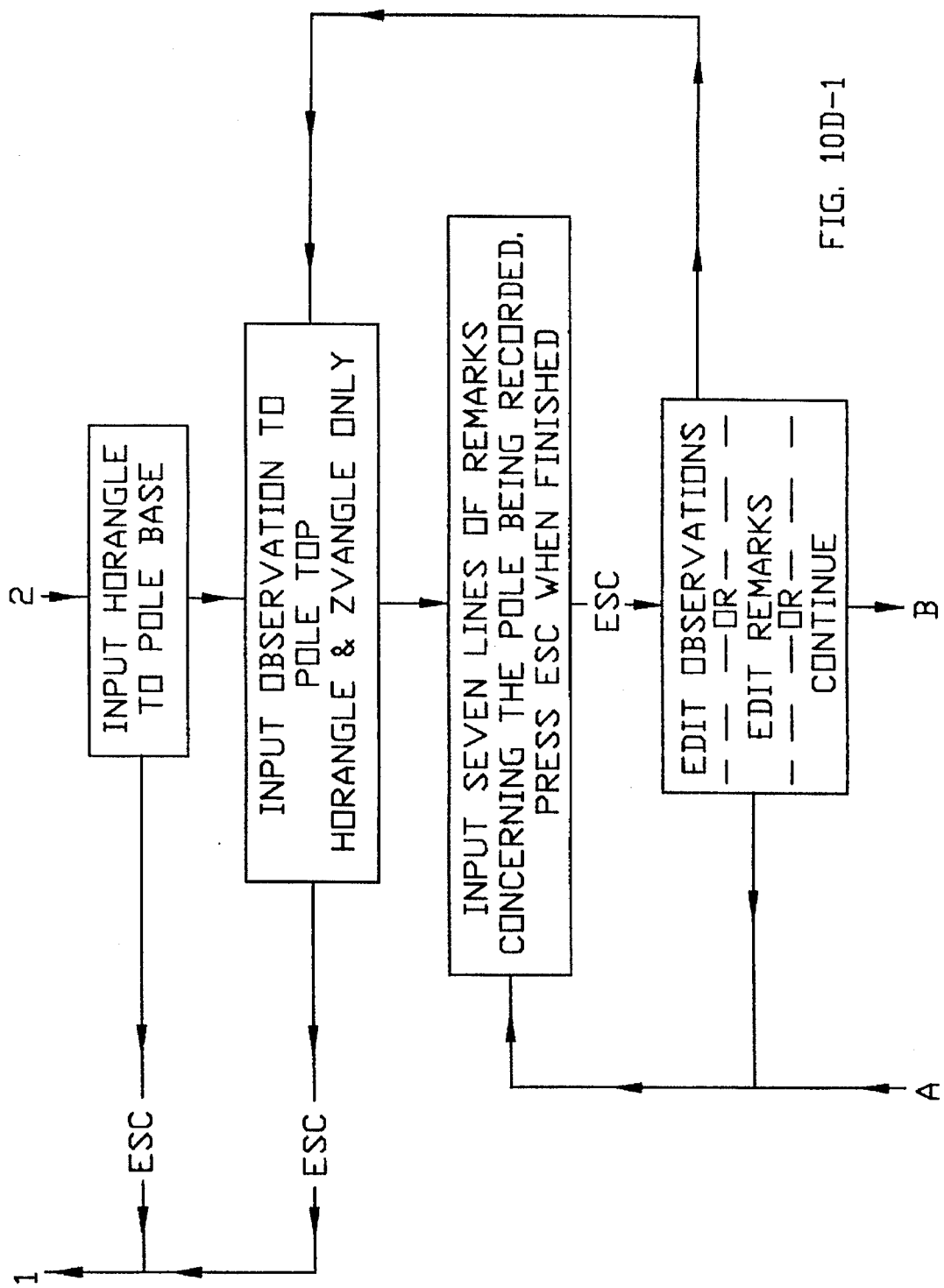
Figures 2, 10D:
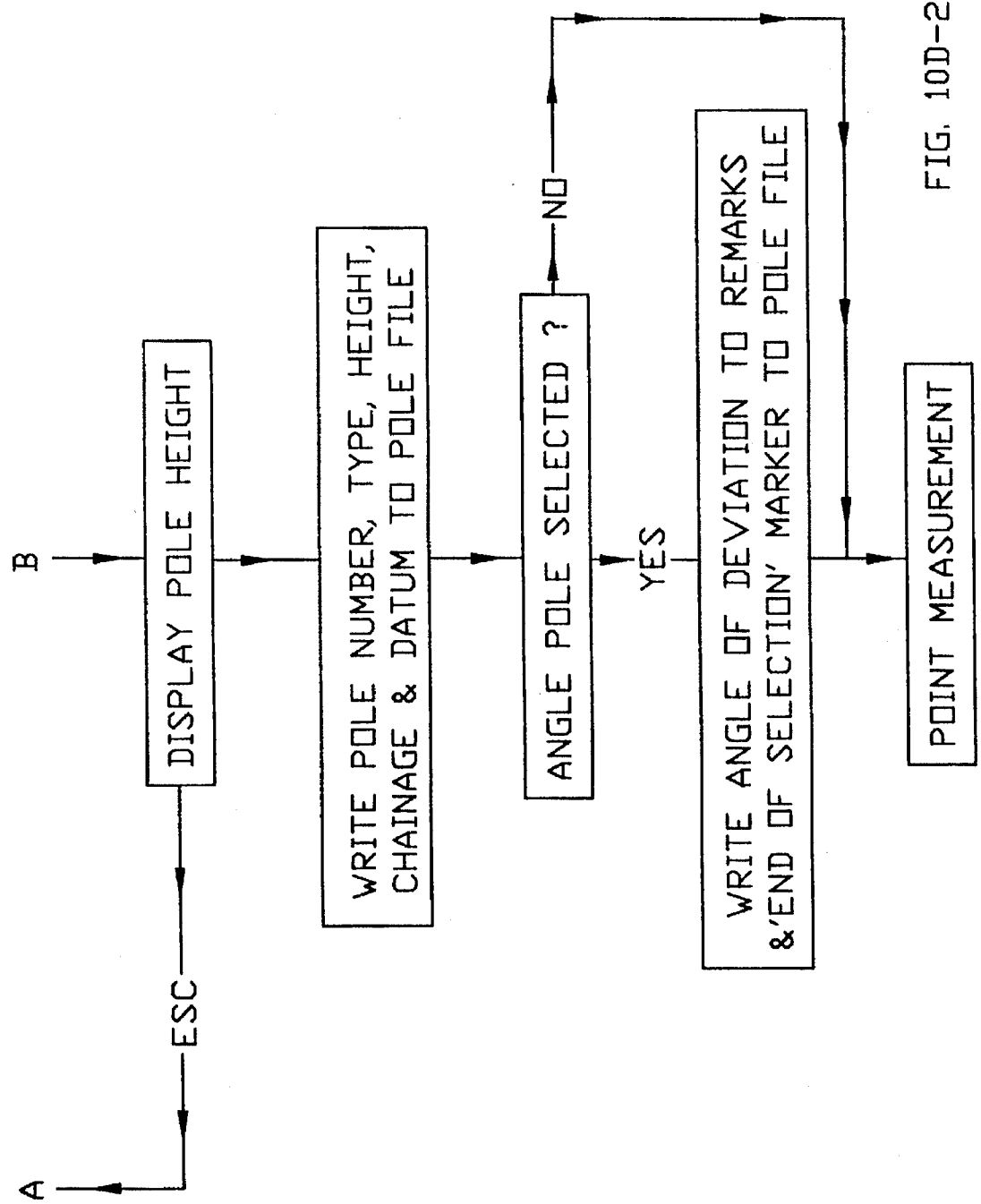
Figure 11A:
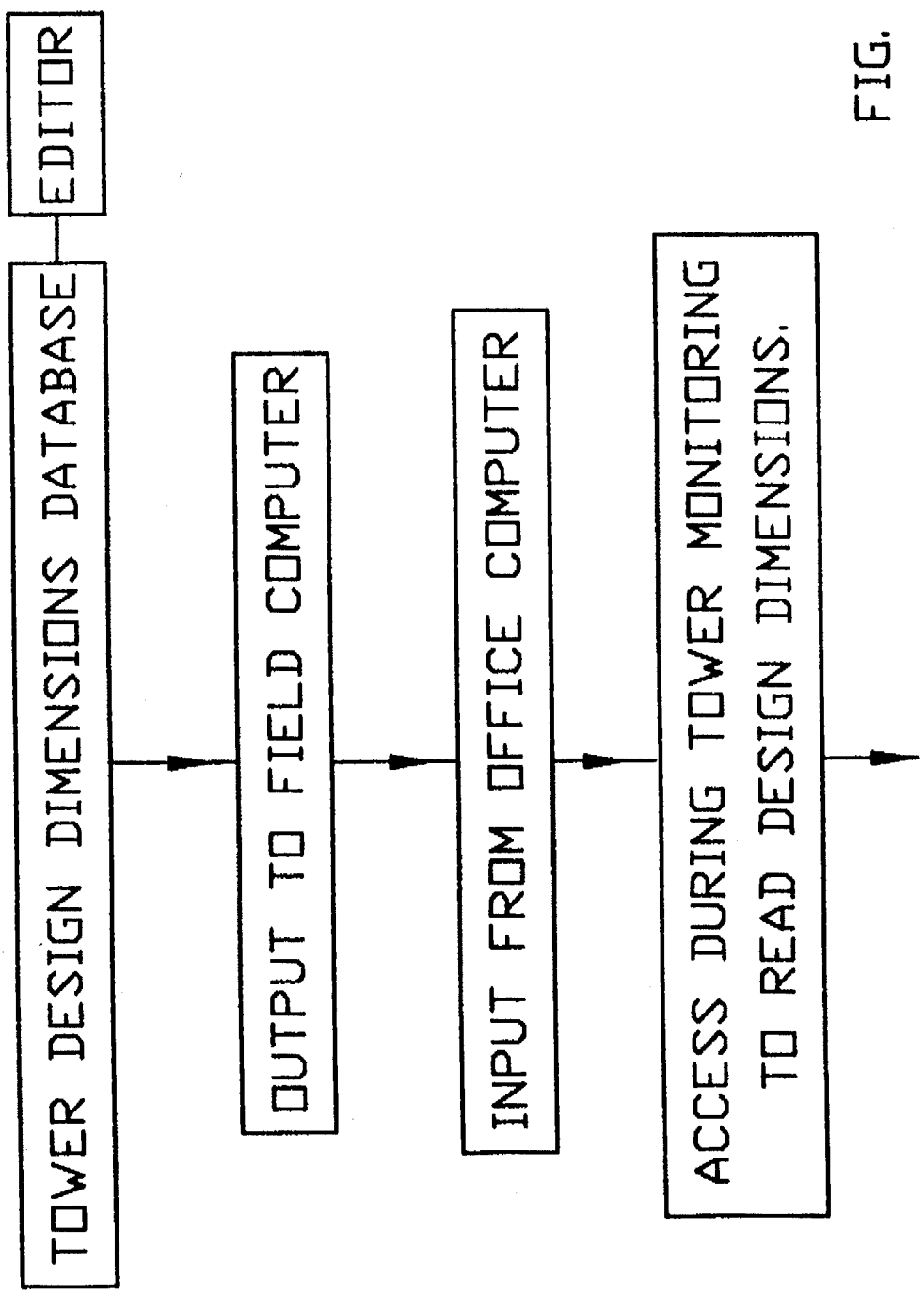
FIGS. 11A–B is a general overview of the data flow of the tower design file.
Figure 11B:
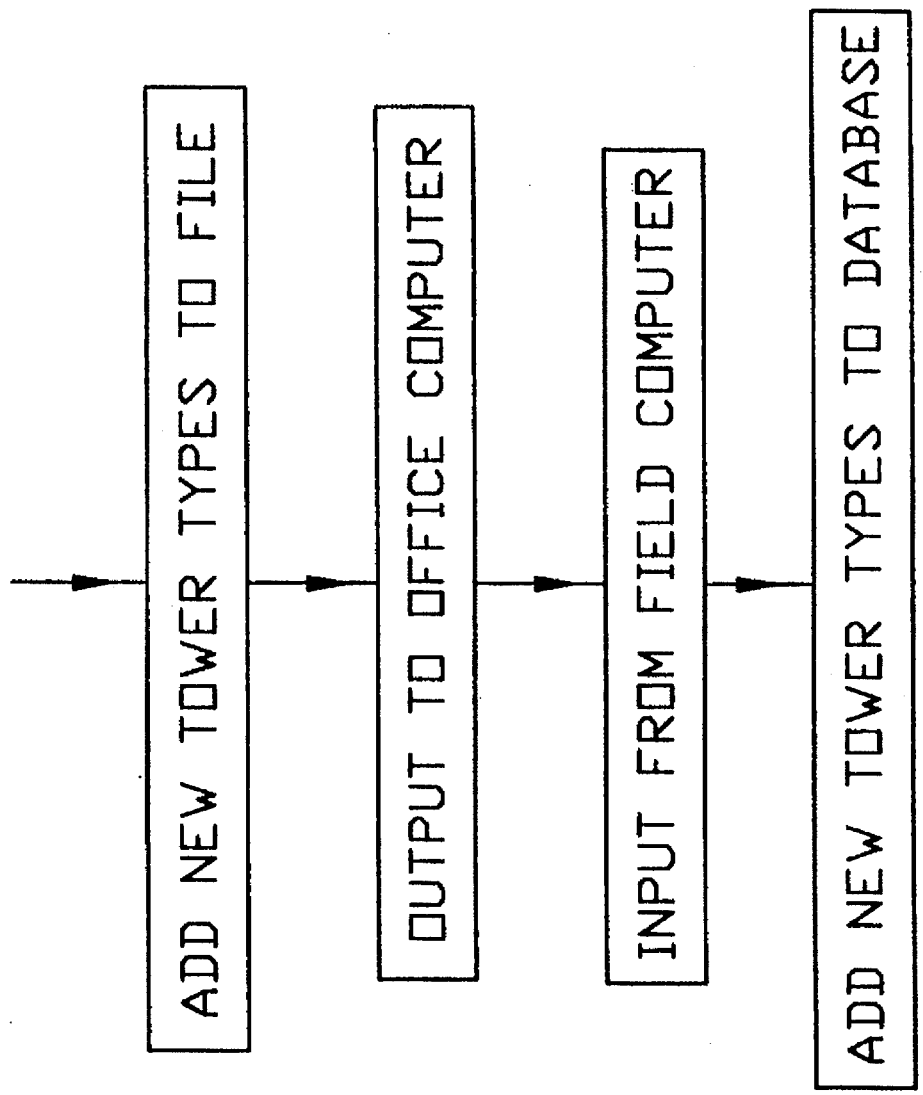
Figure 12A:
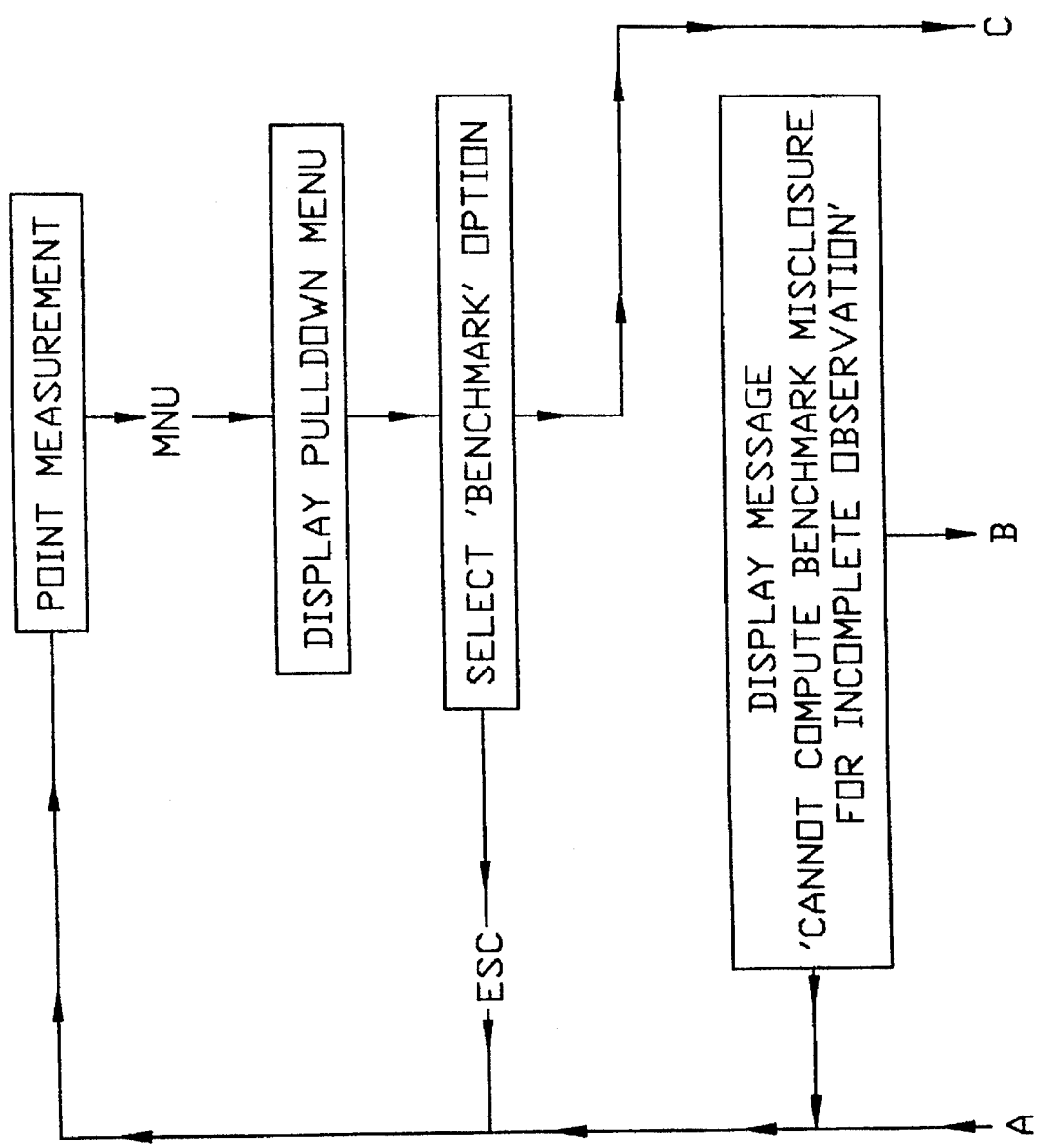
FIGS. 12A–B is the benchmark comparison program flow chart.
Figure 12B:
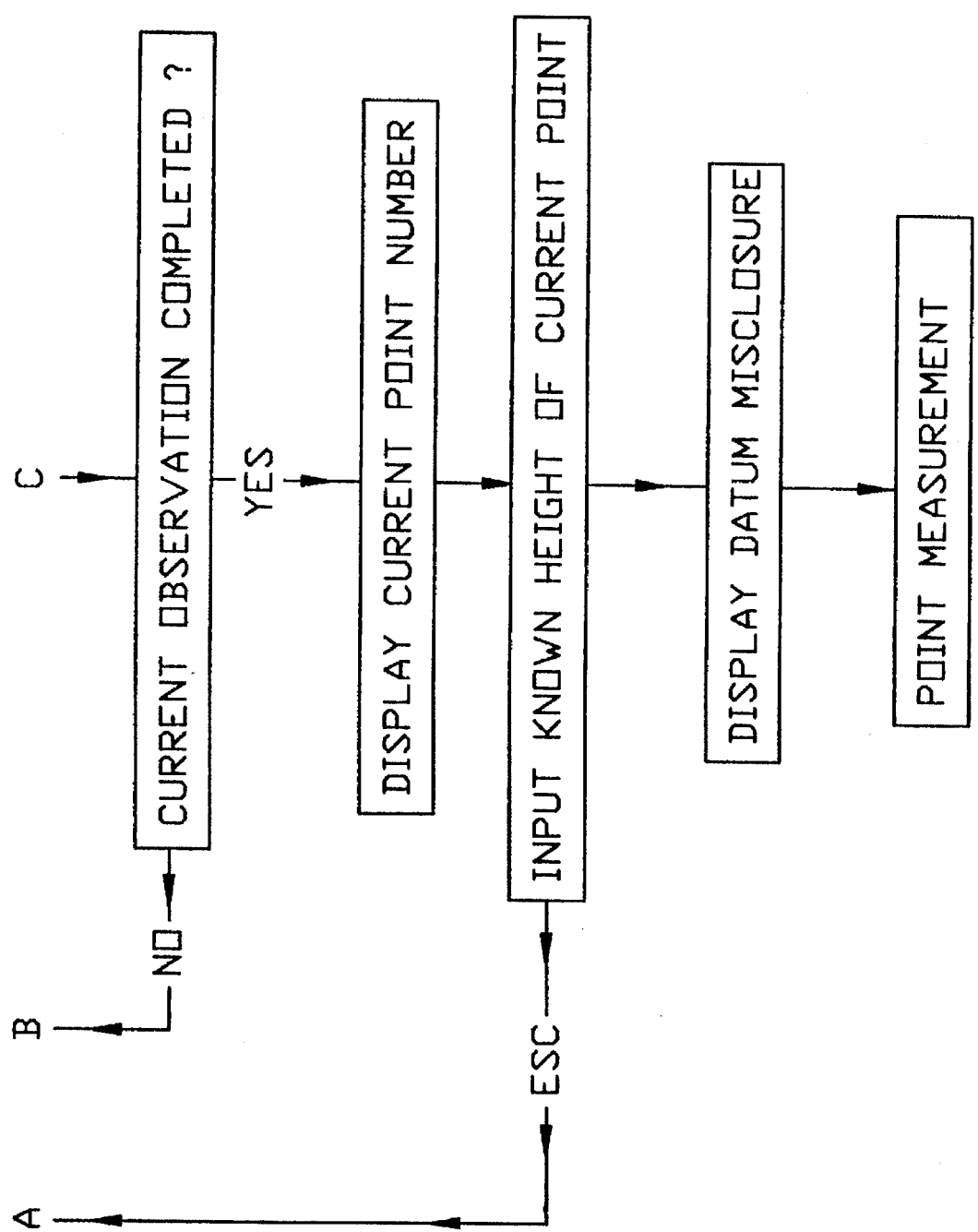

The contents of the Tower Design file are:
Tower Type
Design Height above Stub
Cross-Arm Length (Left)
Cross-Arm Length (Right)
Angle of Deviation In order to facilitate low voltage lines, an alternative to the Tower Monitoring function has been provided. This new function, the Pole Recording function, is shown in FIGS. 10C and 10D. This new Pole Recording function basically permits the pole number and type to be recorded, the pole height to be measured, and seven lines of details to be input. The headings on these seven lines are configurable by the end user. These poles are not checked against design information.

Another modification made in order to facilitate low voltage lines is the facility to observe a number of sections of line in a single job. The termination points are now defined by the positions where the line changes direction (Angle Poles or Angle Towers). The facility is also given to measure the angle of deviation at these points.

The PoleLine and TowerLine modules are kept separate right throughout the system. The modules are downloaded to two different reception programs, displayed differently, strung with different conductors, referenced with different data-bases and checked against different safety standards. Although these differences occur, the overall approach to both types of powerlines is the same. Essentially they are two aspects of a single program.

Referring now to FIG. 12, the benchmark comparison flow chart is shown. Anywhere along the line, a benchmark may be observed. The height difference between the computed height for this point and its given value is displayed.

Figure 13A:
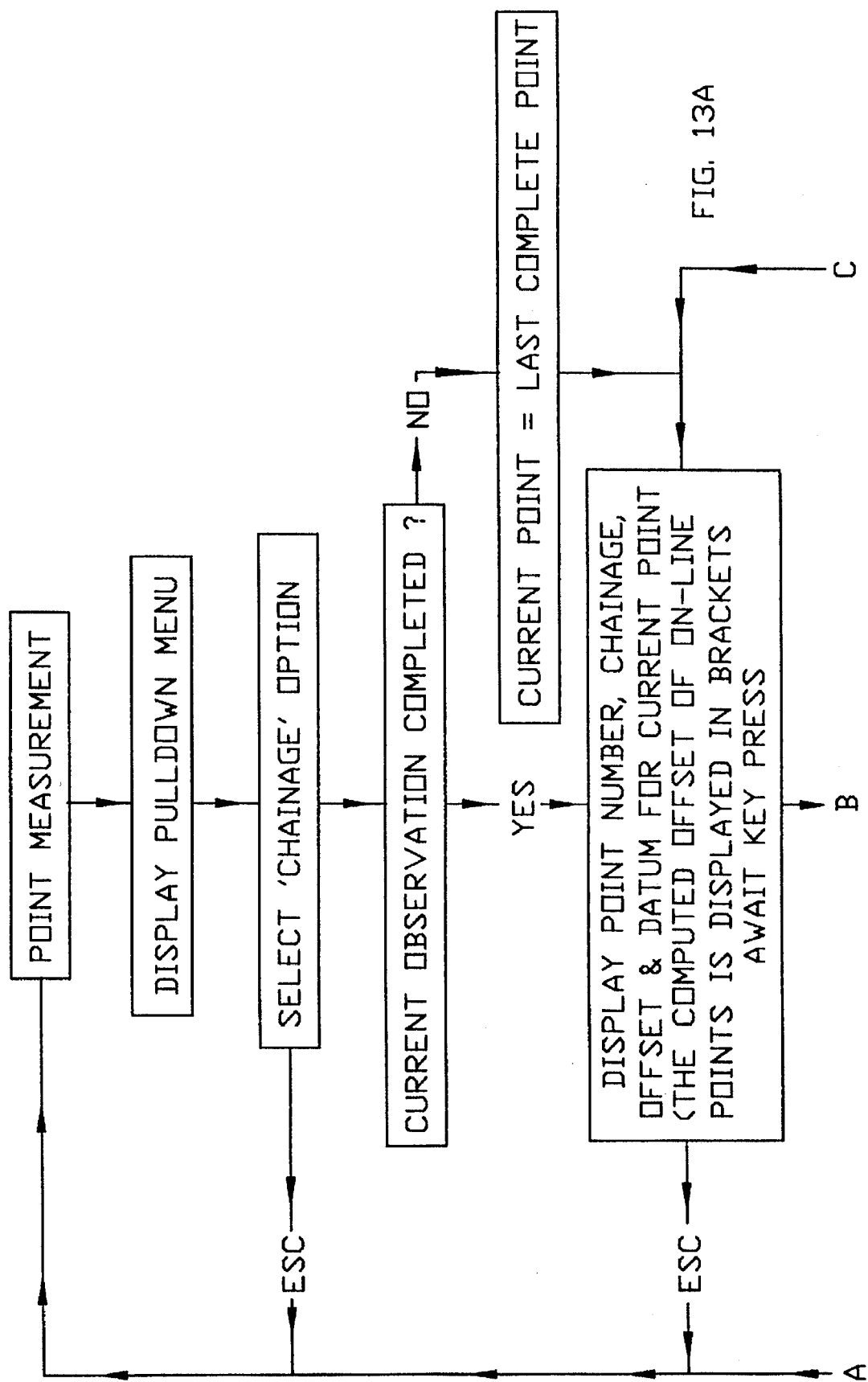
FIGS. 13A–B is the chainage, offset and datum display program.
Figure 13B:
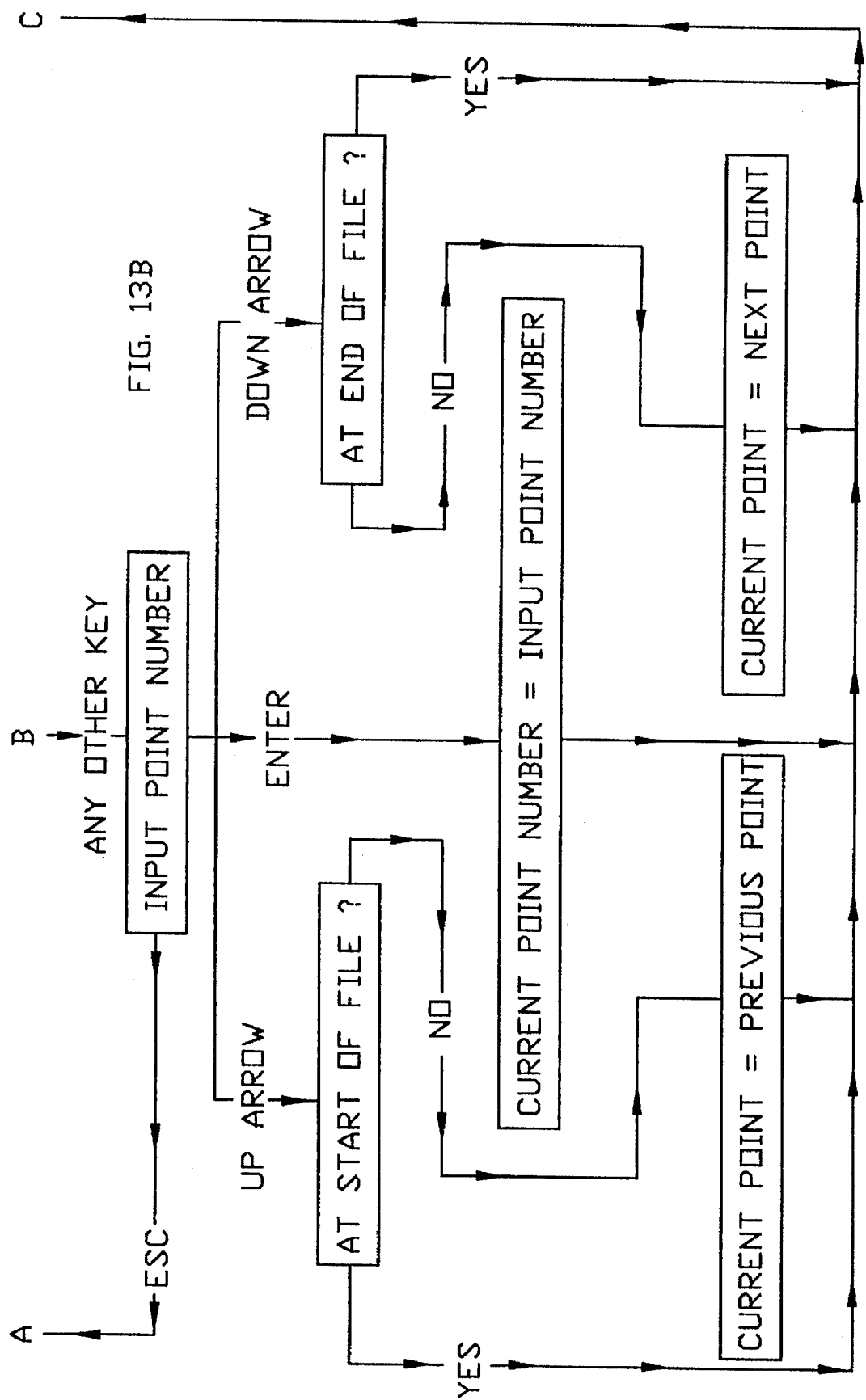
Figures 1, 14A:
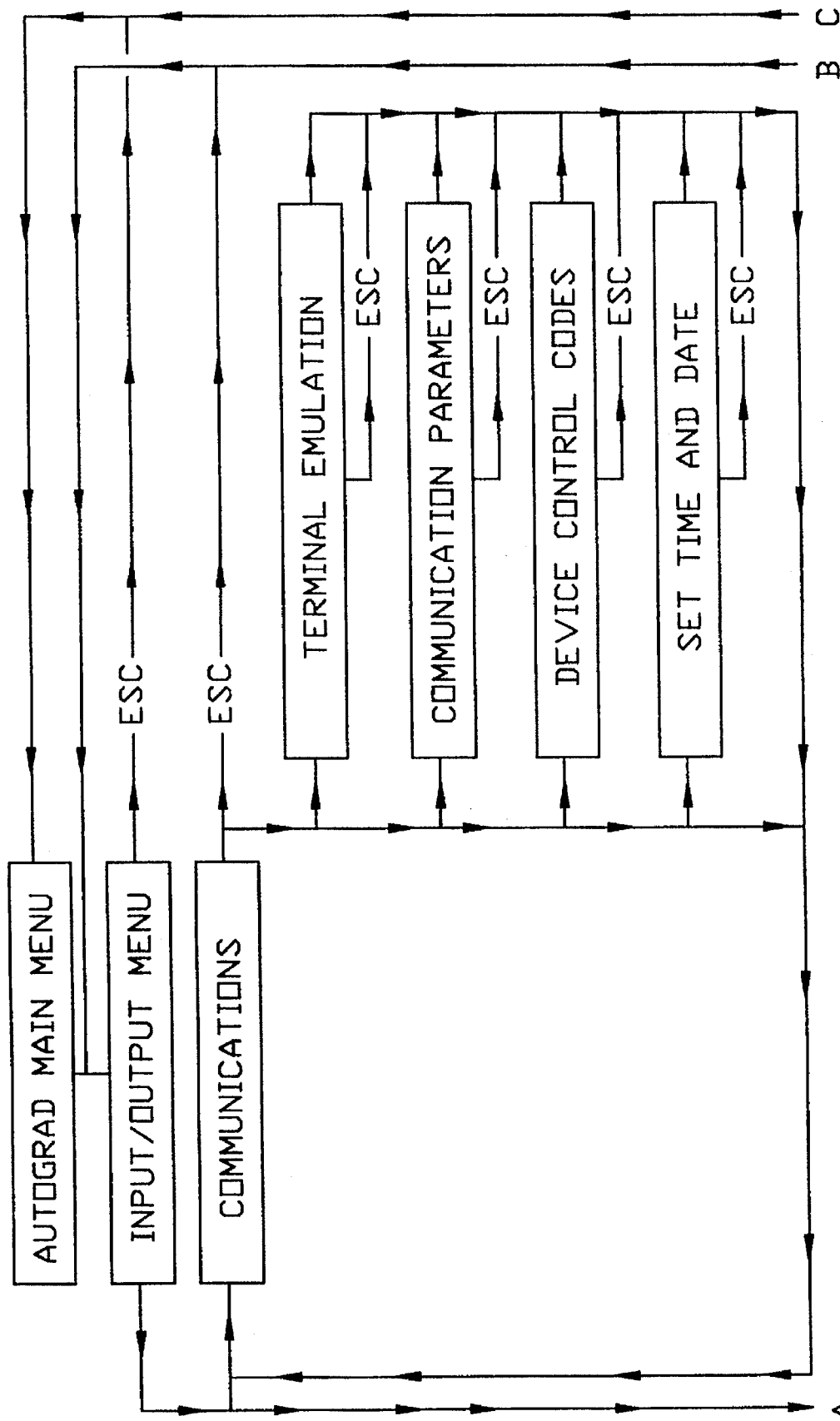
FIGS. 14A(I)–C(II) is the input-output flow chart.
Figures 2, 14A:
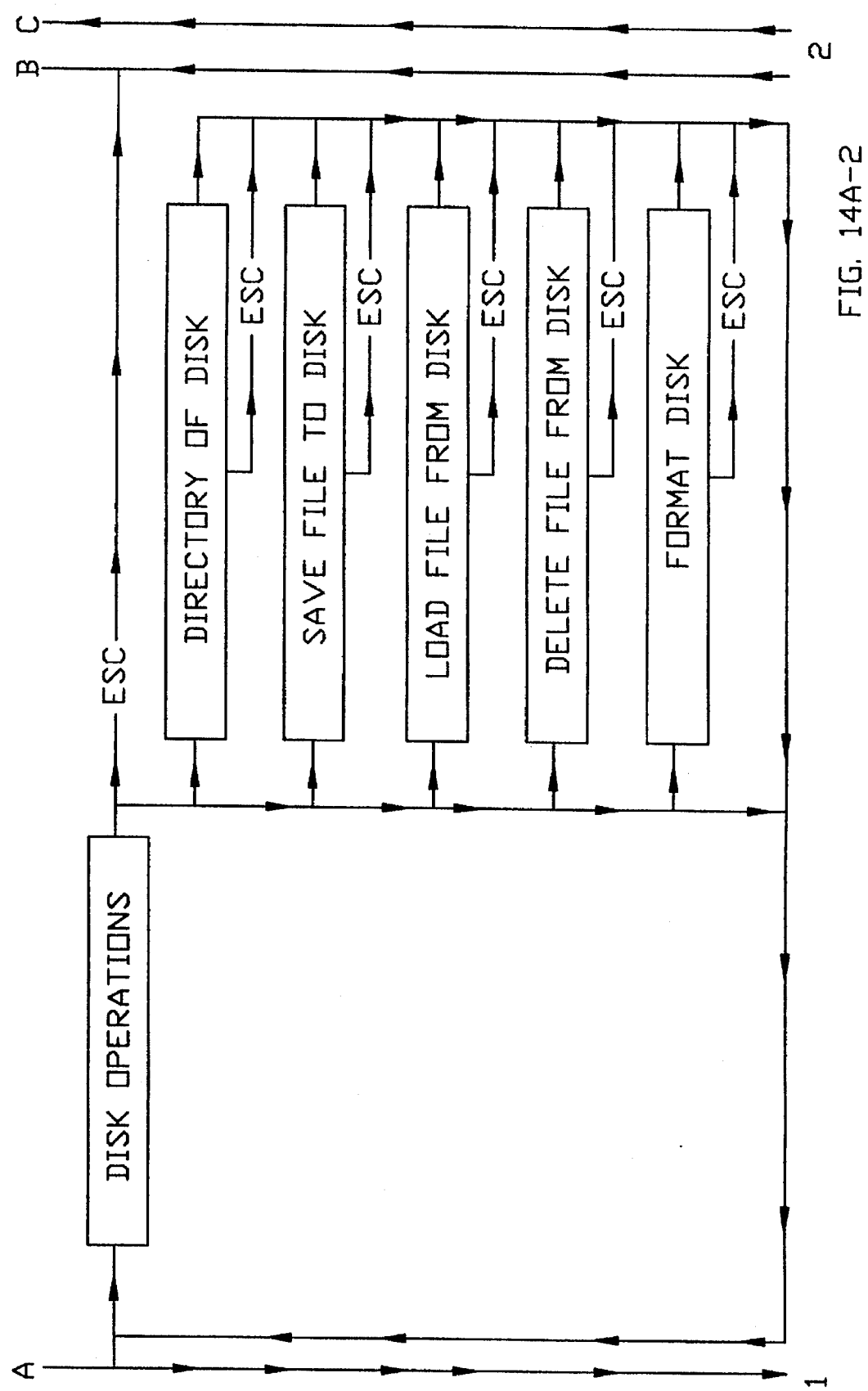
Figures 1, 14B:
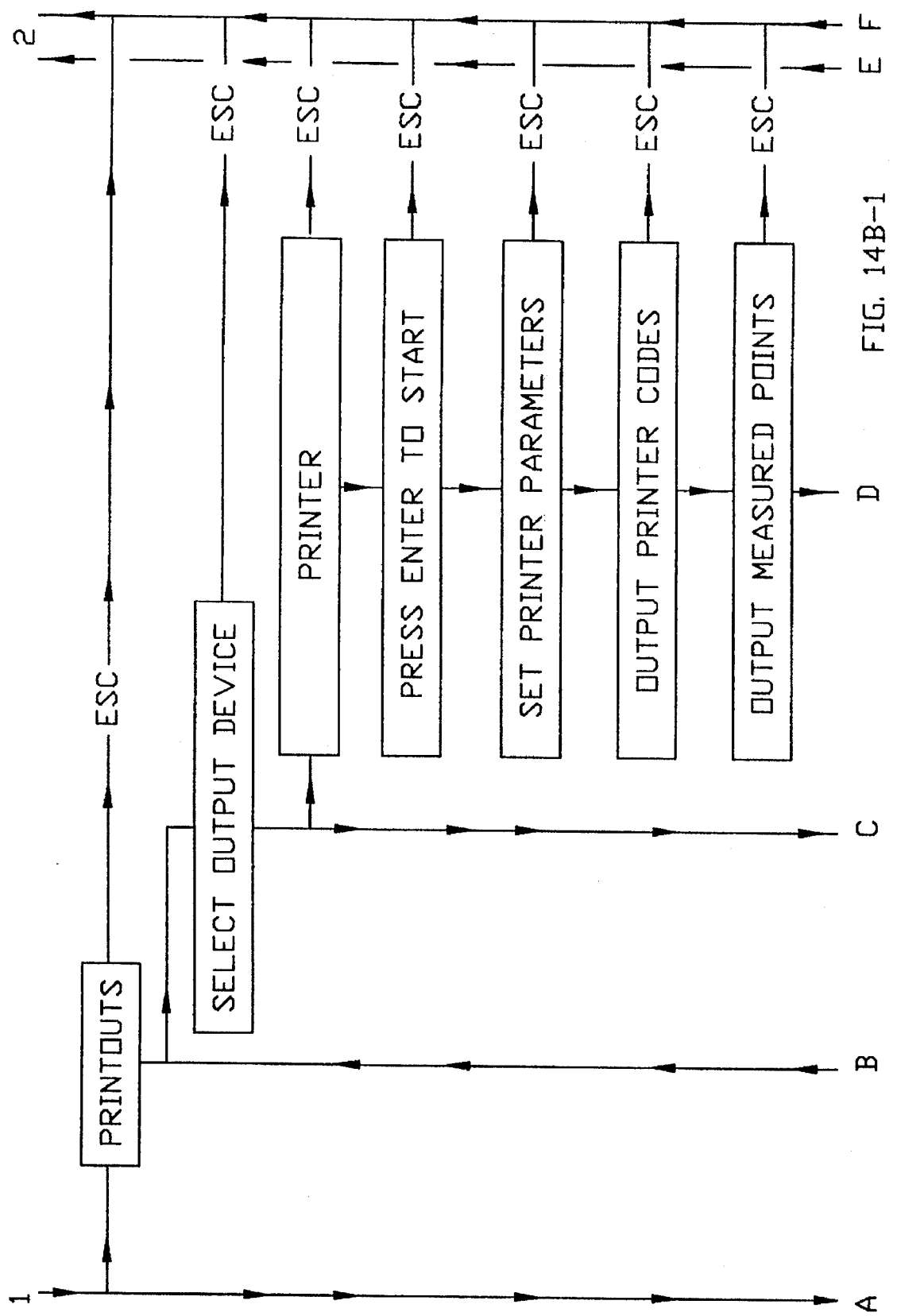
Figures 2, 14B:
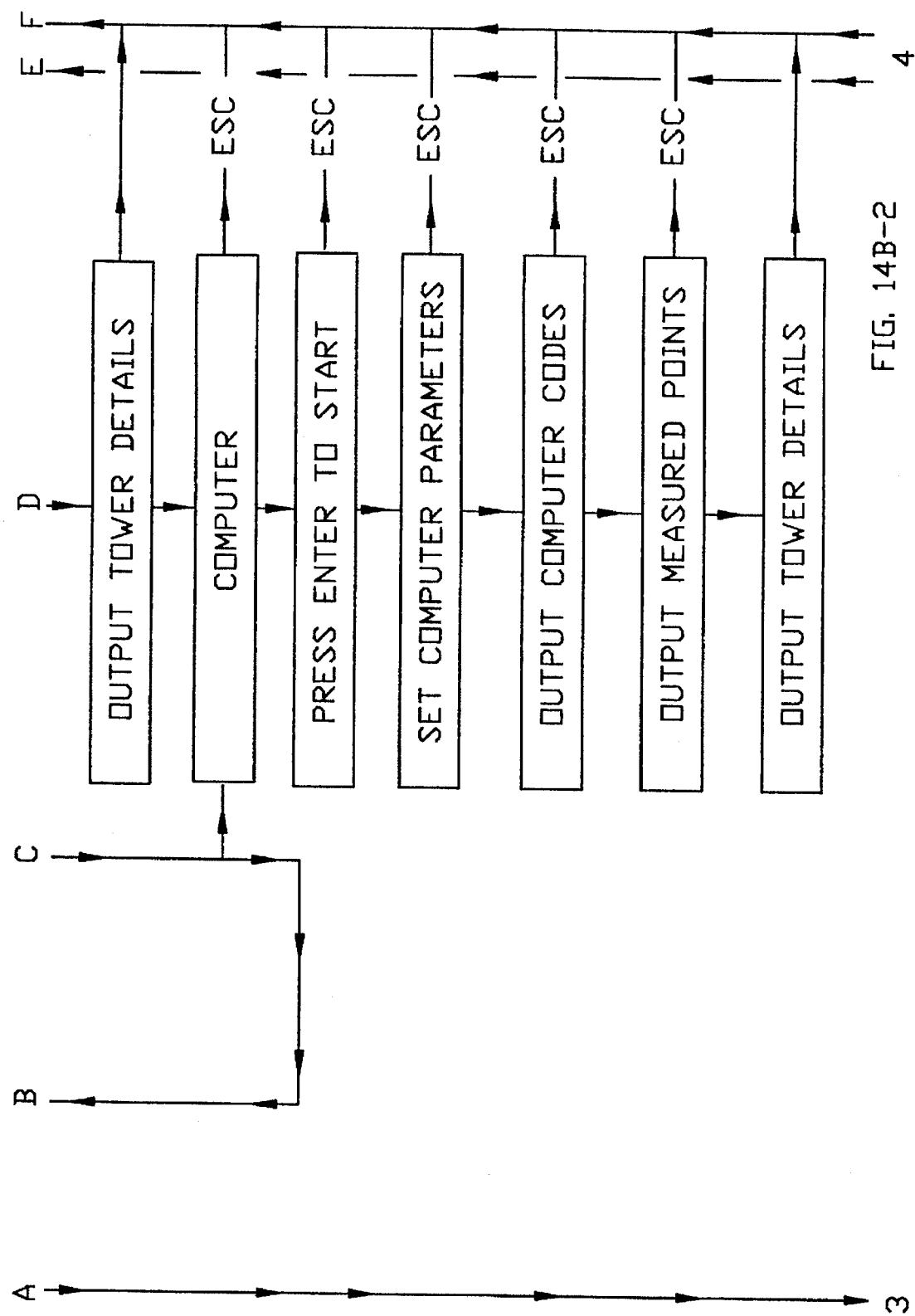
Figures 1, 14C:
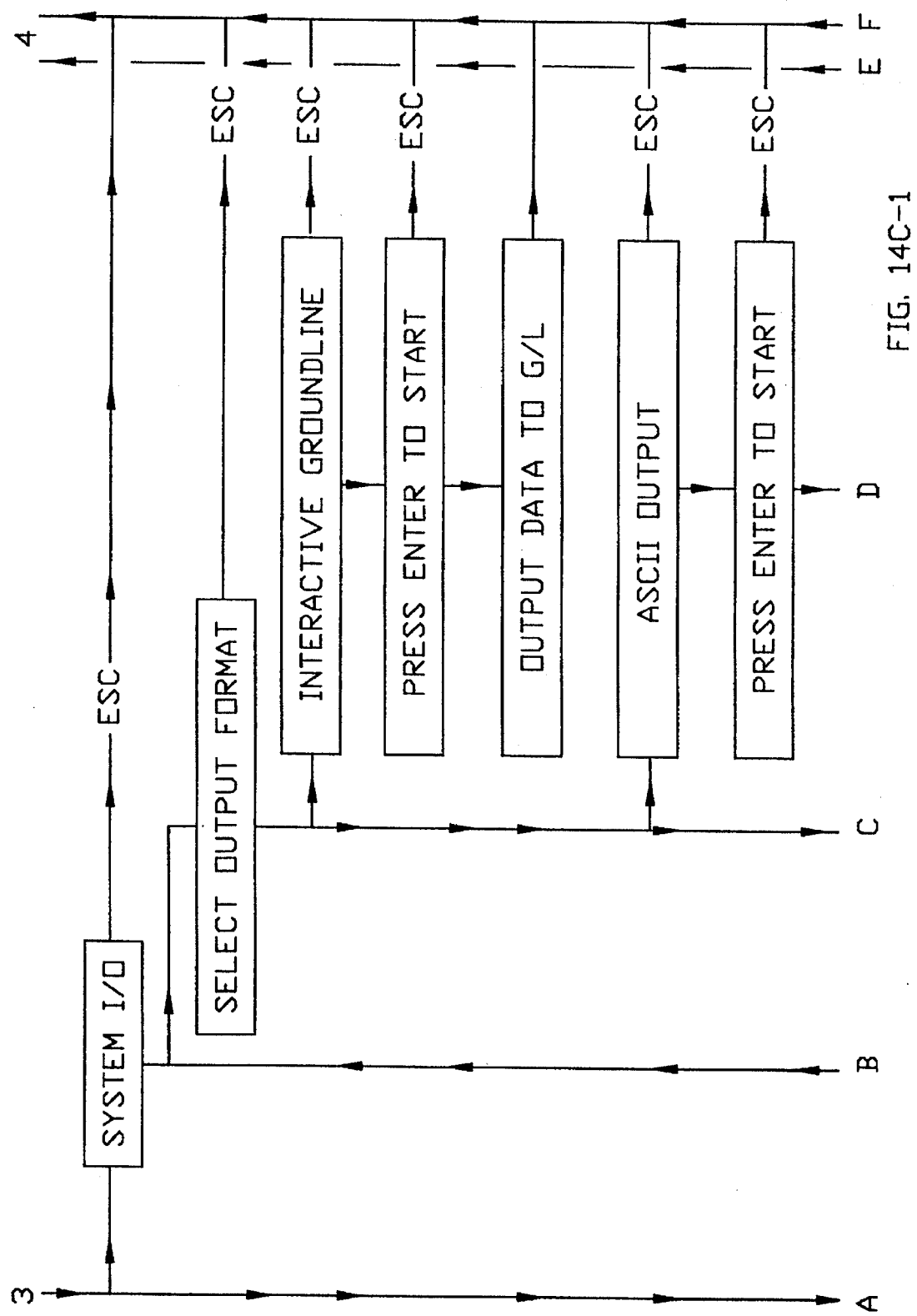
Figures 1, 15A:
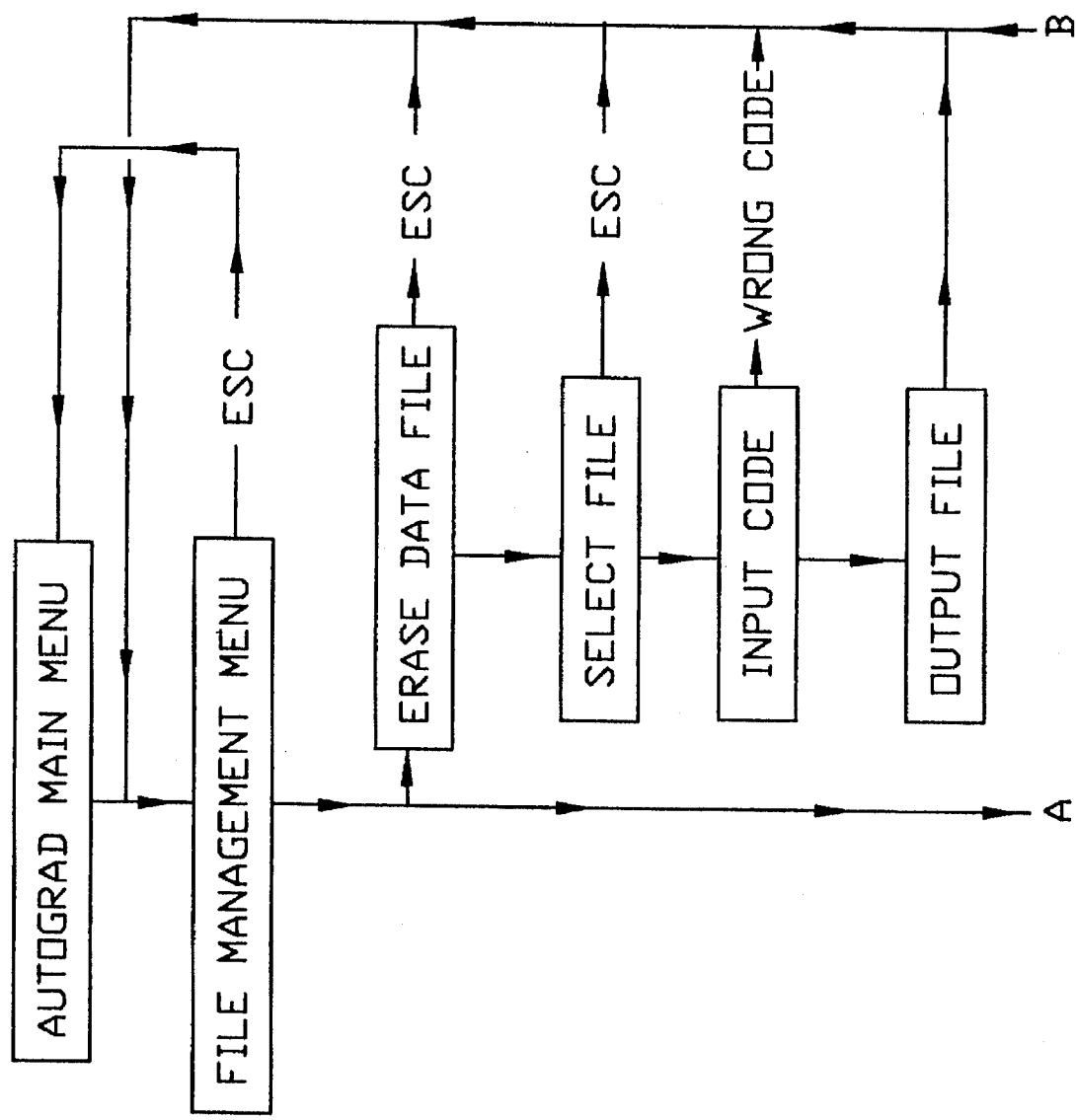
FIGS. 15A(I)–D(II) is the file management flow chart.
Figures 2, 15A:
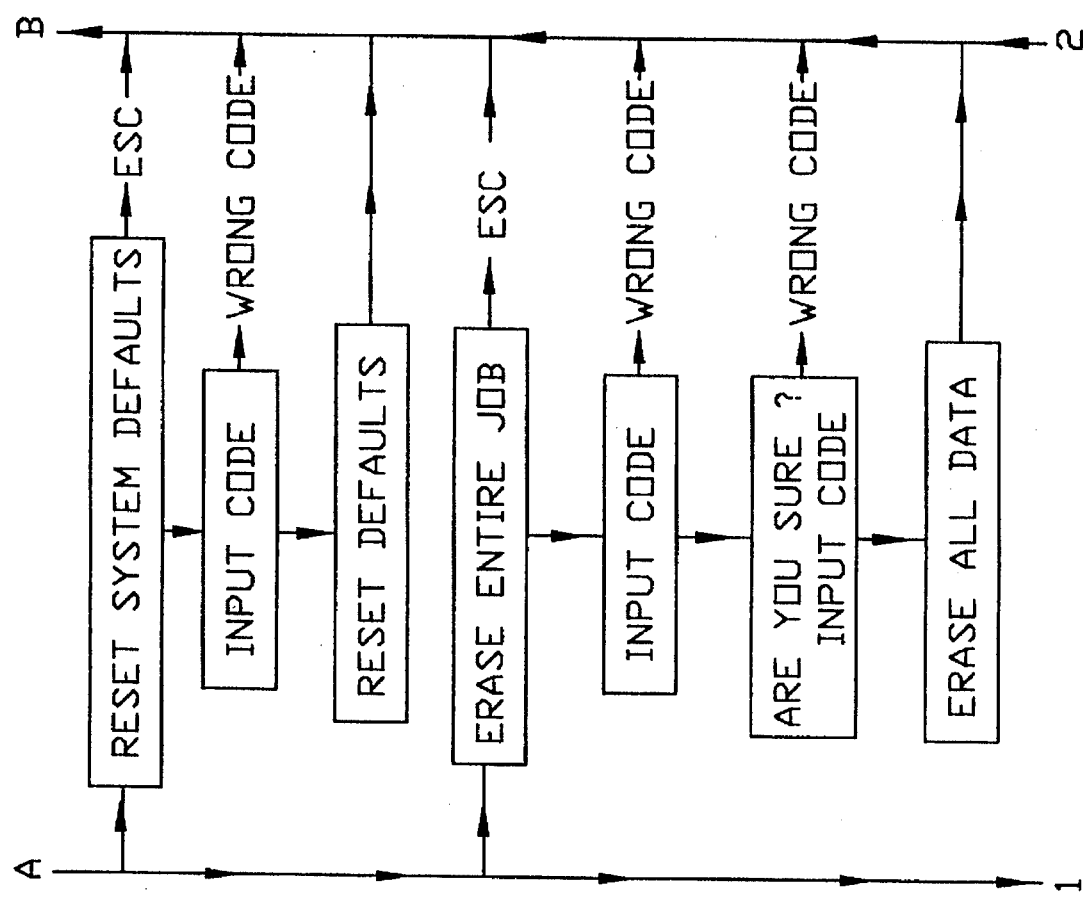
Figures 1, 15B:
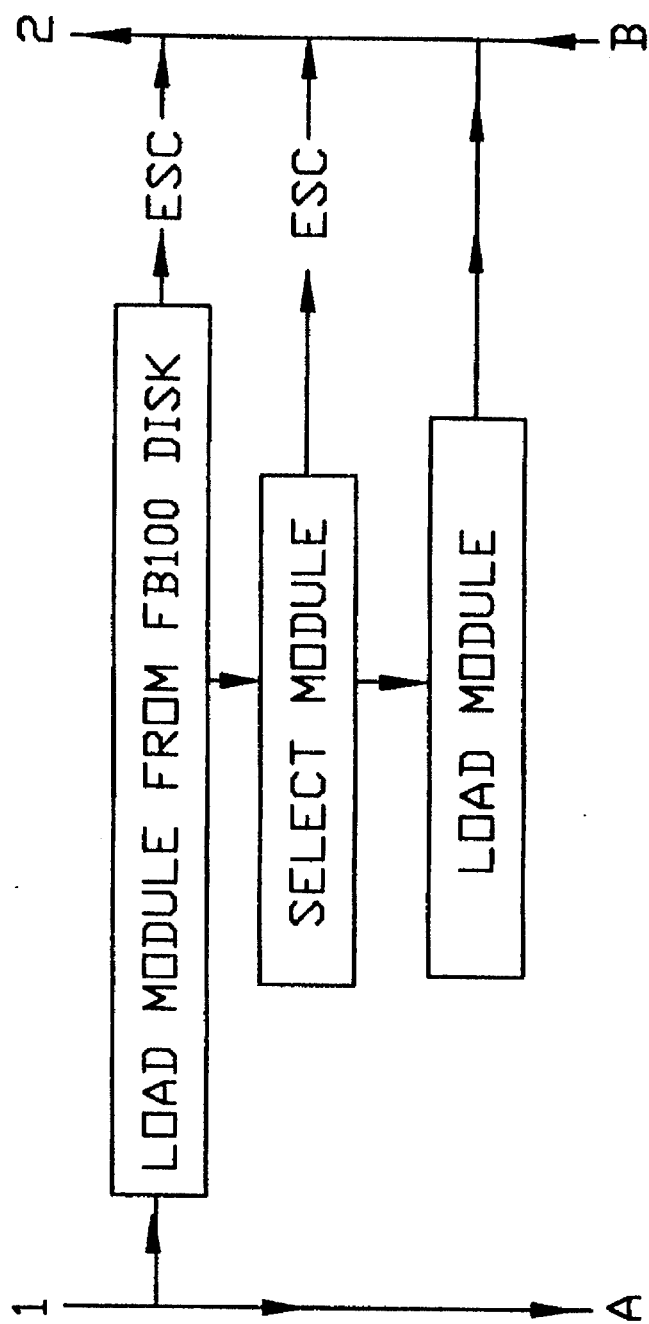
Figures 2, 15B:
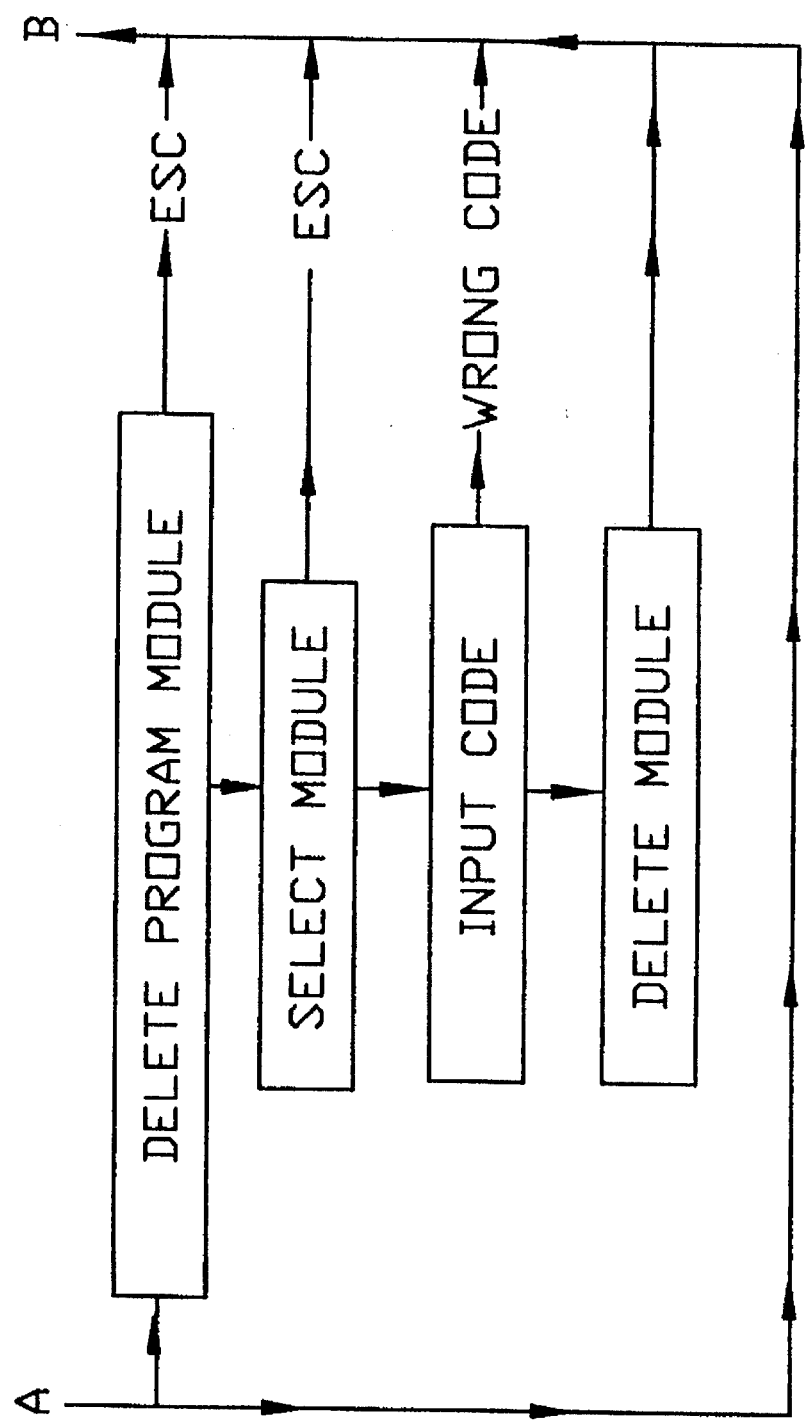
Figure 16A:
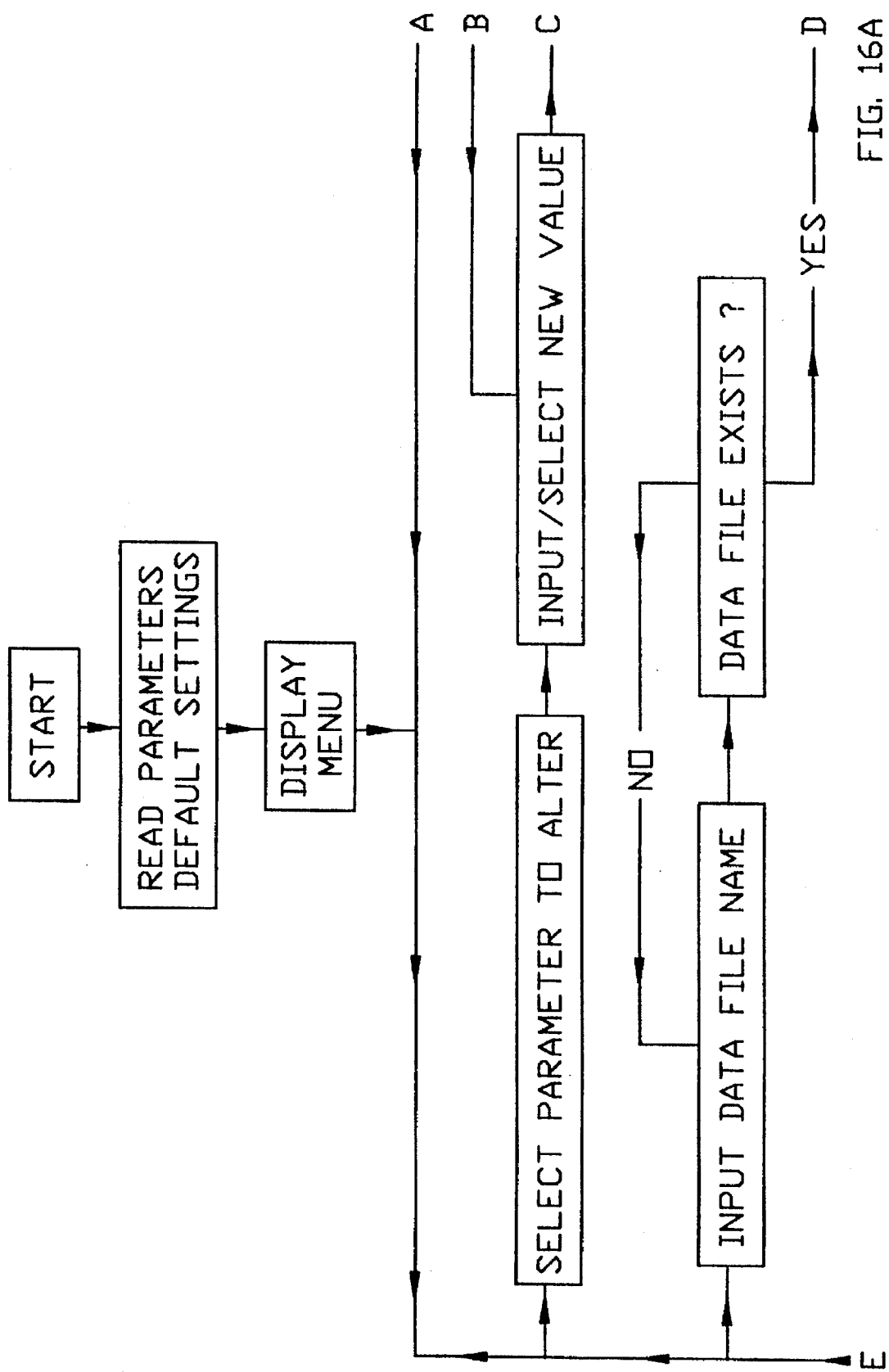
FIGS. 16A–D is the flow chart showing the initial menu flowchart of the overhead line profile modelling program.
Figure 16B:
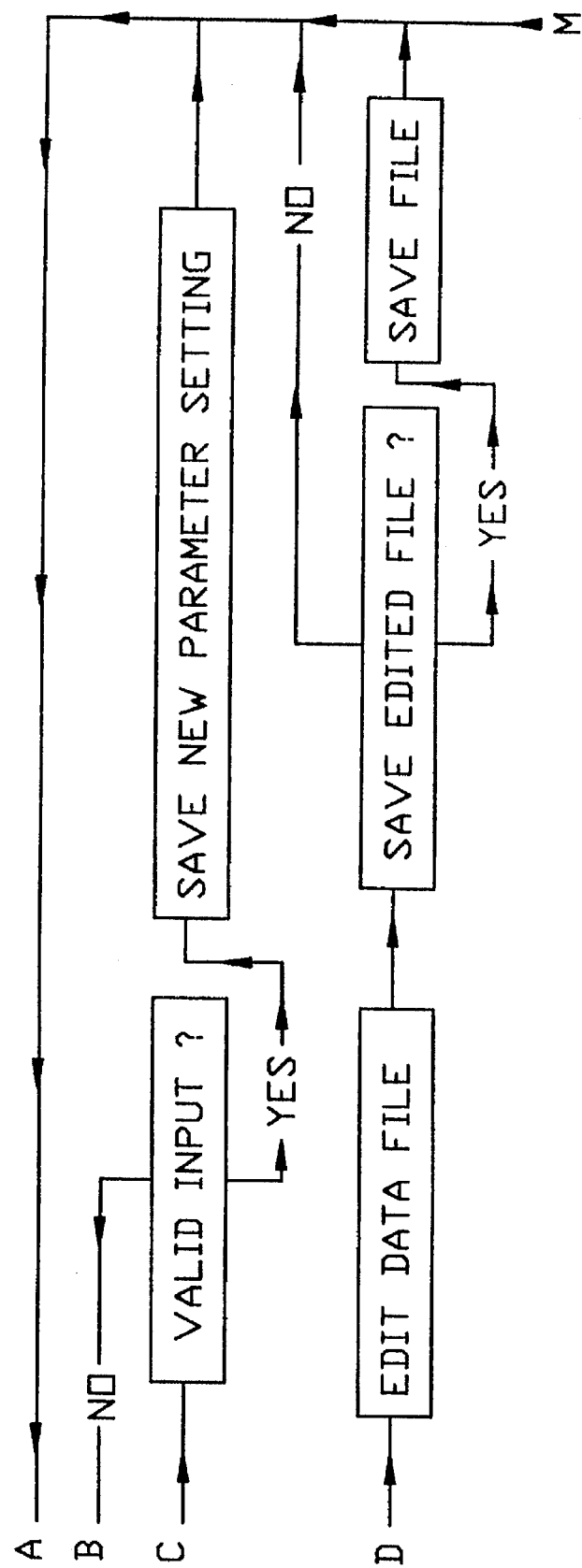
Figure 16C:
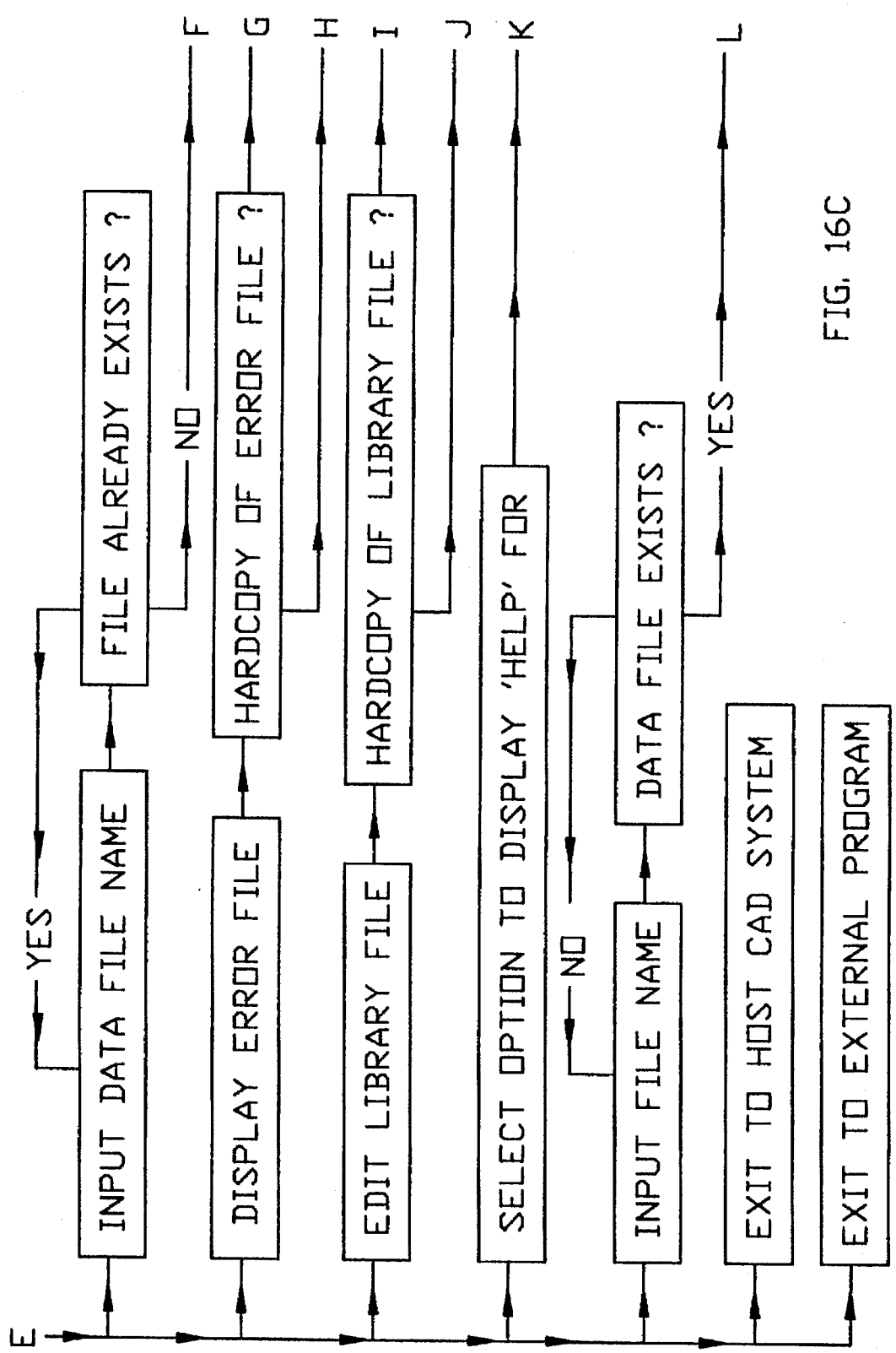
Figure 16D:
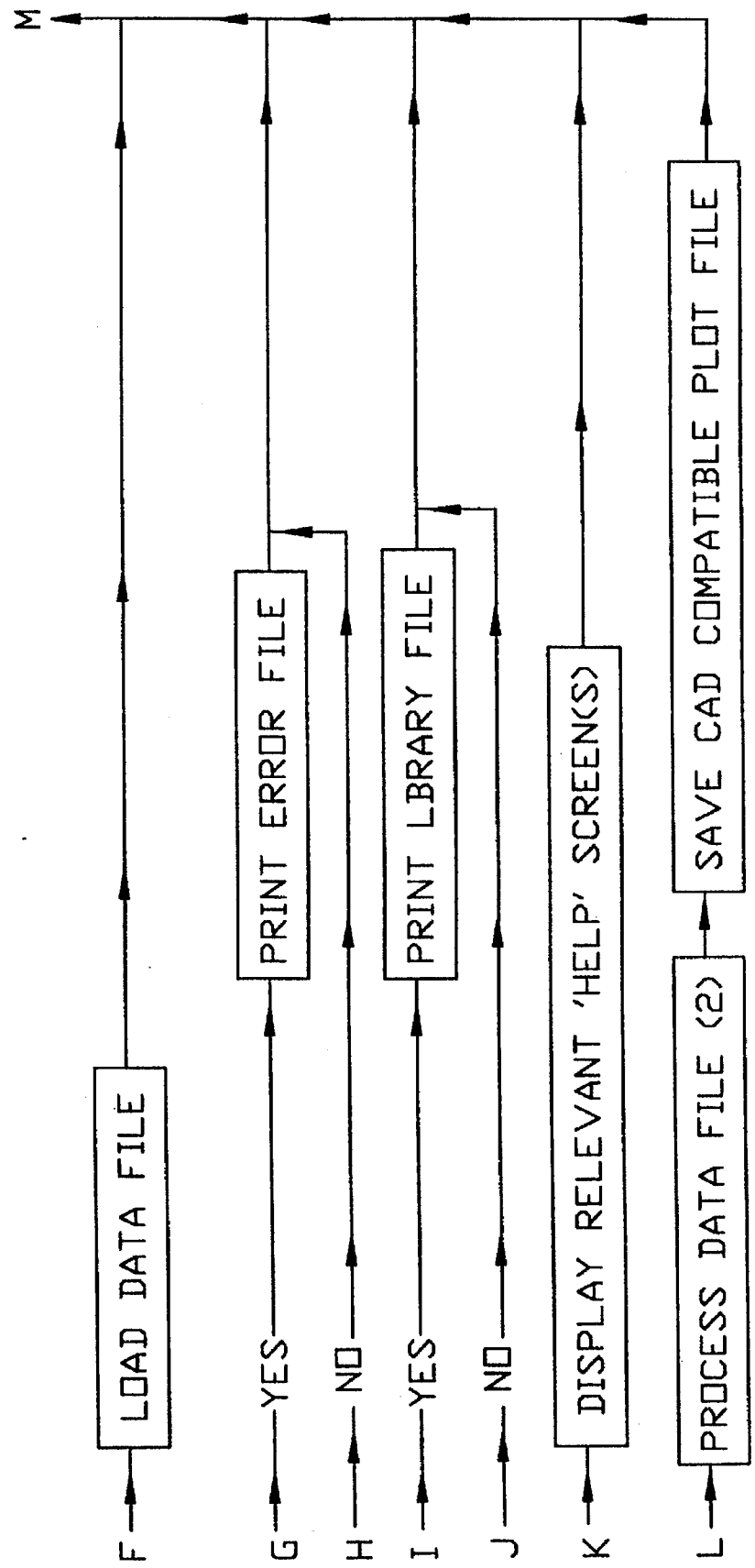
Figures 1, 17A:
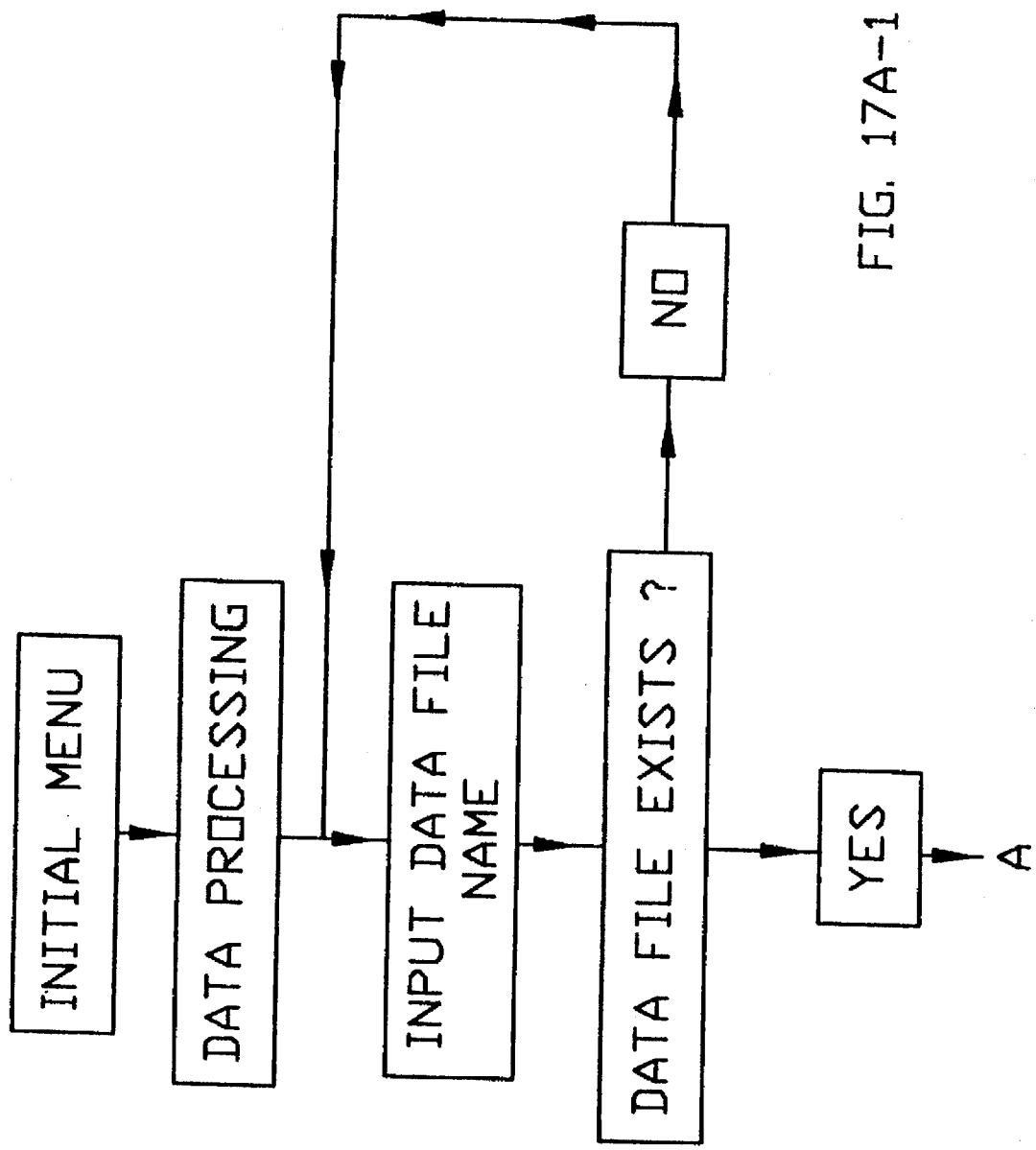
FIGS. 17A(I)–B(II) is a flow chart of the data processing in the overhead line profile modelling program.
Figures 2, 17A:
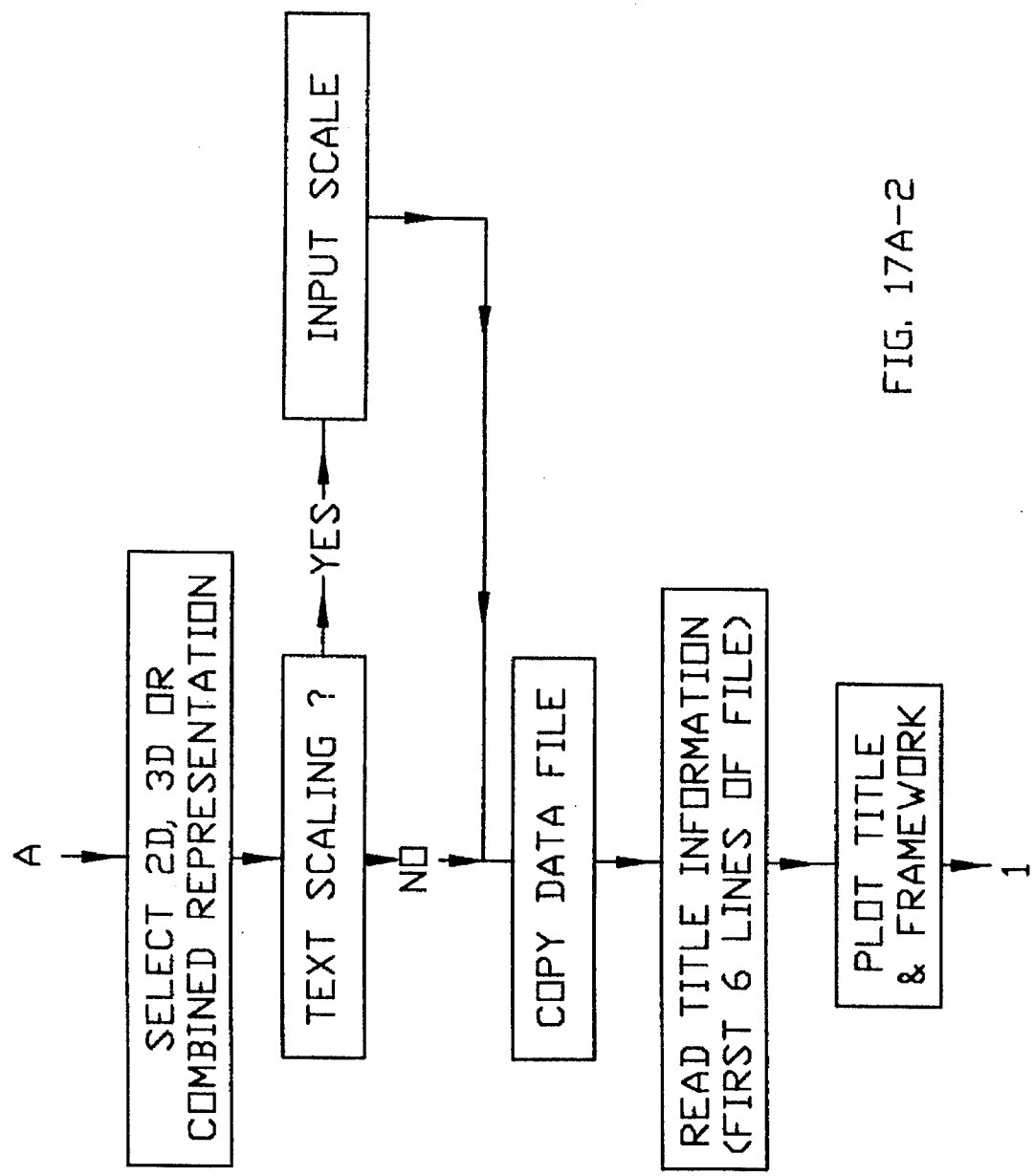
Figures 1, 17B:
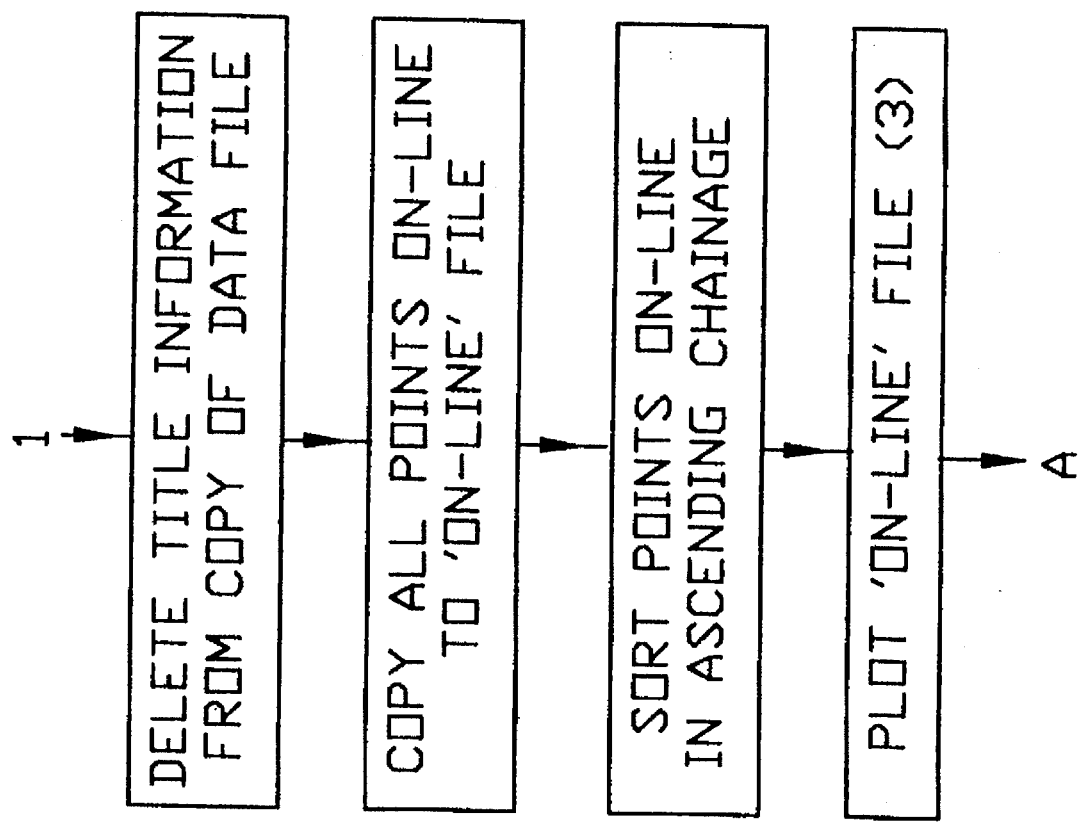
Figures 2, 17B:
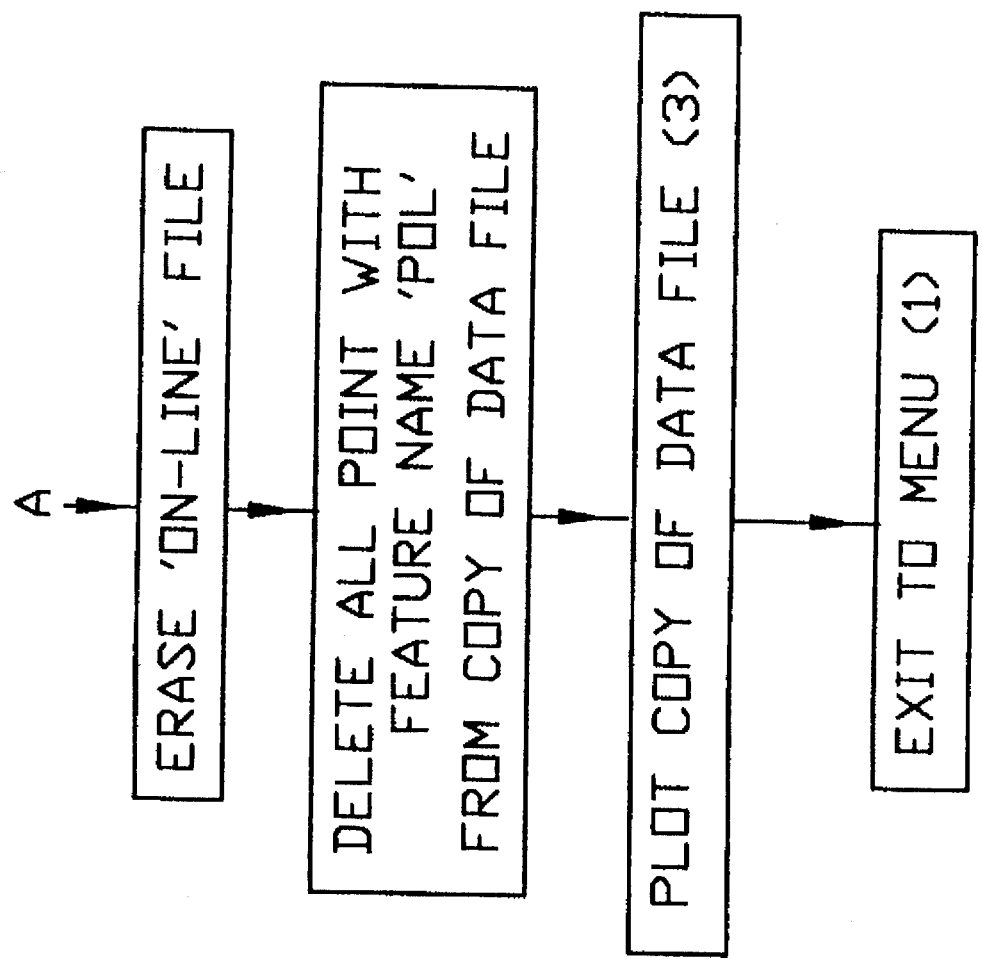
Figures 1, 18A:
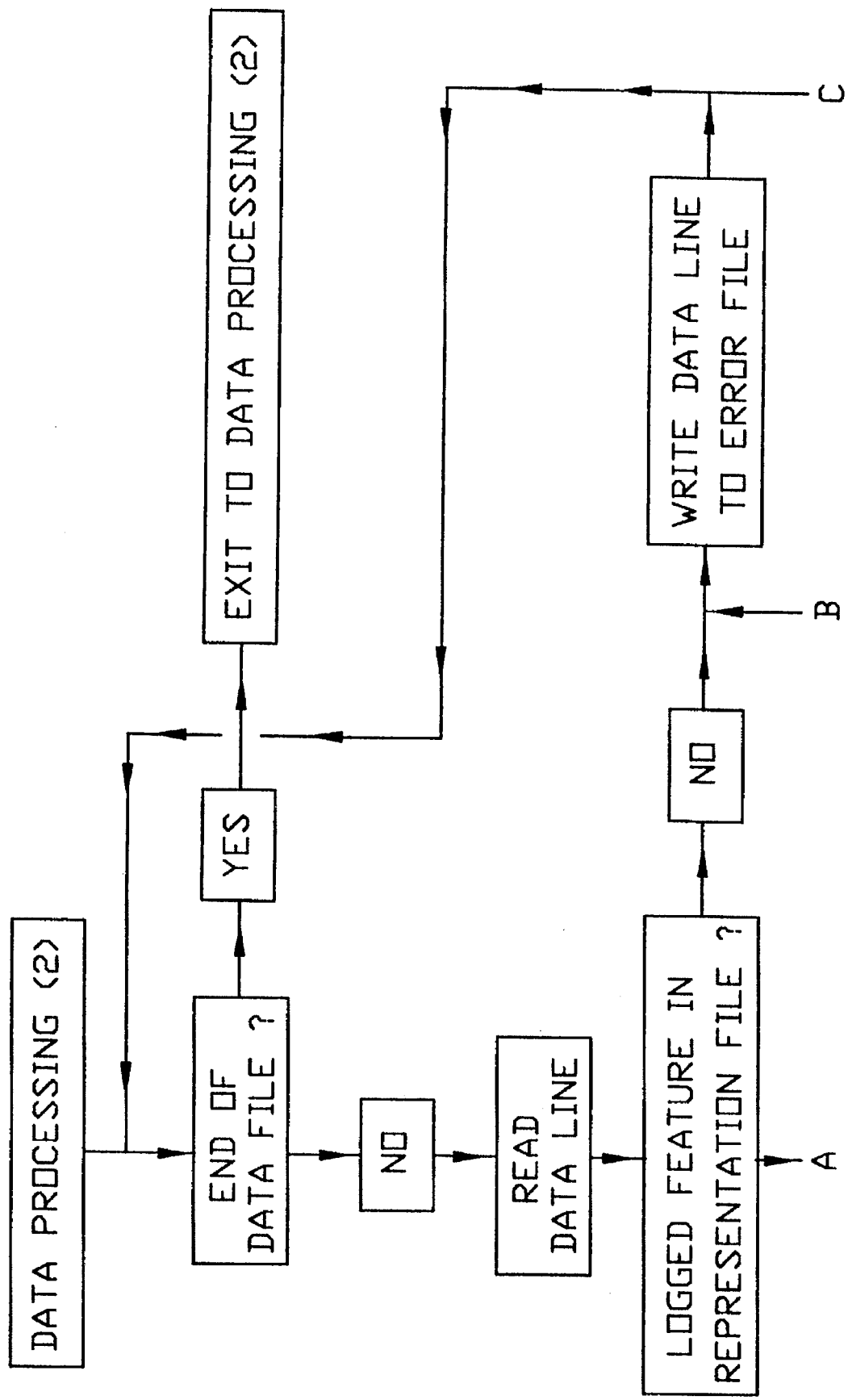
FIGS. 18A(I)–C(II) is the flow chart of the program controlling the plotting of data points in the overhead line profile modelling program.
Figures 2, 18A:
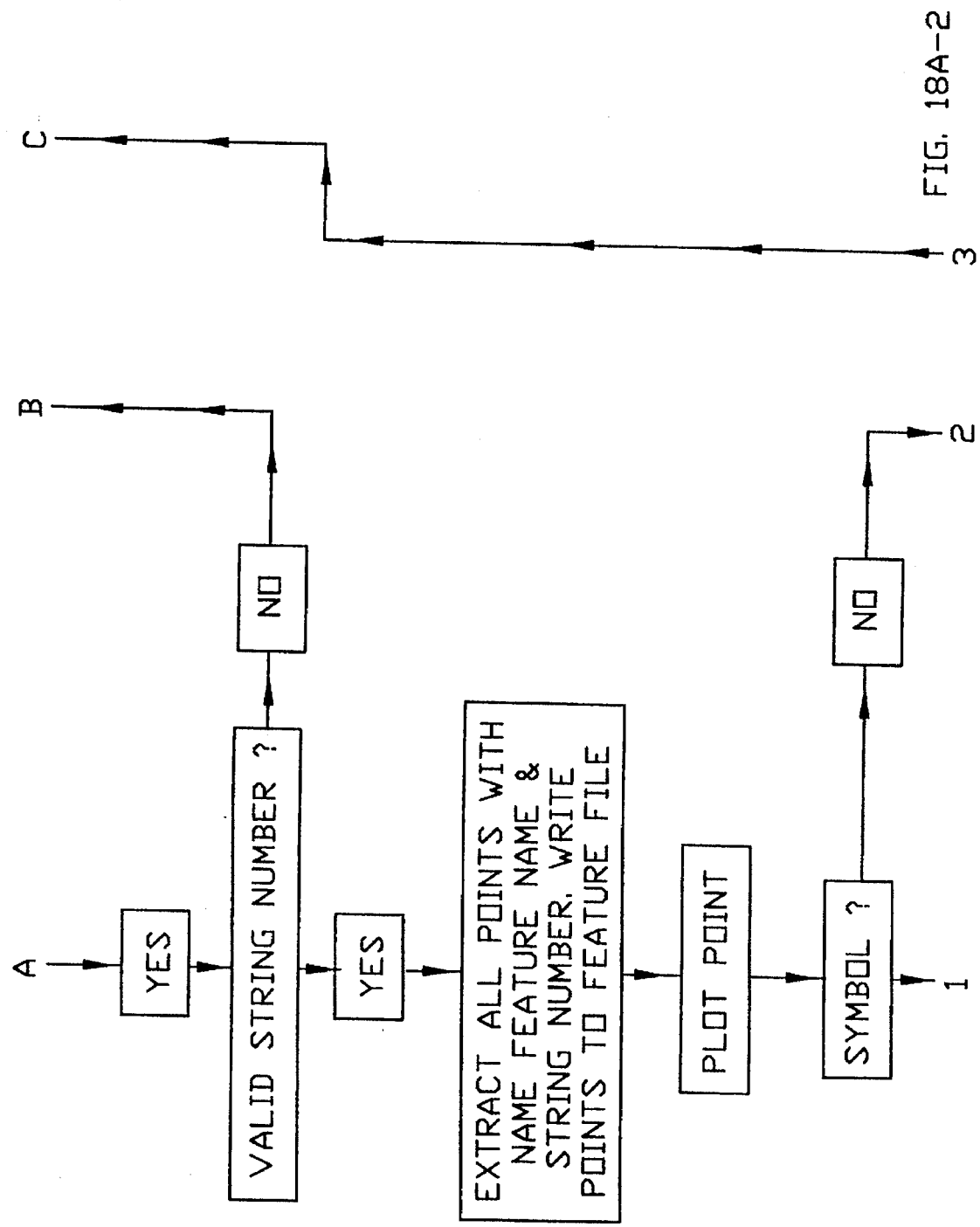
Figures 1, 18B:
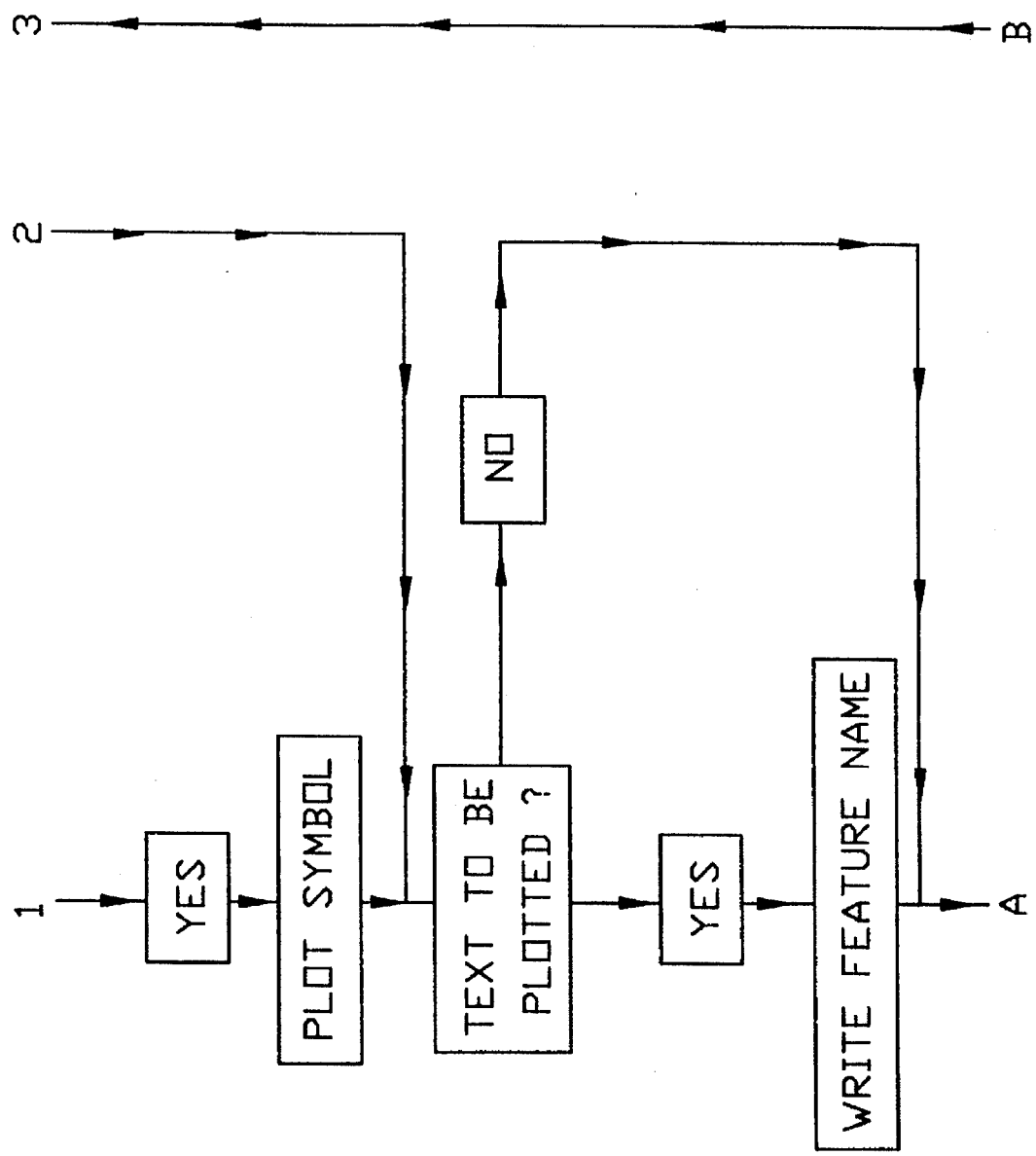
Figures 2, 18B:
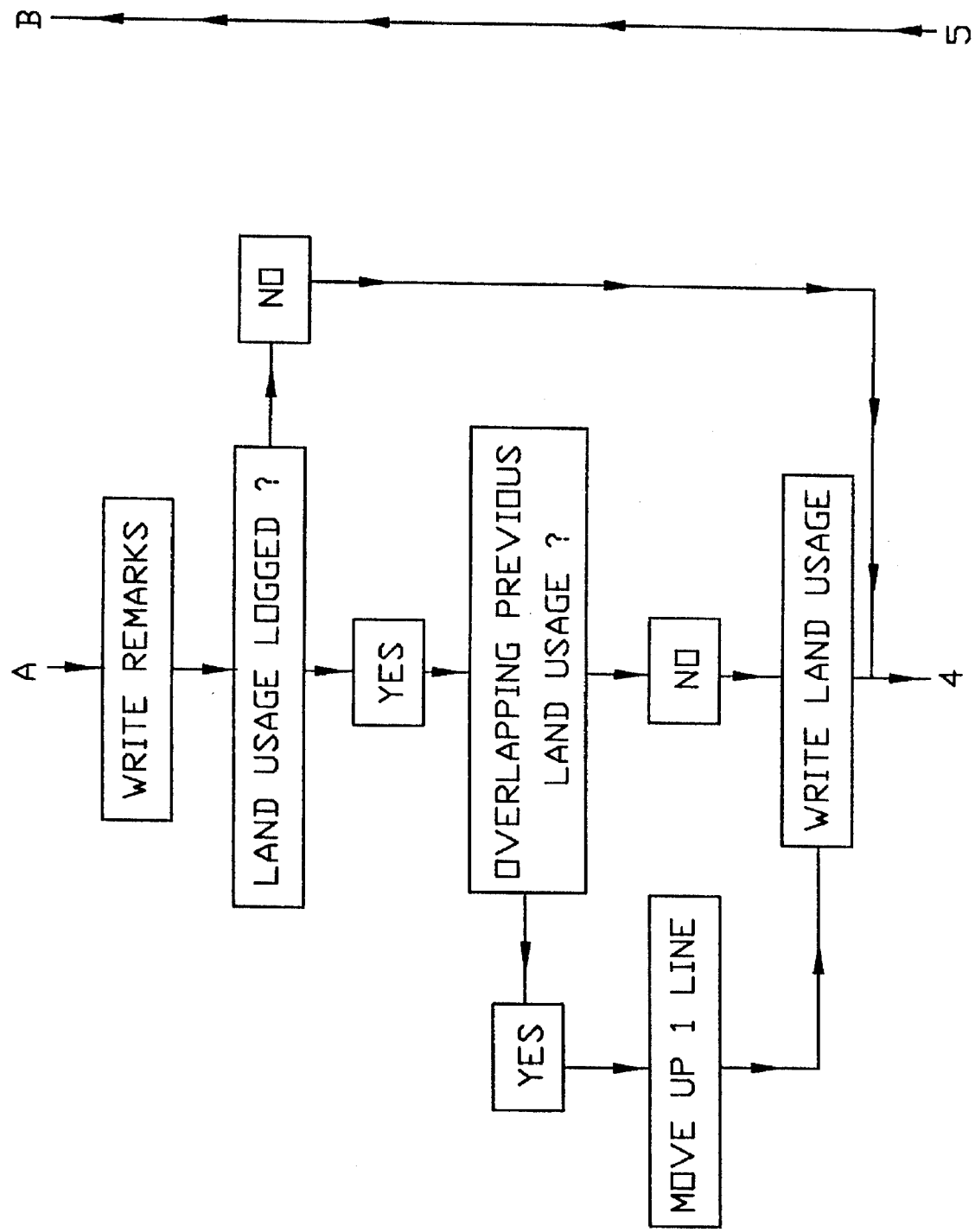
Figures 1, 18C:
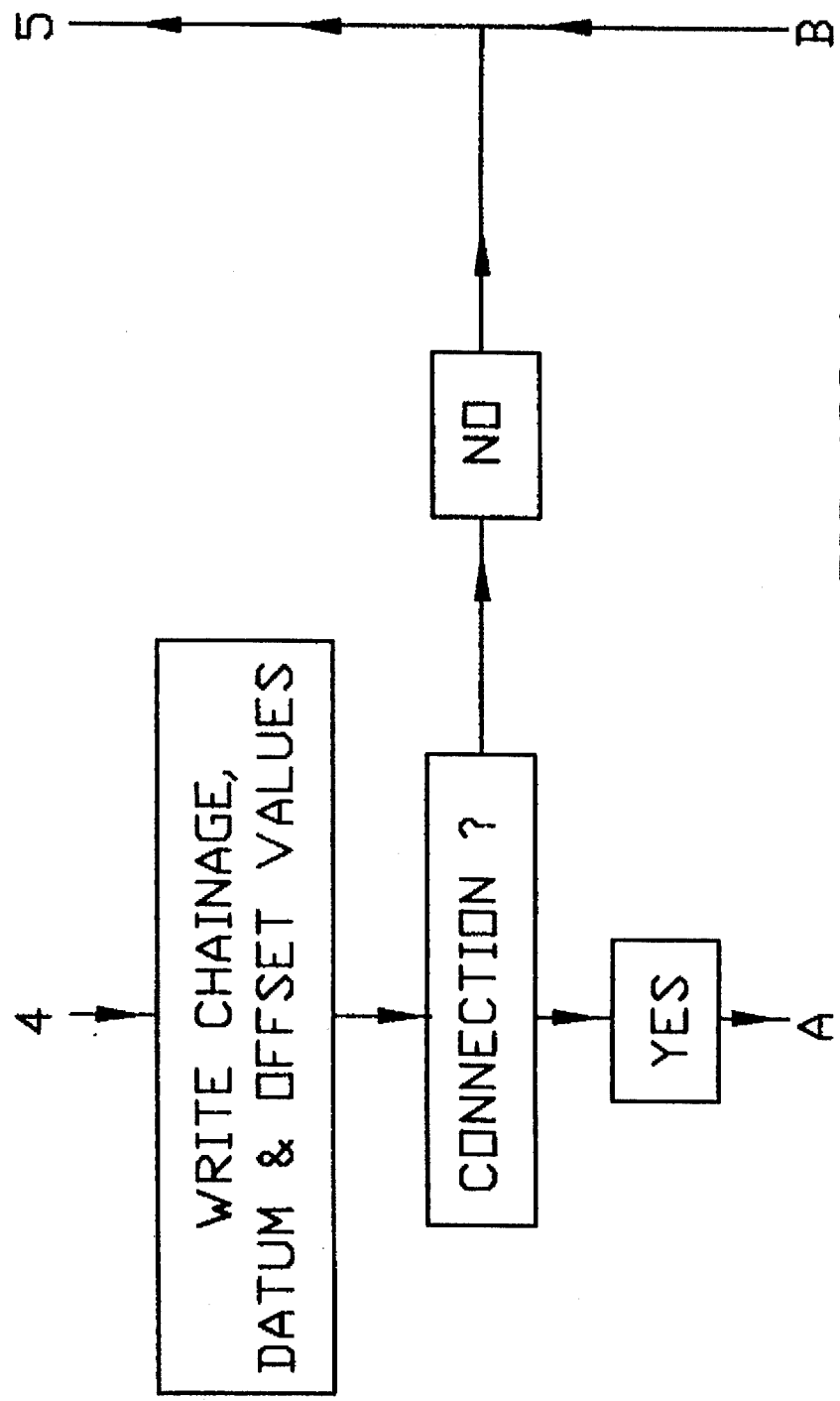
Figures 2, 18C:
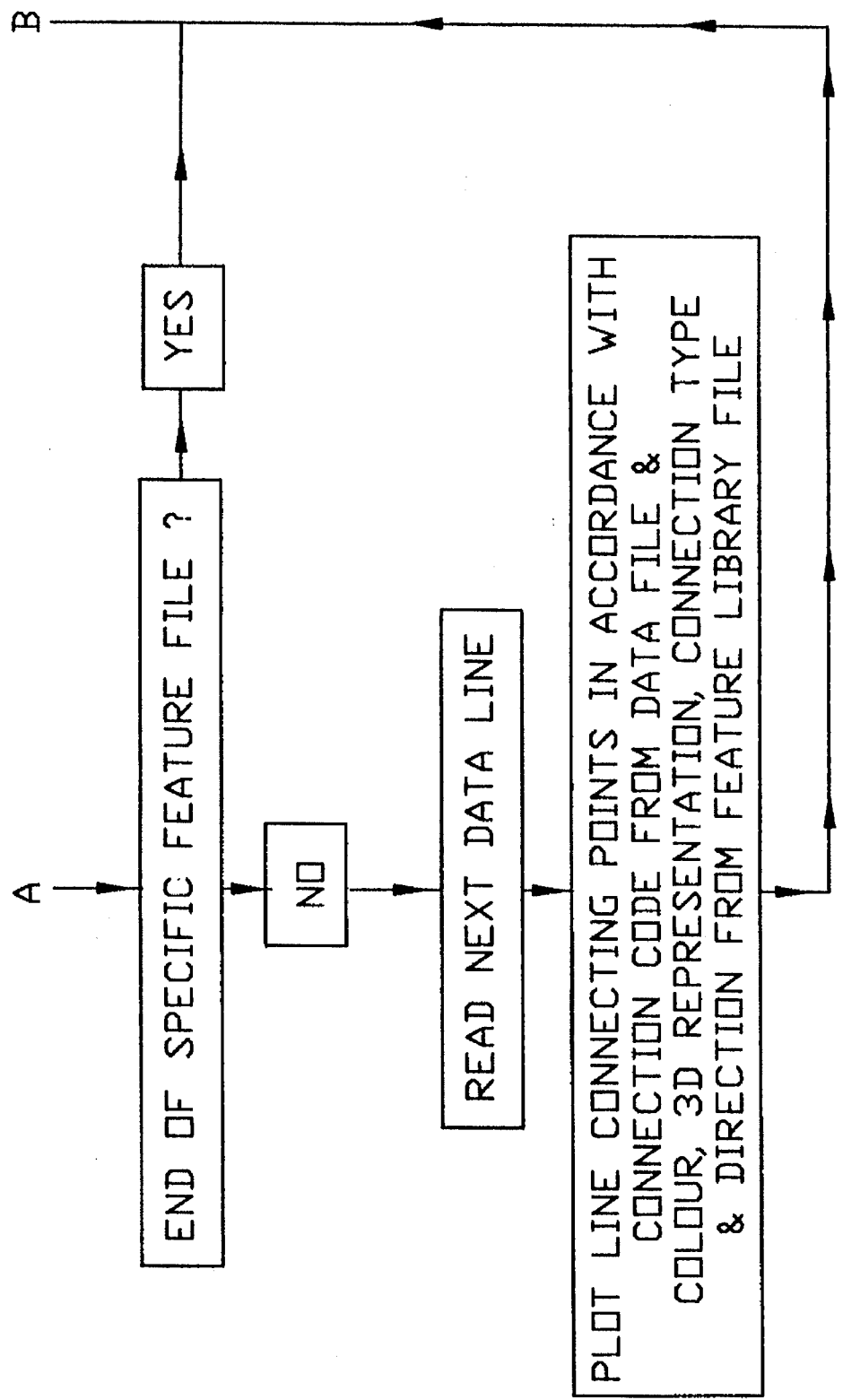

The flow chart for the chainage, offset and datum program is shown in FIG. 13. The chainage, offset and datum from any selected point may be displayed using a pull-down menu option. From this option the values for the previous, next or any specified point may be subsequently displayed.

Referring still to the geo-processing program (FIGS. 4 to 13), observed points are numbered sequentially. The storage capacity of the powerline surveying program is only limited by the memory capacity of the computer on which it is being operated. The remaining space can be reviewed at any time (in terms of the number of points which may still be added) by choosing a pull-down menu option. If the available capacity drops below 50 points a warning is given.

Observations may be edited freely. However, measurements downloaded from an automatic instrument may only be edited by overwriting them with other values following the choosing of the 'Overwrite' option from the pull-down menu.

A remark of up to 20 characters may be logged for each point immediately after the measurements have been logged.

The flow chart of the program controlling input and output of data is shown in FIG. 14. This is a program for interfacing with a portable disk drive, printer and external computer. Specific routines are included to output data in a suitable format for use by a program running within the overhead line profile modelling program for designing and analyzing overhead lines.

This may be selected from the Autograd main menu. It has four standard Autograd options:

1. Communications

This is a standard Autograd feature used to: a) Enter terminal emulation mode. b) Set communications parameters for interfacing with a printer, computer, plotter or digitizer. c) Set device control codes for printouts. d) Set time and date.

2. Disk Operations

This is also a standard Autograd feature for interfacing with a portable disk drive. It provides the following facilities:

a) Directory of disk currently in drive.
b) Save data from any Autograd module to disk. The particular data to be saved is selected after 'Save file to Disk' is selected.
c) Load data for any Autograd module from disk.
d) Delete a file from disk.
e) Format a Disk.

3. Printouts

This permits a hard copy of the data to be output to a printer or computer. The powerline surveying program outputs the following data:

```
Administration Information
Point Number          ⎫
Feature Code          ⎪
Feature Number        ⎪
Link Code             ⎬  For each point
Chainage              ⎪
Offset                ⎪
Datum                 ⎪
Remark                ⎭
Land Usage (when there is a change in Land
Usage
Observation Number        ⎫
Tower Number              ⎪
Tower Type                ⎬  For each Tower
Chainage of Tower Center  ⎪
Datum of Stub             ⎪
Height of Tower           ⎭
Copyright message
```

4. System Input/Output

This permits the recorded powerline data to be output to an external computer either in ASCII format or a format suitable for reception by a special program operating in the overhead line profile modelling program. The same data is output as is included in a standard printout.

A new interface has been written to permit downloading of PoleLine data, including the seven lines of pole details which are displayed as text on the final plot. They are included in a distinct layer within the CAD system so that they may be easily excluded using the standard CAD function of switching off a specific layer.

Referring now to FIG. 15, the file management program is a standard Autograd feature used for erasing data and controlling which program modules are currently resident within the computer. Program modules may be erased and reloaded from a portable disk-drive.

Turning now to FIGS. 16, 17 and 18, the means for representing the geography of the area surrounding a powerline will now be described. There is provided a program for receiving data collected in the course of a field survey of an overhead line, which program converts the geographical data of the surveyed area into digital form compatible with a specified host CAD system. The data is initially collected, at the time of a survey, by the powerline program operating on a hand held computer. It is then transferred to the overhead line profile modelling program in a standard data interchange format shown in FIG. 16. The transfer of data is via a specially written interactive communications program consisting of an output facility in the powerline program which has been mated with an input facility to the overhead line profile modelling program. Interface between the two programs takes place on the basis of exchanged codes.

The following field data may be transferred:

Header:
  Client Name
  Measurement Date
  Job Title
  Location
  Job Number
  Surveyor
Data for each point measured:
  Sequential Point Number
  Feature Name
  String Number
  Connection Code
  Chainage
  Offset
  Datum
  Remark (If any)
  Land Usage Start (If any)

The Feature Library and Tower Design Dimension files may be transferred if required.

Referring now to FIG. 17, in order to process the received data appropriately the program requests any additional information required, i.e., two dimensional, three dimensional or combined representation. It also accesses a library file holding the required representation for each type of feature encountered. This file may be edited by the operator as required. The program is invoked from a customized menu that may be activated during the operation of the host CAD system. Among the options given are the loading of field data, processing of data, selection of general parameters, activation of HELP messages, display of errors encountered, editing of data, editing of the library file, exit to the host CAD system, activation of associated programs and various other appropriate options specific to the CAD system involved.

FIG. 18 shows the flow chart relating to processing of the data and plotting it in two or three dimensions, as specified. Processing of the data takes place on a copy of the original data file held internally within the program memory. Prior to general processing all points lying on the route of the powerline are extracted from the field data and are plotted as a separate distinct feature irrespective of the associated feature names or tag codes. The feature names are however used to indicate the connection between one point and the next along the line.

Points lying on the route of the powerline are sorted in order of ascending chainage and are connected appropriately. Points on all other features are linked sequentially in the order they are encountered within the field data file.

During processing, the feature names associated with the observed data are matched with those held in the library and the surveyed features presented accordingly.

The data held internally is scanned for all occurrences of the first feature and string number combination encountered. All points lying on this feature are extracted from the file and processed. This procedure is then repeated until all the data has been processed.

Each individual feature is identified through a combination of the associated feature name and number. Therefore, a number of features of the same type can be processed as separate units.

Points associated with a particular feature name and string number combination are connected together in accordance with a TAG code collected during the survey. The most common connections are a straight or curved horizontal line, a vertical line or a gap. The program may add an additional or alternative connection or symbol as specified in the library file. The color and thickness of the connecting lines are defined in the library file.

Gaps within a feature are represented using a gap line the existence of which (together with its color and thickness) is specified in the library file.

If a curved connection is specified all points relating to a feature (including those on gap lines) are used to define the best fit curve. The degree of curve smoothing applied may be set from the initial menu.

In order to represent the collected three dimensional information on a two dimensional plane, any features lying off the route of the power-line are represented by dashed lines. These dashed lines are only created if a two dimensional representation is required. All other connections are made using solid lines.

If there is insufficient or incorrect data associated with a specific feature, or a feature associated with the field data does not occur in the library, this is noted in the record of errors which may be reviewed from the initial menu.

The observed points are plotted at actual size so as to maintain the integrity of the original data. They may be viewed through using the panning facilities of the host CAD system.

Any text associated with the field data (remarks or land usage information) is scaled (in accordance with an input scale factor) and placed in the appropriate annotation field. The feature name, chainage, offset and datum values are treated similarly if so indicated in the library file. This scaling is done in order to maintain the legibility of the text as the scale of the full plot is reduced.

There are five distinct annotation fields. Annotation is displayed vertically within the relevant field at a position corresponding to the chainage of the point to which it refers, with the exception of land use which is written horizontally commencing at the relevant start point. Land uses which occur in close proximity to each other are slightly offset vertically so as to prevent them from overwriting each other.

The five annotation fields and the survey model are displayed vertically one above the other (separated by horizontal lines) in the following order (top to bottom):

Survey Model
Description
  Remarks
  Feature Name
Datum Value
Chainage Value
Offset Left
Offset Right
Lane Usage Text describing the job being processed is read from the field data file and placed in a title block at the top left hand corner of the plot. The input scale factor is also applied to this text.

At the graphic processing end the way each type of feature should be displayed is defined in the library. The points making up a feature may be connected or symbolized in different manners as appropriate. This enables single points, linear vertical objects, horizontal objects or three dimensional objects to be logically represented in the final graphic output. When a feature name is encountered in the field data the associated data is read from the feature library. This data consists of color, line width, symbol (if any), whether to display associated text or not, whether to display gaps in the feature and if so the color and line thickness to be used and how to connect points together. The feature library may be edited from within the graphic processing module.

The contents of the feature library may be transferred freely between the field and office based modules.

The final product is the data for a full drawing (in two and/or three dimensions as specified) which is passed into the host CAD data management/ground modelling system from which interactive screen editing may be done, the data analyzed and a graphical plot produced.

Figure 19A:
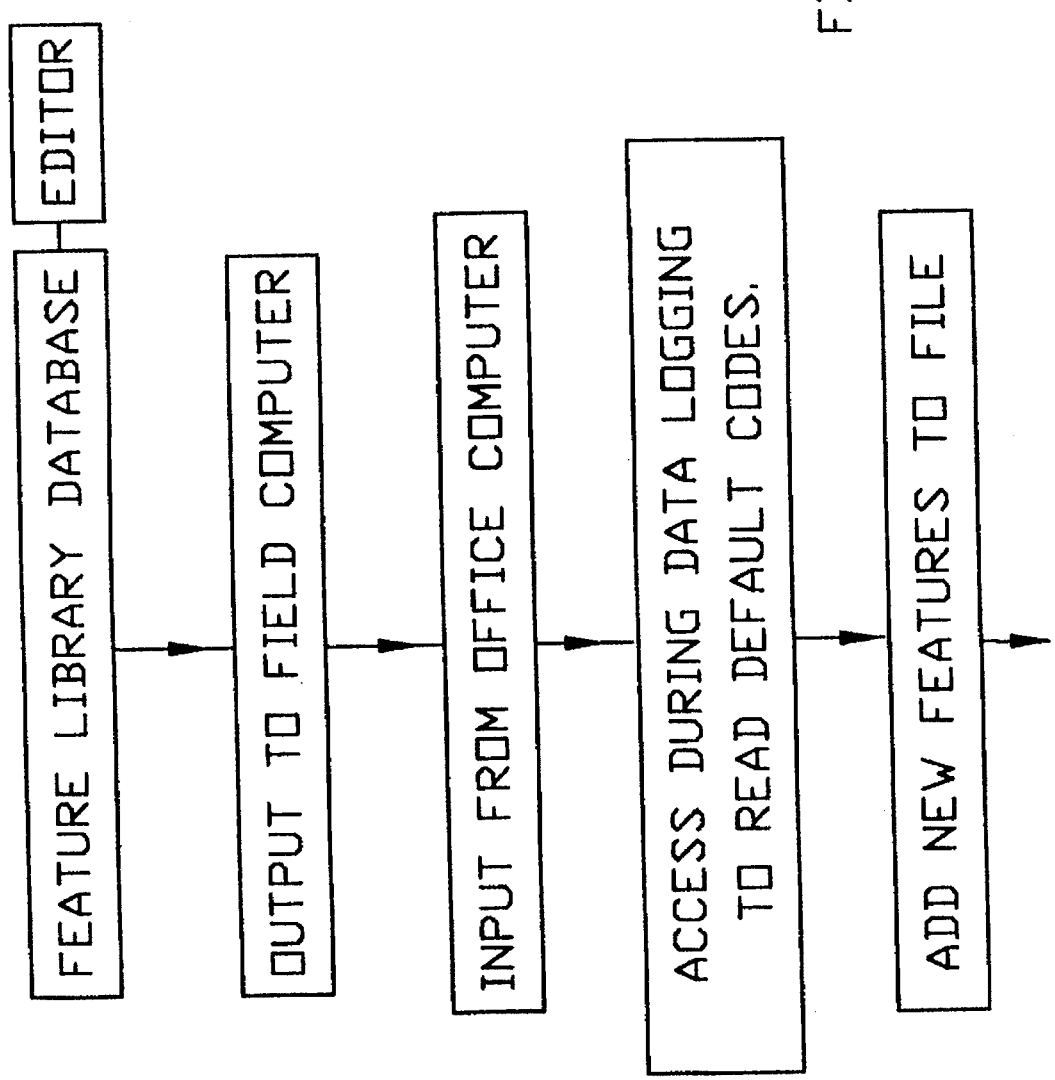
FIGS. 19A–B is the data flow diagram for the feature library.
Figure 19B:
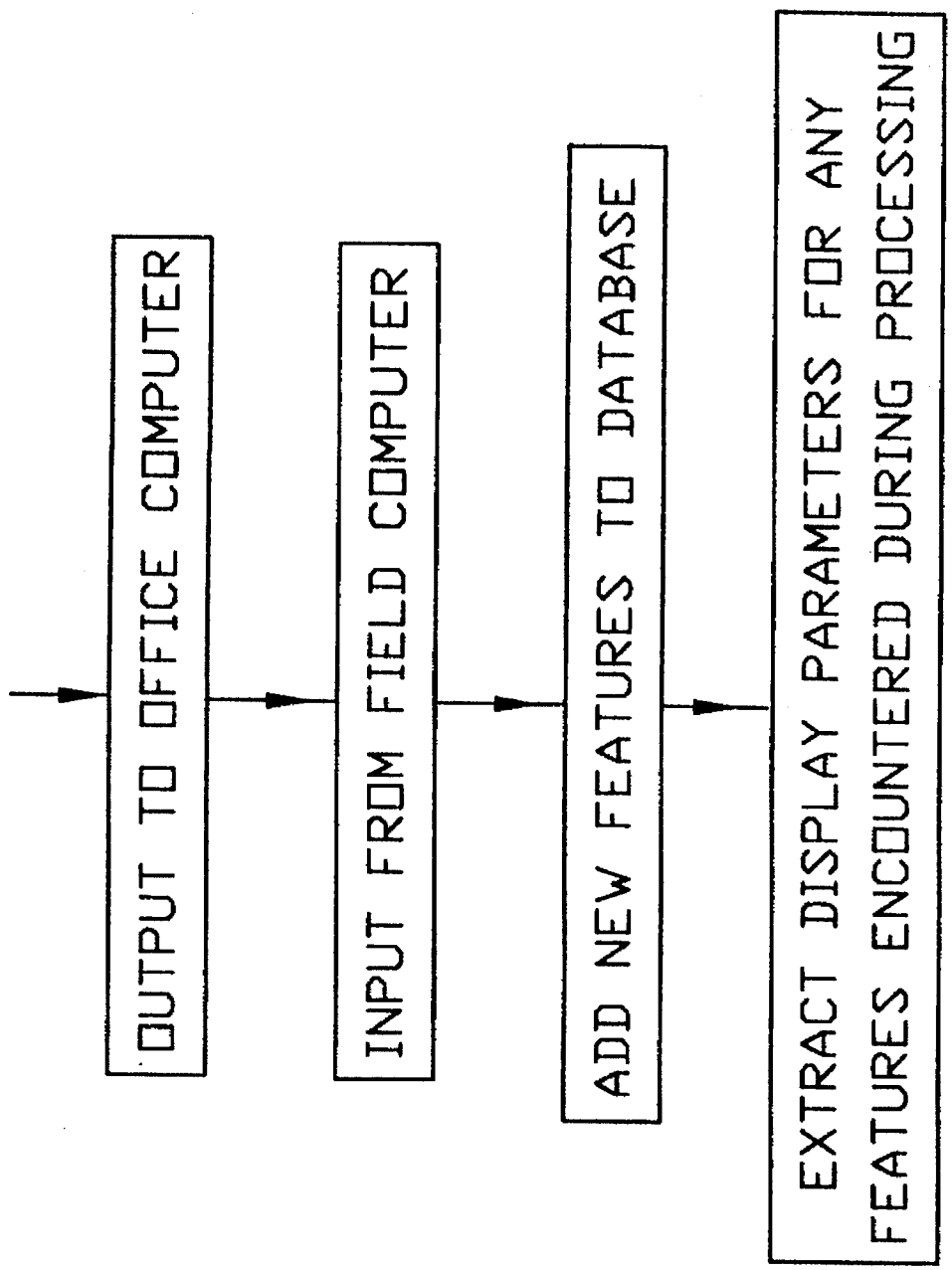
Figure 20A:
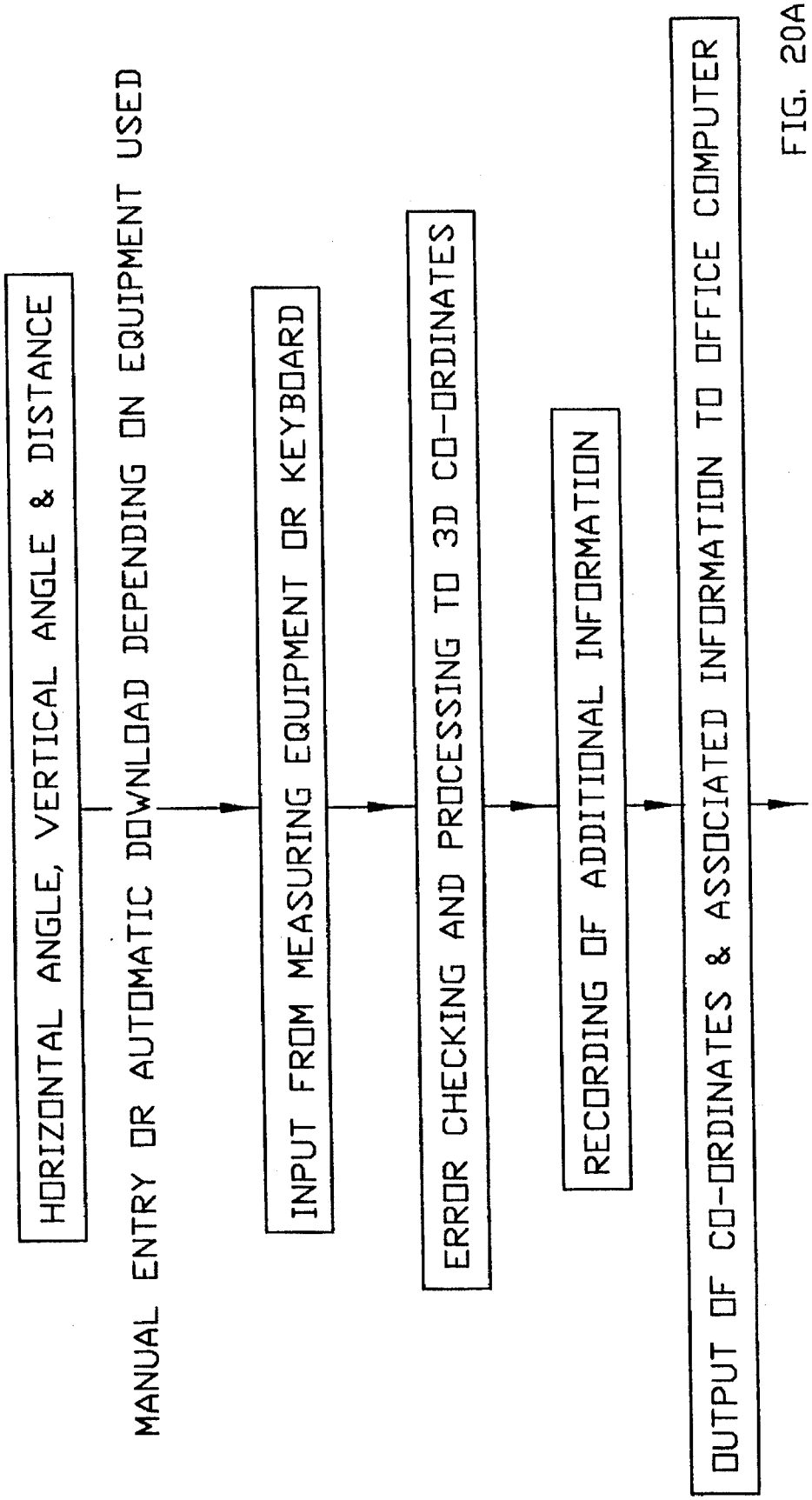
FIGS. 20A–B is an overview flow chart showing the flow of data between the field survey and host CAD systems.
Figure 20B:
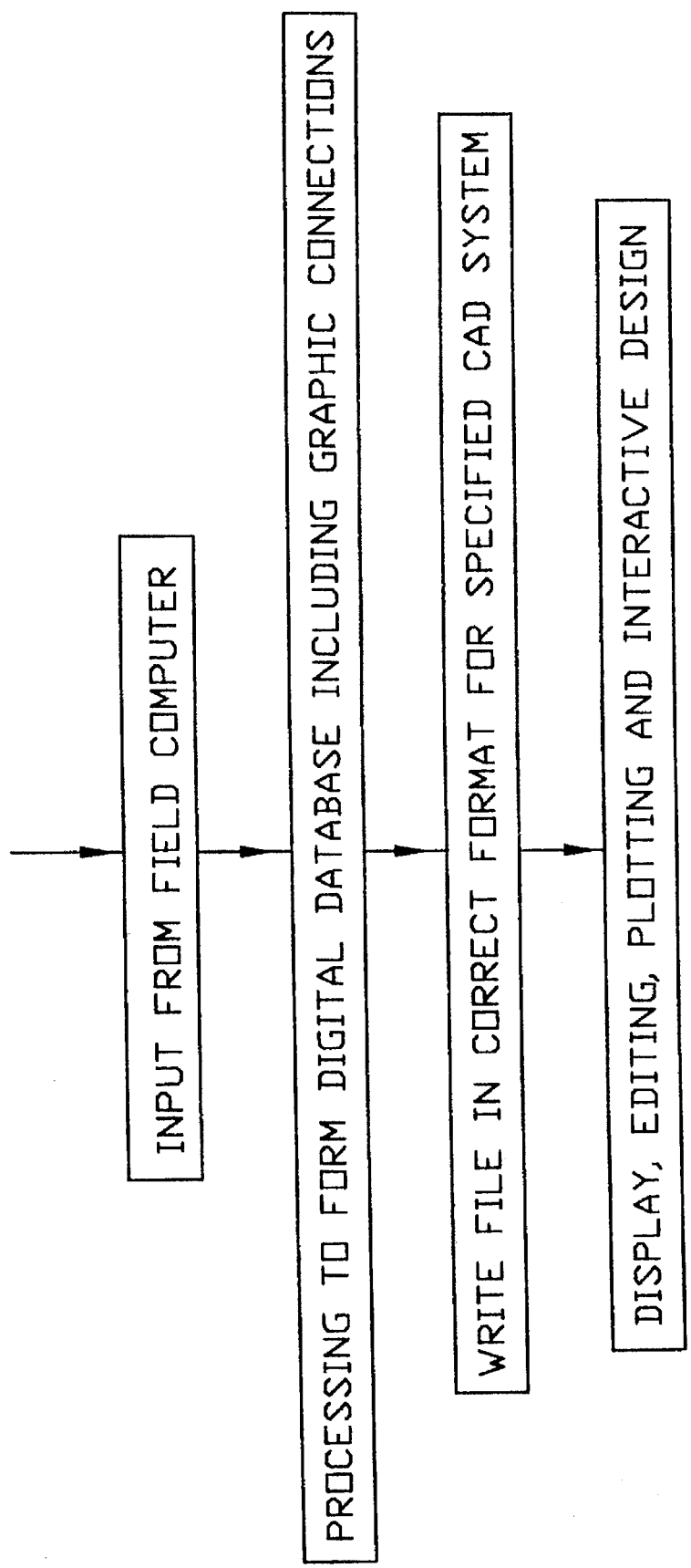

FIGS. 19 and 20 are general overview flowcharts showing the data flow between the field and office computers with respect to the features library and general data flow, respectively.

FIG. 21 is an isometric projection of a sample powerline survey produced by a CAD system. The sample powerline survey 2 shows conductors drawn at any swing angle 4, with both phase strung 6. Towers or poles are placed as cells 8. A full 3D model 10 is surveyed as shown. Also, a near face only 12 is surveyed as shown. A typical poleline crossing 14 is shown, as well as a minor road crossing 16.

FIGS. 22A–22I are schematic overviews depicting the entirety of the system according to the invention.

Figure 22A:
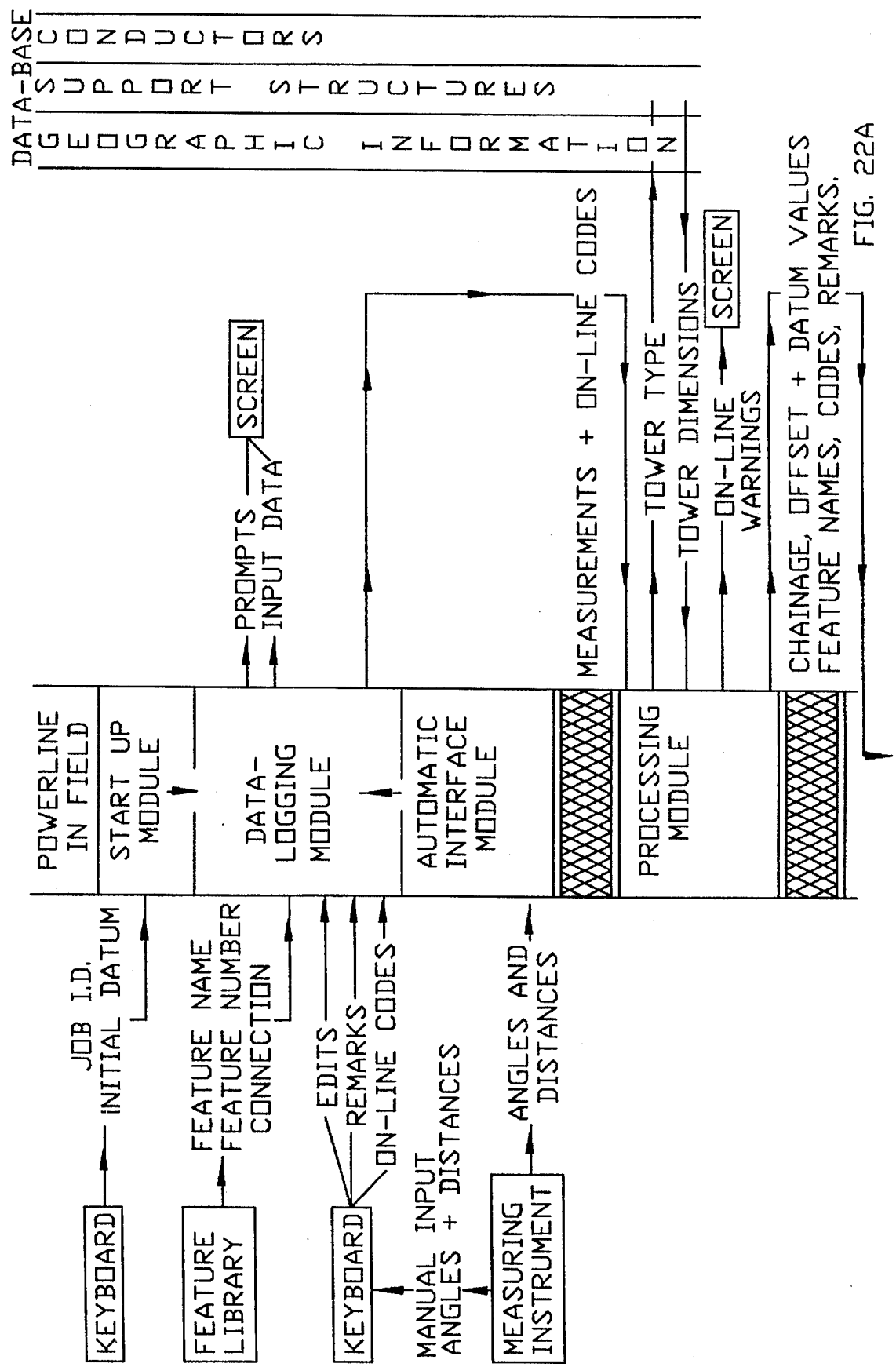
Figure 22B:
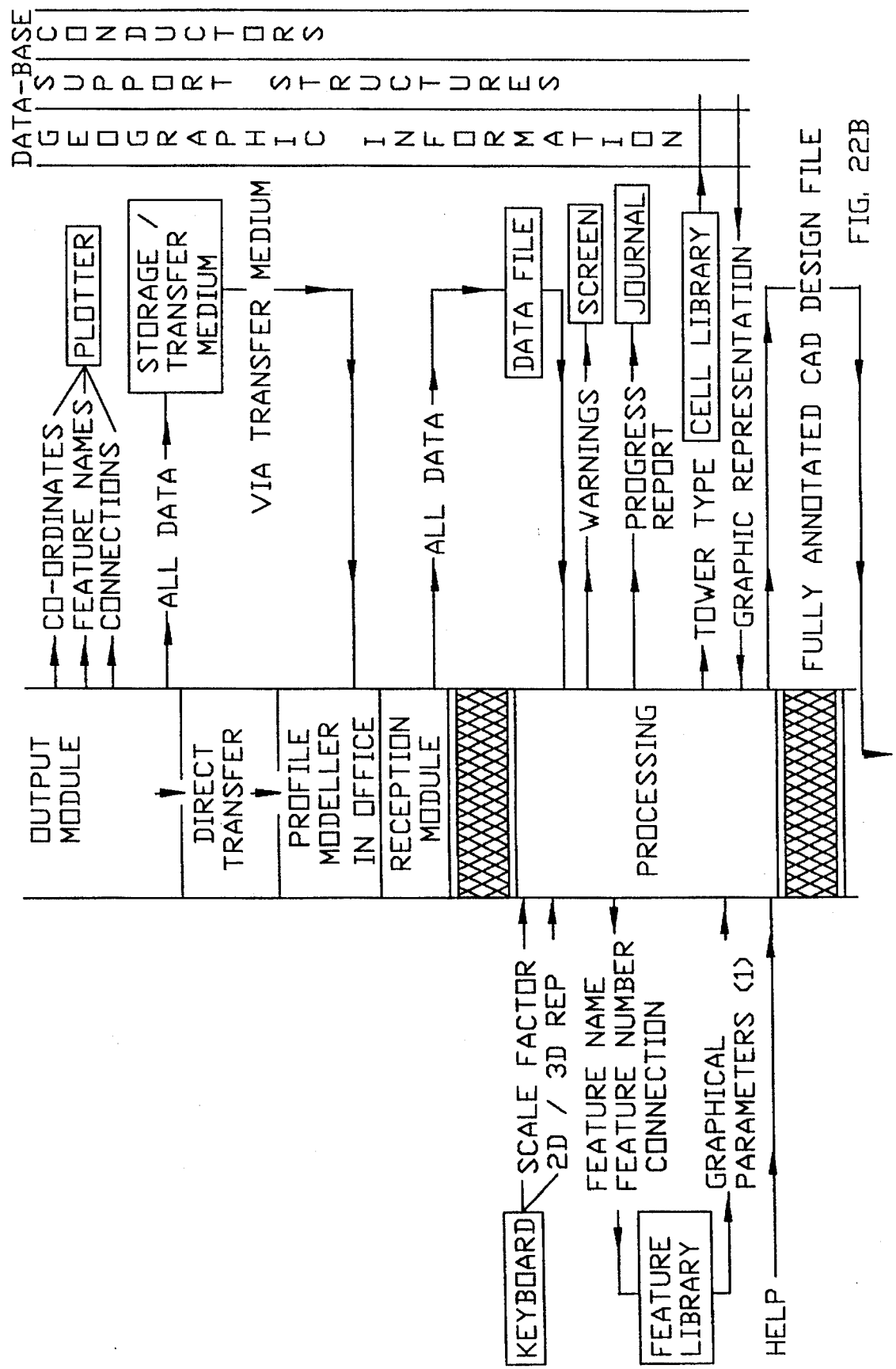

FIG. 22A is an overview of the data collection area of the system, as described above, while FIG. 22B shows the previously described data processing.

FIGS. 22C–22G relate to the design aspects of the scheme. In FIG. 22C the number, type, position, etc. of support structures may be specified and passed to the cell library, which then indicates how the structures are displayed and cross-references them with the data-base.

Figure 22D:
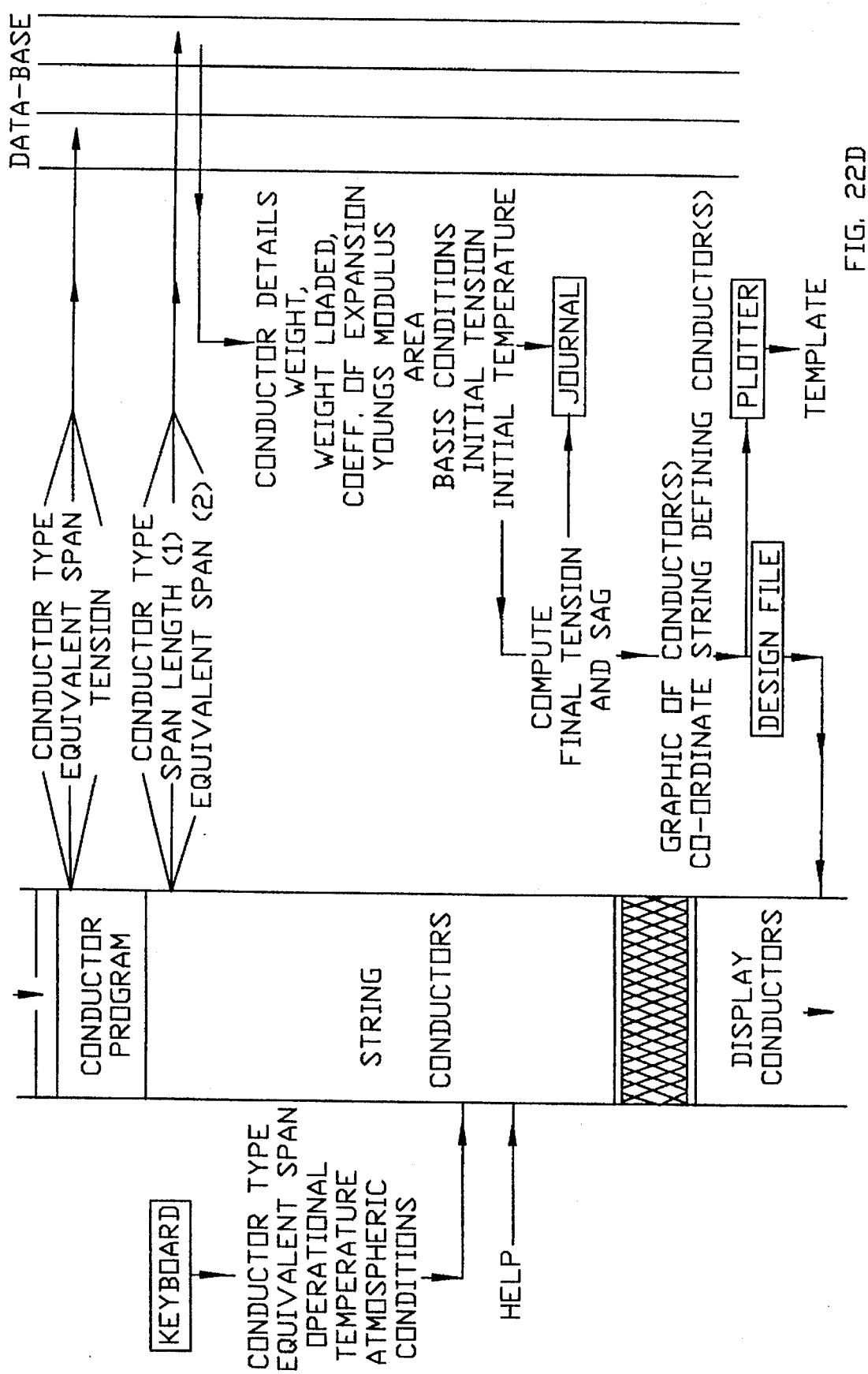

A schematic view of the conductor program is shown in FIG. 22D. This conductor program is one of the most significant innovations of the system. In order for the clearance between the ground profile and the existing or designed line to be checked, the position of the actual line itself must first be defined. The Conductor program does this precisely using mathematical equations. The defined conductor is then plotted on the same drawing as the ground profile enabling clearance checks to be quickly carried out. To facilitate this, a clearance line located the specified minimum clearance distance from the defined line may also be plotted showing graphically where sufficient clearance has not been obtained.

Traditionally, this whole procedure was carried out in a number of stages. The ground profile was plotted on paper. This was usually done at a scale of 1:10 so as to fit it on a sheet of paper. Reducing the scale however also reduced the accuracy of the determined clearances so a substantial margin of safety had to be left. The line was then designed and the relevant support structures overlaid on the original plot. Following this, the positions and types of the support structures used, together with the type of conductor used, its normal operating temperature and the maximum and minimum environmental temperatures were fed into a computer program. This program computed the coordinates of a number of points on two lines (hot and cold). Curves were then fitted to these points and cut out so as to form two templates. These templates could then be used to draw the hot and cold conductor curves on the plot. Because of the length of time and cost of producing these templates, the tendency was to use similar templates which had already been produced. The chances of this template actually being correct however are very small as there are a large number of variables used in defining these curves. One of the more significant variables is the weight and type of the conductor used. If a new improved conductor type was introduced, a completely new set of templates had to be produced. If after all this it was found that sufficient ground clearance had not been obtained, the line would have to be re-designed and the whole procedure repeated. Because of the great cost and inconvenience involved in doing this, the line was designed so that any great possibility of this happening was avoided. This margin of safety however in most situations resulted in a much more expensive design being implemented so as to give the exaggerated clearances required.

If a rare or awkward situation were encountered, an actual scaled model had to be built to determine the relevant curves. This scaled model however still had the limitations of scale inaccuracy and could not take into account extreme conditions. It was also very difficult to modify the scaled model.

The conductor program removes the uncertainty over the exact position of the conductor. All calculations are undertaken at actual scale as the process is no longer paper based. It is now possible to scale down the plot so as to fit it on a sheet of paper.

The slow and expensive process of producing templates has been completely by-passed as the curves are drawn by the program. These curves are exact as they are related to a specific curve with specific variables rather than being best fit curves.

If any of the variables are changed the curve is also changed. This means that different conductor types, weights, tensions, temperatures, etc. may be tested and the most suitable selected. Furthermore, whereas the traditional system could only show the conductor line at extreme temperatures, the conductor program can model it under a wide range of conditions, the most important of these being normal, extremely cold, extremely hot, very windy, icy and construction conditions.

The conductor program, so as to accommodate users who may still wish to follow traditional methods or who are fitting new conductors to an existing line on the basis of existing plots, also provides the feature of simply producing the relevant template, given the relevant details.

Figure 23:
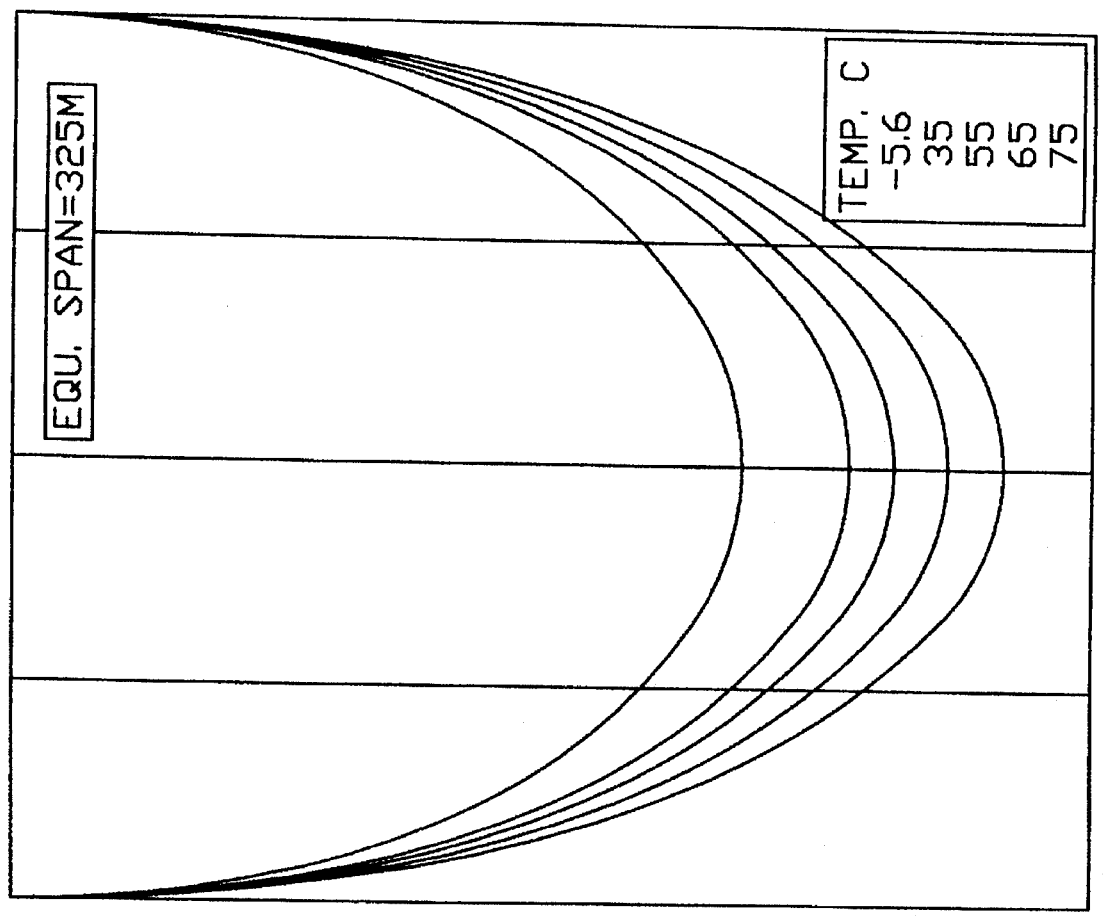
FIG. 23 is an example of a template plot produced in the system.
Figure 24A:
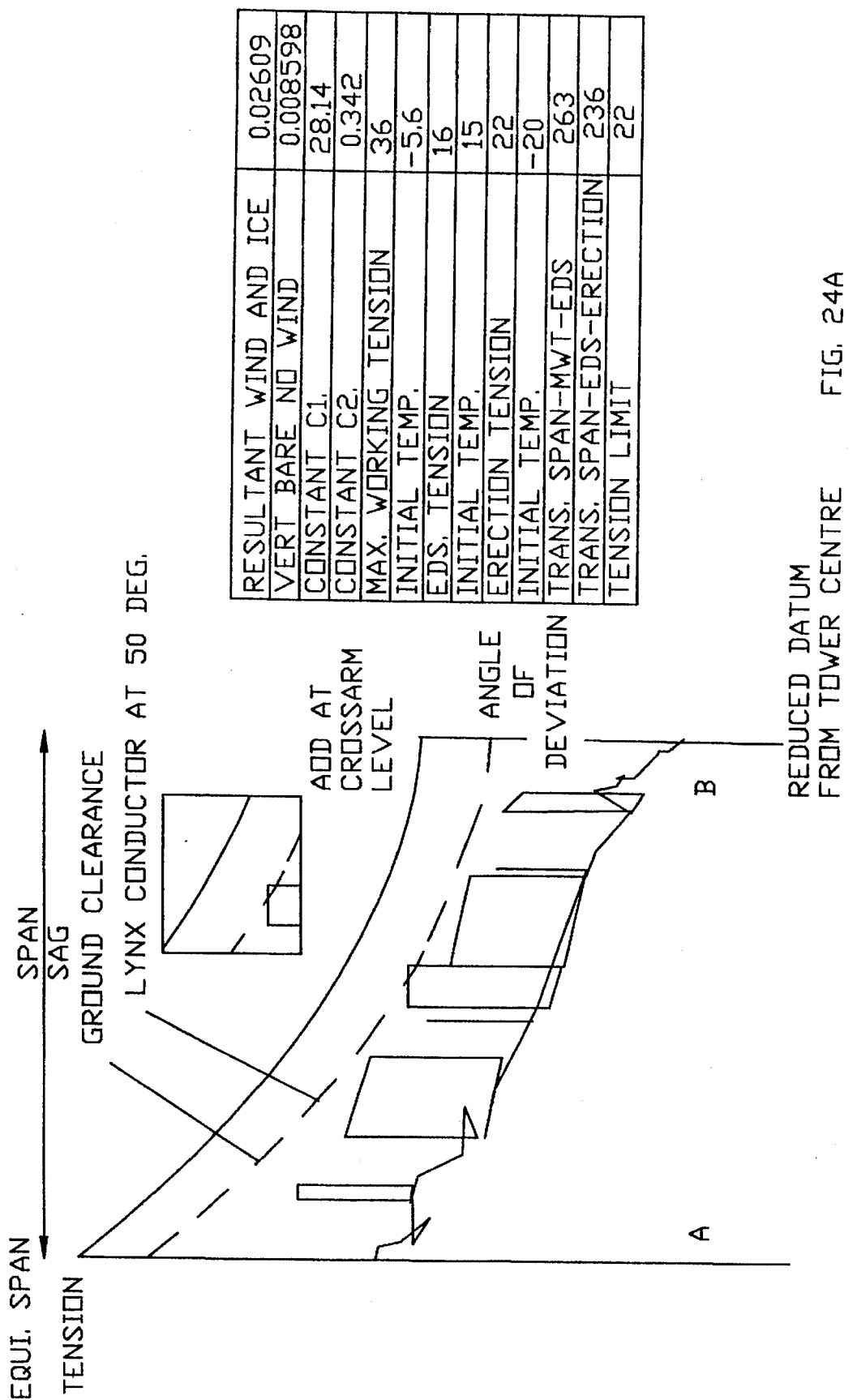

FIG. 23 is an example of a template plot produced in the system. For conventional conductor placement, templates can be plotted for any loading conditions, temperature and exact equivalent span. Catenary calculations are used throughout and templates can be plotted at any scale in both metric and imperial units. FIG. 24 shows a sample section of line with the conductor strung. The inset box shows a typical clearance check. The conductor loading parameters are listed to the left. Because it can do this instantly, the curve can simply be plotted on acetate and overlaid on the drawing. An exact curve can thereby be produced for each span. The slow and expensive process of making plastic templates is bypassed.

Figure 25:
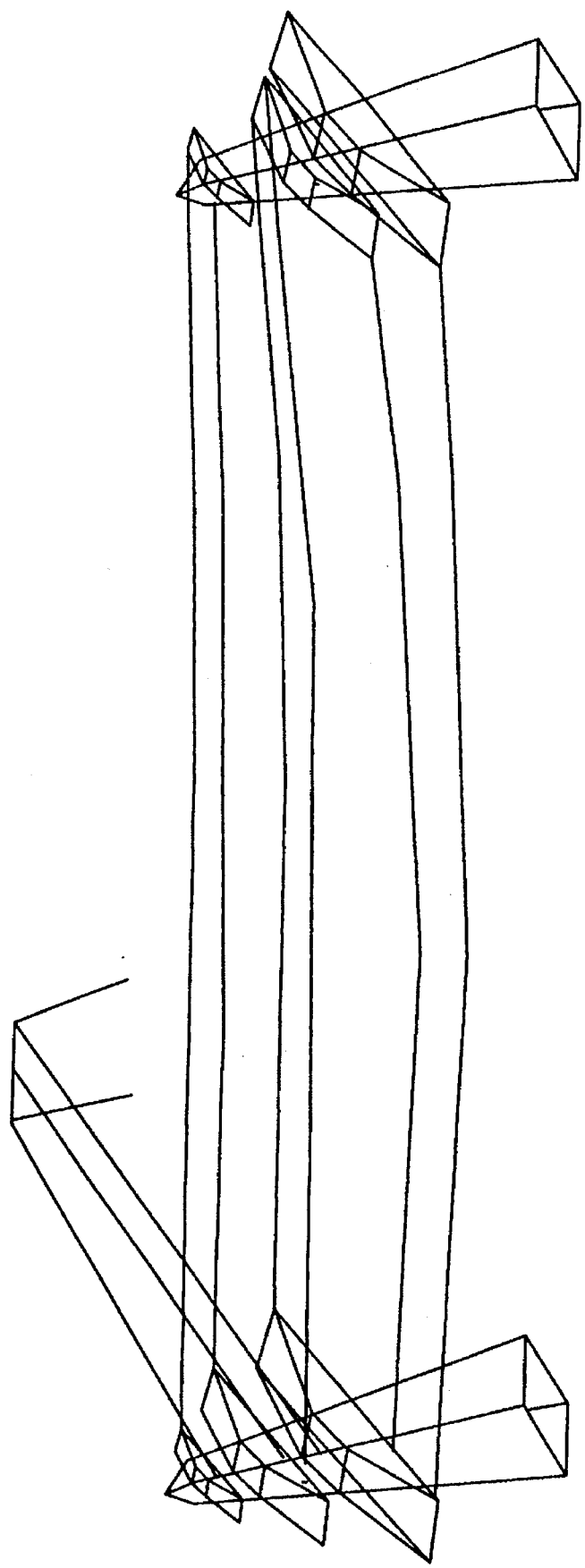
FIG. 25 is an illustration of a typical incoming line terminating on high voltage switchgear overhead gantry showing jumpers and downleads.

The conductor program also has facilities to cope with rare and awkward situations. It can model the downleads from an initial support structure to a substation or a short stretch of line between two different insulator sets. FIG. 25 is an illustration of a typical incoming line terminating on high voltage switchgear overhead gantry. For clarity, the towers are only shown in outline form. By using the CAD level control, all internal bracing and detail could be shown. Downleads can be strung at any reduced tension with the CAD system providing full phase to phase clearance checks. Downleads can also be strung under any swing conditions. Each conductor can be strung under any loading conditions and all relevant sag/tension data is accessible. Jumpers can also be strung under any swing conditions.

The conductor program can model two or more different conductors in the same model. Where one powerline crosses the route of another or two lines are in close proximity to one another the clearance between the two can therefore be quickly and precisely determined. Complex situations such as usually occur in close proximity to substations can be simply and quickly resolved.

Figure 22E:
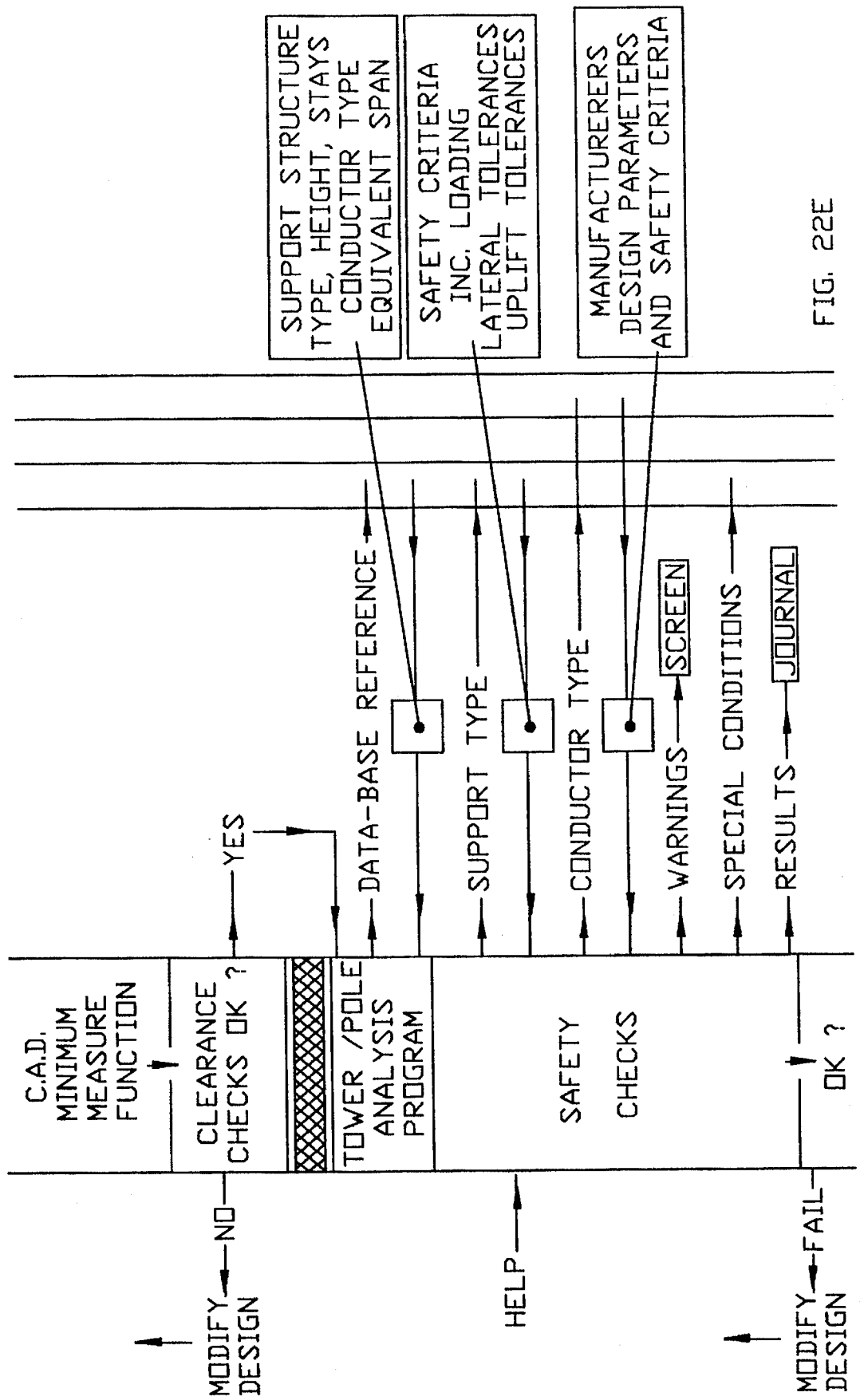

The design checking scheme is depicted schematically in FIG. 22E. A section of powerline has to conform to a number of pre-set safety conditions. In the UK these conditions are set out in a document issued by the Electricity Supply Industry (CEGB). This is one of a series outlining Electricity Supply Industry (ESI) standards. It is referenced by the title 'ESI STANDARD 43–40.' These conditions include such items as maximum and minimum equivalent spans, maximum and minimum distances between supports, maximum and minimum tension, spacer requirements etc. Compliance with these conditions must be checked for both normal and extreme (temperature, wind, snow and ice) weather conditions. Obviously these extreme conditions vary from one place to another.

Once a section of powerline has been designed it must be checked that it conforms to these standards. When these standards were first developed this involved lengthy calculations. Since then, computer programs have been developed which, once the support structure details are fed into it, check the proposed line for compliance. A major disadvantage of these systems is that the support structure details have to be input manually taking considerable time and leaving plenty of scope for errors.

By integrating this checking procedure with the graphic design system this interim stage is overcome. The data for the designed line is read directly from the design file, which is displayed graphically on screen, and may be plotted out at will. Each support structure is stamped with a data-base tab cross-referencing it with its full details and dimensions.

This integration removes the possibility of transcription errors thereby ensuring that the analyzed line and the designed line are identical. It also speeds up the whole process. Noncompliance with the standards is thereby changed from being a major catastrophe, requiring a new line to be designed, drawn and analyzed (taking a number of days), to a minor inconvenience as with this new system the line can be edited in a matter of minutes. Obviously, when noncompliance was so critical a substantial margin of error was left—incurring substantial excess construction costs. With this new system this margin of error may be eliminated resulting in substantial savings.

Standards tend to vary slightly from place to place. The system permits the user to define the standards required. Any number of different standards may be stored within the system. A designed line may be checked against any such standards. This is an important facility for engineering contractors who may have to deal with a number of different standards.

Figure 22F:
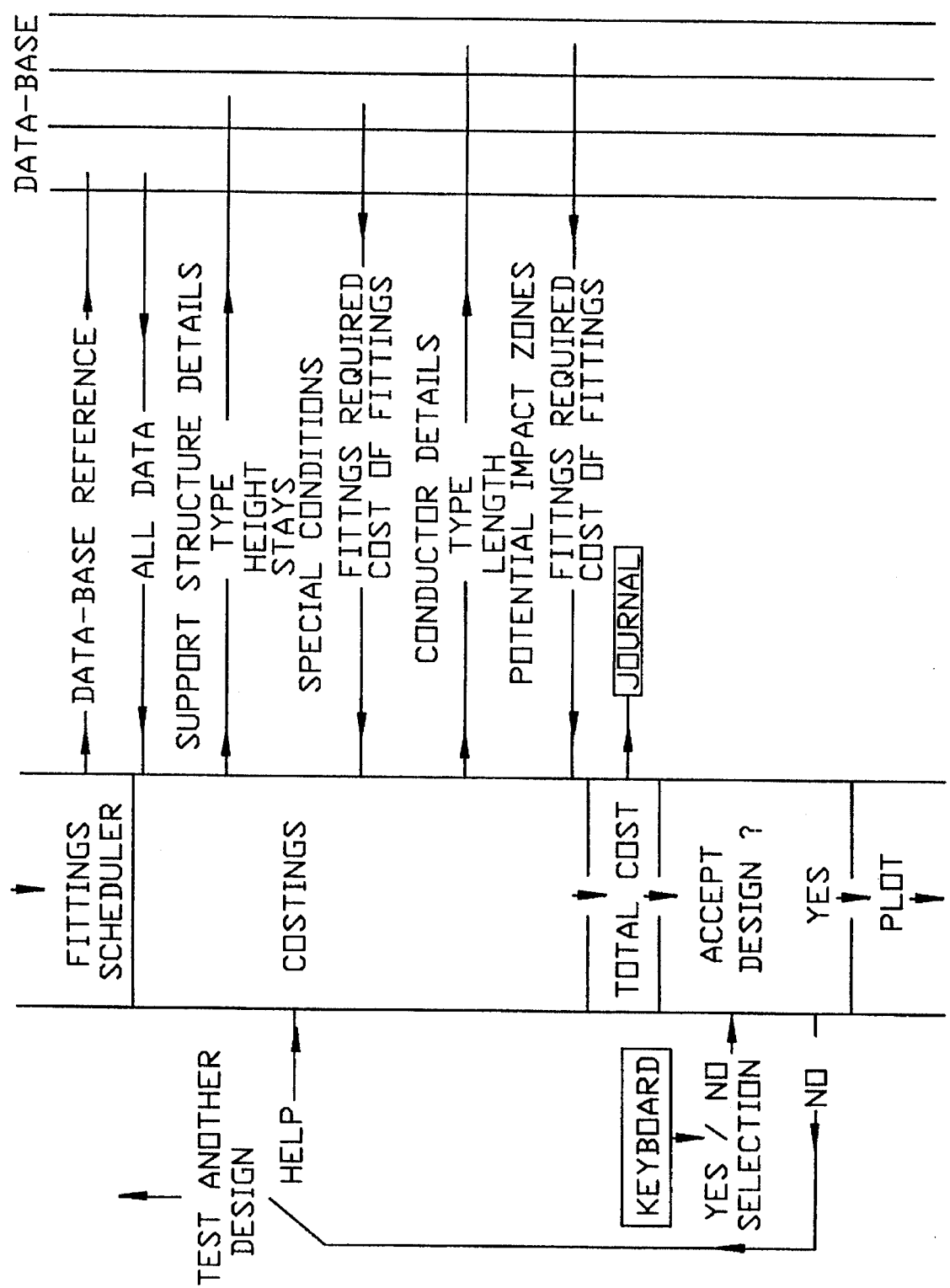
Figure 22G:
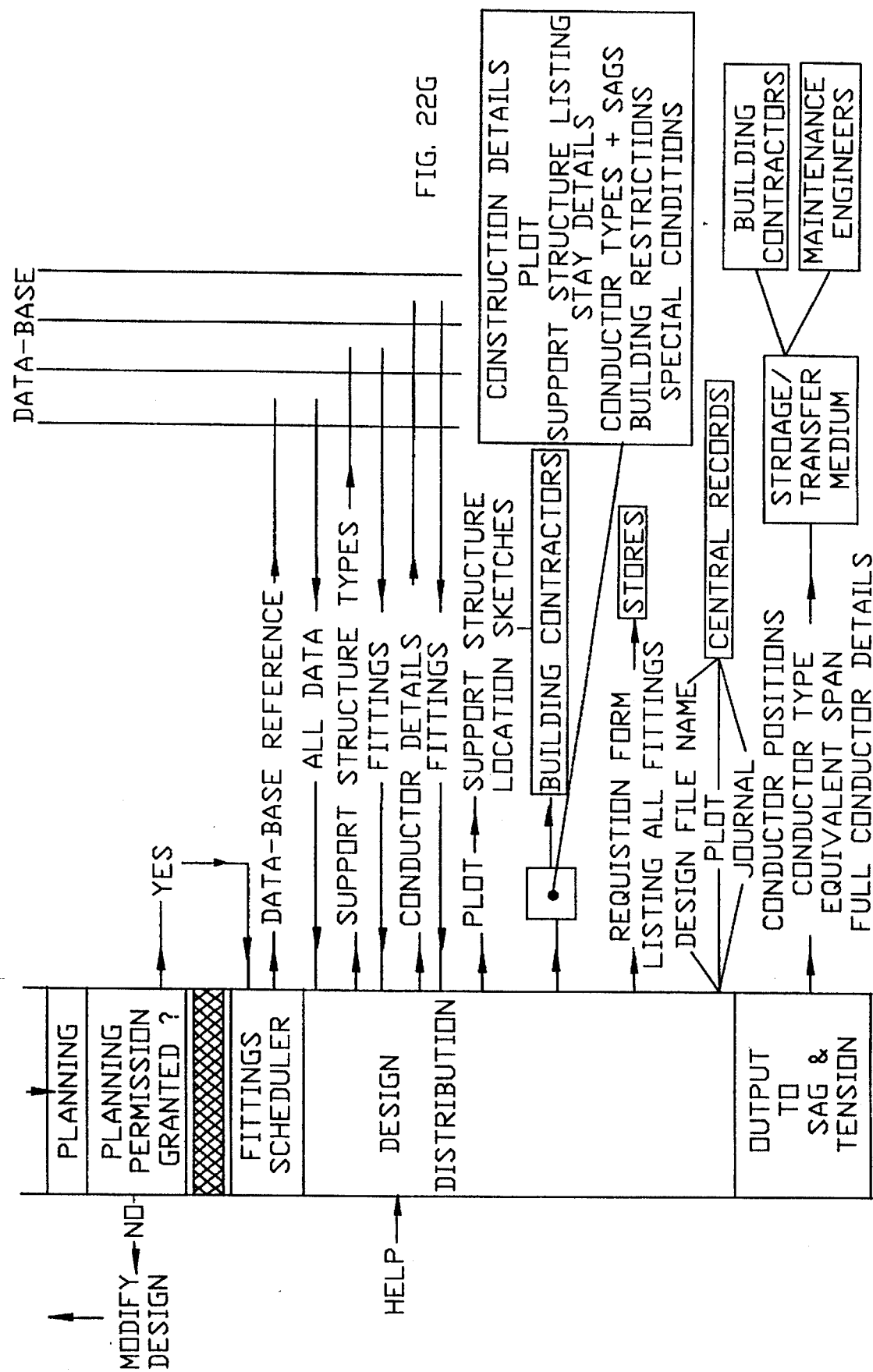

The design costing and distribution areas of the program may be understood by reference to FIG. 22F and 22G. Major considerations in the design of a new section of powerline are the construction cost, time and fittings required. The powerline collection of programs provides the tools whereby the engineer may minimize these using his own skill and training to modify an initial design produced by the system. The fittings required need to be precisely listed so that they can be ordered before construction commences. The fittings scheduler gives a total listing of all the fittings required for a proposed section of line and the total cost thereof.

Some electricity generating boards are currently using their own programs to compute these requirements and costs. These programs however have the disadvantage that they are not integrated with the design system. This means that the details of all the support structures and conductors must first be input into the program. This takes time and leaves opportunities for mistakes to be made. At present the line is first designed, then costed and the required fittings ordered. This means that, although the estimated cost is a major factor in the whole design process, the testing of a number of different designs and selecting the most economical is not really practical.

The new powerline fittings scheduler performs exactly the same function as the currently existing programs. However, because it is integrated within a total system, the details of the support structures and conductors used are read directly from the design drawing. This removes any possibility of mistakes (which may result in substantial expense) being made. It also means that any potential changes can be implemented and costed within a few minutes (compared with at least a number of hours with even the most efficient system currently available). The end result is that quite a number of different designs may be tested and the most economical quickly selected.

Figures 1, 22I:
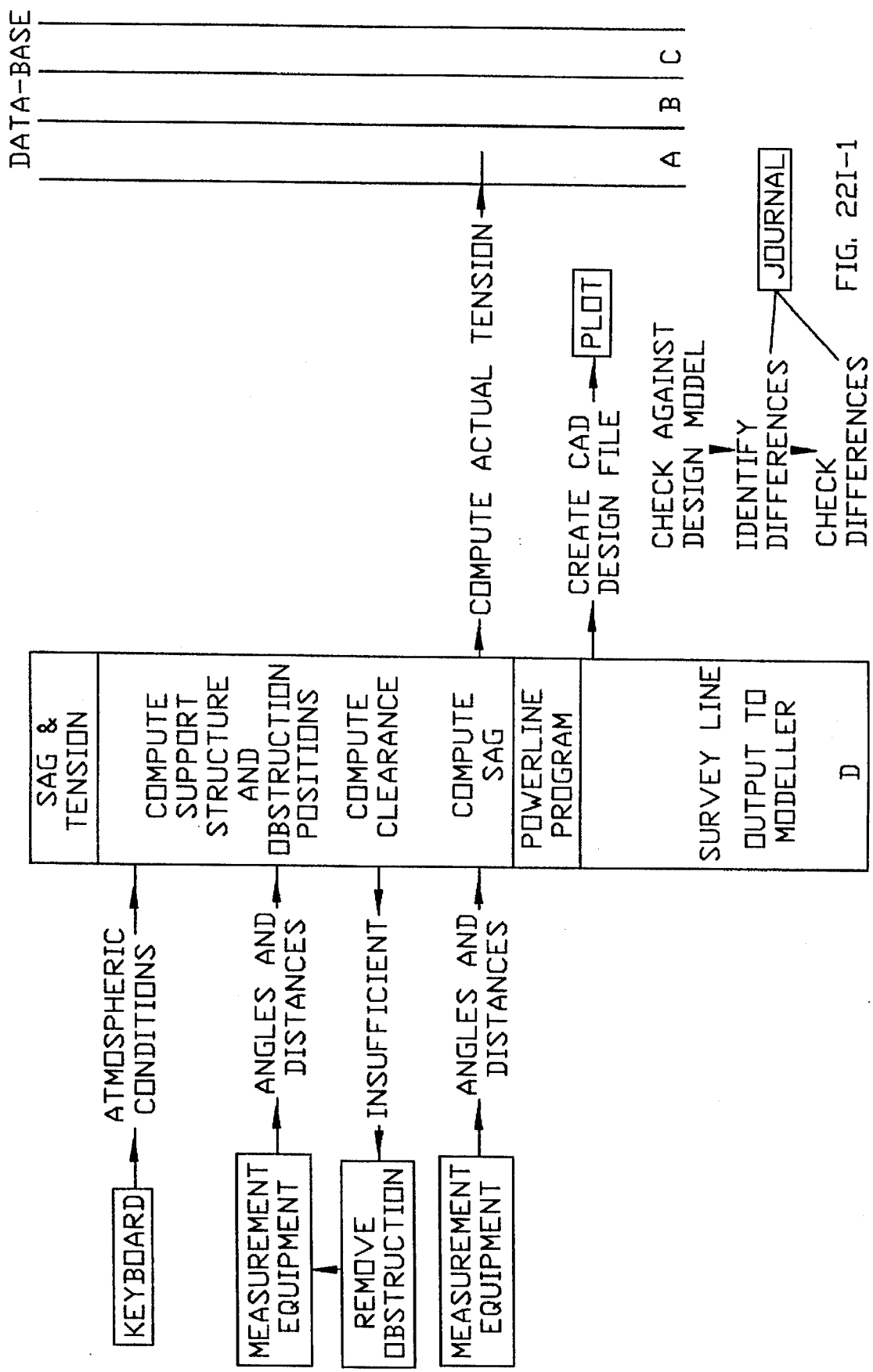
Figures 2, 22I:
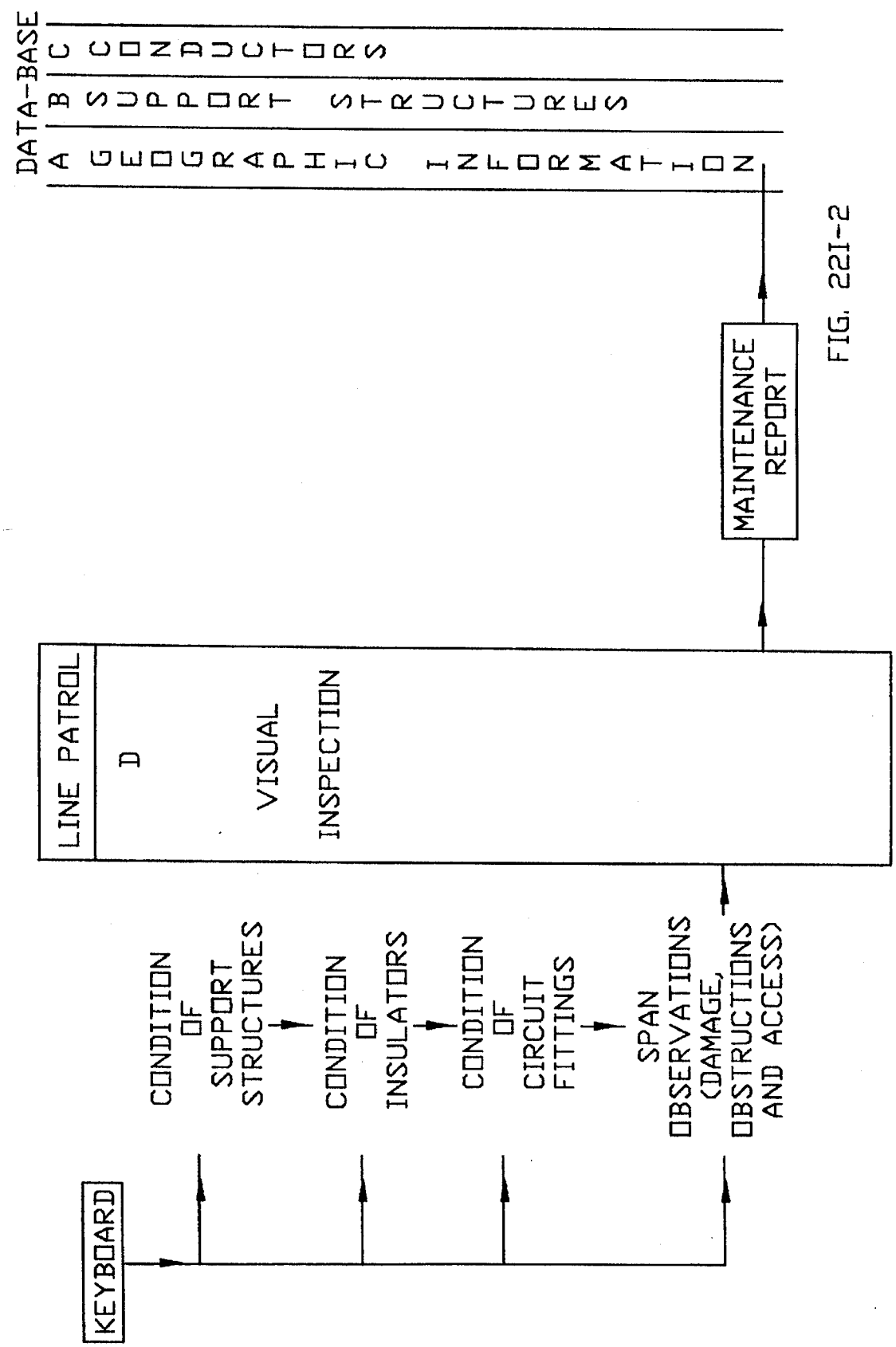

Line construction and line quality control and maintenance are depicted in FIG. 22H and 22I, respectively. It is impossible to actually measure the tension of a conductor. Instead this is done by measuring the amount it sags and from this computing its tension. As a line gets older, it tends to stretch thereby causing the tension to lessen and the line to sag further. An important part of line maintenance is therefore to monitor how much a conductor sags and what tension it is under. Obviously, a conductor under a different tension from its design tension will react in a different way than predicted under extreme conditions. It will also effect the amount of clearance between the line and its local geography.

The facility is provided whereby an initial design incorporating the whole process of positioning the support structures, stringing the conductors and checking clearances may be produced automatically by the system. This special facility can take account of safety tolerances, minimum clearance zones, fixed height zones (within which the existing structures may not be altered), varying ground types requiring different support structure foundations, and exclusion zones within which support structures may not be placed. This initial design should then be verified and altered as appropriate by the engineer using his skill and expertise.

Figure 28A:
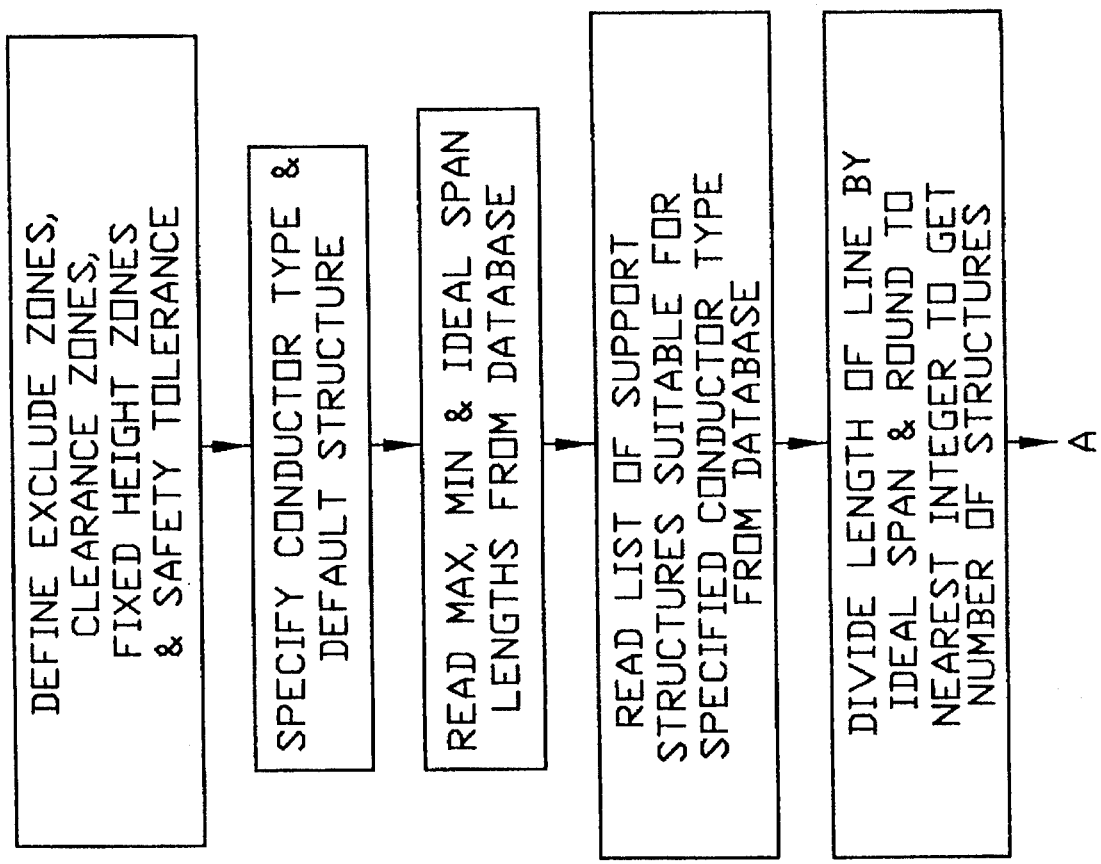
FIGS. 28A–C is an overview flow chart showing the automated initial design program.
Figure 28B:
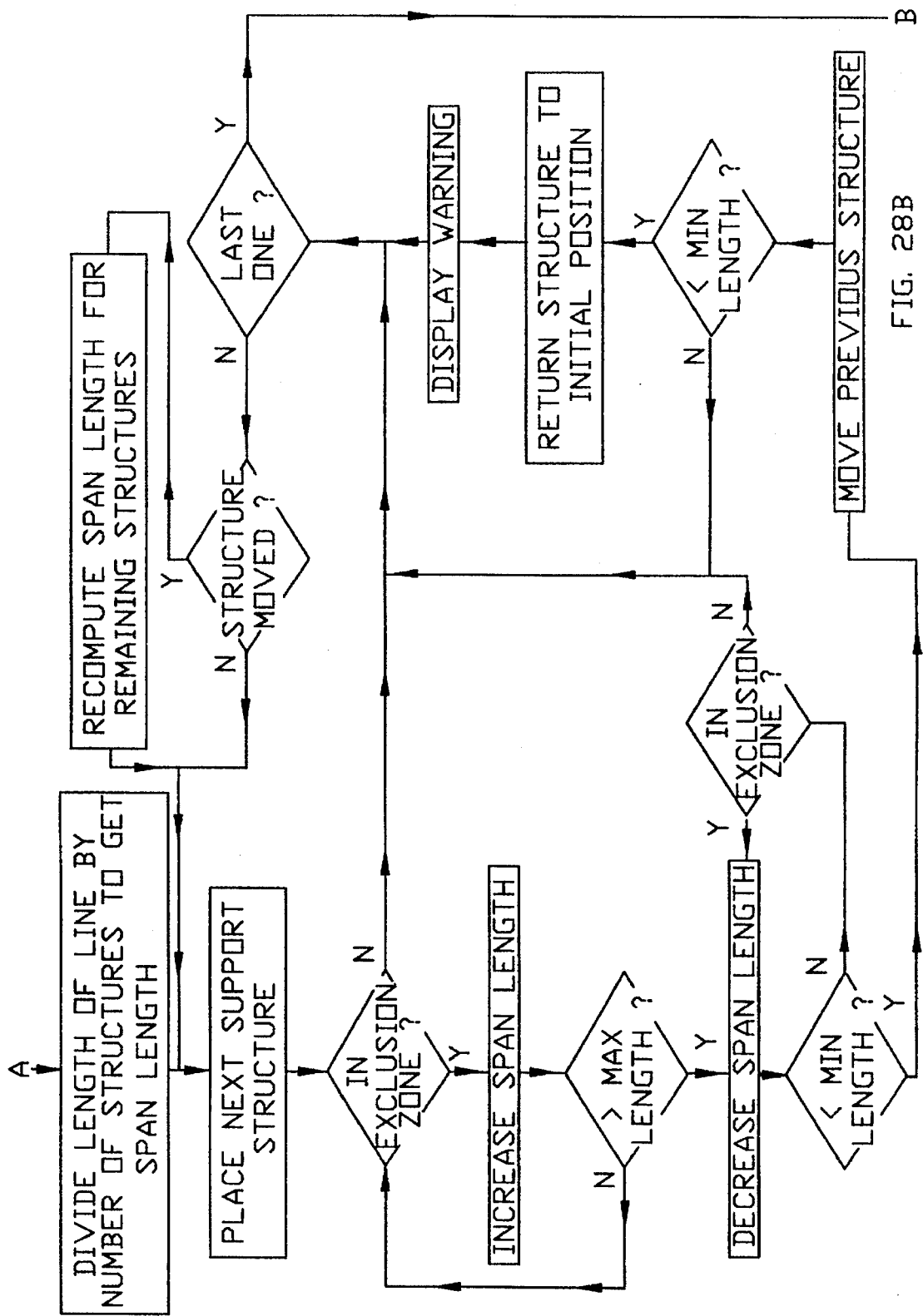
Figure 28C:
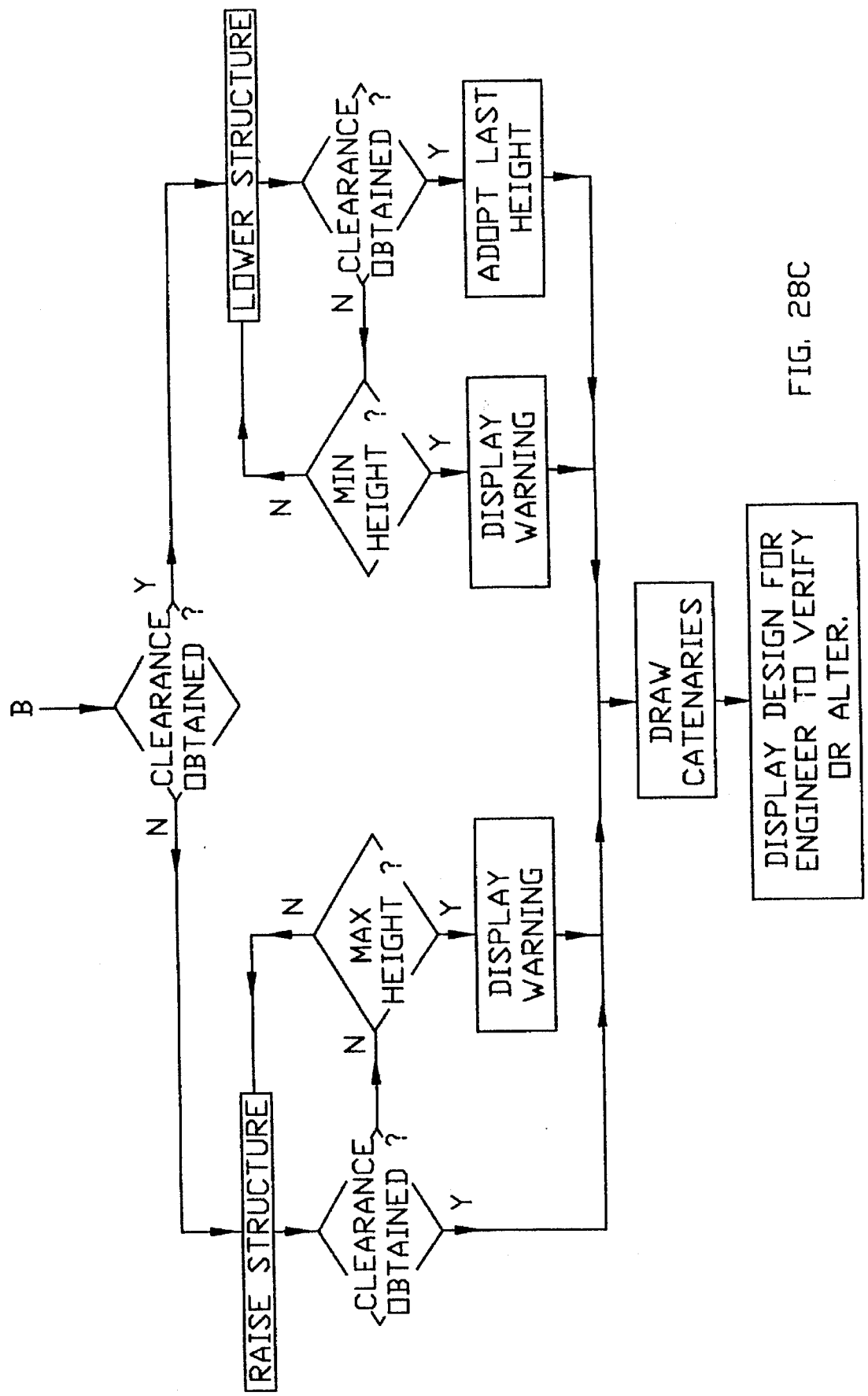

FIG. 28 shows the program for automated initial design, according to which the engineer should specify the conductor to be used, the default support structure, maximum, minimum and ideal span lengths, safety tolerances and exclusion, fixed height and minimum clearance zones.

This process then calculates the optimum number of support structures to be used, based on the specified ideal span length. It then computes the working span length based on this figure and the total length of the line. Working from the start of the line it places the default structure at intervals equal to this span length. If one of these structures lies within an exclusion zone it is moved along the line to avoid it. If this cannot be done without exceeding the span length limits the previous structures may be moved also. If this still leaves the structure within the exclusion zone it is returned to its original position, the engineer being warned. If the structure had to be moved the working span length is modified for the remaining structures.

Once the structures have been placed they are checked and, if necessary, exchanged with other structures suitable for supporting the type of conductor specified. Alternative structures are drawn from a reference library so that minimum clearance criteria are met for every point along the conductor's catenary curve. If it is impossible to meet the specified clearance tolerances a warning is given.

The structures are then checked to see if they would be subject to uplift (possibly causing them to being pulled out of the ground by the conductor) under minimum temperature conditions (the conductor contracts when cold). If this is the case alternative structures are specified if this is possible, otherwise a warning is given.

Finally, the central phase of each structure is plotted and a dotted clearance curve is drawn according to the statutory clearance distance below it. This initial design may then be verified and modified by the engineer.

The Sag & Tension program uses catenary calculations similar to the conductor program. It reads the data concerning the type of conductor used from a data-base held in computer memory. However, because the program is run on a hand-held computer, it has completely different application areas. It can be used during the construction of a new section of line, or when an existing line is being re-strung so as to check that it is being strung at the required tension. Previously, this was done by computing in advance the amount the line should sag and constructing it so that it did in fact sag by this amount. One disadvantage of this system was that the design sag was computed using an estimated air and conductor temperature. If this differed significantly from the actual temperature on the day the line was being strung errors were introduced. Furthermore, the process of computing the sags and checking them is very slow and cumbersome. It is also critical to the whole line construction process.

The Sag & Tension program overcomes these problems as all the computations are done immediately. Therefore, as it is not necessary to compute the sag positions in advance, the actual temperature taken at the time the measurement is used in the calculations. In addition to removing this source of error, the whole process is speeded up and simplified.

Another application area for the Sag & Tension program is in the determination of clearances during routine line maintenance.

Traditionally the height difference between the highest point and the line was measured. This dimension was used to determine whether clearance tolerances were being met. This procedure however only checks for the currently existing conditions. A significant margin of error must be left in order that this tolerance would also be met under extreme conditions. Additionally, as the clearance was only determined on the basis of two dimensional information the point selected as being closest to the conductor may in fact be in error.

The Sag & Tension program overcomes these difficulties as it can model the line not only under existing conditions, but can also predict its position under extreme conditions. It works on the basis of full three dimensional conditions. It also simplifies the whole process as only the attachment points must be measured. From these positions and the input variables, the position of the conductor is modelled. There is therefore no longer a requirement to measure the height of the actual conductor for this purpose.

The other application of the Sag & Tension program is in the determination of the tension applied to an existing conductor. This can change over time as the conductor stretches. At present it is computed by measuring the sag on the line and the environmental temperature. These measurements are then used at a later date to compute the actual tension. The Sag & Tension program computes this information. This can be particularly critical after extreme conditions have occurred and the line is being monitored to determine the extent of the damage.

Figures 1, 26:
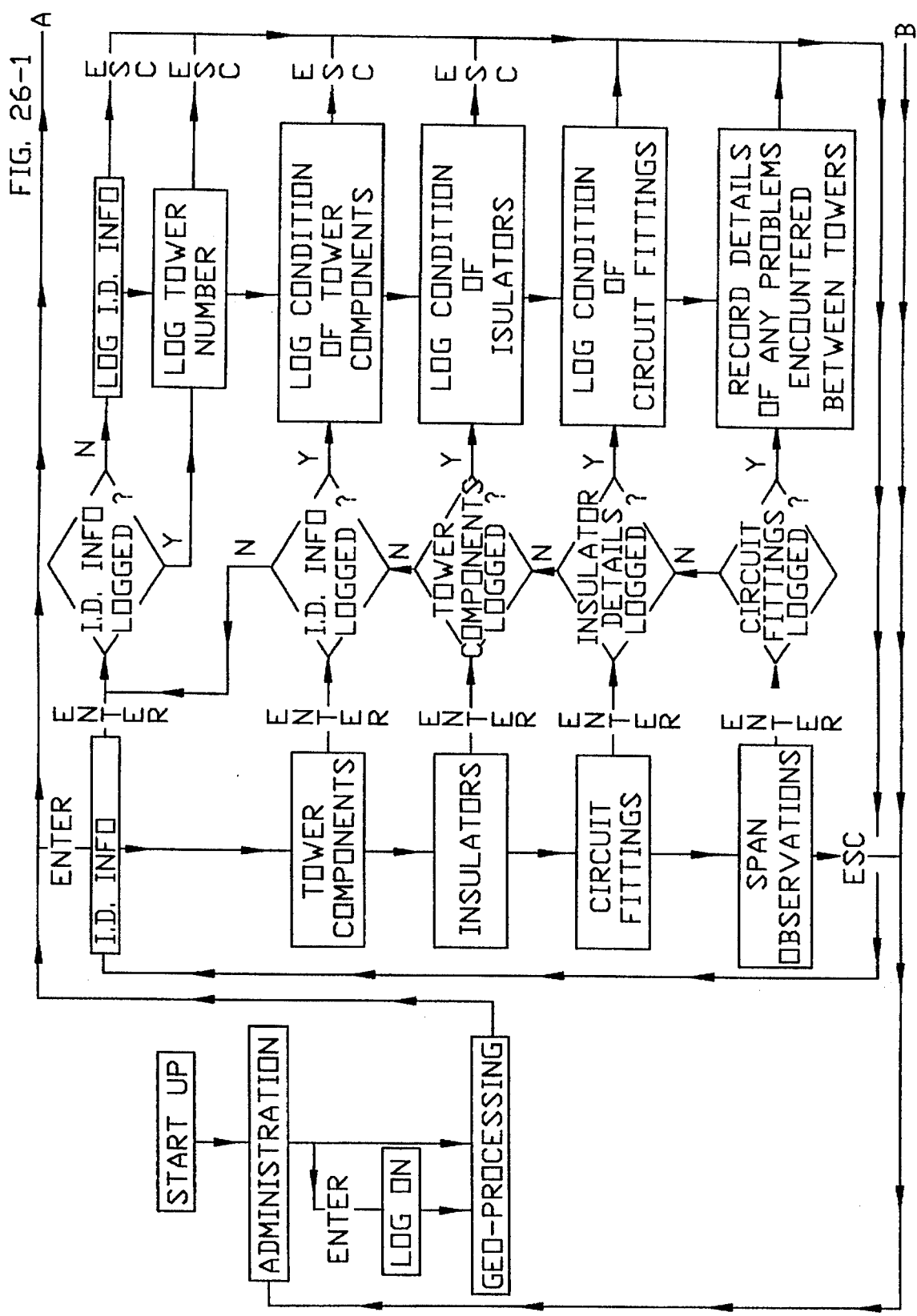
Figures 1, 27D:
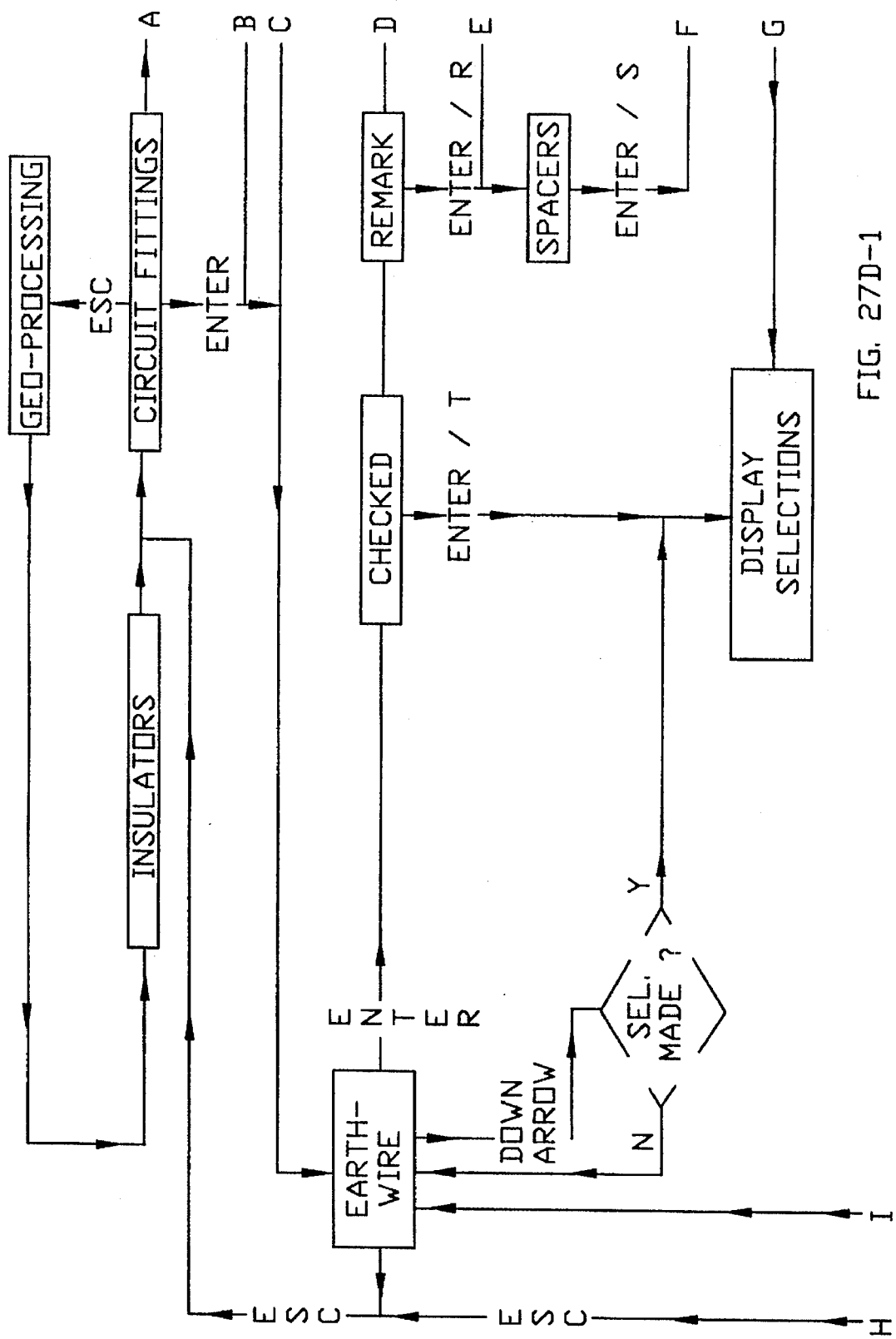
Figures 2, 27D:
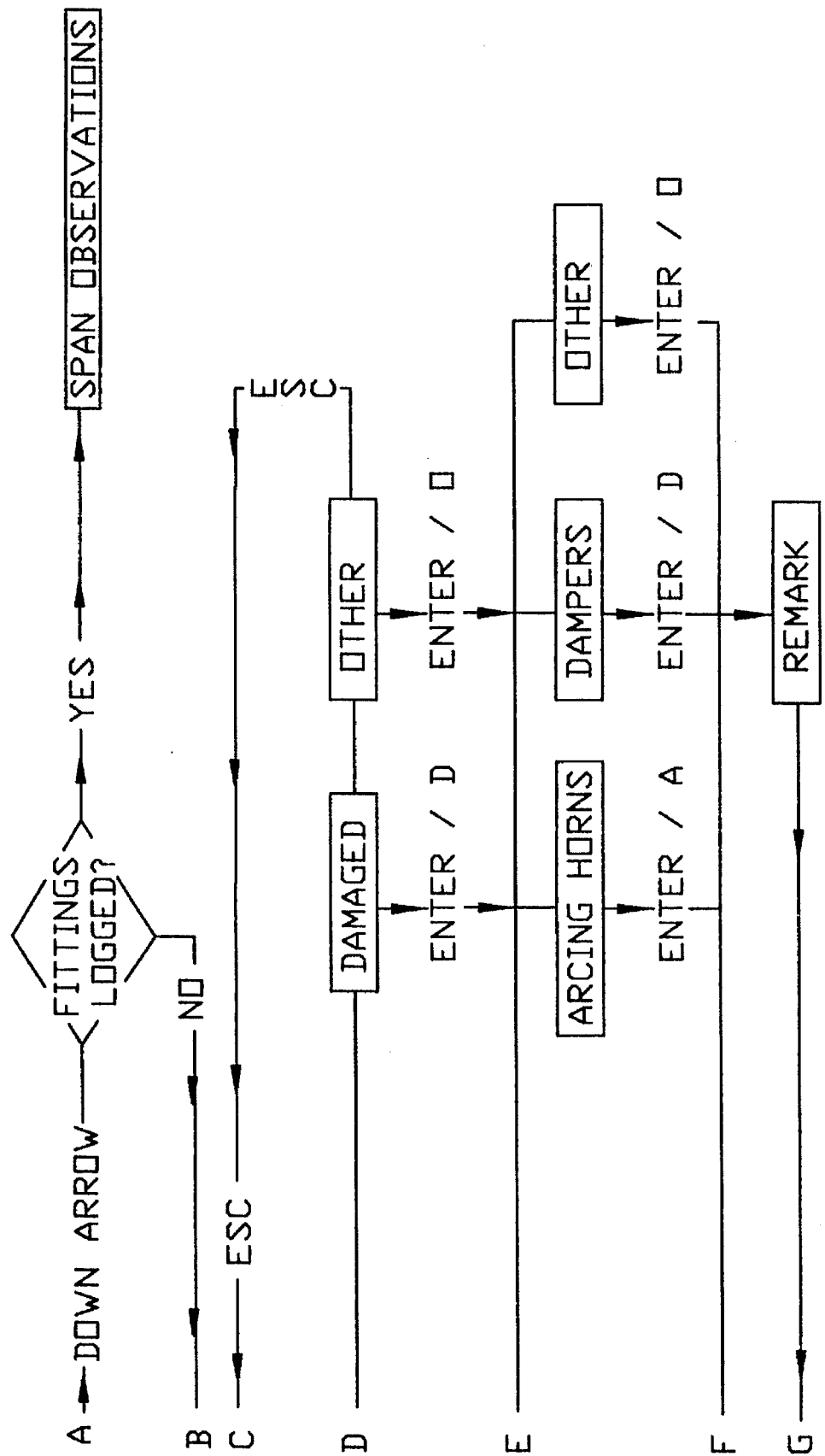
Figures 3, 27D:
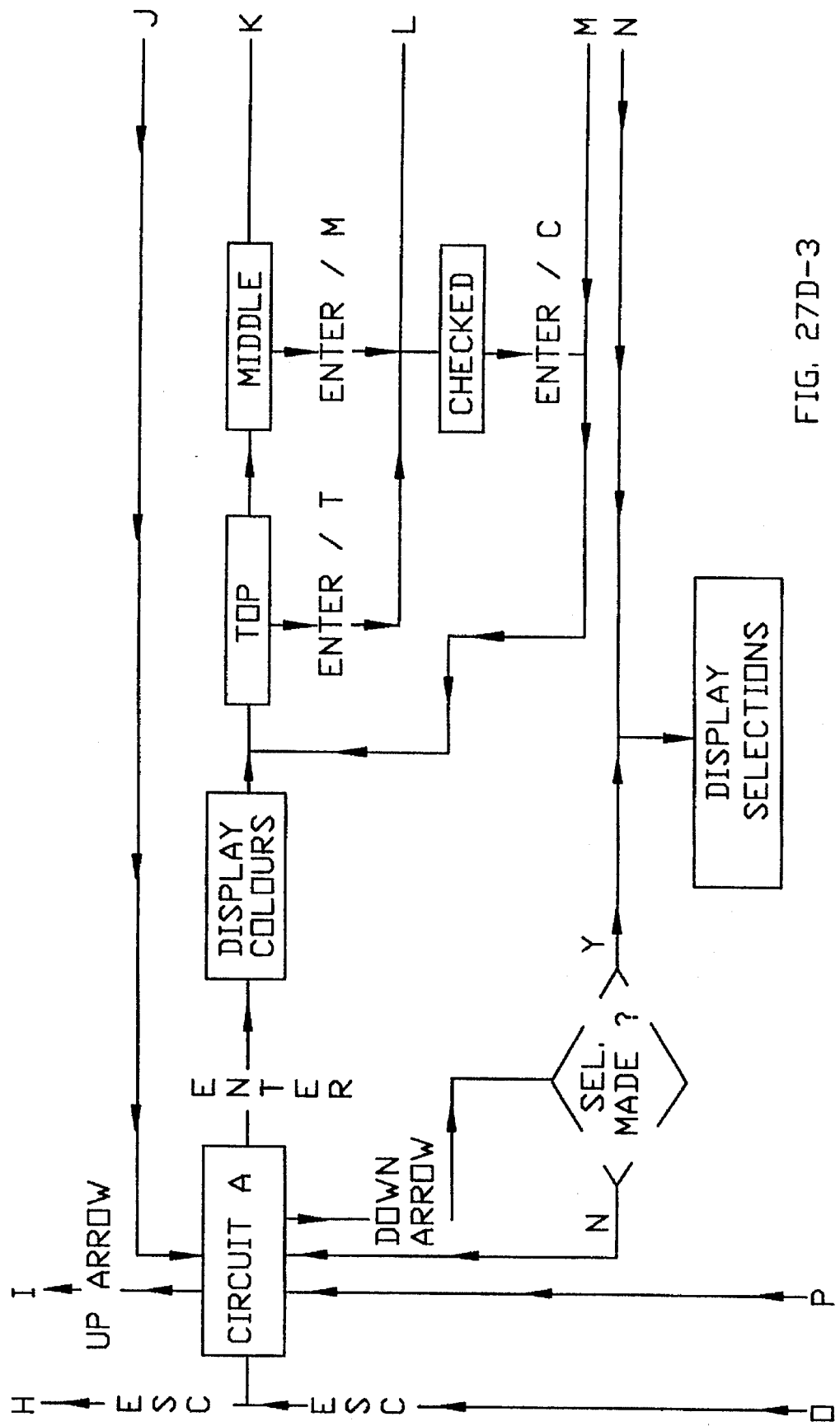
Figures 4, 27D:
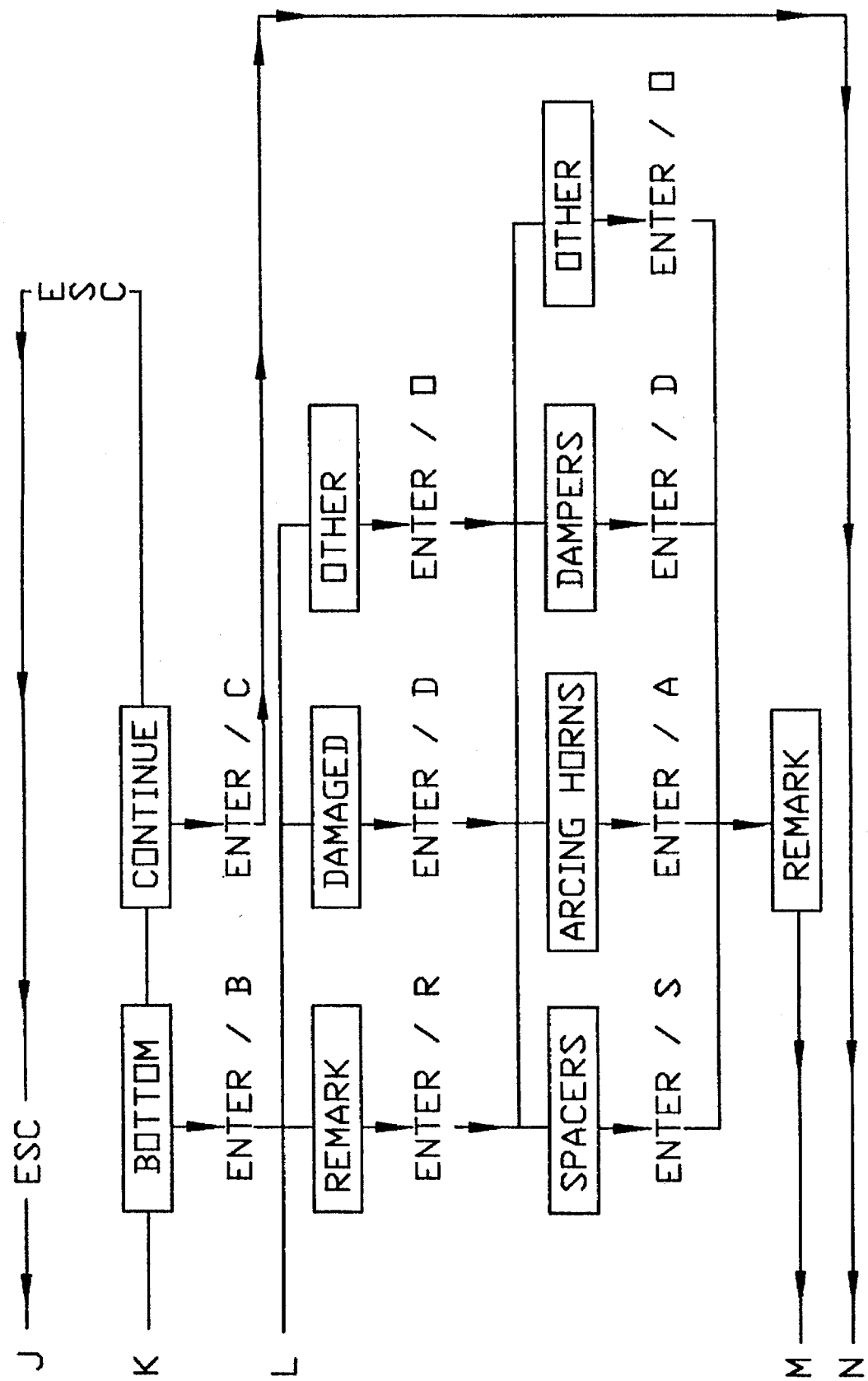
Figures 5, 27D:
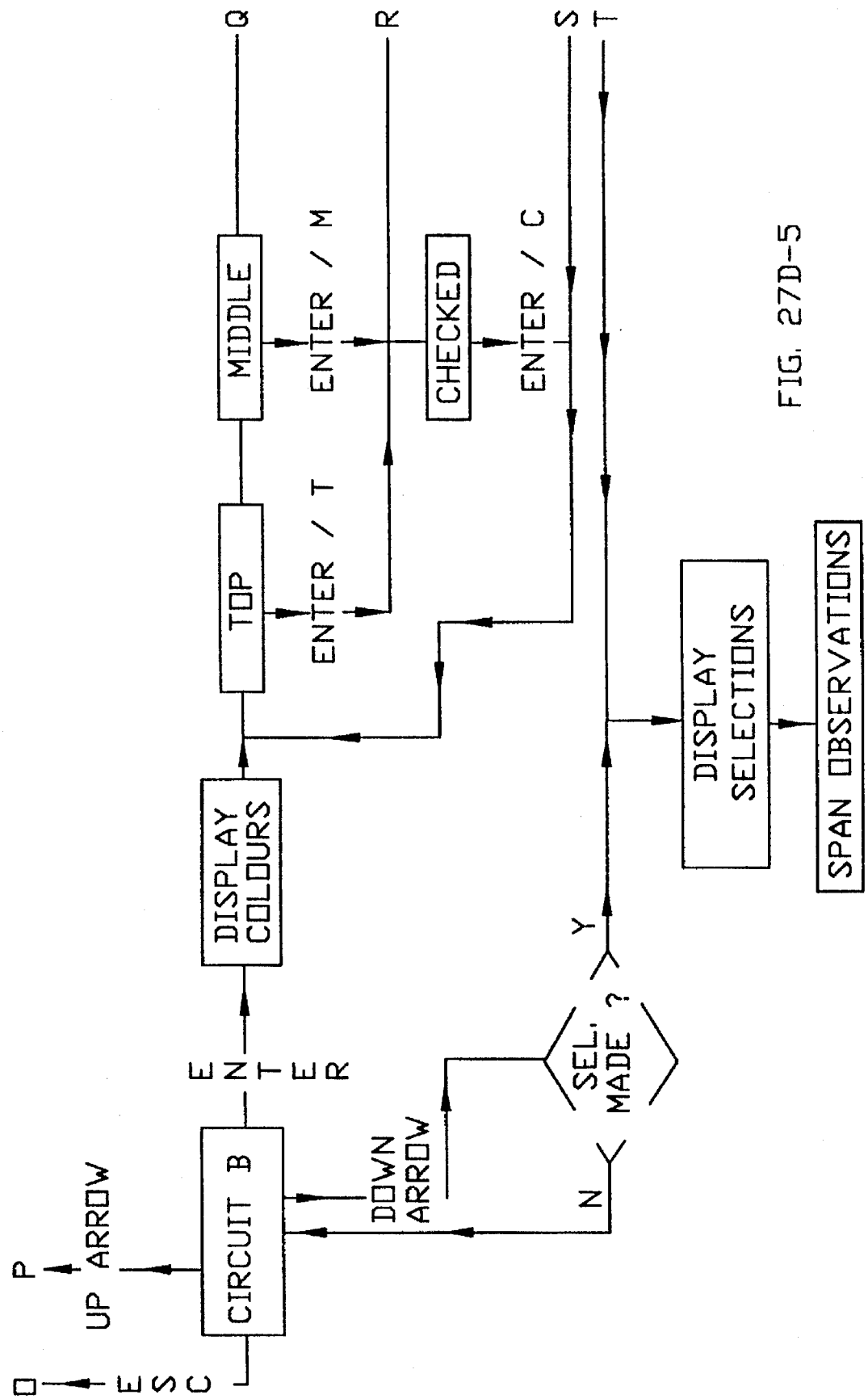
Figures 6, 27D:
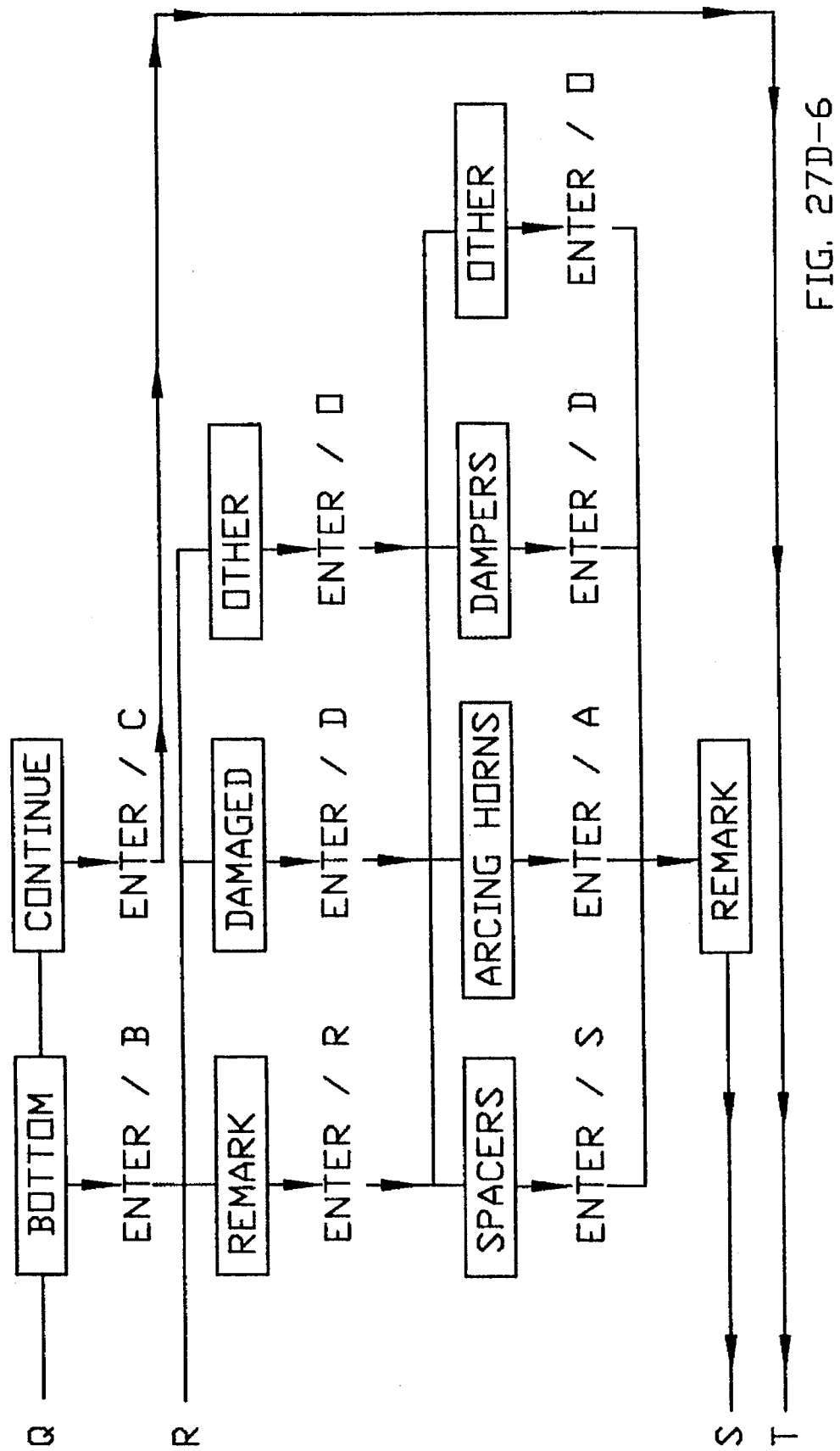
Figures 1, 27E:
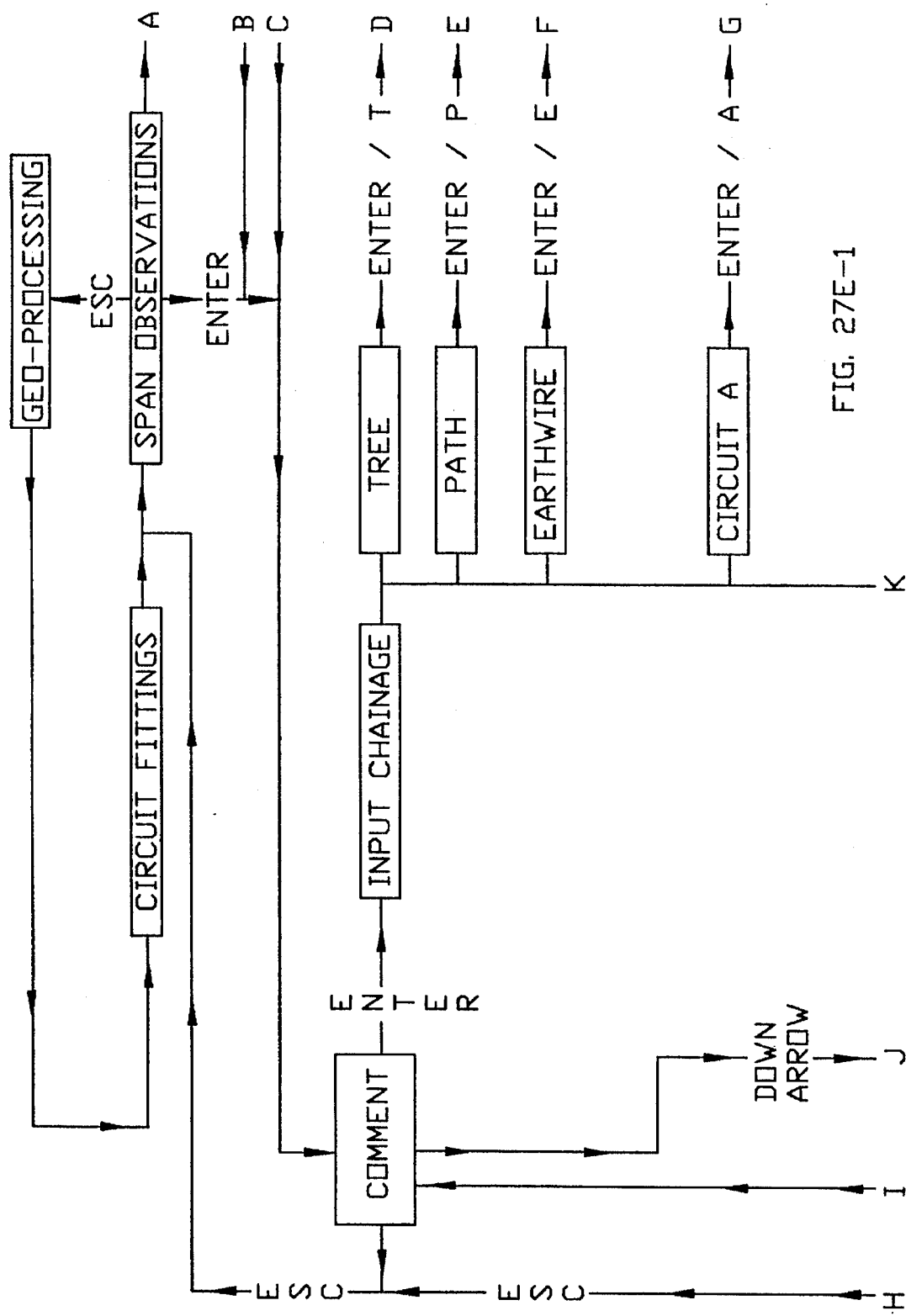
Figure 27E:
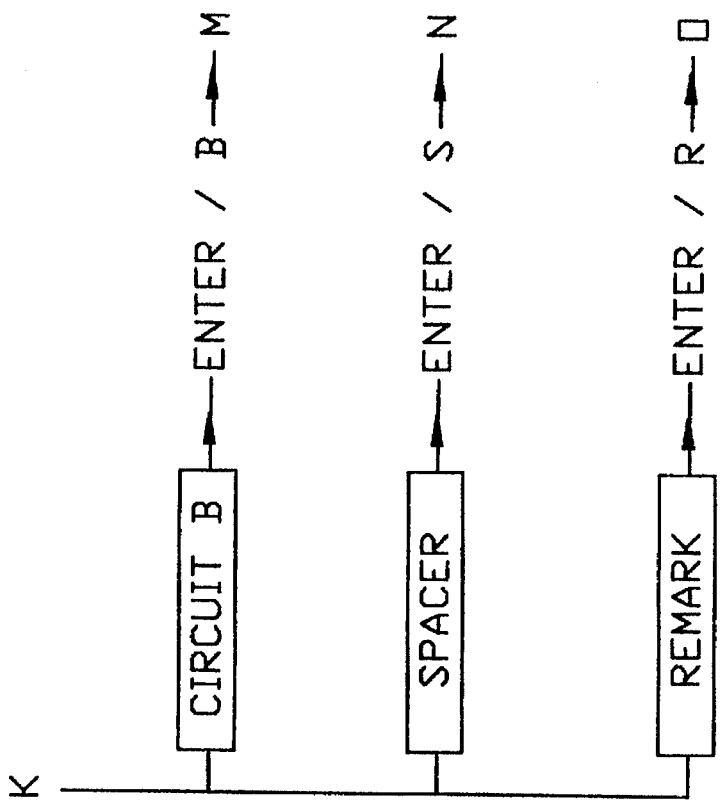
Figure 3:
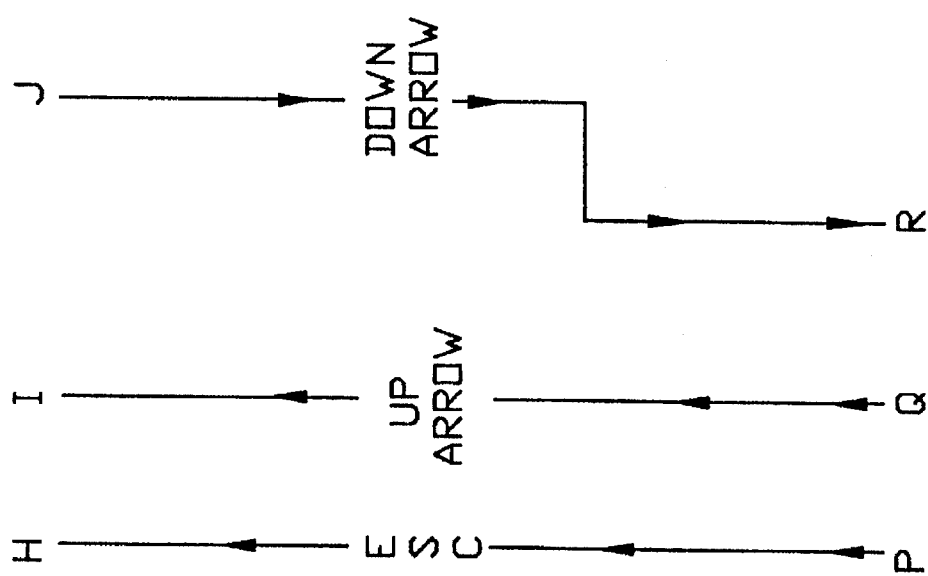
Figures 4, 27E:
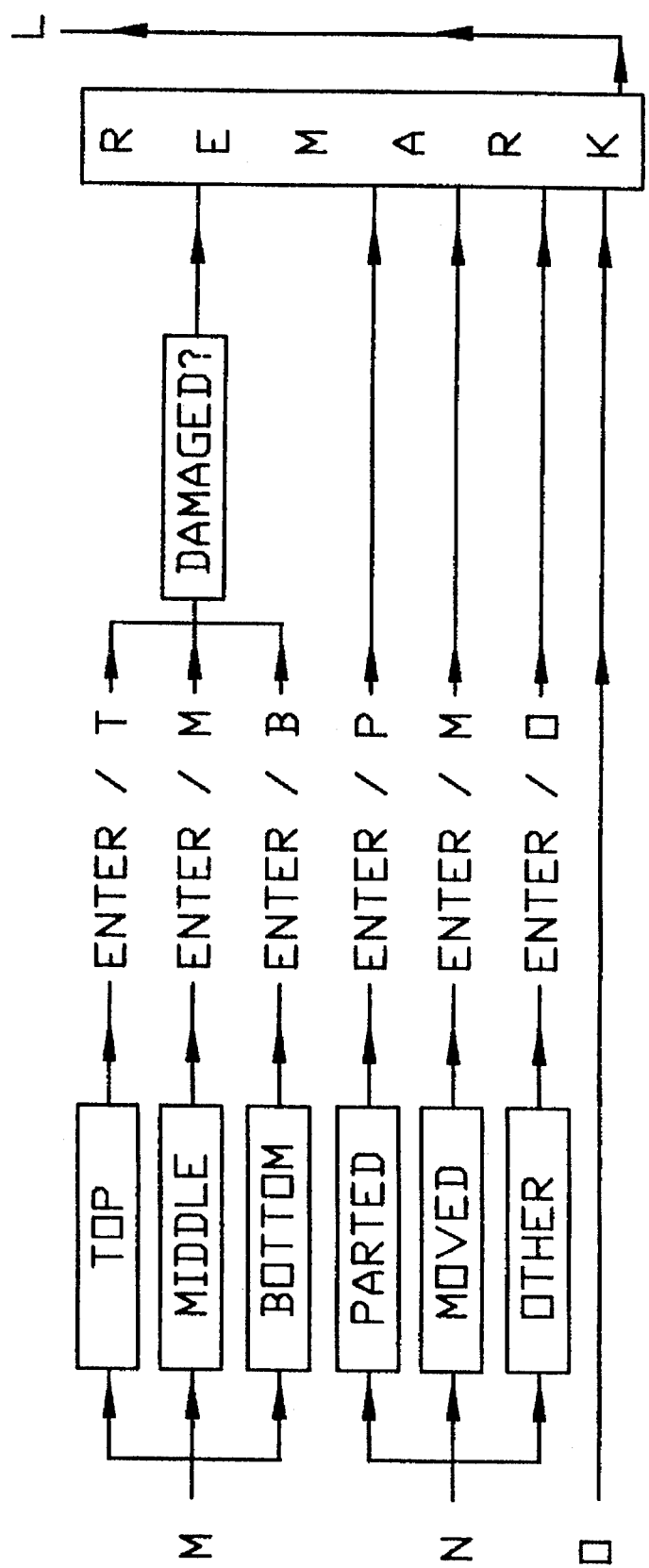
Figures 5, 27E:
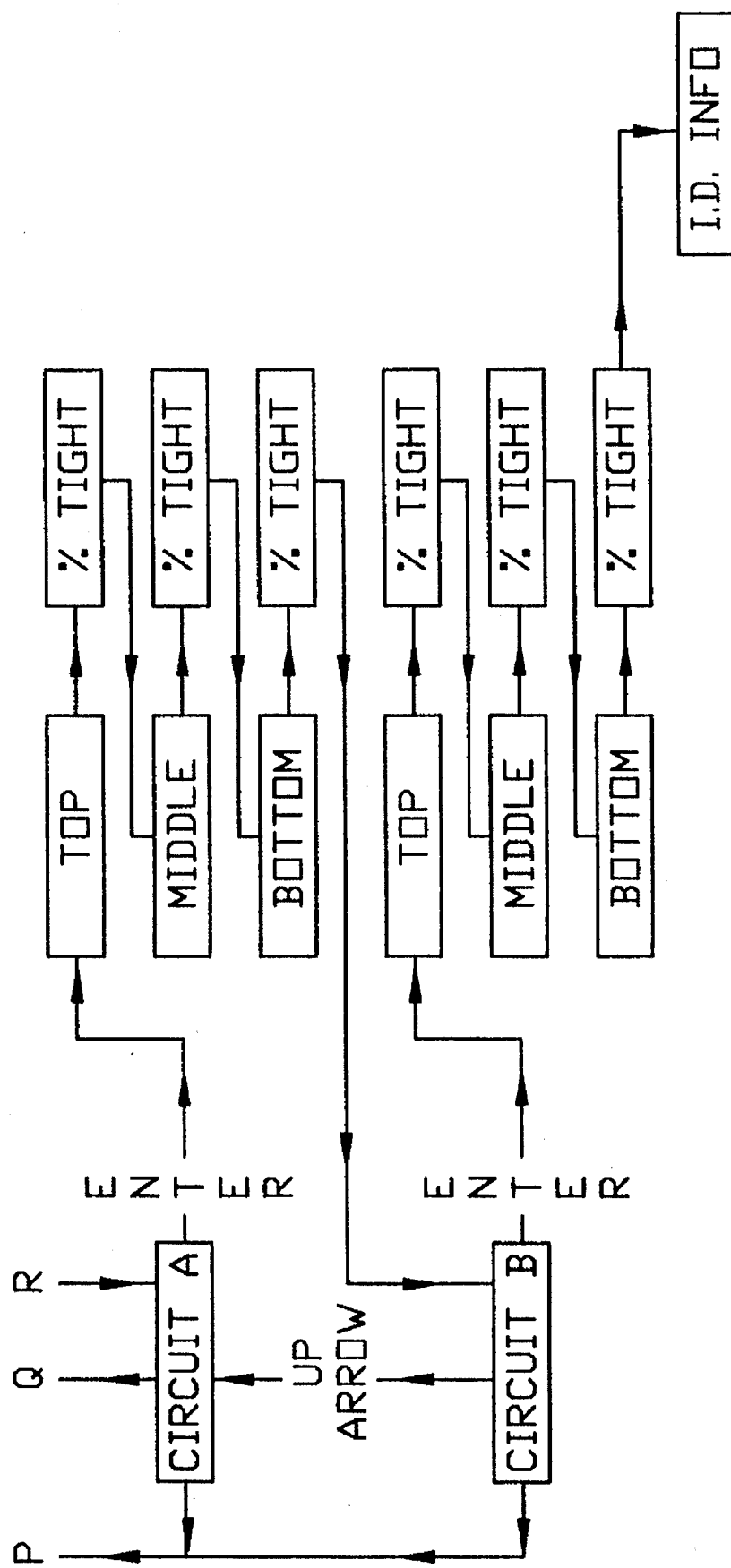

The quality control and maintenance facility includes an integrated Line Patrol Program which has been produced to enable the collection of data relating to the condition of a section of powerline and the poles or towers supporting it. FIG. 26 is an overview flow chart of the integrated line patrol program. The various subsections are shown in more detail in FIG. 27. The I.D. information component is shown in FIG. 27A, tower components in FIG. 27B, insulators in FIG. 27C, circuit fittings in FIG. 27D and span observations in FIG. 27E. The data is generally collected by a person walking along the route of the line inspecting all the relevant items. In most cases the data is recorded on a paper logging sheet which would be returned to the head office where the logging sheet would be copied into a standardized format and the logging sheet filed. A planning engineer would then review this data and the necessary repairs would be authorized. In some areas this data collection process has already been automated using a simple hand-held computer.

The main feature which differentiates this product from any previously produced is the fact that this process will now be integrated into a total systems solution covering all aspects of powerline maintenance. The data may be transferred (either directly or via an intermediate storage device) from the hand-held collection device to a geographical data-base, holding a full description of the supporting structures involved including their exact position. This new data is cross referenced with any existing data on the basis of the route name and the support structure numbers.

Advantages of an automated systems are:
1. Standardized methodology.
2. Standardized output format.
3. Check against individual items not being investigated.
4. No transcription of results necessary.

Advantages of the system according to the invention are:
1. The data goes directly into the main office data-base from whence it may be accessed immediately by any authorized person.
2. The data may be transferred from the field collection unit without returning to the office.
3. When the collection data is being examined, all the information available on the relevant structure is easily accessible.

It will of course be understood that the invention is not limited to the specific details described herein, which are given by way of example only, and that various modifications and alterations are possible within the scope of the invention.

We claim:

1. A computerized apparatus for erecting and maintaining a powerline having a plurality of conductors, the apparatus comprising:

means for inputting position and condition data in three dimensions pertaining to a geographical position and a condition of components of the powerline erected at a powerline site; and computing means for receiving said inputted three-dimensional position and condition data at the powerline site and determining, at the powerline site, in three dimensions, a tension of at least one of the powerline conductors based upon said inputted data and data stored in memory of said computing means relating to characteristics of said powerline conductor.

2. An apparatus according to claim 1, including means for storing data relating to an original design of the powerline and for comparing the original design data with the position and condition data to determine the modifications required to restore the powerline to the original design.

3. Apparatus according to claim 1, further comprising means for modifying an original design of the powerline and powerline support structures stored in a computer-aided design file.

4. Apparatus according to claim 1, further comprising means for matching a design of a replacement conductor for replacing one of the plurality of conductors to an original design of the one of the plurality of conductors to obtain a sag profile of the replacement conductor that matches a sag profile of the one of the plurality of conductors.

5. Apparatus according to claim 1, wherein the means for obtaining data comprises:

means for inputting environmental data relating to an environment surrounding the powerline including access to the powerline and vegetation growth;

means for determining from the environmental data if any modifications are needed to be made to the environment surrounding the powerline;

means for computing modification data relating to the required modifications; and means for incorporating the modification data into a computer-aided design file.

6. Apparatus according to claim 1, further comprising:

means for determining a sag of at least one of the plurality of conductors;

means for determining a tension of at least one of the plurality of conductors; and means for determining a clearance amount between at least one of the plurality of conductors and an observed point in an environment surrounding the powerline for current weather conditions and worst case scenario weather conditions.

7. Apparatus according to claim 1, wherein the powerline includes a plurality of guy lines each having vertical and lateral elements, the apparatus further comprising means for checking a position of at least one of the guy lines of the powerline and determining a three-dimensional clearance area between an environment surrounding the powerline and the powerlines for the vertical and lateral elements of the at least one guy line.

8. An apparatus according to claim 1, further comprising redesigning means for determining, based on a comparison of the data, if modifications to the powerline are required and for specifying the modifications required.

9. A method for erecting and maintaining a powerline having a plurality of conductors, the method comprising:

inputting data in three dimensions pertaining to a geographical position and condition of components of the powerline erected at a powerline site; and calculating in three dimensions at the powerline site, using a computer, a tension of at least one of the plurality of powerline conductors based upon said inputted three-dimensional position and condition data and data stored in a memory of said computer relating to characteristics of said powerline conductor.

10. A method according to claim 9, including storing data relating to an original design of a powerline and comparing the original design data with the position and condition data to identify the modifications required to restore the powerline to the original design.

11. A method according to claim 9, further comprising the step of matching a design of a replacement conductor for replacing one of the plurality of conductors to an original design of the one of the plurality of conductors to obtain a sag profile of the replacement conductor that matches a sag profile of the one of the conductors.

12. A method according to claim 9, further comprising the steps of:

gathering data obtained by visual inspection relating to a condition of the powerline and powerline support structures and vegetation growth surrounding the powerline;

determining from the data if any modifications need to be made to an environment surrounding the powerline;

computing modification data relating to the modifications; and incorporating the modification data into a computer-aided design file.

13. A method according to claim 9, further comprising the steps of:

determining a sag of at least one of the plurality of said conductors to determine a tension of the at least one of the plurality of conductors; and determining a clearance amount between at least one of the plurality of conductors and an observed point in an environment surrounding the powerline for current weather conditions and worst case scenario weather conditions.

14. A method according to claim 9, wherein the powerline includes a plurality of guy lines each having vertical and lateral elements, and the method further comprises the steps of:

locating a position of one of the guy lines of the powerline; and determining a three dimensional clearance area between an environment surrounding the powerline and the powerline for the vertical and lateral elements of the one of the lines.

* * * * *